(12) United States Patent
Abido et al.

(10) Patent No.: US 9,461,535 B2
(45) Date of Patent: Oct. 4, 2016

(54) PHOTOVOLTAIC SYSTEMS WITH MAXIMUM POWER POINT TRACKING CONTROLLER

(71) Applicants: KING FAHD UNIVERSITY OF PETROLEUM AND MINERALS, Dhahran (SA); KING ABDULAZIZ CITY FOR SCIENCE AND TECHNOLOGY, Riyadh (SA)

(72) Inventors: Mohamed Ali Abido, Dhahran (SA); Muhammad Sheraz Khalid, Dhahran (SA)

(73) Assignees: King Fahd University of Petroleum and Minerals, Dhahran (SA); King Abdulaziz City for Science and Technology, Riyadh (SA)

( * ) Notice: Subject to any disclaimer, the term of this patent is extended or adjusted under 35 U.S.C. 154(b) by 404 days.

(21) Appl. No.: 14/144,122

(22) Filed: Dec. 30, 2013

(65) Prior Publication Data

US 2015/0188415 A1    Jul. 2, 2015

(51) Int. Cl.
| | |
|---|---|
| H02J 1/00 | (2006.01) |
| H02M 3/00 | (2006.01) |
| H02J 1/04 | (2006.01) |
| G05B 17/02 | (2006.01) |
| G05F 1/67 | (2006.01) |
| G06F 17/50 | (2006.01) |

(52) U.S. Cl.
CPC ............. *H02M 3/005* (2013.01); *G05B 17/02* (2013.01); *G05F 1/67* (2013.01); *H02J 1/04* (2013.01); *G06F 17/5009* (2013.01); *H02J 2001/004* (2013.01); *Y02E 10/58* (2013.01)

(58) Field of Classification Search
CPC ...................................................... H02M 3/005
See application file for complete search history.

(56) References Cited

U.S. PATENT DOCUMENTS

| 2006/0132102 A1 | 6/2006 | Harvey |
| 2012/0038217 A1* | 2/2012 | Egiziano ............... G05F 1/67 307/82 |

FOREIGN PATENT DOCUMENTS

| CN | 102118432 A | 7/2011 |
| IN | 2008009401 | 6/2012 |
| KR | 10-0886891 | 3/2009 |
| KR | 10-0989441 | 10/2010 |

OTHER PUBLICATIONS

M. Veerachary, T. Senjyu and K. Uezato, "Neural-network-based maximum-power-point tracking of coupled-inductor interleaved-boost-converter-supplied PV system using fuzzy controller," in IEEE Transactions on Industrial Electronics, vol. 50, No. 4, pp. 749-758, Aug. 2003.*
Elmas et al., "Adaptive fuzzy logic controller for DC-DC converters," Expert Systems with Applications 36 (2009), pp. 1540-1548.
Ali et al., "A Survey of Maximum PPT techniques of PV Systems," May 2012, 17 pages.

* cited by examiner

*Primary Examiner* — Daniel Cavallari
(74) *Attorney, Agent, or Firm* — Oblon, McClelland, Maier & Neustadt, L.L.P

(57) ABSTRACT

A system and a method provide a photovoltaic system which regenerates the output characteristics of the photovoltaic at different ambient condition with high precision under all environmental conditions. The photovoltaic system includes a photovoltaic array, a buck/boost converter, a DC link capacitor to connect the buck/booster converter to a load/inverter, an adaptive network-based fuzzy inference maximum power point tracking controller, a voltage control loop, a proportional integral controller to maintain the output voltage of the photovoltaic array to the reference voltage by adjusting the duty ratio of buck/boost converter.

2 Claims, 117 Drawing Sheets

PHOTOVOLTAIC SYSTEMS WITH MAXIMUM POWER POINT TRACKING CONTROLLER

FIELD OF DISCLOSURE

The present disclosure relates to photovoltaic systems, more particularly, embodiments of the subject matter relate to maximum power point tracking for photovoltaic systems.

BACKGROUND OF DISCLOSURE

In the near future, the demand of electric energy is expected to increase rapidly due to the global population growth and industrialization. This increase in energy demand requires electric utilities to increase their generation. Recent studies predict that the world's net electricity generation is expected to rise from 17.3 trillion kilowatt-hours in 2005 to 24.4 trillion kilowatt-hours (an increase of 41%) in 2015 and 33.3 trillion kilowatt-hours (an increase of 92.5%) in 2030, as described in *Energy Information Administration*. ("International Energy Outlook, 2011,"—incorporated herein by reference). Currently, a large share of electricity is generated from fossil fuels, especially coal due to its low prices. However, the increasing use of fossil fuels accounts for a significant portion of environmental pollution and greenhouse gas emissions, which are considered the main reason behind global warming. For example, the emissions of carbon dioxide and mercury are expected to increase by 35% and 8%, respectively, by the year 2020 due to the expected increase in electricity generation, as described in U.S. Energy Information Administration, ("U.S. energy-related CO2 emissions in early 2012 lowest since 1992"—incorporated herein by reference). Moreover, possible depletion of fossil fuel reserves and unstable price of oil are two main concerns for industrialized countries.

To overcome the problems associated with generation of electricity from fossil fuels, Renewable Energy Sources (RES) can participate in the energy mix. Also the deregulation in electricity markets and the development of the distributed generation (DG) technologies are promoting the use of RES in power generation, as described in International Confederation of Energy Regulators, ("Renewable Energy and Distributed Generation: International Case Studies on Technical and Economic Considerations," *International Confederation of Energy Regulators* 21 Feb. 2012—incorporated herein by reference). Among the renewable energy sources (RES), solar energy is the promising and photovoltaic (PV) system provides the most direct method to convert solar energy into electrical energy without environmental contamination. As PV cells are semiconductor devices, they are quite, static, having no moving or rotating parts, require very little maintenance and have very low operational cost as compared to other RES like wind energy. Despite the intermittency of sunlight, numerous PV systems have been developed in many countries around the world because of their long term benefits, benevolent fed in tariff initiatives and other schemes offered by governments to encourage the use of renewable energy sources (RES). The use of photovoltaic (PV) systems for electricity generation started in the seventies of the 20th century and is currently growing rapidly worldwide. In fact, many organizations expect a bright future for these systems because it is abundant, ubiquitous, sustainable, environmental friendly and free of cost. The world's cumulative installed capacity of PV was 23 GW in year 2009. In 2011, more than 69 GW of PV power is installed worldwide that can generate 85 TWh of electricity per year. Among all the RES the growth rate of PV power is incomparable and reached almost 70% in year 2011, as described in (EPIA) *Industry Association*, ("Global Market Outlook For Photovoltaics Until 2016,", *Europian Photovoltaic*, 2012—incorporated herein by reference). The European Photovoltaic Industry Association (EPIA) expects that the global cumulative PV capacity will reach 200 GW by the year 2020 and 800 GW by the year 2030. This large increase in the deployment of PV generation has led the researchers to work on the different issues of photovoltaic like PV cells material, modeling of the PV panel, maximum power point tracking algorithms, power electronics converter used to integrate PV array with grid and its impact on power system etc.

SUMMARY OF THE DISCLOSURE

A photovoltaic system to track the maximum power point, including: a photovoltaic array that generates a varying DC output voltage and current depending on the weather conditions; a buck/boost converter to step down/step up of the output voltage from the photovoltaic array; a DC link capacitor to connect the buck/booster converter to a load/inverter, wherein the load/inverter provides a grid output of the photovoltaic system; an adaptive network-based fuzzy inference maximum power point tracking controller to generate a reference voltage; a voltage control loop to compare the output voltage of the photovoltaic array to the reference voltage, and a proportional integral controller to maintain the output voltage of the photovoltaic array to the reference voltage by adjusting the duty ratio of buck/boost converter.

In the first feature, wherein the adaptive network-based fuzzy inference based maximum power point tracking controller generates the reference voltage based on irradiation and temperature, the reference voltage is output to the voltage control loop, and the adaptive network-based fuzzy inference based maximum power point tracking controller maps an input-output data set to a 5-layer architecture to generate the reference voltage.

A computer-implemented method for developing a photovoltaic system to track the maximum power point, including: developing with a processing circuitry a five parameter photovoltaic panel model; investigating with the processing circuitry a behavior of the developed photovoltaic panel model with respect to the five parameters; estimating with the processing circuitry a plurality of optimal values of the five parameters using a differential evolution technique; developing with the processing circuitry MATLAB/Simulink photovoltaic array model; verifying with the processing circuitry robustness of the photovoltaic array model; designing with the processing circuitry an adaptive neuro-fuzzy inference based system maximum power point tracking controller; Integrating with the processing circuitry the adaptive neuro-fuzzy inference based system maximum power point tracking controller to photovoltaic array model; verifying with the processing circuitry the robustness of the adaptive neuro-fuzzy inference based system maximum power point tracking controller through time domain simulations of the photovoltaic system; investigating with a processing circuitry a dynamic performance of the photovoltaic system; implementing with a processing circuitry the adaptive neuro-fuzzy inference based system maximum power point tracking controller on a dSPACE DS1104; validating with a processing circuitry the adaptive neuro-fuzzy inference based system maximum power point tracking controller using a Real Time Digital Simulator.

In the second feature, the photovoltaic system including: a photovoltaic array that generates a varying DC output voltage and current depending on the weather conditions; a buck/boost converter to step down/step up of the output voltage from the photovoltaic array; a DC link capacitor to connect the buck/booster converter to a load/inverter, wherein the load/inverter provides a grid output of the photovoltaic system; an adaptive network-based fuzzy inference maximum power point tracking controller to generate a reference voltage; a voltage control loop to compare the output voltage of the photovoltaic array to the reference voltage, and a proportional integral controller to maintain the output voltage of the photovoltaic array to the reference voltage by adjusting the duty ratio of buck/boost converter.

In the second feature, wherein the adaptive network-based fuzzy inference based maximum power point tracking controller generates the reference voltage based on irradiation and temperature, the reference voltage is output to the voltage control loop, and the adaptive network-based fuzzy inference based maximum power point tracking controller maps an input-output data set to a 5-layer architecture to generate the reference voltage.

The non-transitory computer readable storage medium having stored therein instructions that when executed by processing circuitry cause the processing circuitry to perform a method for providing instant ice, the method including: developing with a processing circuitry a five parameter photovoltaic panel model; investigating with the processing circuitry a behavior of the developed photovoltaic panel model with respect to the five parameters; estimating with the processing circuitry a plurality of optimal values of the five parameters using a differential evolution technique; developing with the processing circuitry MATLAB/Simulink photovoltaic array model; verifying with the processing circuitry robustness of the photovoltaic array model; designing with the processing circuitry an adaptive neuro-fuzzy inference based system maximum power point tracking controller; Integrating with the processing circuitry the adaptive neuro-fuzzy inference based system maximum power point tracking controller to photovoltaic array model; verifying with the processing circuitry the robustness of the adaptive neuro-fuzzy inference based system maximum power point tracking controller through time domain simulations of the photovoltaic system; investigating with a processing circuitry a dynamic performance of the photovoltaic system; implementing with a processing circuitry the adaptive neuro-fuzzy inference based system maximum power point tracking controller on a dSPACE DS1104; validating with a processing circuitry the adaptive neuro-fuzzy inference based system maximum power point tracking controller using a Real Time Digital Simulator.

In the third feature, the photovoltaic system including: a photovoltaic array that generates a varying DC output voltage and current depending on the weather conditions; a buck/boost converter to step down/step up of the output voltage from the photovoltaic array; a DC link capacitor to connect the buck/booster converter to a load/inverter, wherein the load/inverter provides a grid output of the photovoltaic system; an adaptive network-based fuzzy inference maximum power point tracking controller to generate a reference voltage; a voltage control loop to compare the output voltage of the photovoltaic array to the reference voltage, and a proportional integral controller to maintain the output voltage of the photovoltaic array to the reference voltage by adjusting the duty ratio of buck/boost converter.

In the third feature, the adaptive network-based fuzzy inference based maximum power point tracking controller generates the reference voltage based on irradiation and temperature, the reference voltage is output to the voltage control loop, and the adaptive network-based fuzzy inference based maximum power point tracking controller maps an input-output data set to a 5-layer architecture to generate the reference voltage.

Figure 55:
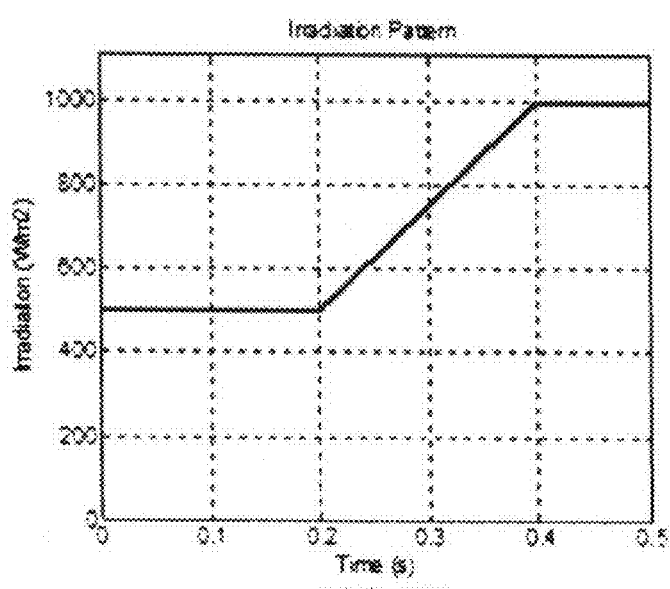

FIG. 55 shows a plot of a linear change in irradiation of a Test 5 for the adaptive network-based fuzzy inference based maximum power point tracking controller.

Figure 56:
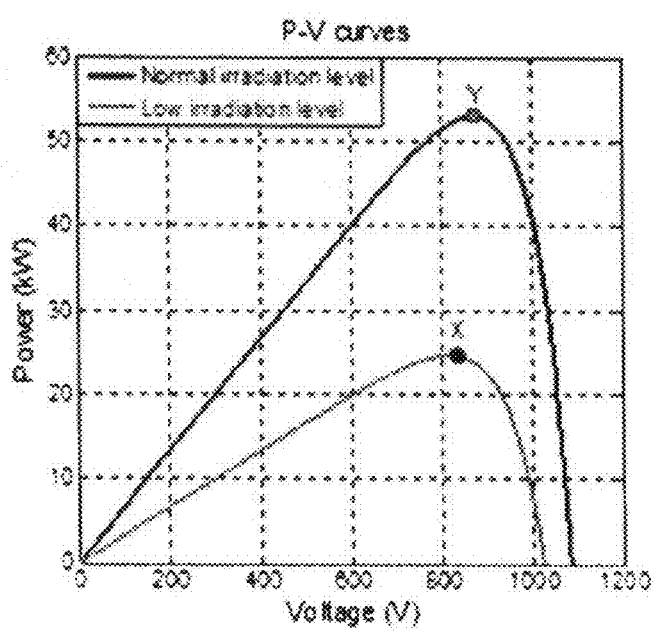

FIG. 56 shows a diagram of Power vs. voltage curve under normal and low irradiation conditions of the Test 5 for the adaptive network-based fuzzy inference based maximum power point tracking controller.

Figure 57:
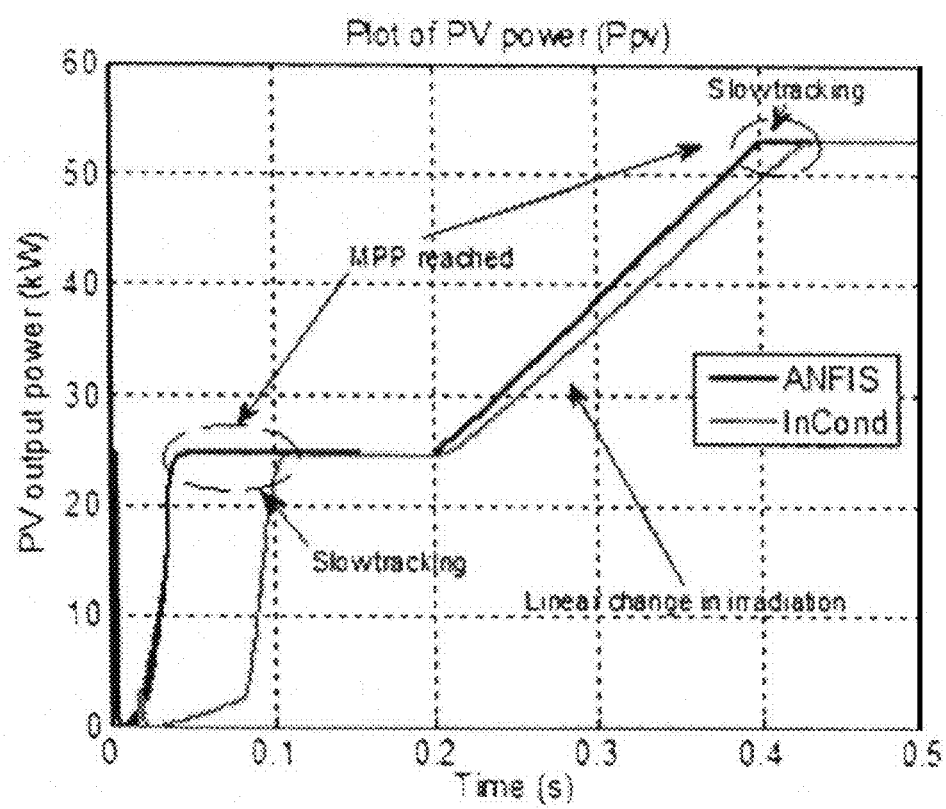

FIG. 57 shows a diagram of characteristics of photovoltaic power output under linear irradiation change of the Test 5 for the adaptive network-based fuzzy inference based maximum power point tracking controller.

Figure 58:
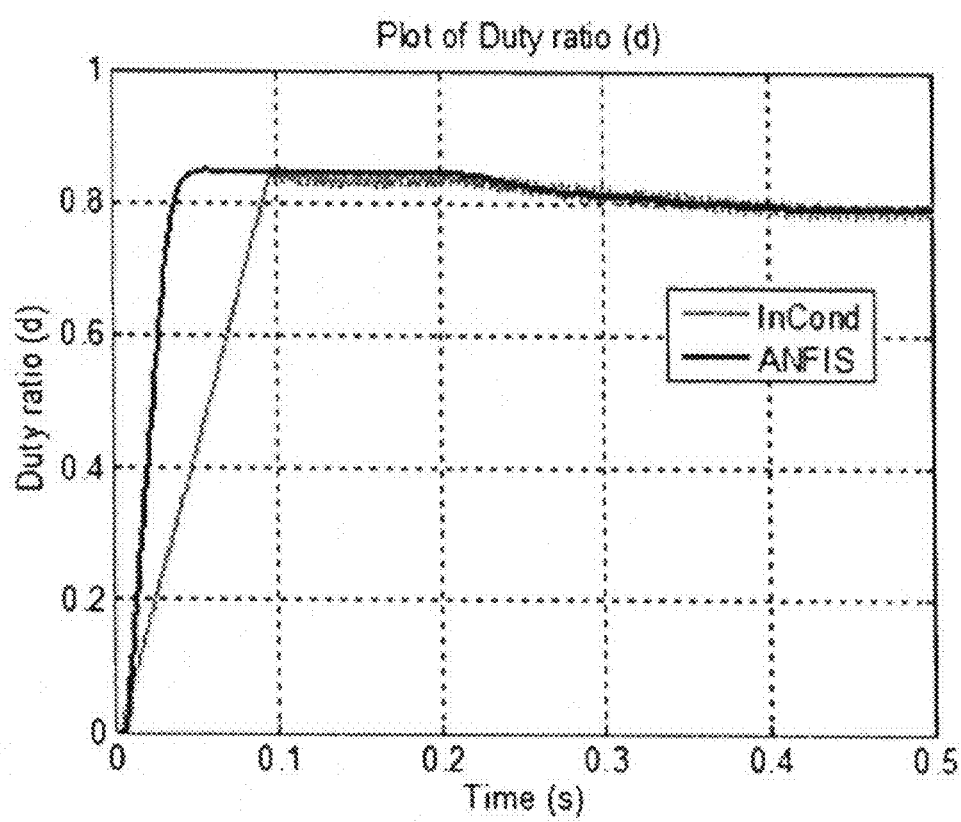

FIG. 58 shows a plot of duty ratio under linear irradiation of the Test 5 for the adaptive network-based fuzzy inference based maximum power point tracking controller.

Figure 59:
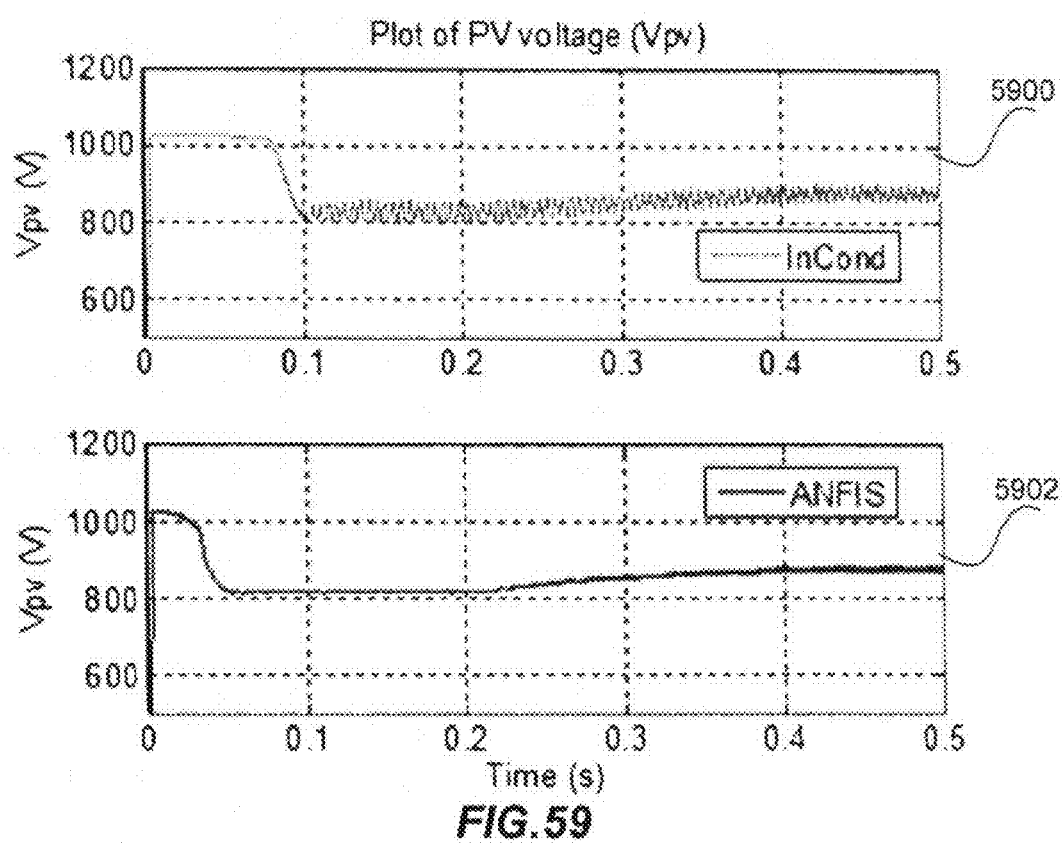

FIG. 59 shows a plot of characteristics of photovoltaic voltage under linear irradiation change of the Test 5 for the adaptive network-based fuzzy inference based maximum power point tracking controller.

Figure 60:
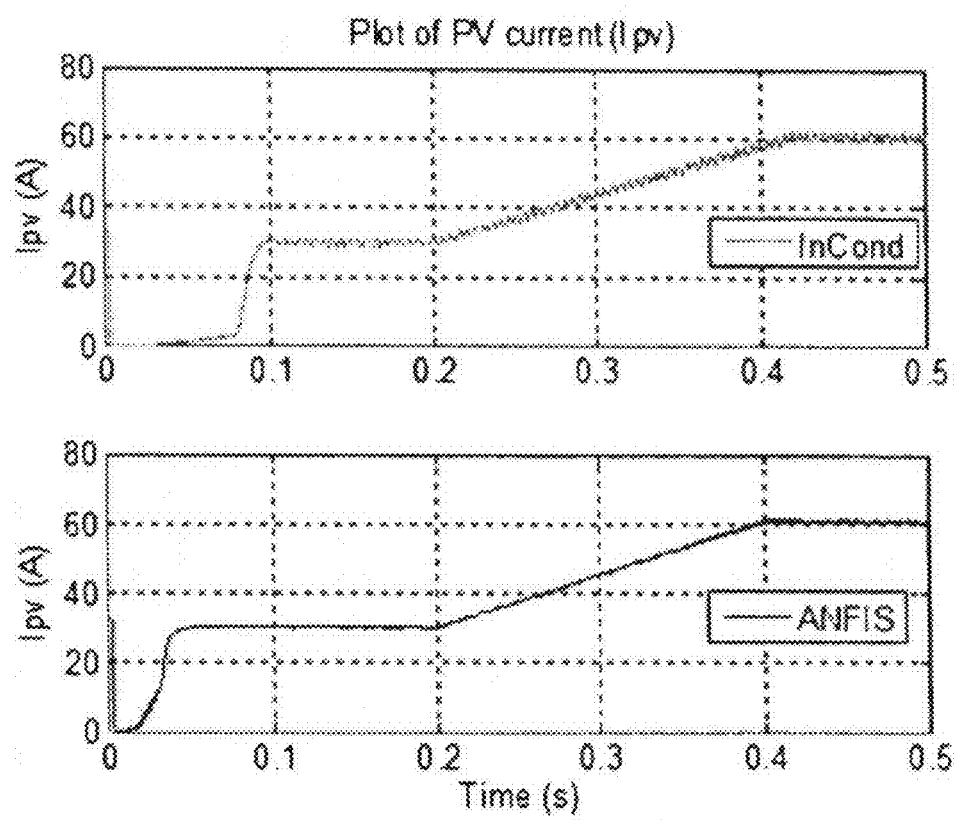

FIG. 60 shows a plot of characteristics of photovoltaic current under linear irradiation change of the Test 5 for the adaptive network-based fuzzy inference based maximum power point tracking controller.

Figure 61:
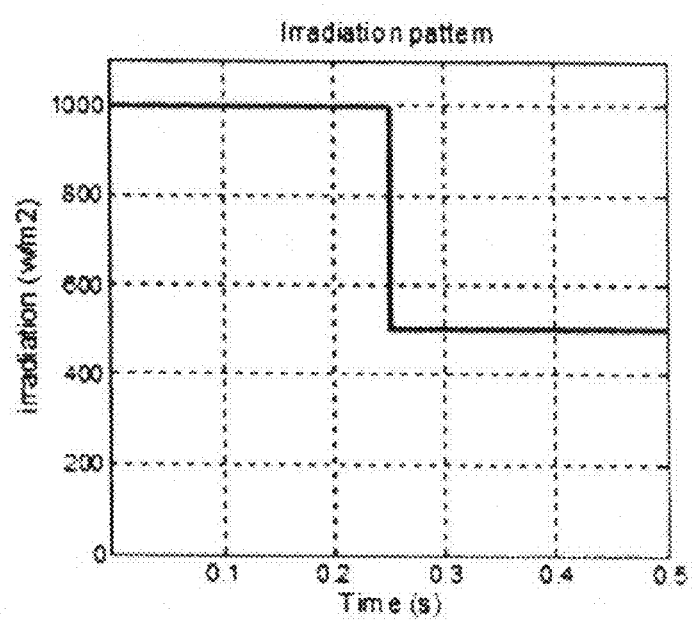

FIG. 61 shows a plot of a setup-down irradiation pattern of a Test 6 for the adaptive network-based fuzzy inference based maximum power point tracking controller.

Figure 62:
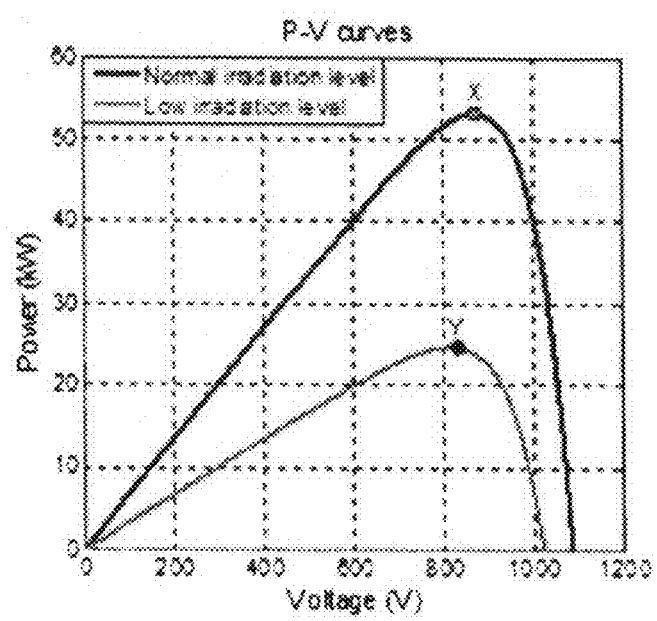

FIG. 62 shows a diagram of power vs. voltage curve under normal and low irradiation conditions of the Test 6 for the adaptive network-based fuzzy inference based maximum power point tracking controller.

Figure 63:
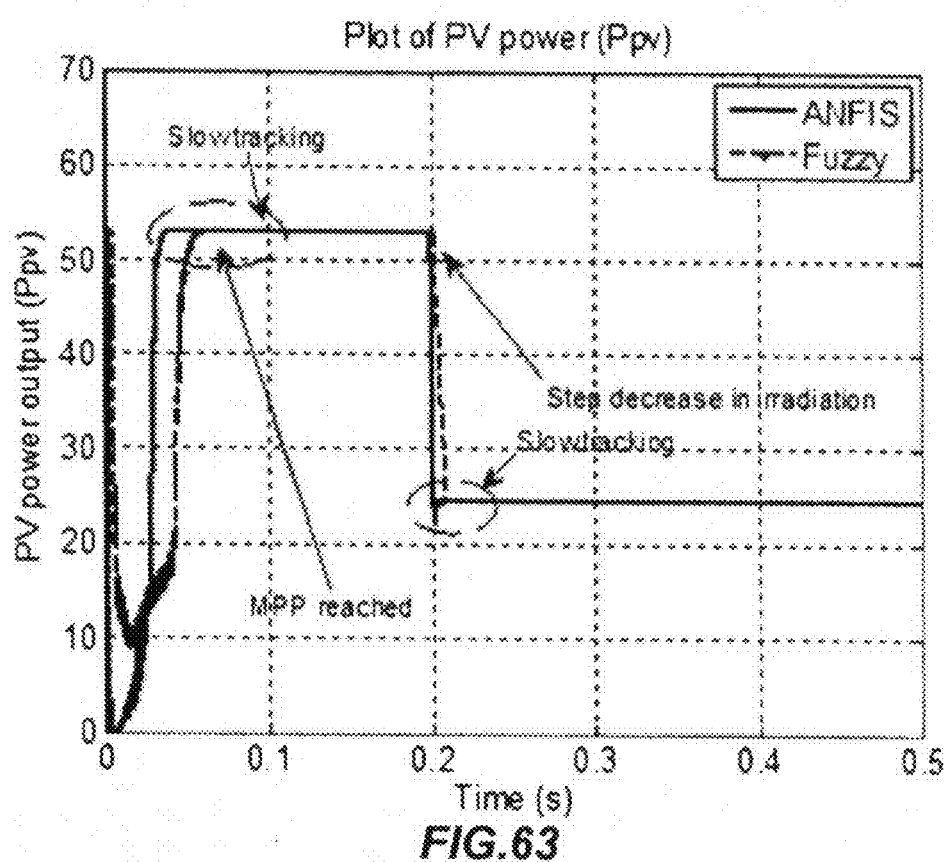

FIG. 63 shows a diagram of characteristics of photovoltaic power output under step-down irradiation change of the Test 6 for the adaptive network-based fuzzy inference based maximum power point tracking controller.

Figure 64:
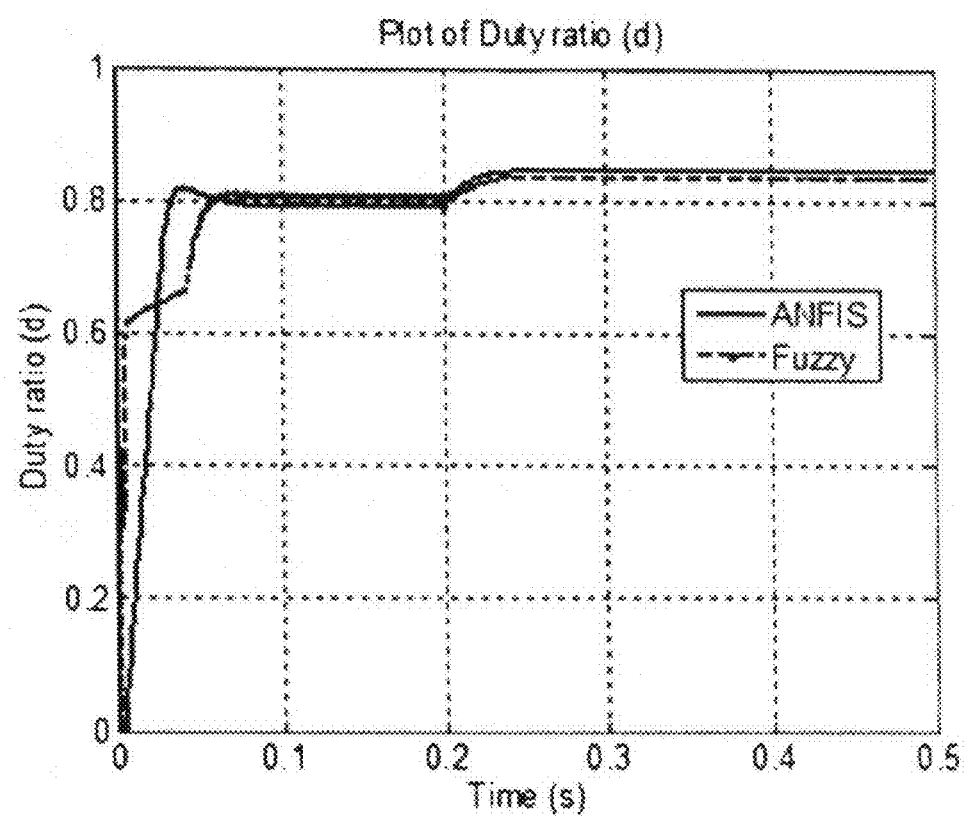

FIG. 64 shows a plot of duty ratio under step-down irradiation change of the Test 6 for the adaptive network-based fuzzy inference based maximum power point tracking controller.

Figure 65:
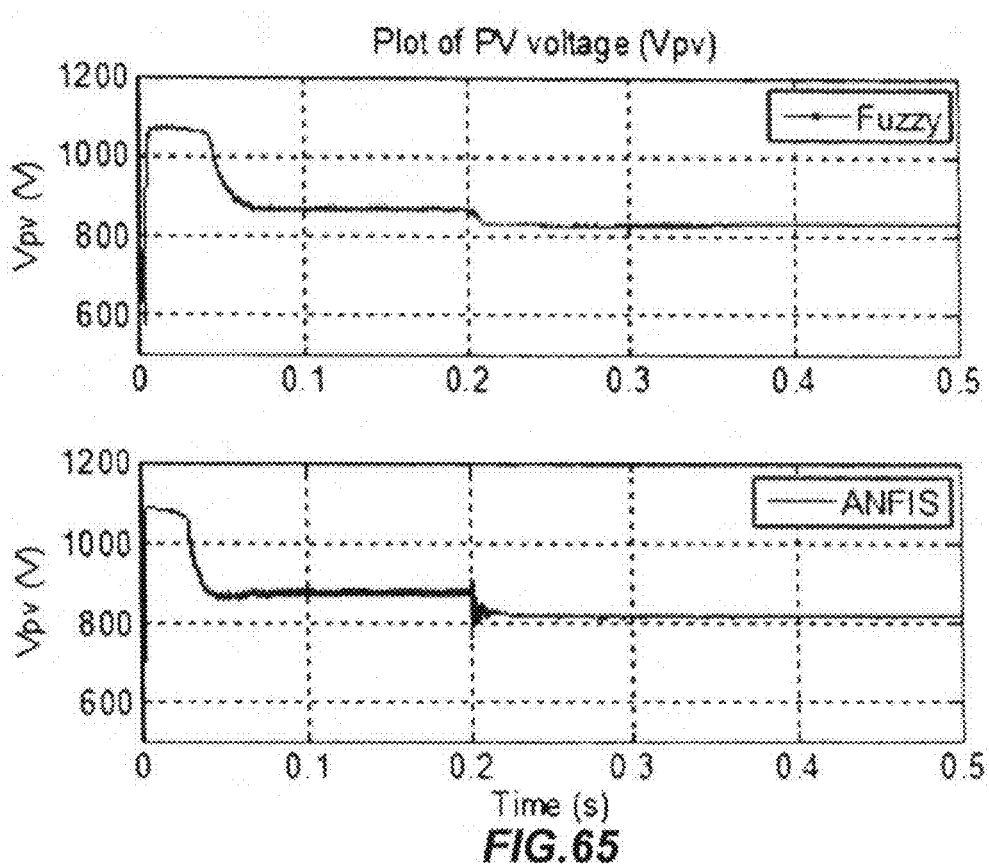

FIG. 65 shows a plot of characteristics of photovoltaic voltage under step-up irradiation change of the Test 6 for the adaptive network-based fuzzy inference based maximum power point tracking controller.

Figure 66:
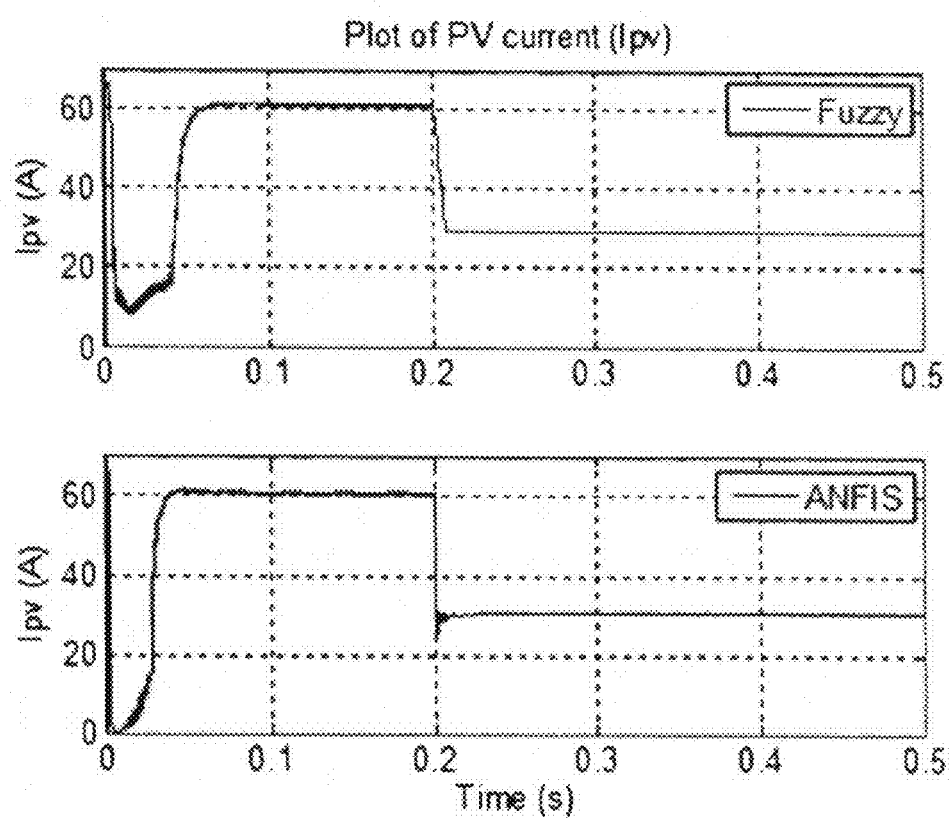

FIG. 66 shows a plot of characteristics of photovoltaic current under step-up irradiation change of the Test 6 for the adaptive network-based fuzzy inference based maximum power point tracking controller.

Figure 67:
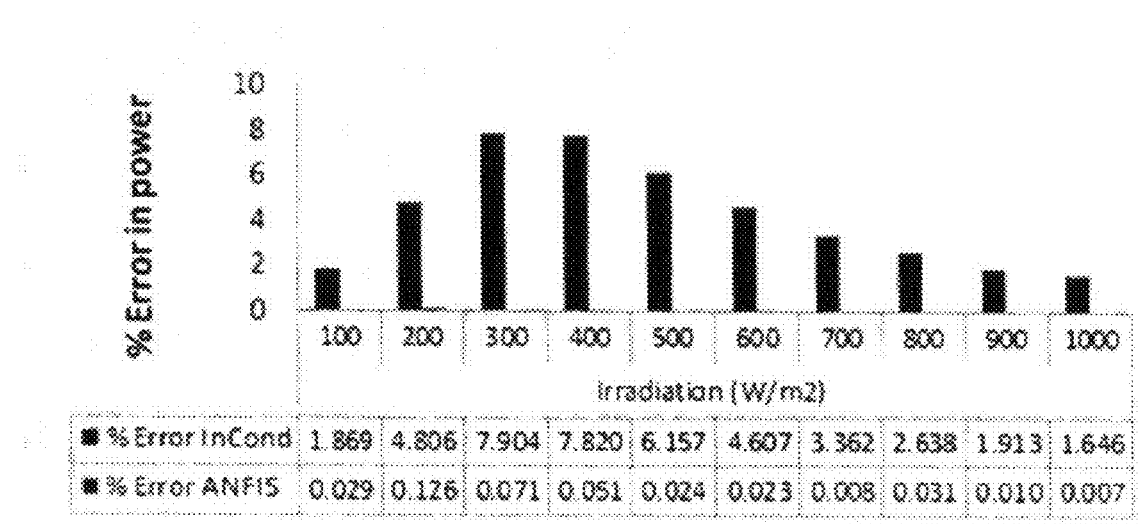

FIG. 67 shows a plot of percentage error in $P_{MP}$ at different irradiation level and constant temperature.

Figure 68:
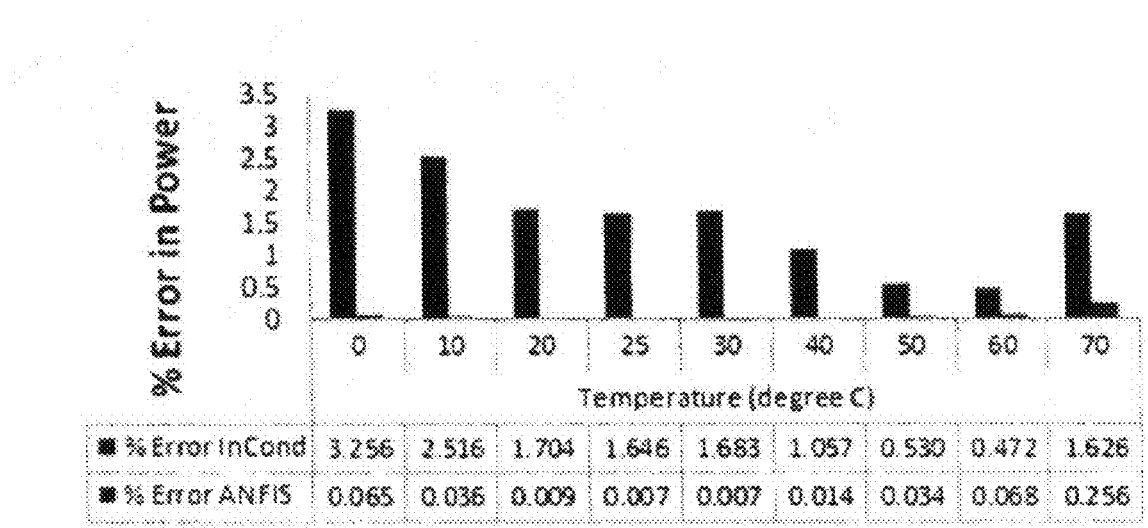

FIG. 68 shows a plot of percentage error in $P_{MP}$ at different temperature and constant irradiation.

Figure 69:
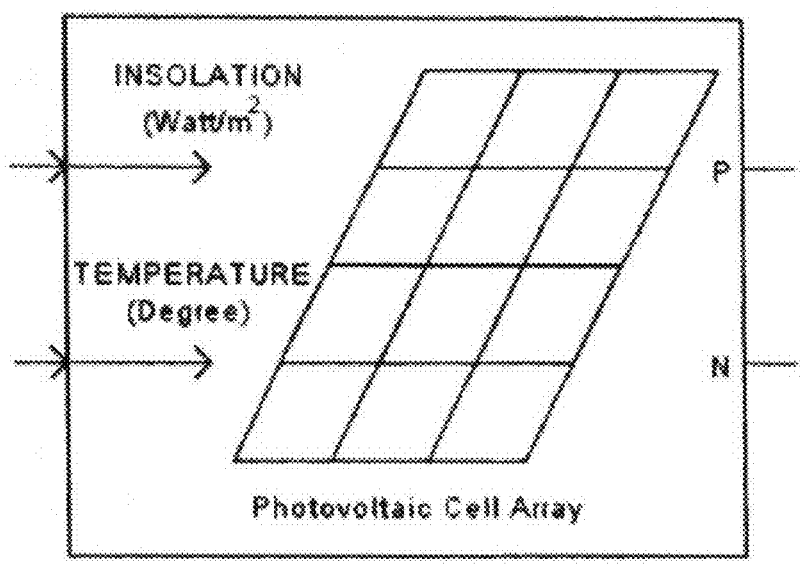

FIG. 69 shows a schematic of the photovoltaic array model in a Real Time Digital Simulator.

Figure 70:
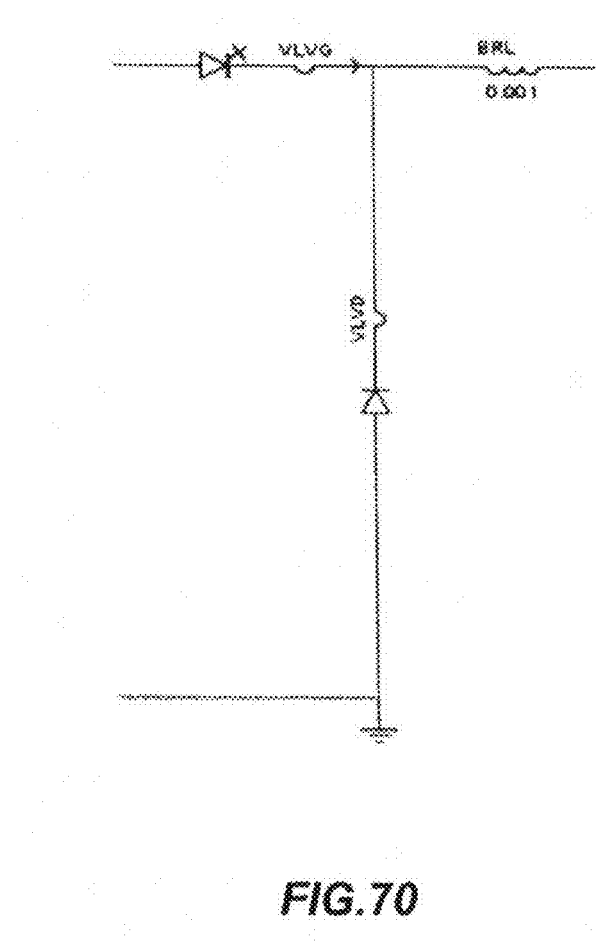

FIG. 70 shows a schematic of a buck converter in the Real Time Digital Simulator.

Figure 71:
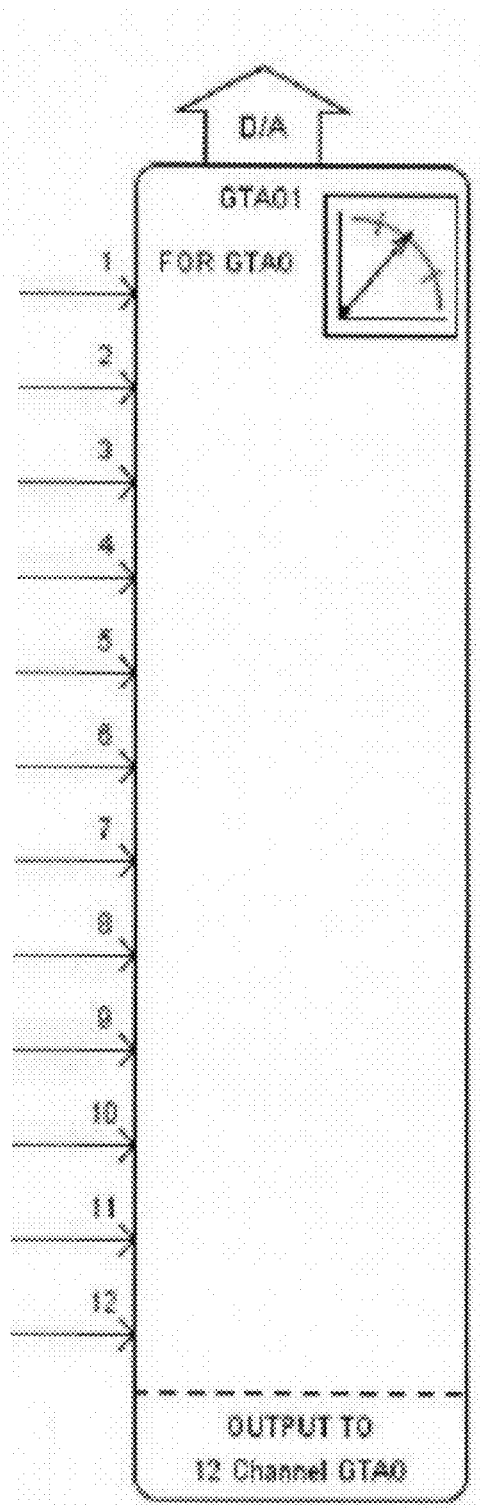

FIG. 71 shows a schematic of a Gigabit Transceiver Analogue Output component in RSCAD (software for the Real Time Digital Simulator)

Figure 72:
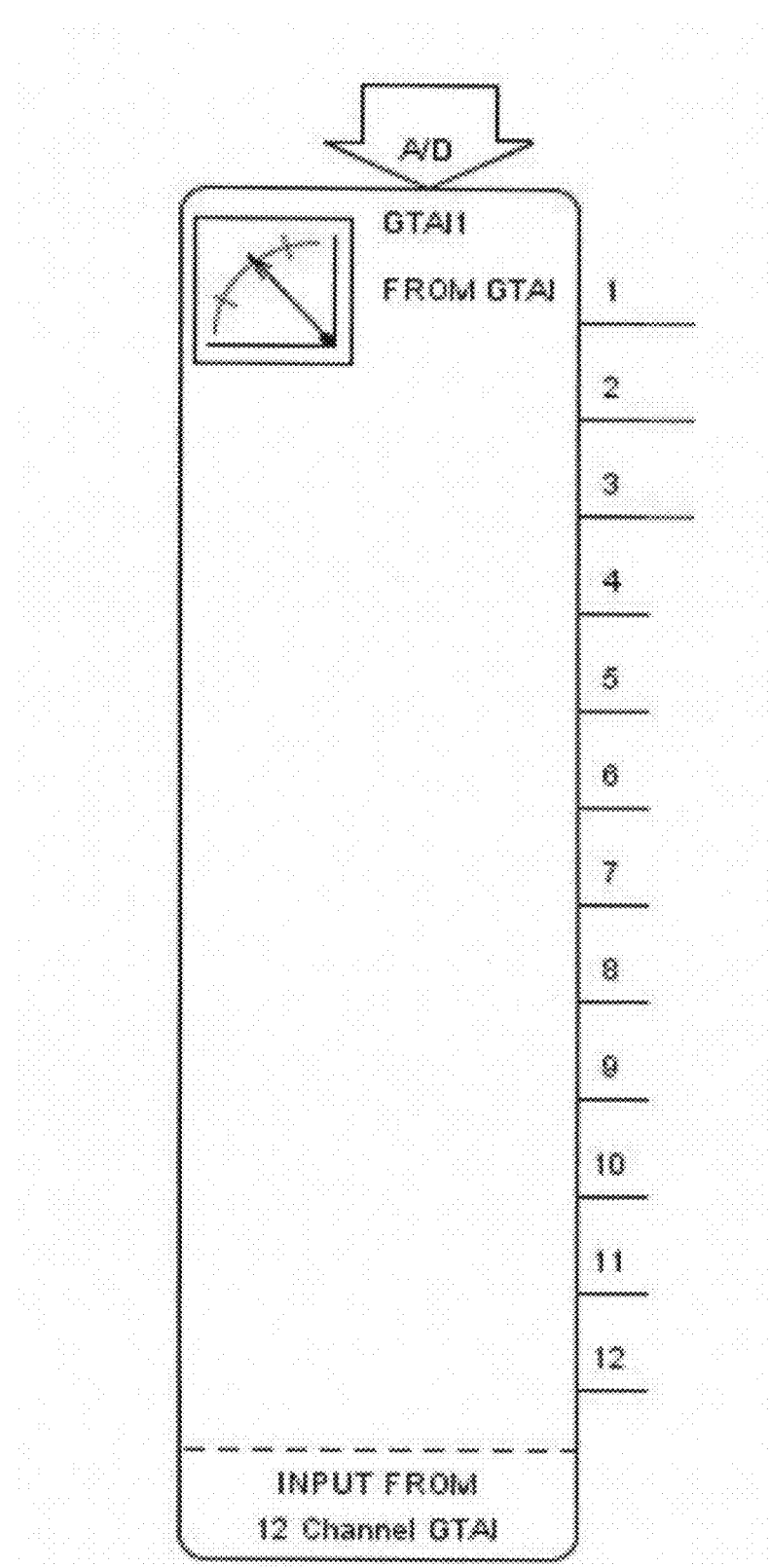

FIG. 72 shows a schematic of Gigabit Transceiver Analogue Input component in RSCAD (software for the Real Time Digital Simulator)

Figure 73:
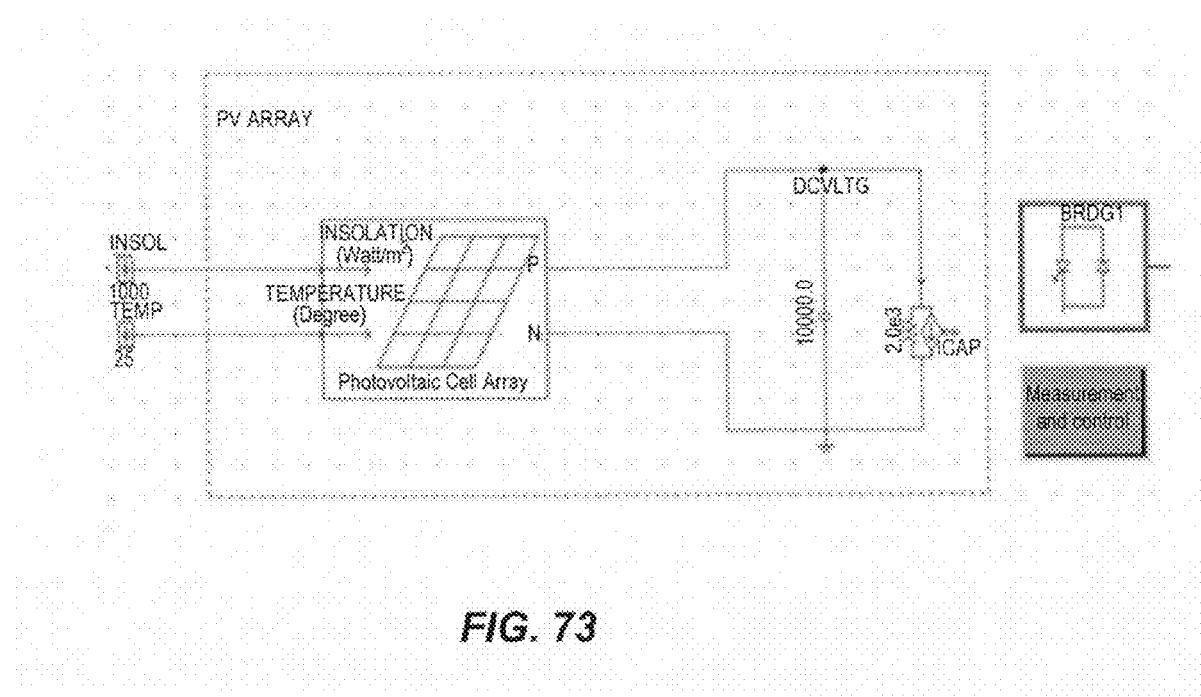

FIG. 73 shows a schematic of the photovoltaic system in RSCAD (software for the Real Time Digital Simulator).

Figure 74:
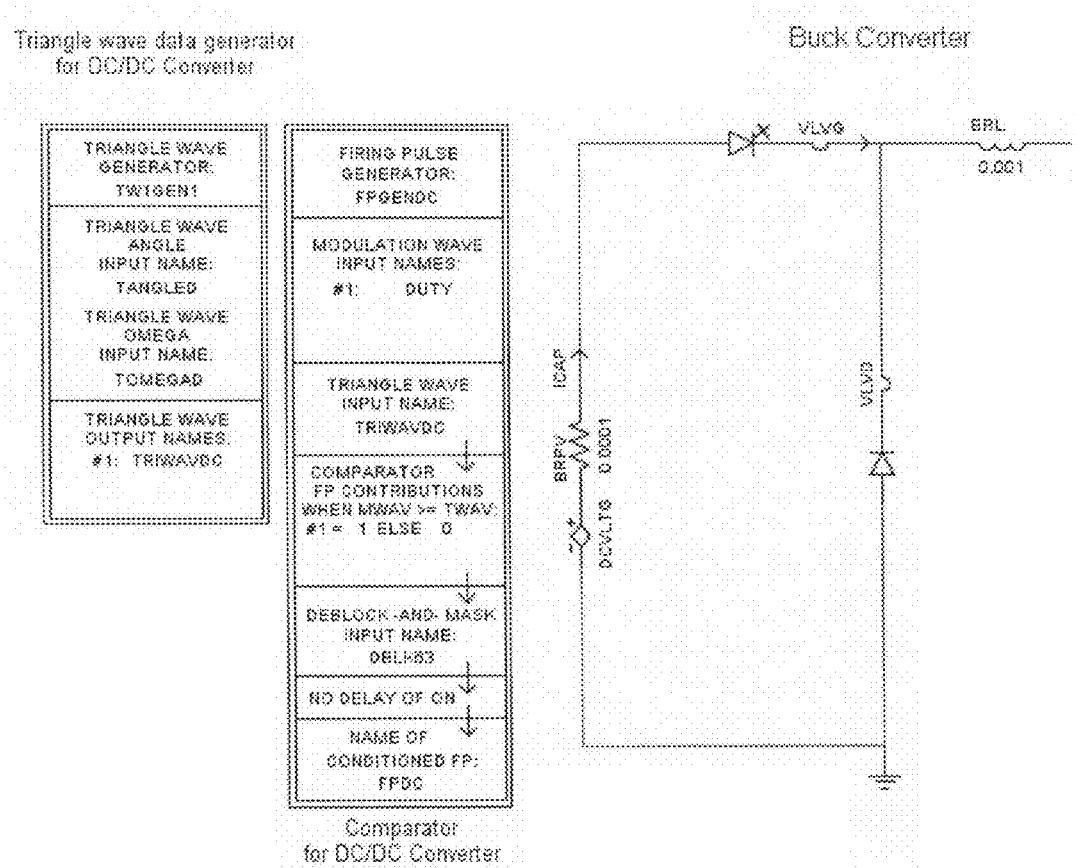

FIG. 74 shows a schematic of the Buck converter, a triangular wave generator and a comparator block in RSCAD (software for the Real Time Digital Simulator).

Figure 75:
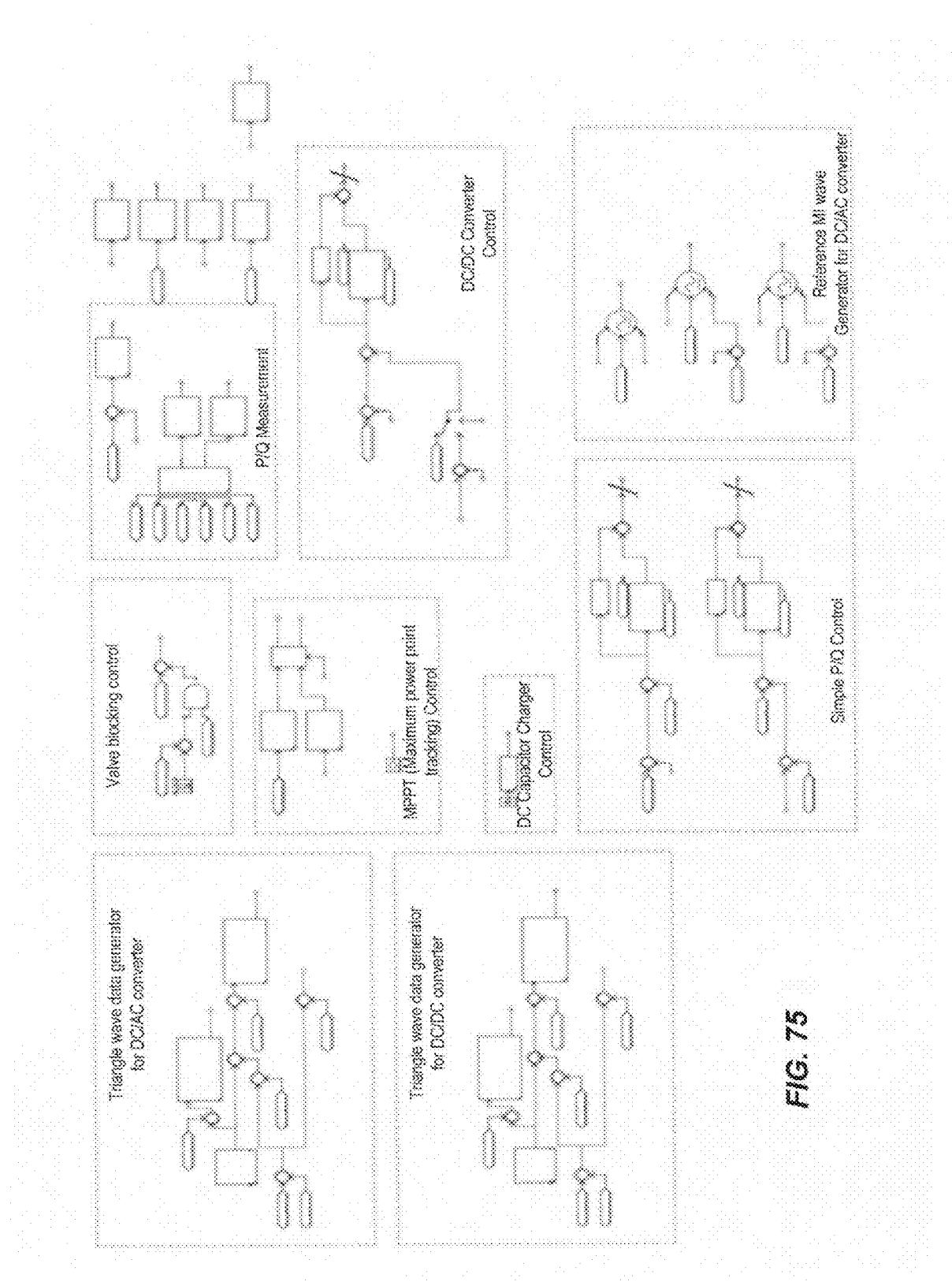

FIG. 75 shows a schematic of a measurement and control unit in RSCAD (software for the Real Time Digital Simulator).

Figure 76:
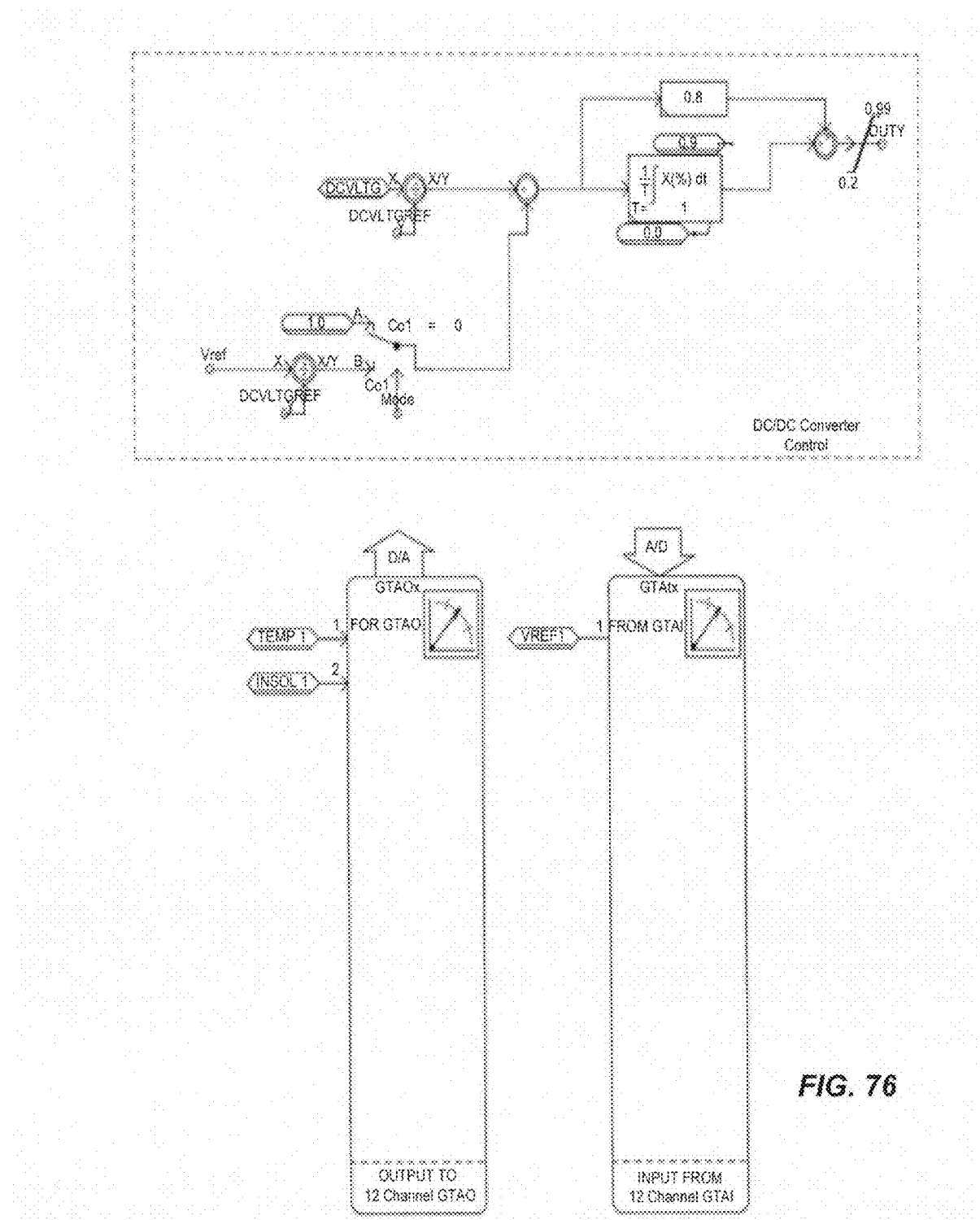

FIG. 76 shows a schematic of an arrangement of Gigabit Transceiver Analogue Output and Gigabit Transceiver Analogue input in interfacing the Real Time Digital Simulator with external controller.

Figure 77:
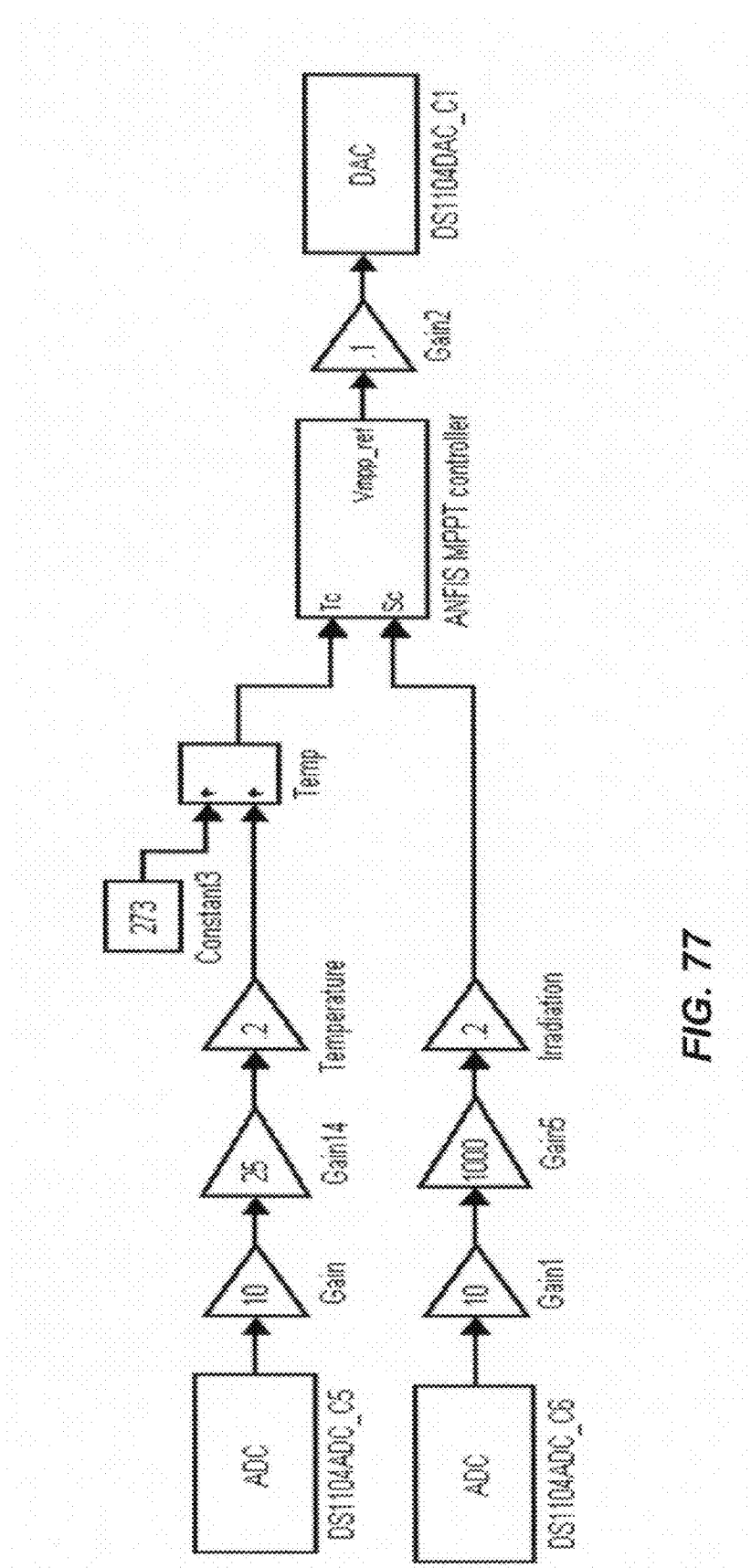

FIG. 77 shows a schematic of the Adaptive Network-Based fuzzy Inference System-based MPPT controller in simulink to build in dSPACE.

Figure 78:
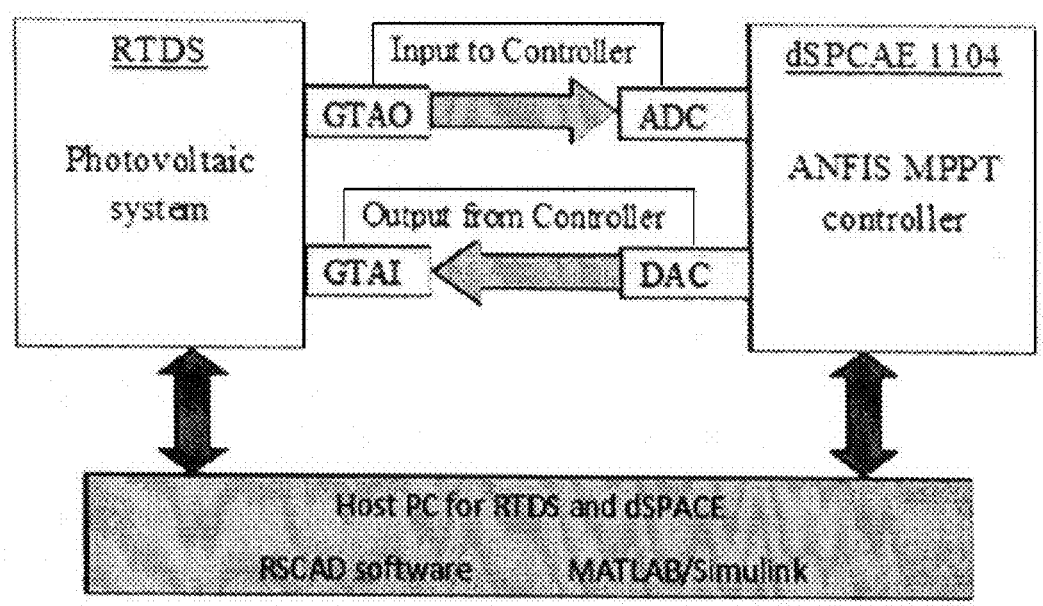

FIG. 78 shows a schematic of a closed loop control system.

Figure 79:
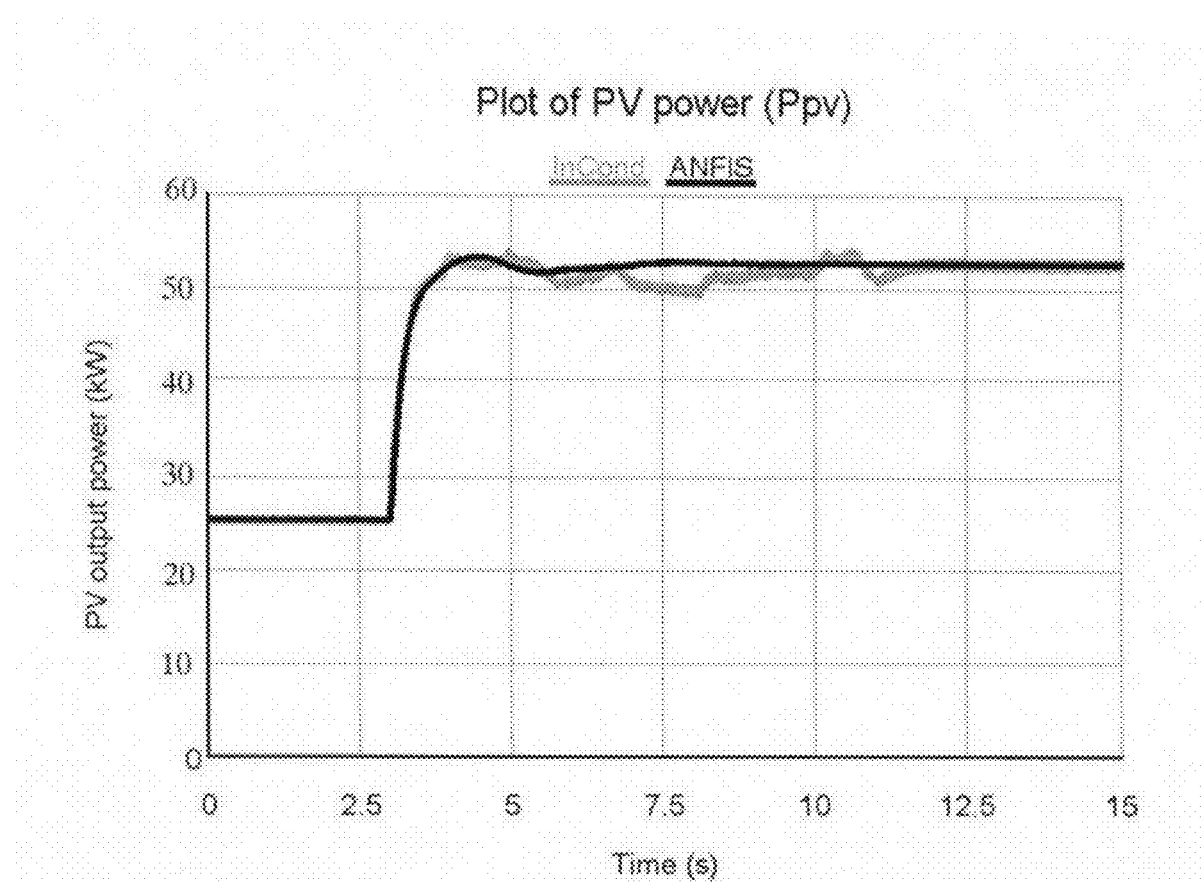

FIG. 79 shows a plot of photovoltaic output power ($P_{PV}$) for step-up change in irradiation.

Figure 80:
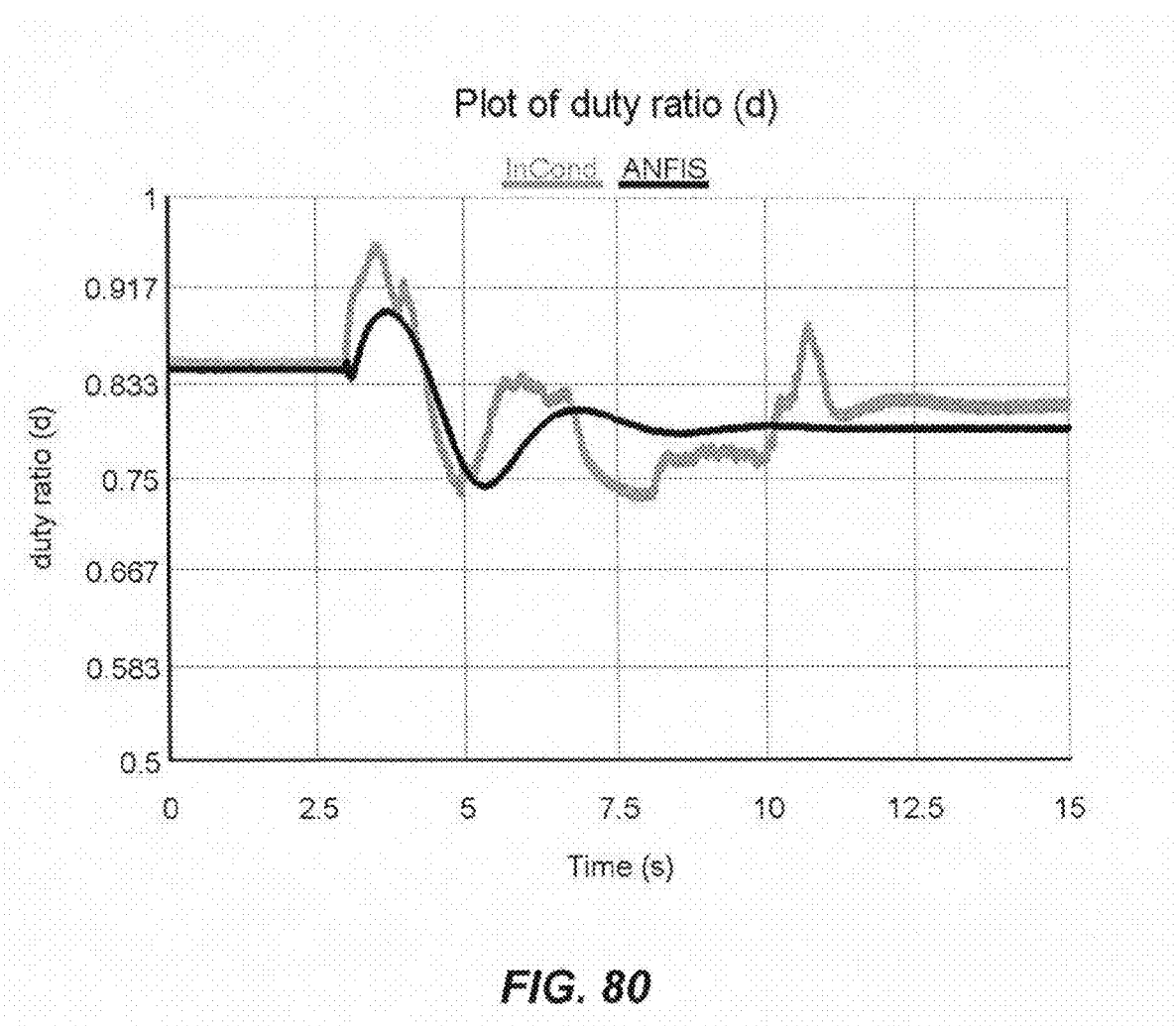

FIG. 80 shows a plot of duty ratio for step-up change in irradiation.

Figure 81:
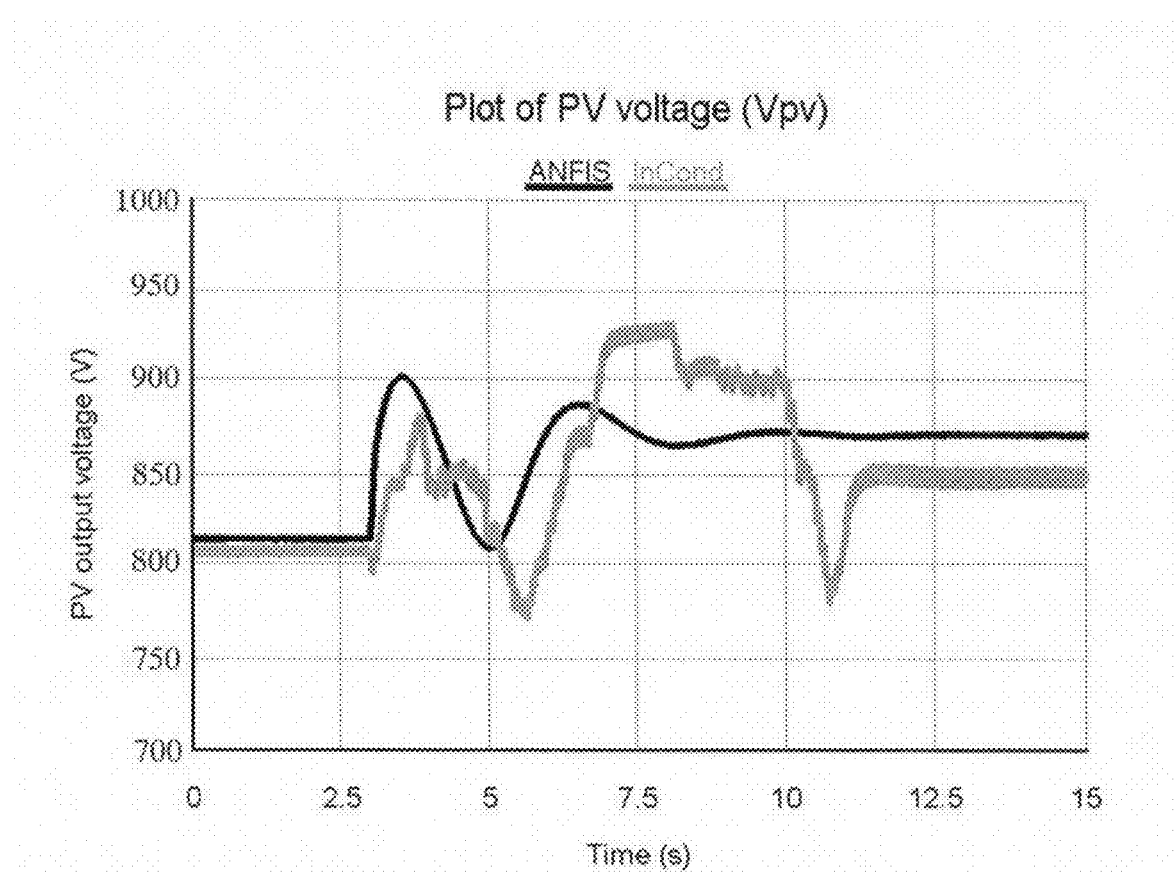

FIG. 81 shows a plot of photovoltaic voltage ($V_{PV}$) for step-up change in irradiation.

Figure 82:
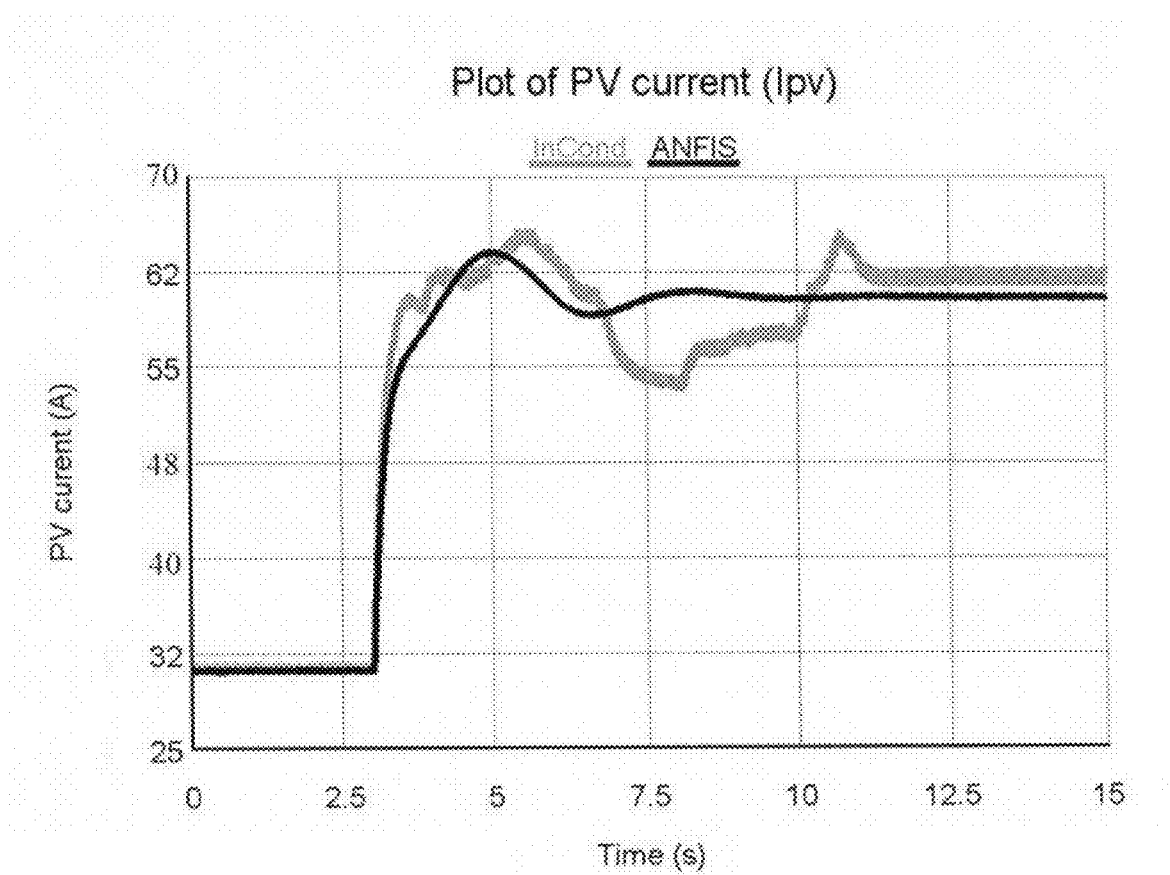

FIG. 82 shows a plot of photovoltaic current ($I_{PV}$) for step-up change in irradiation.

Figure 83:
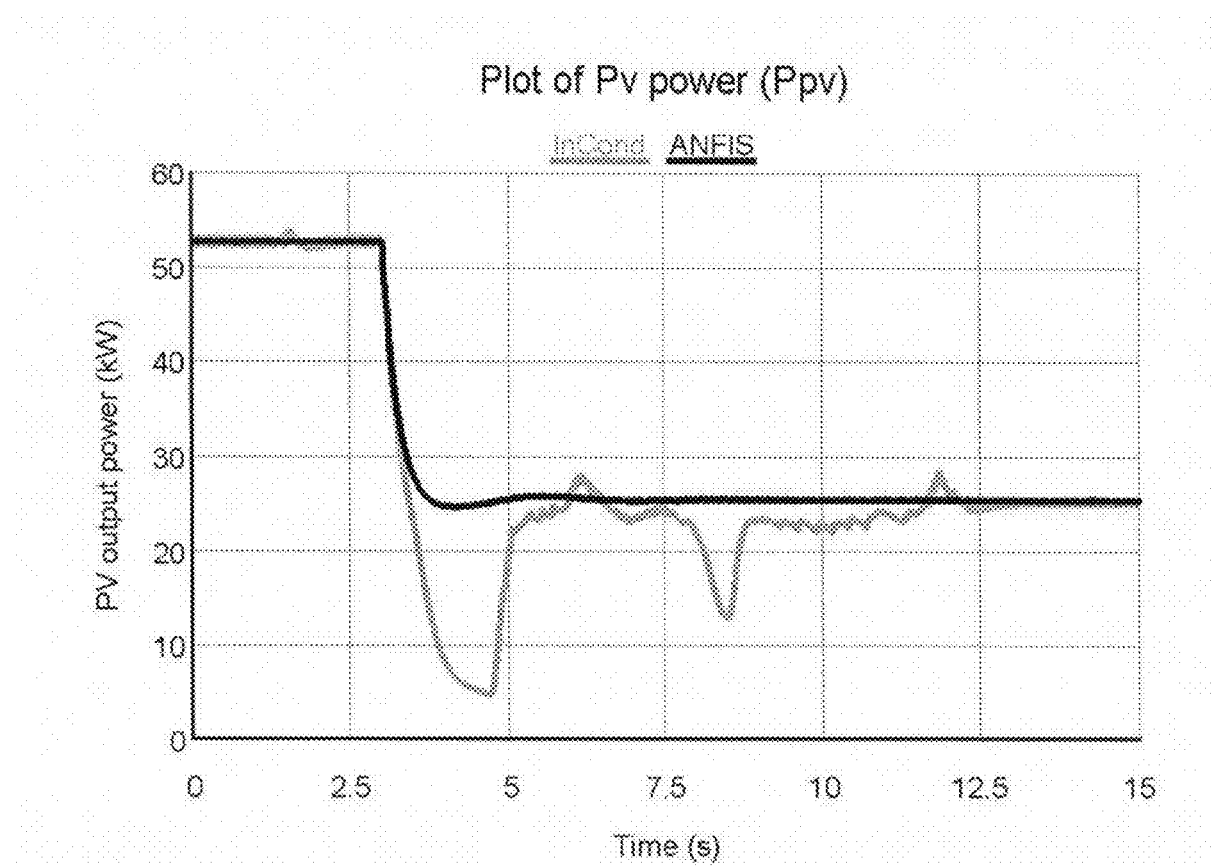

FIG. 83 shows a plot of photovoltaic output power ($P_{PV}$) for step-down change in irradiation.

Figure 84:
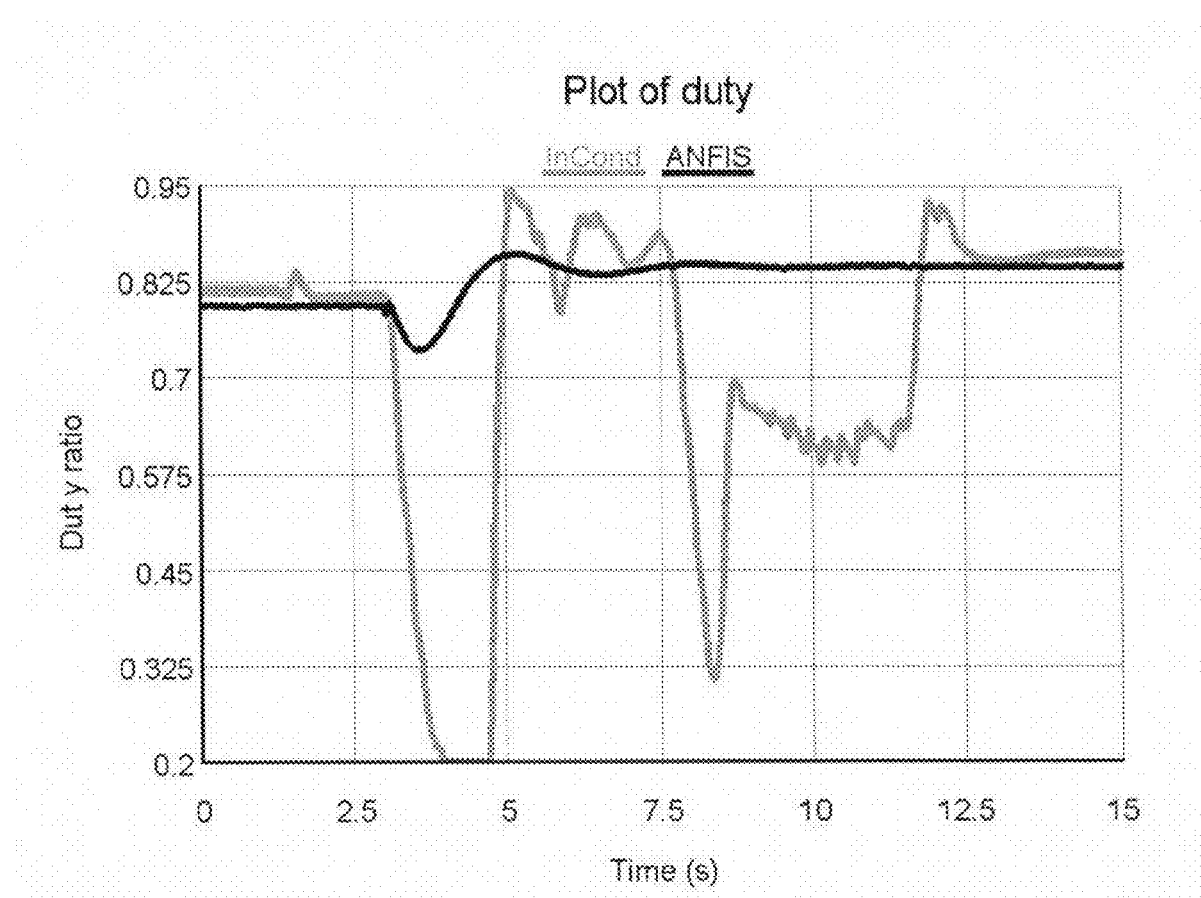

FIG. 84 shows a plot of duty ratio for step-down change in irradiation.

Figure 85:
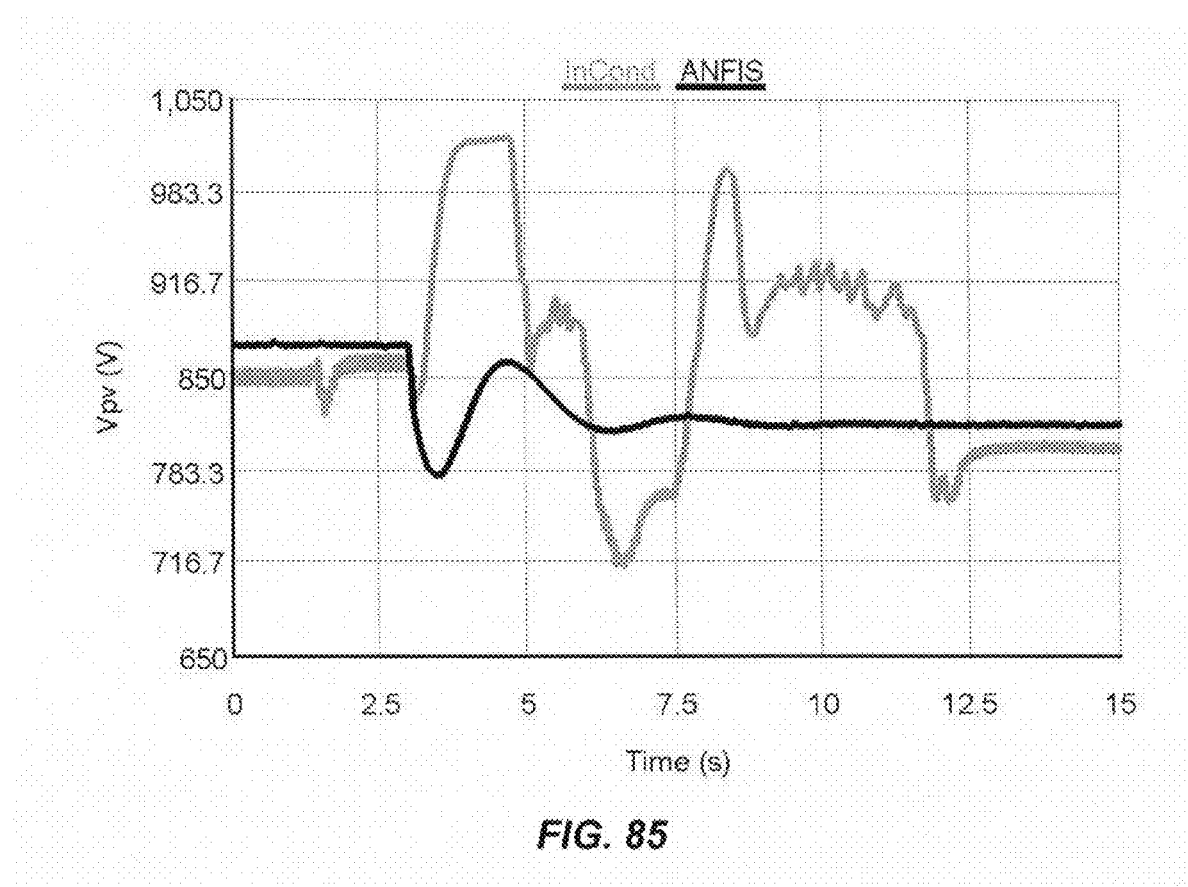

FIG. 85 shows a plot of photovoltaic voltage ($V_{PV}$) for step-down change in irradiation.

Figure 86:
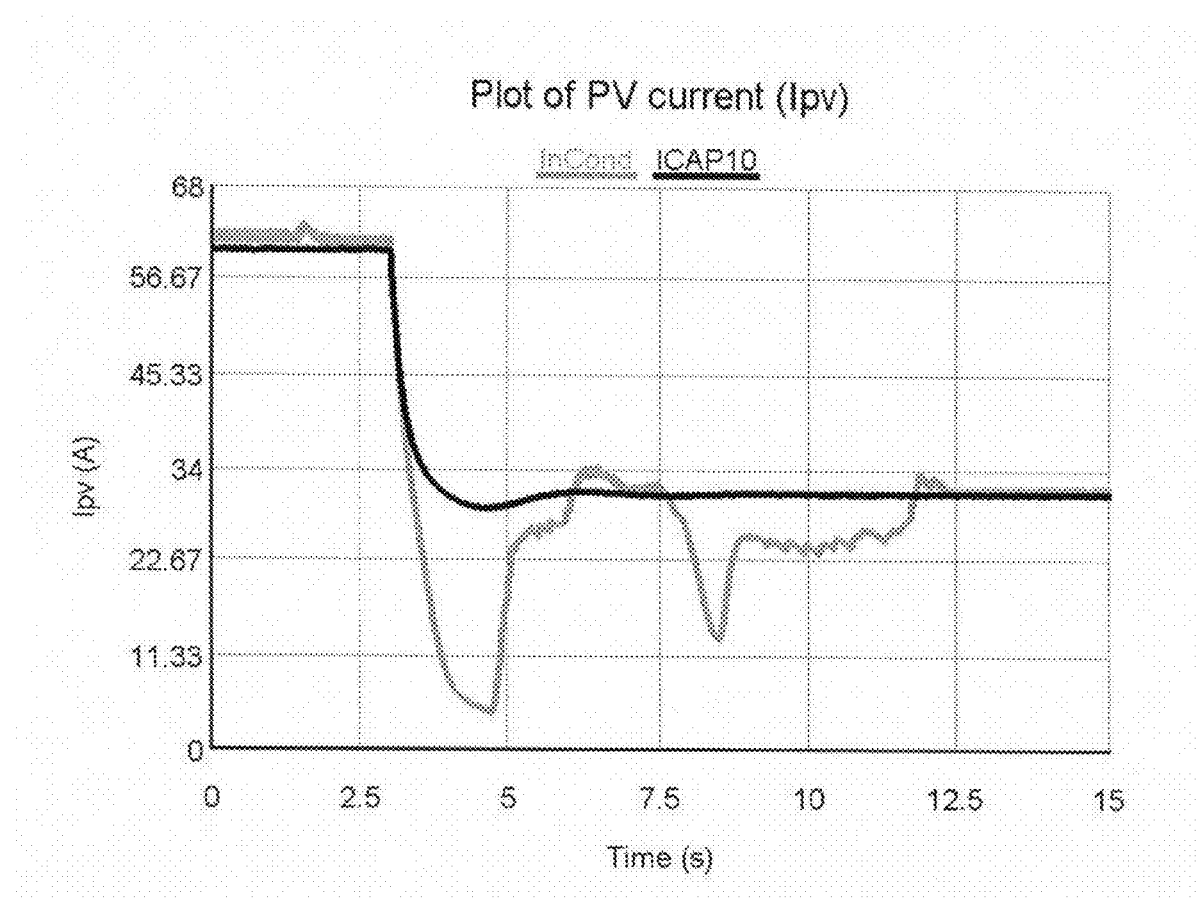

FIG. 86 shows a plot of photovoltaic current ($I_{PV}$) for step-down change in irradiation.

Figure 87:
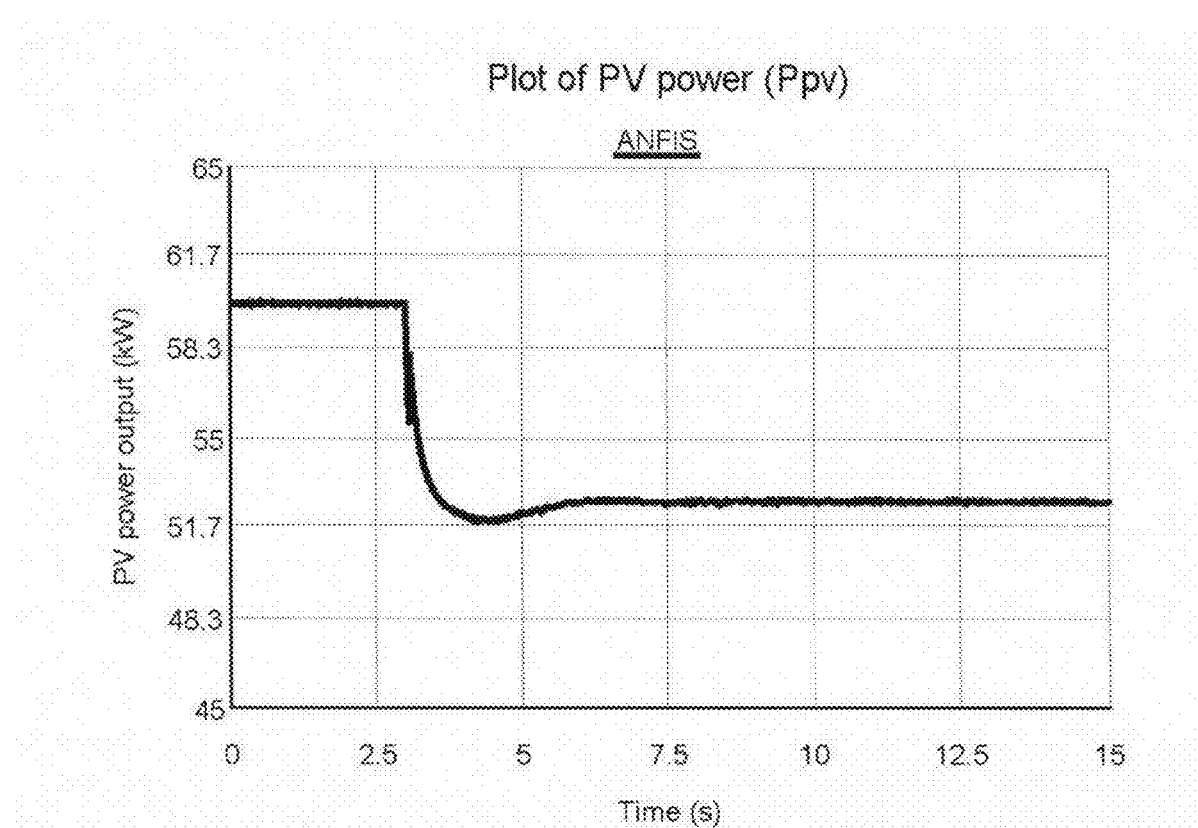

FIG. 87 shows a plot of photovoltaic output power ($P_{PV}$) for step-up change in temperature.

Figure 88:
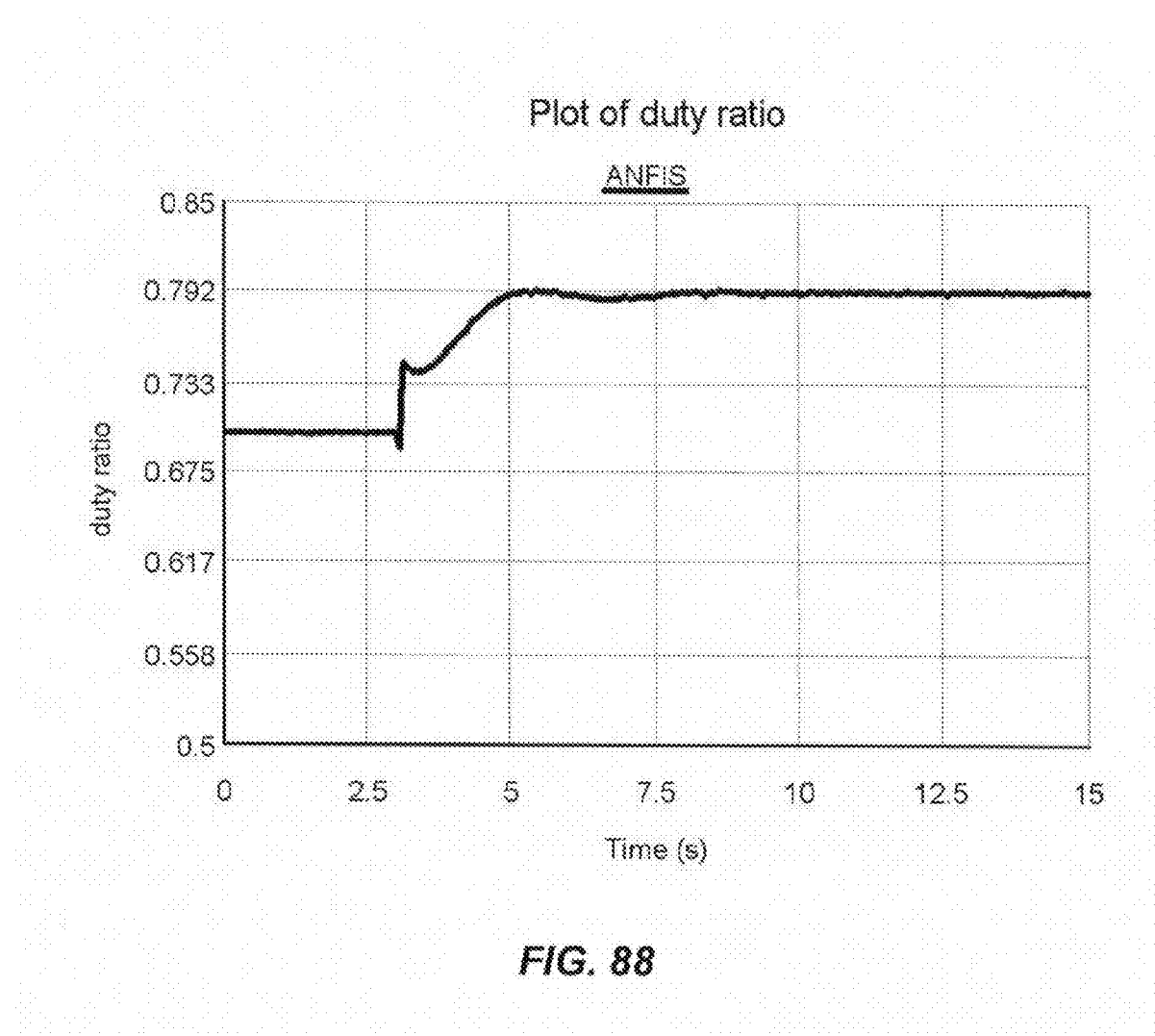

FIG. 88 shows a plot of duty ratio for step-up change in temperature.

Figure 89:
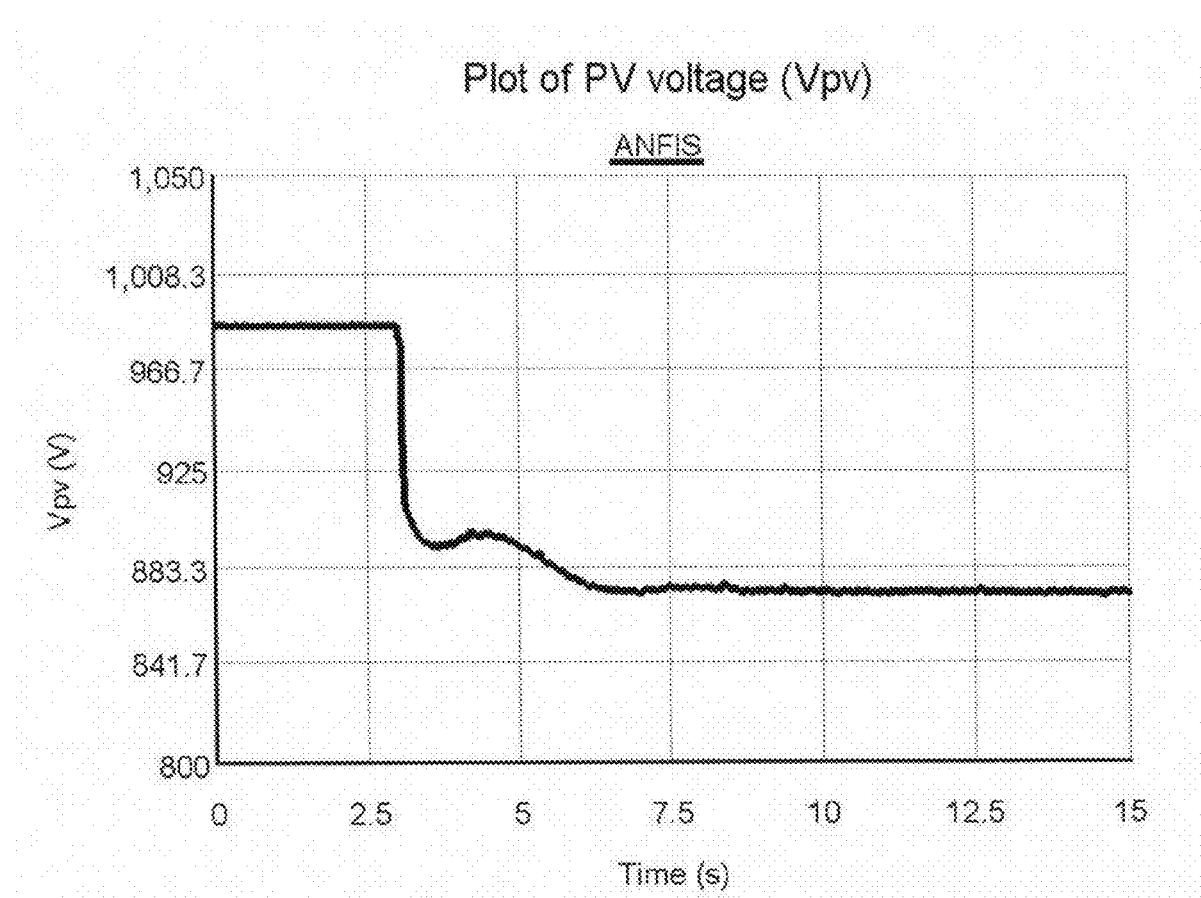

FIG. 89 shows a plot of photovoltaic voltage ($V_{PV}$) for step-up change in temperature.

Figure 90:
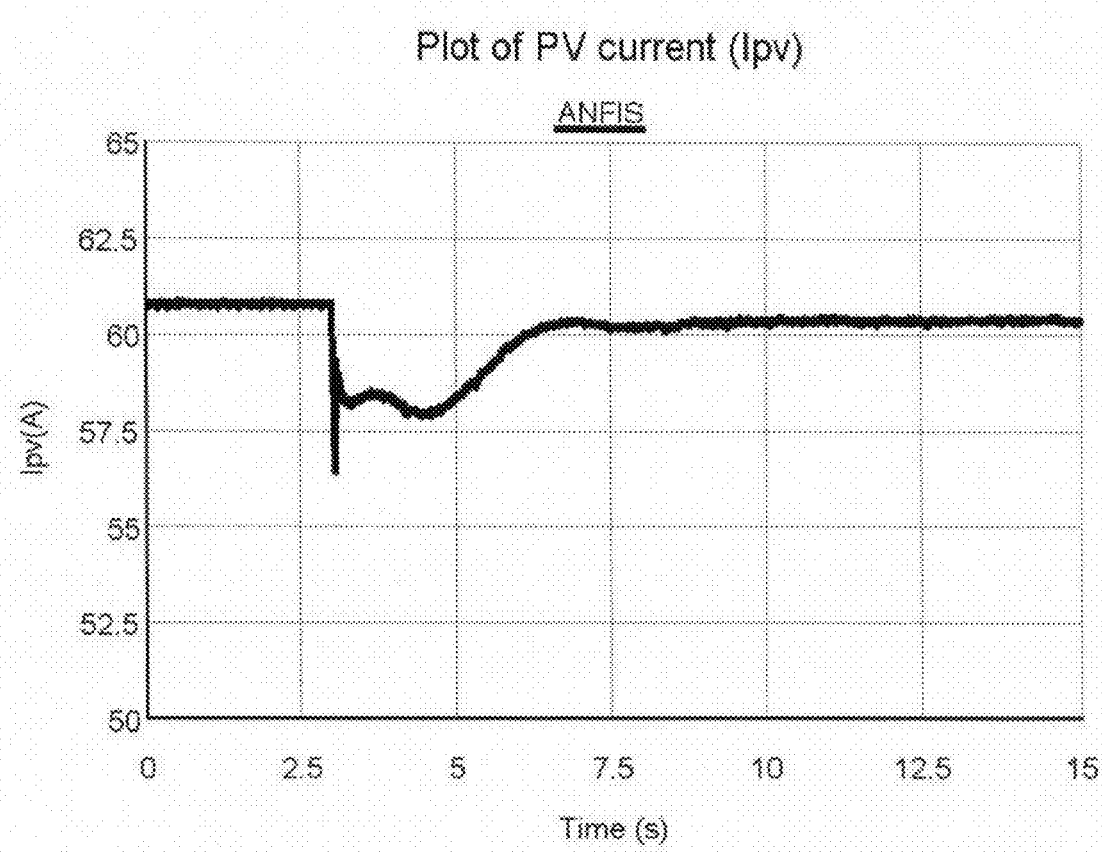

FIG. 90 shows a plot of photovoltaic current ($I_{PV}$) for step-up change in temperature.

Figure 91:
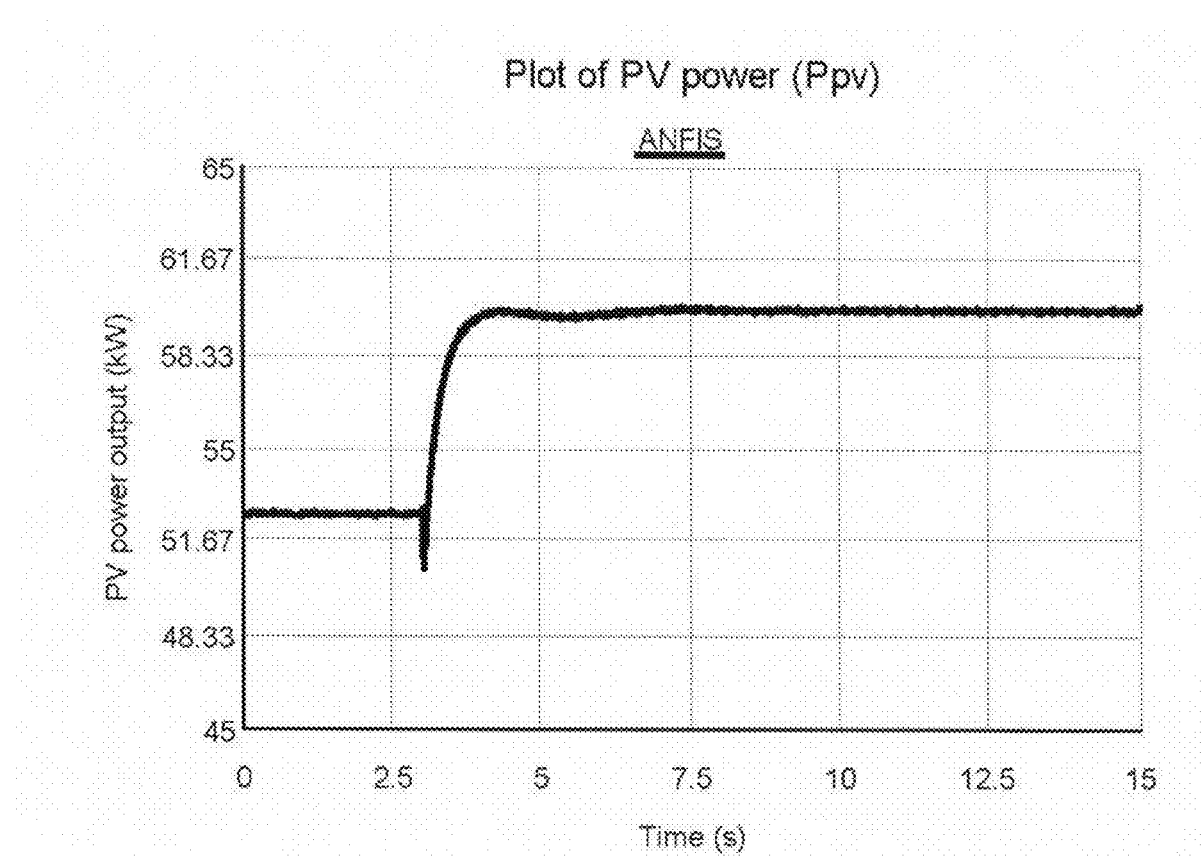

FIG. 91 shows a plot of photovoltaic output power ($P_{PV}$) for step-down change in temperature.

Figure 92:
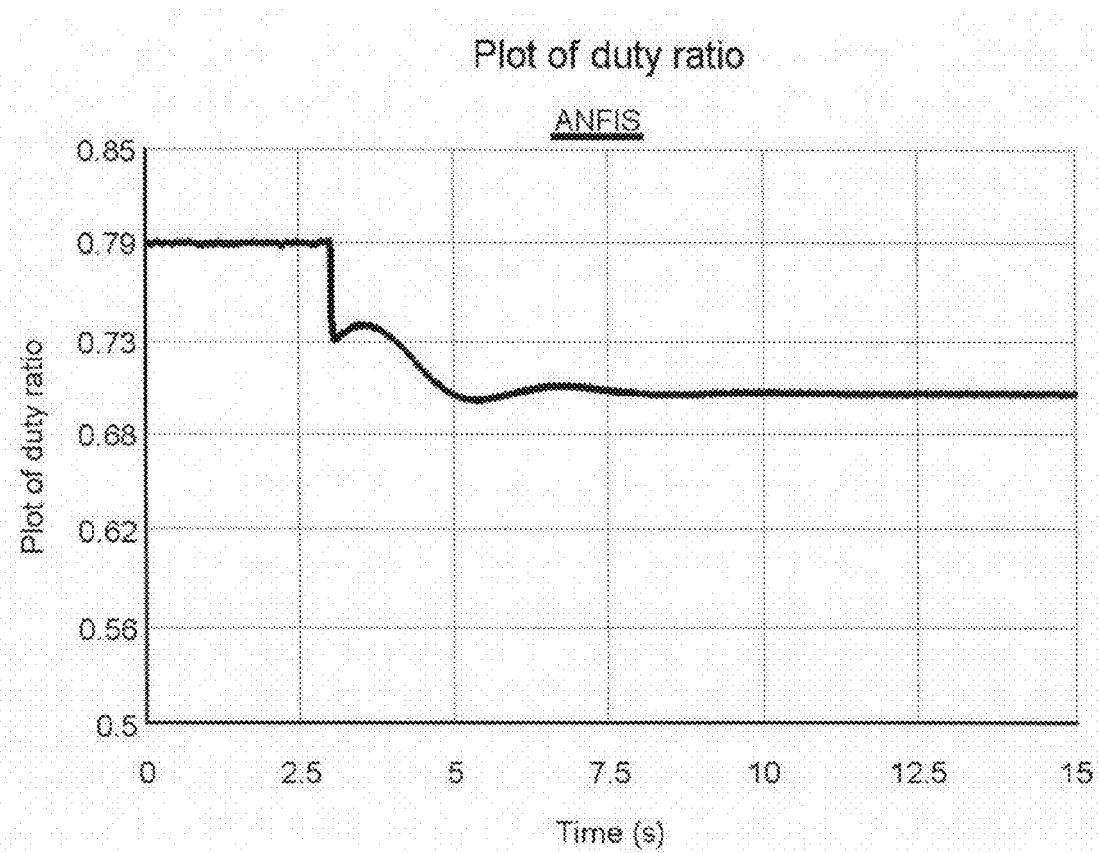

FIG. 92 shows a plot of duty ratio for step-down change in temperature.

Figure 93:
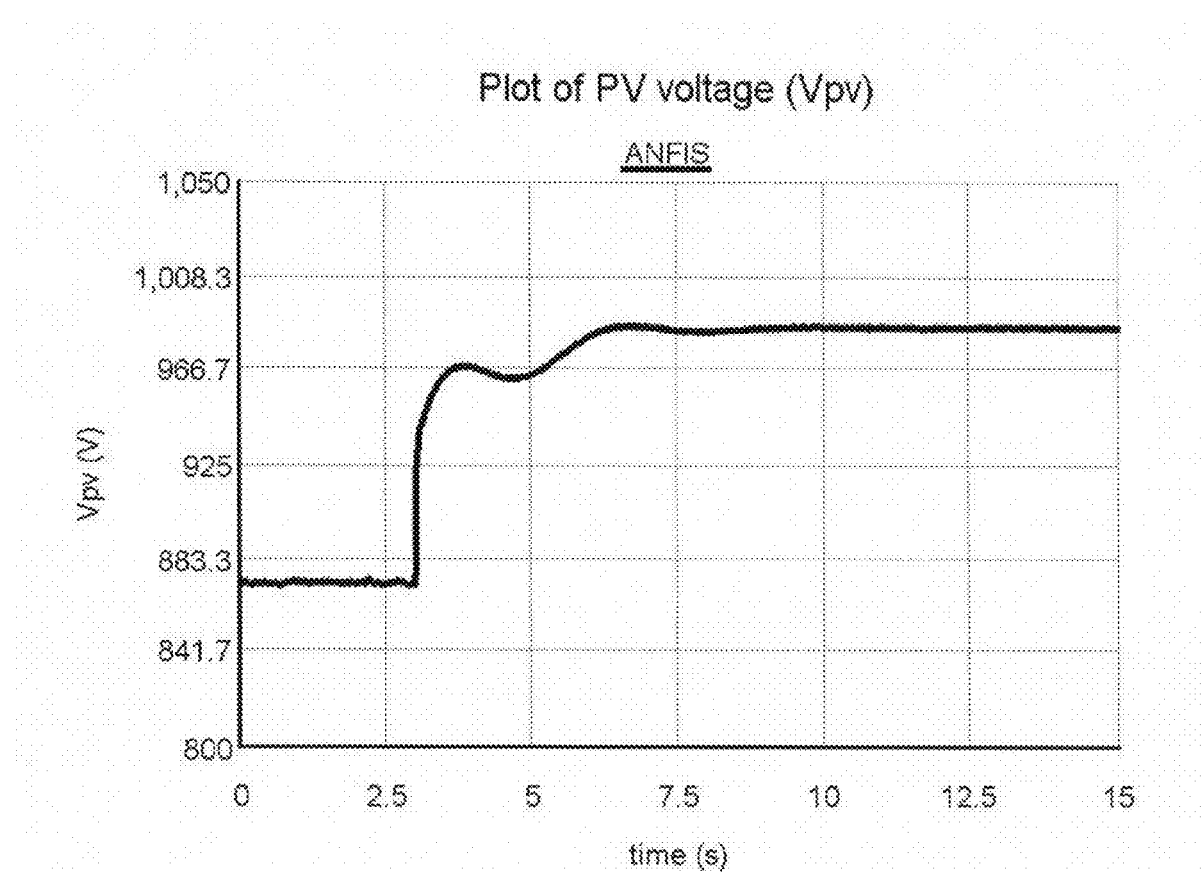

FIG. 93 shows a plot of photovoltaic voltage ($V_{PV}$) for step-down change in temperature.

Figure 94:
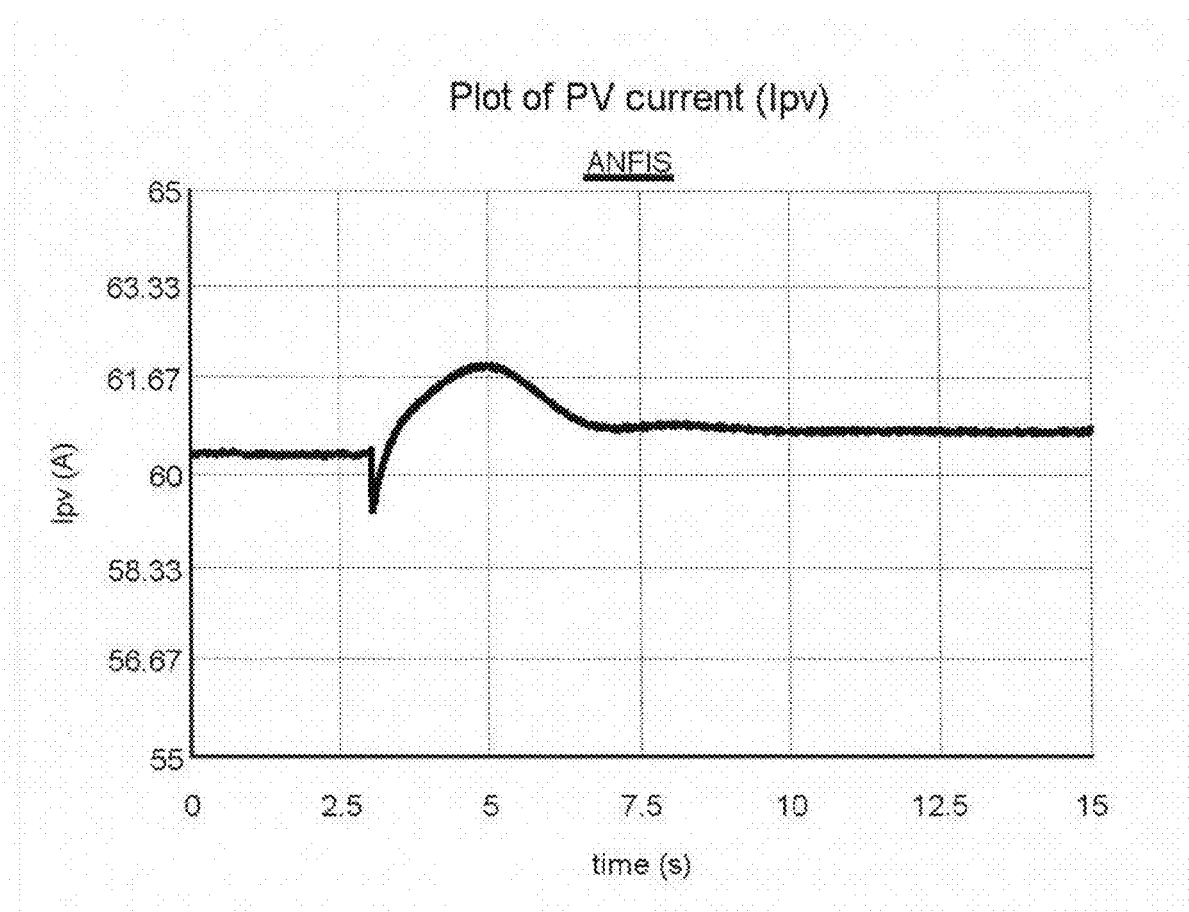

FIG. 94 shows a plot of photovoltaic current ($I_{PV}$) for step-down change in temperature.

Figure 95:
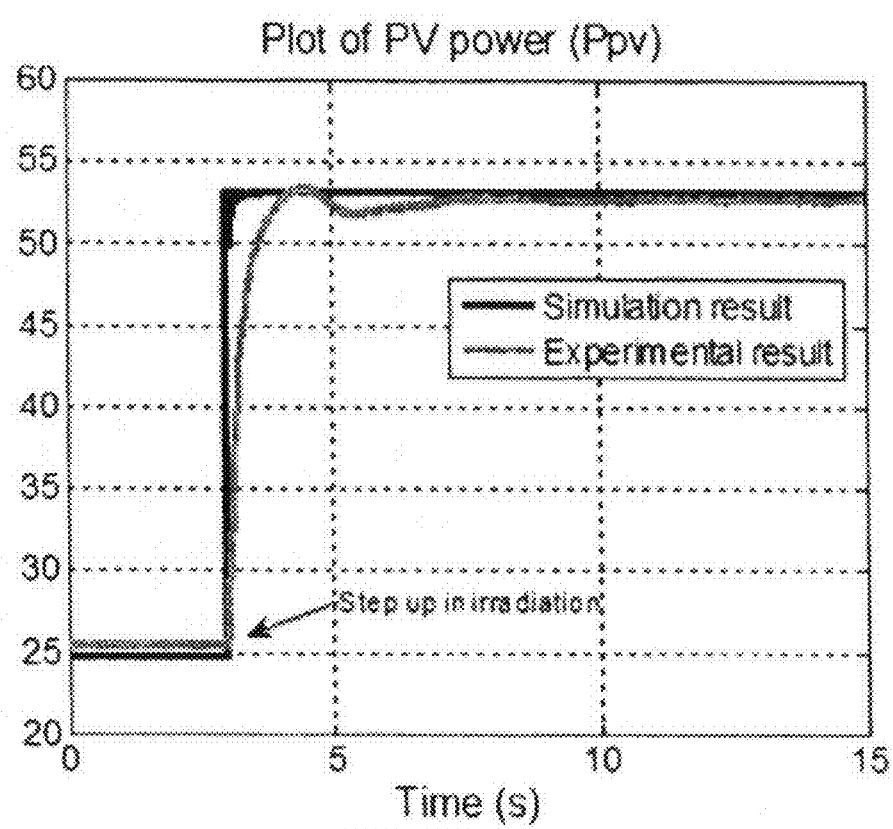

FIG. 95 shows a plot of a comparison of simulation results and experiment results of photovoltaic power ($P_{PV}$) for step-up change in irradiation.

Figure 96:
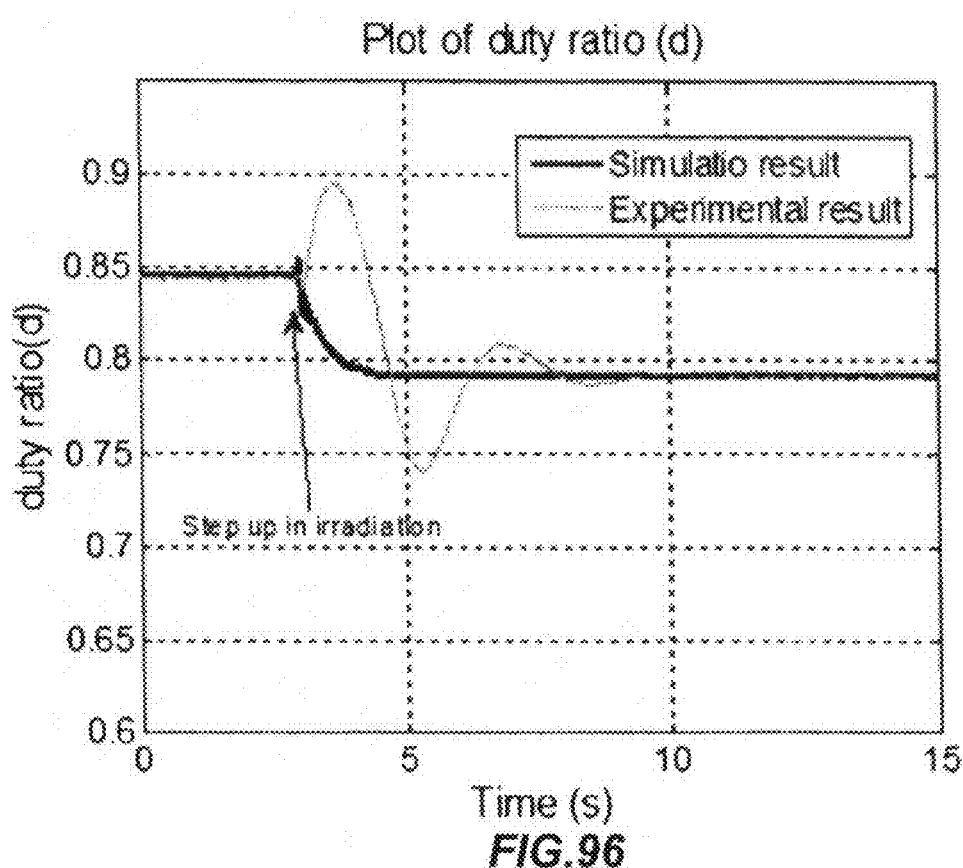

FIG. 96 shows a plot of a comparison of simulation results and experiment results of duty ratio for step-up change in irradiation.

Figure 97:
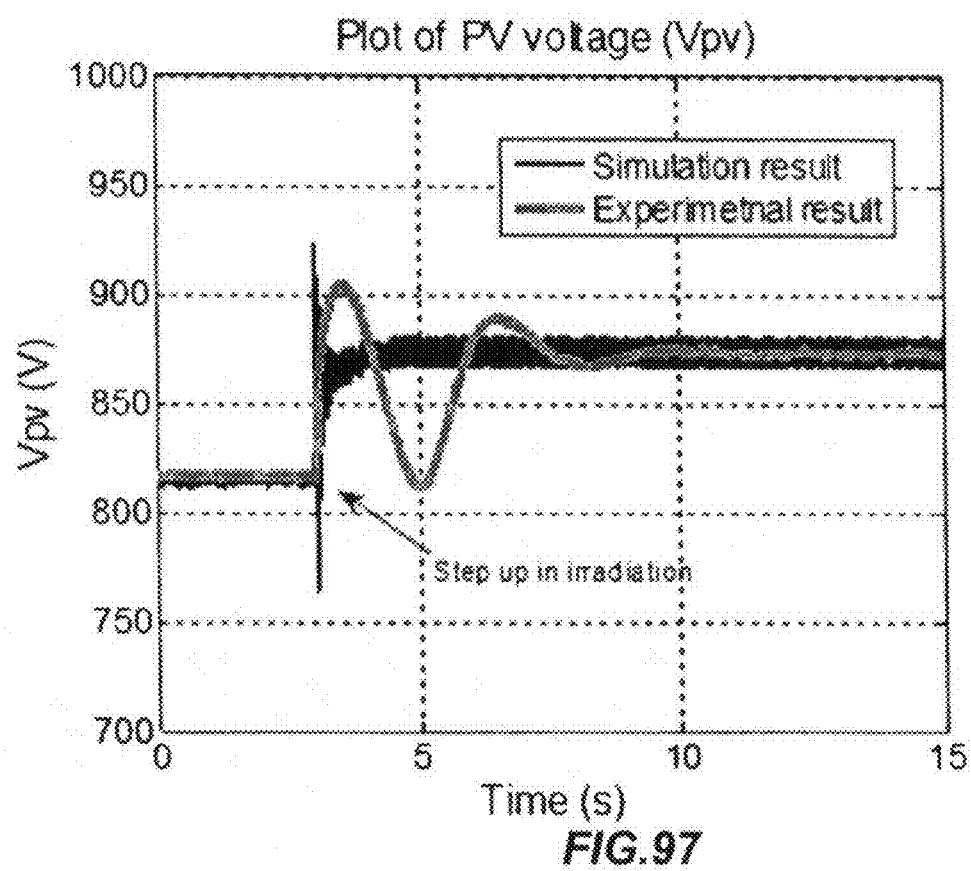

FIG. 97 shows a plot of a comparison of simulation results and experiment results of photovoltaic voltage ($V_{PV}$) for step-up change in irradiation.

Figure 98:
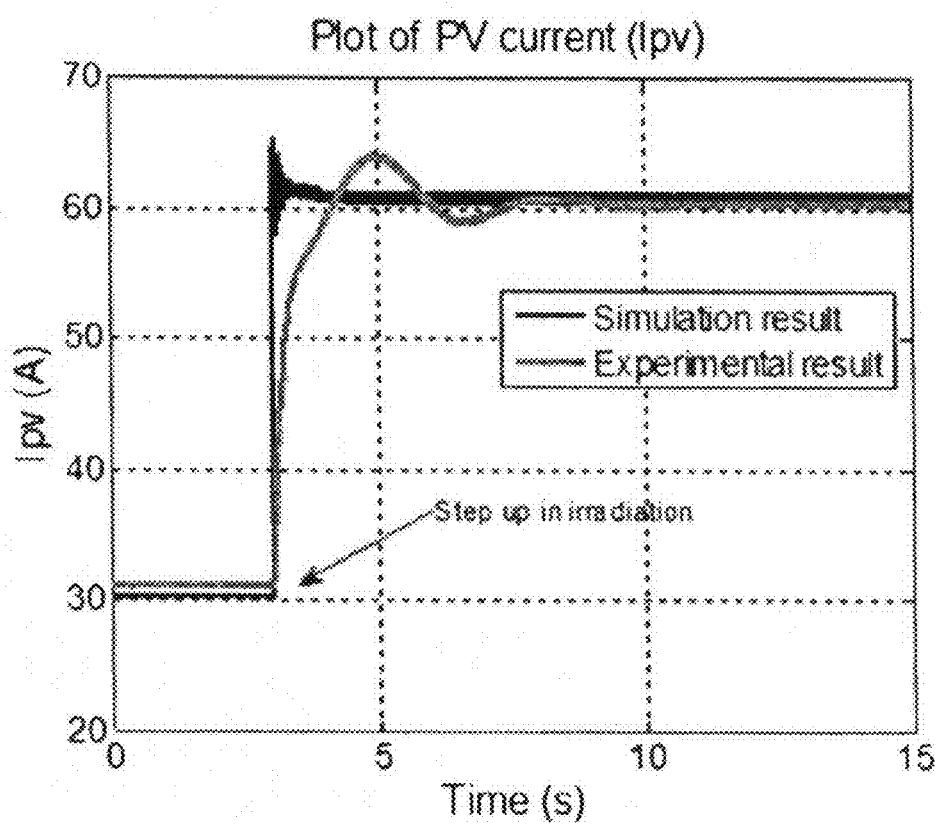

FIG. 98 shows a plot of a comparison of simulation results and experiment results of photovoltaic current ($I_{PV}$) for step-up change in irradiation.

Figure 99:
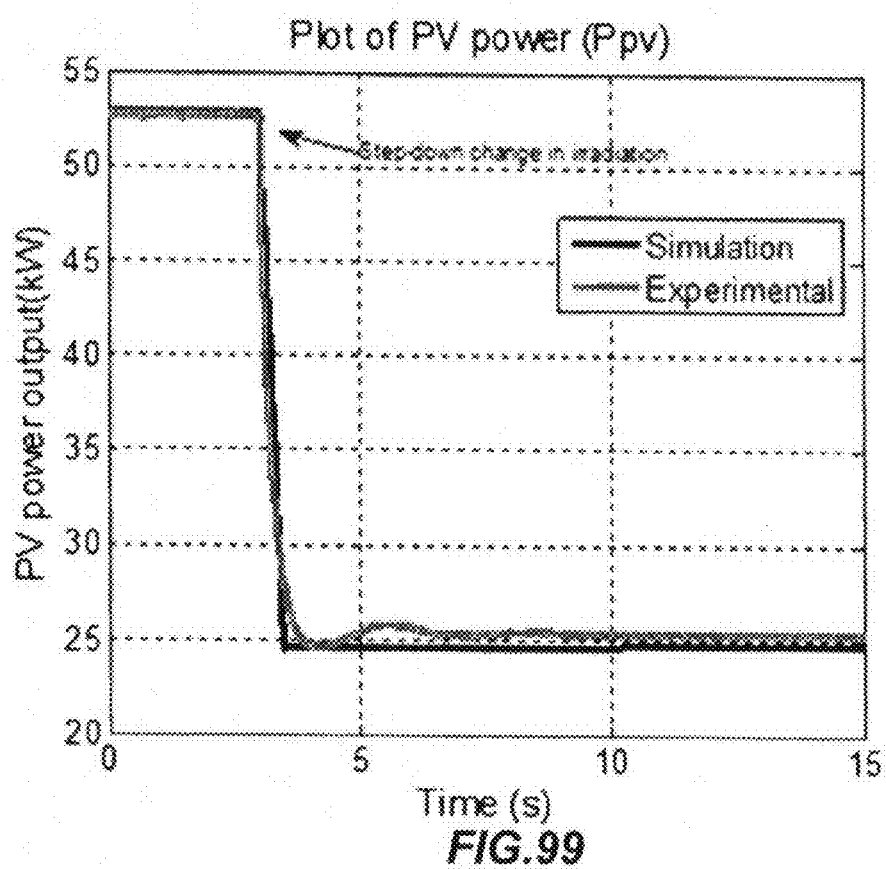

FIG. 99 shows a plot of a comparison of simulation results and experiment results of photovoltaic power ($P_{PV}$) for step-down change in irradiation.

Figure 100:
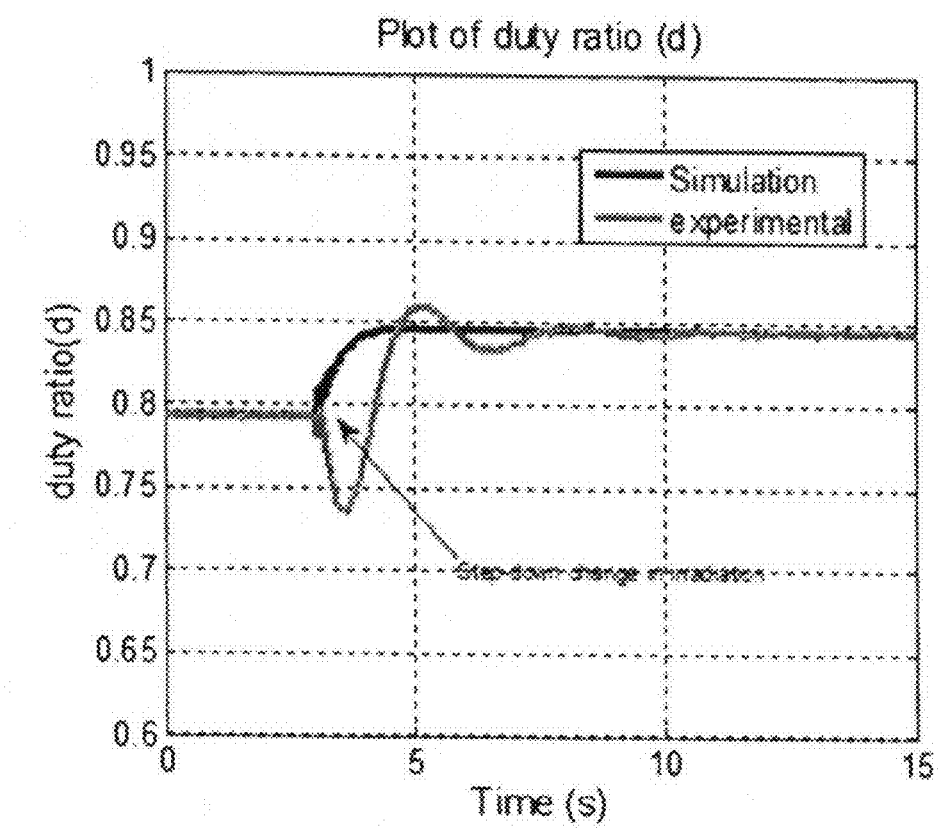

FIG. 100 shows a plot of a comparison of simulation results and experiment results of photovoltaic duty ratio for step-down change in irradiation.

Figure 101:
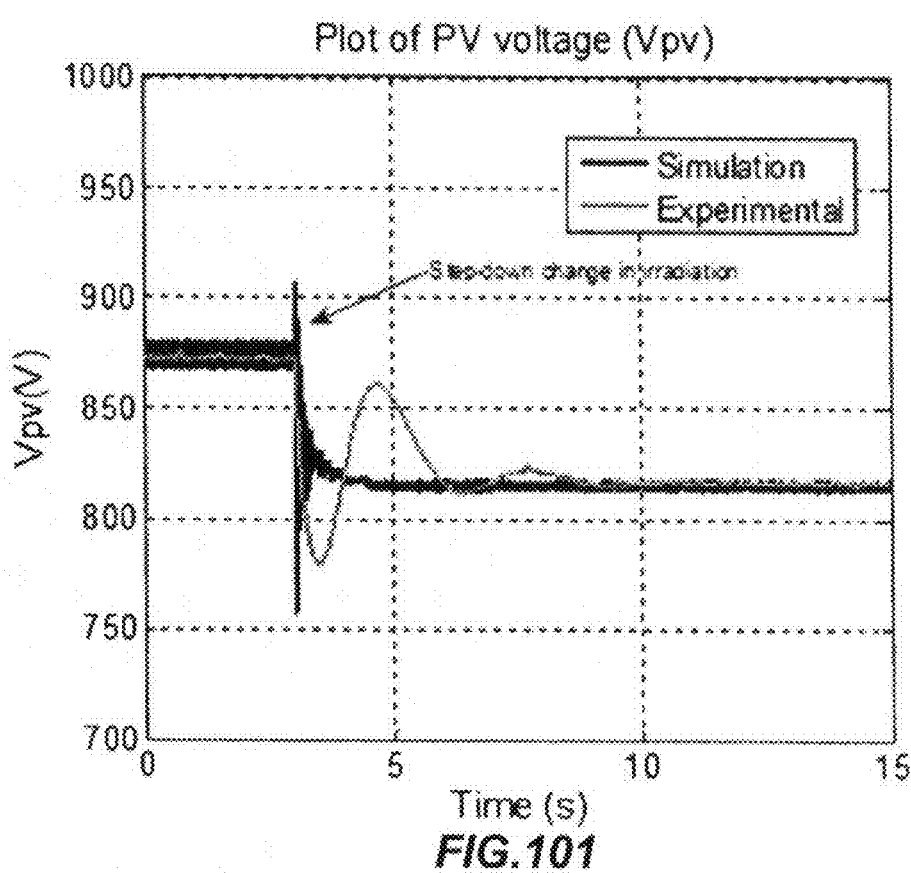

FIG. 101 shows a plot of a comparison of simulation results and experiment results of photovoltaic voltage ($V_{PV}$) for step-down change in irradiation.

Figure 102:
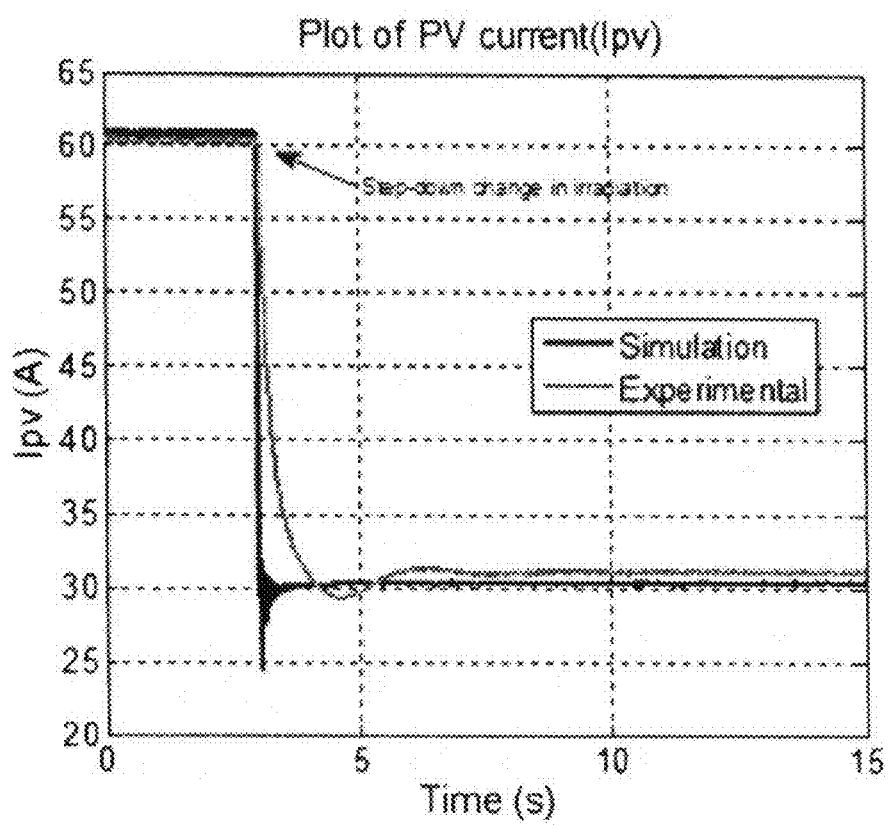

FIG. 102 shows a plot of a comparison of simulation results and experiment results of photovoltaic current ($I_{PV}$) for step-down change in irradiation.

Figure 103:
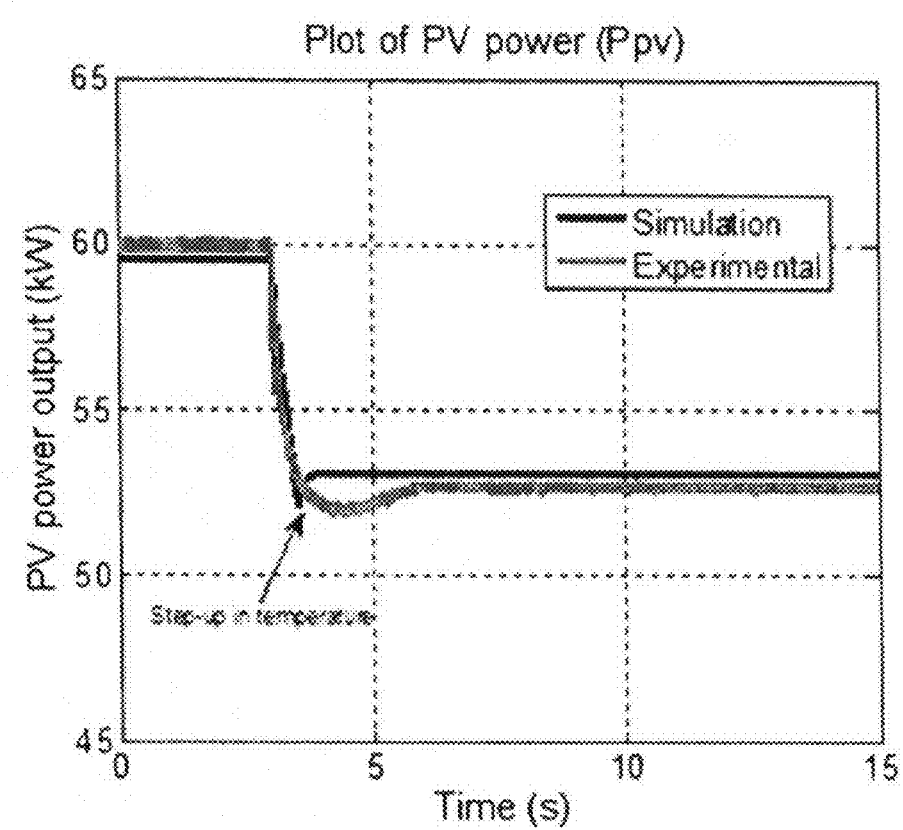

FIG. 103 shows a plot of a comparison of simulation results and experiment results of photovoltaic power ($P_{PV}$) for step-up change in temperature.

Figure 104:
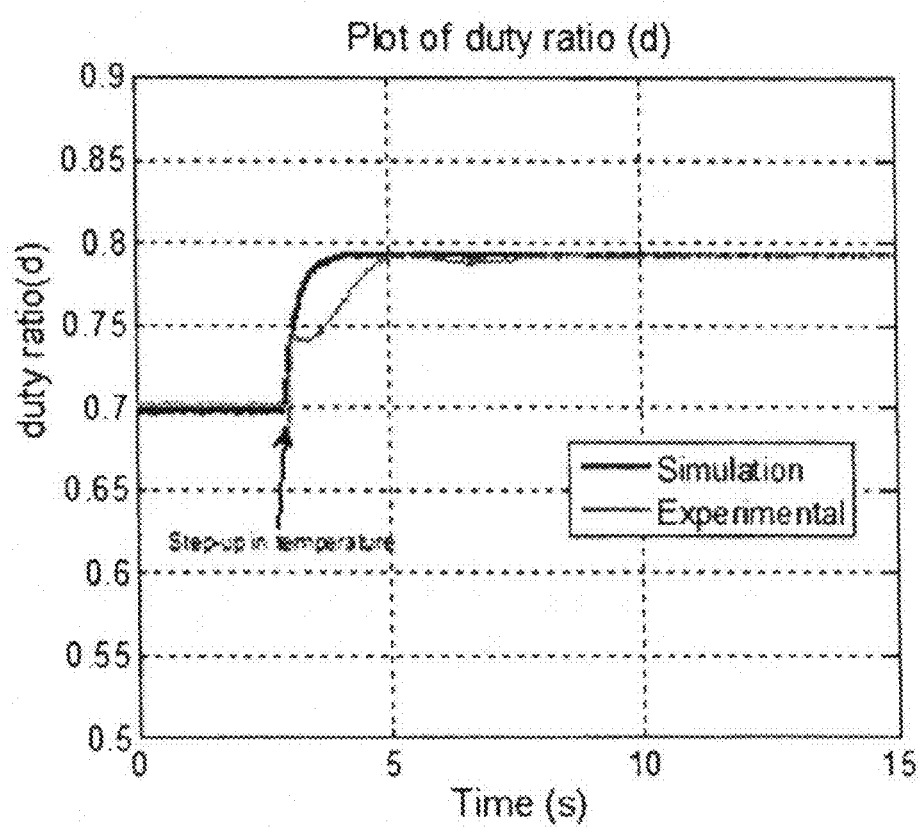

FIG. 104 shows a plot of a comparison of simulation results and experiment results of photovoltaic duty ratio for step-up change in temperature.

Figure 105:
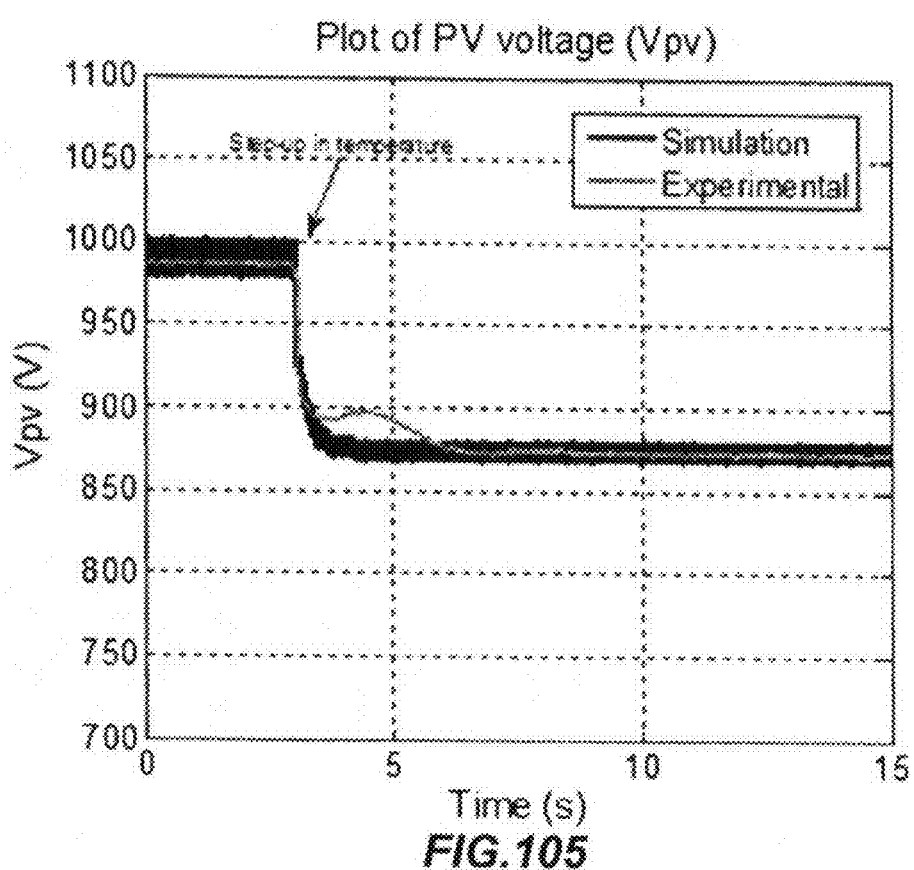

FIG. 105 shows a plot of a comparison of simulation results and experiment results of photovoltaic voltage ($V_{PV}$) for step-up change in temperature.

Figure 106:
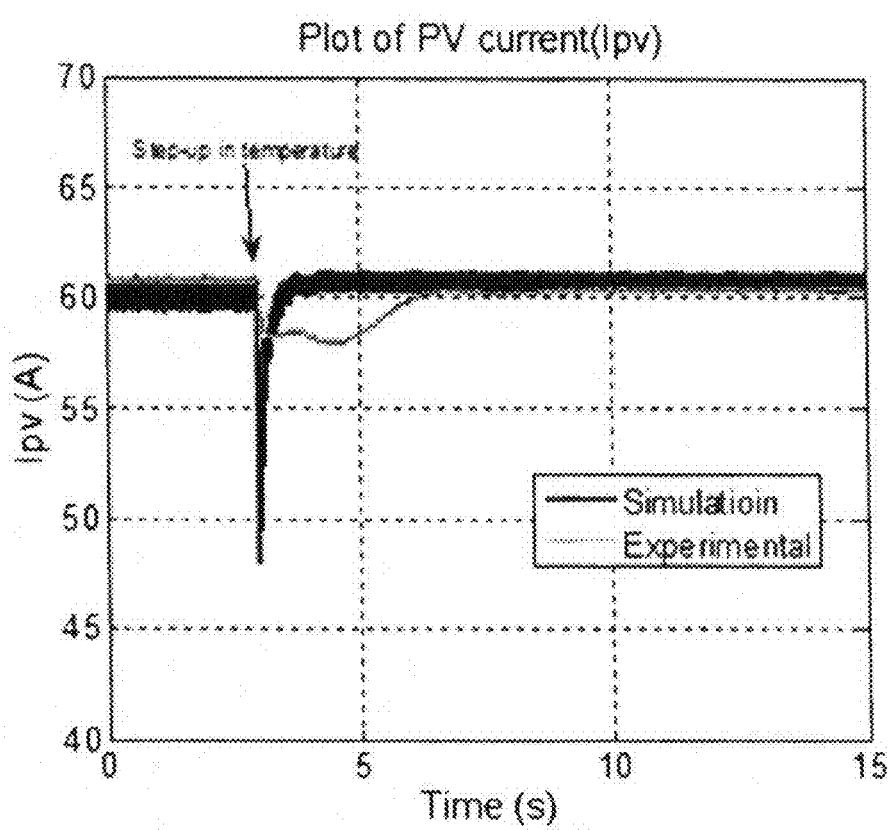

FIG. 106 shows a plot of a comparison of simulation results and experiment results of photovoltaic current ($I_{PV}$) for step-up change in temperature.

Figure 107:
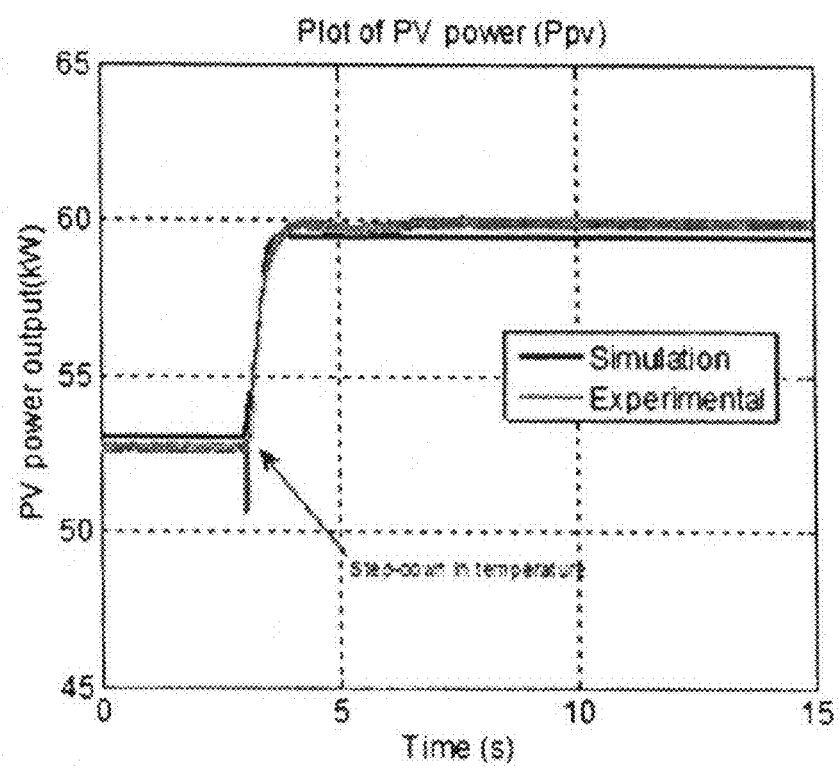

FIG. 107 shows a plot of a comparison of simulation results and experiment results of photovoltaic power ($P_{PV}$) for step-down change in temperature.

Figure 108:
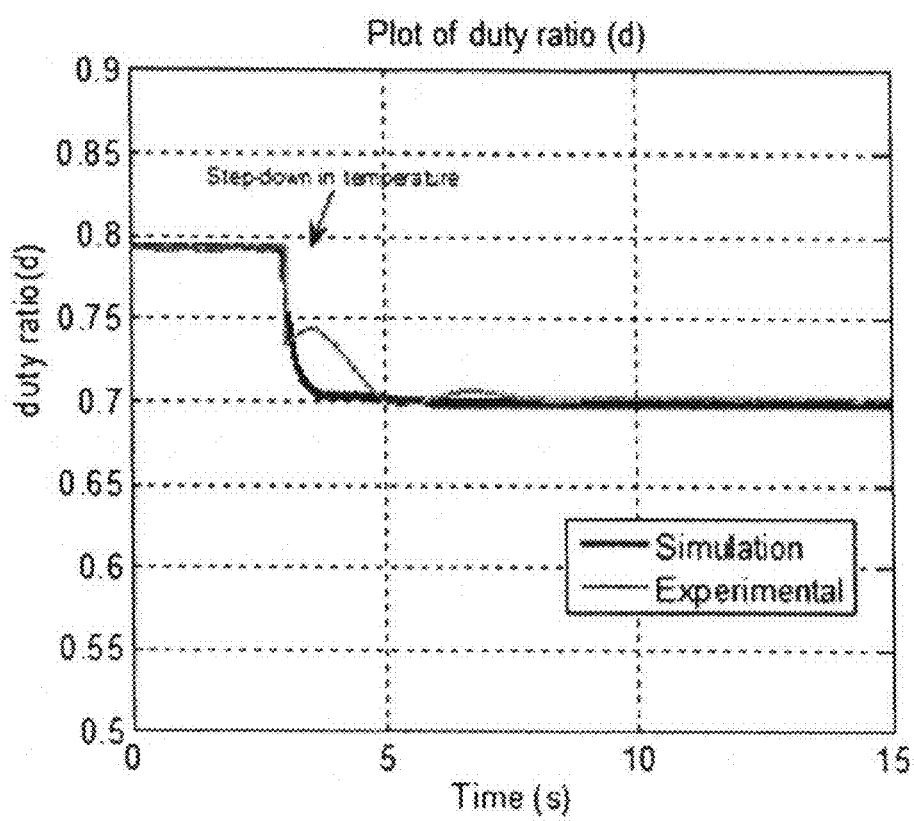

FIG. 108 shows a plot of a comparison of simulation results and experiment results of photovoltaic duty ratio for step-down change in temperature.

Figure 109:
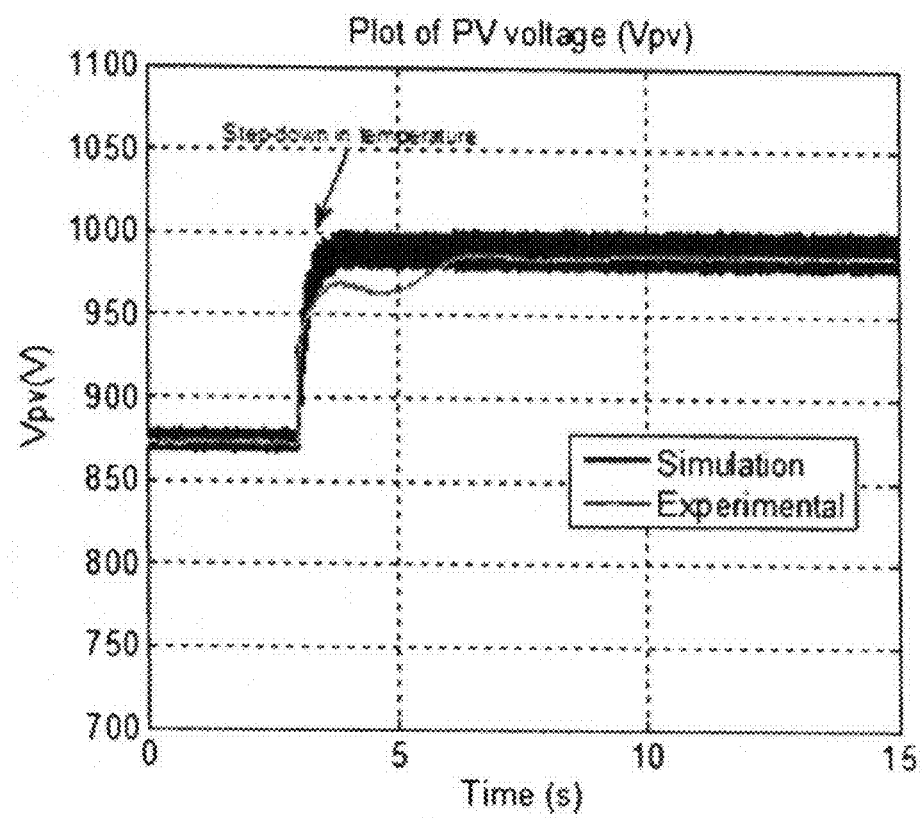

FIG. 109 shows a plot of a comparison of simulation results and experiment results of photovoltaic voltage ($V_{PV}$) for step-down change in temperature.

Figure 110:
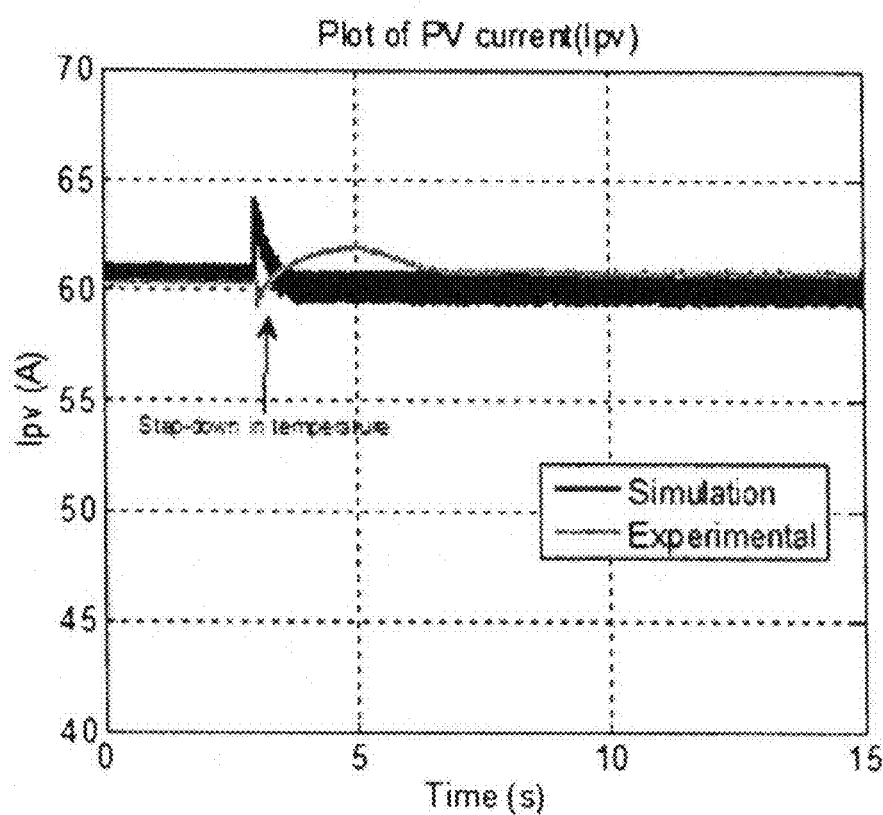

FIG. 110 shows a plot of a comparison of simulation results and experiment results of photovoltaic current ($I_{PV}$) for step-down change in temperature.

Figure 111:
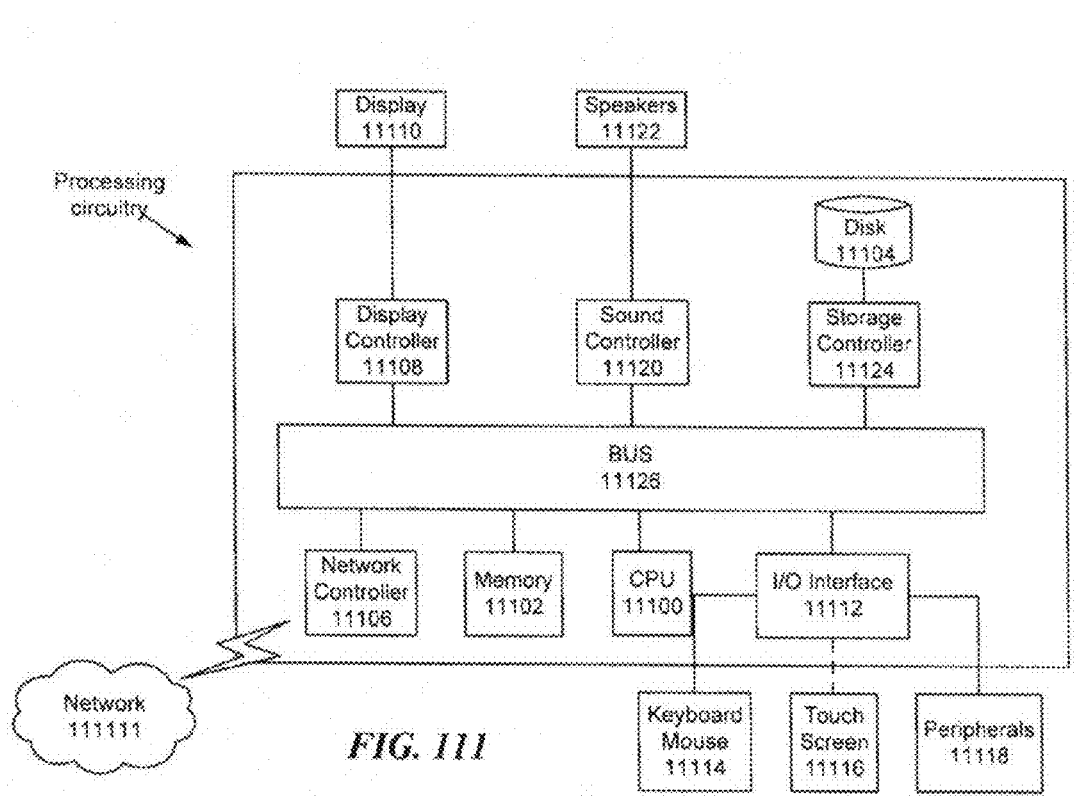

FIG. 111 is a diagrammatic overview of a system for implementing the photovoltaic system.

DETAILED DESCRIPTION OF THE PRESENT EMBODIMENT

Figure 1:
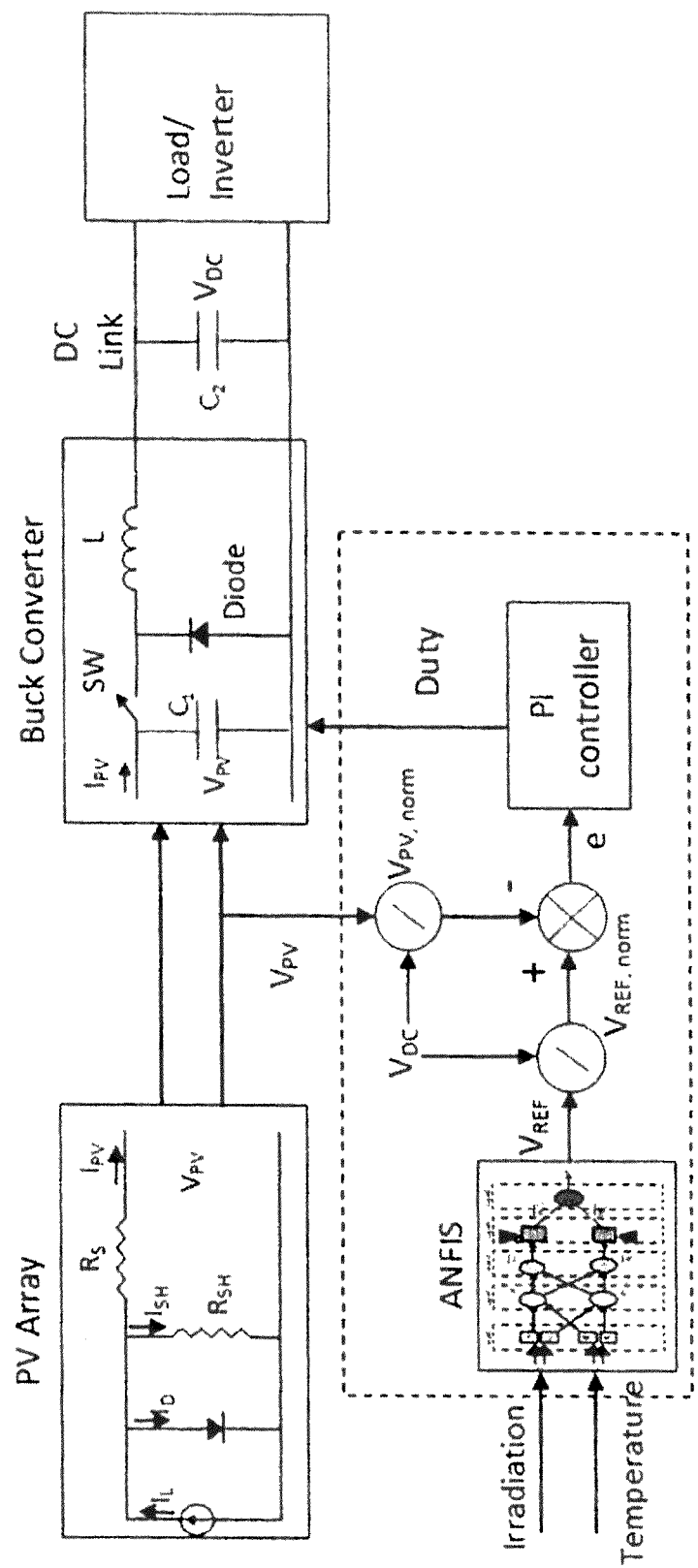
FIG. 1 shows a block diagram of a present photovoltaic system embodiment.

FIG. 1 is a block diagram of a present photovoltaic system embodiment. The PV system includes a photovoltaic array that generates a varying DC output voltage and current depending on the weather conditions, a buck/boost converter to step down/step up of the output voltage from the photovoltaic array, a DC link capacitor to connect the buck/booster converter to a load/inverter, wherein the load/inverter provides a grid output of the photovoltaic system, an adaptive network-based fuzzy inference maximum power point tracking controller to generate a reference voltage, a voltage control loop to compare the output voltage of the photovoltaic array to the reference voltage, and a proportional integral controller to maintain the output voltage of the photovoltaic array to the reference voltage by adjusting the duty ratio of buck/boost converter. Input of the proposed ANFIS-based MPPT controller is the ambient conditions, i.e irradiation and temperature and its output is the reference voltage ($V_{REF}$) which is normalized using DC link voltage ($V_{DC}$). The normalized reference voltage ($V_{REF,norm}$) is feedback to the voltage control loop where PI controller is used to maintain the output voltage of PV array ($V_{PV}$) to the reference optimal voltage by adjusting the duty ratio of DC-DC converter, which results in maximum power extraction. PV array will generate a varying DC voltage ($V_{PV}$) and current ($I_{PV}$) depending upon the weather conditions. Buck converter and DC link capacitor are utilized to smooth these varying quantities and make accessible for the inverter. MPPT is employed as a controller for buck converter that adjusts the duty ratio of switch to extract maximum possible power from the PV array under all operating conditions.

A DC-to-DC converter is an electronic circuit which converts a source of direct current (DC) from one voltage level to another. A proportional-integral-derivative controller (PID controller) is a generic control loop feedback mechanism (controller) widely used in industrial control systems. A PID controller calculates an "error" value as the difference between a measured process variable and a desired set point. The controller attempts to minimize the error by adjusting the process control inputs. The PID controller algorithm involves three separate constant parameters, and is accordingly sometimes called three-term control: the proportional, the integral and derivative values, denoted P, I, and D. Simply put, these values can be interpreted in terms of time: P depends on the present error, I on the accumulation of past errors, and D is a prediction of future errors, based on current rate of change. The weighted sum of these three actions is used to adjust the process via a control element such as the position of a control valve, a damper, or the power supplied to a heating element.

Figure 2:
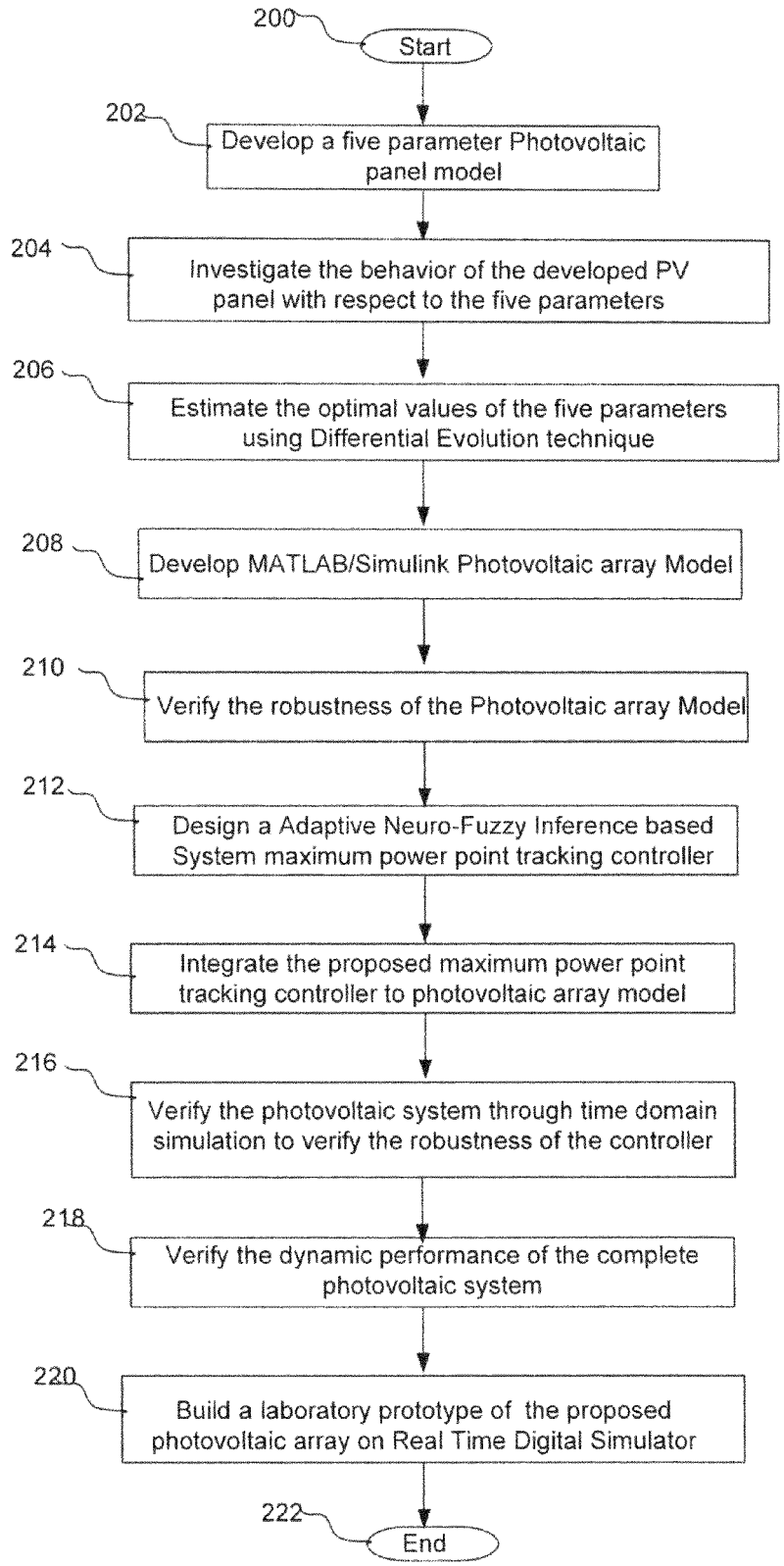
FIG. 2 shows a flowchart illustrating a procedure of a development and implementation of photovoltaic system in the current embodiment.

FIG. 2 is a flowchart illustrating a procedure of a development and implementation of Photovoltaic system. At step 202, the non-linear model of the PV panel using the five parameter equivalent electric circuit model is developed. At step 204, behavior of the PV panel output characteristics with respect to these parameters is investigated. At step 206, optimal values of the parameters are estimated at Standard Test conditions (STC) using the Differential Evolution (DE) technique to simulate the exact output characteristics of PV panel. At step 208, MATLAB/Simulink model of the PV array is developed that is flexible enough to simulate any number of series and parallel connected panels. At step 210, Robustness of the developed model is verified using simulation study at different operating conditions; PV panels of three different technologies are used to verify the effectiveness of the proposed modeling. At step 212, a proficient Adaptive Neuro-Fuzzy Inference System (ANFIS) based Maximum power point tracker (MPPT) is developed. At step 214, the complete non-linear model of the PV array, DC-DC converter, Maximum power point tracking (MPPT) controller and load is developed. At step 216, Time domain simulations of a PV system are carried out to verify the robustness of the proposed controller under different operating conditions. At step 218, the dynamic performance of the complete system is investigated under different disturbances such as sudden change in irradiation scenario and the proposed ANFIS-based MPPT is implemented on dSPACE DS1104. And Practical validation of the proposed controller is verified using the Real Time Digital Simulator (RTDS).

In this embodiment, first, a generalized Photovoltaic (PV) array simulator is developed in MATLAB/Simulink based on the five parameters equivalent electric circuit model. The values of the five unknown parameters are estimated using a stochastic optimization technique. Estimation problem is converted into an optimization problem where Differential Evolution (DE) as an efficient optimizing technique is employed to identify the model parameters at Standard Test Condition (STC) using only the data provided by the manufacturer. The effectiveness of the proposed method is analyzed by estimating the parameters of six PV panels of three different technologies and comparing the determined I-V curves with the experimental curves given in the datasheets. These identified parameters are then used to develop a precise PV simulator which is flexible enough to simulate any number of PV panels connected in series and parallel. The robustness of the proposed simulator is demonstrated under partial shaded conditions and its performance is verified by interfacing it with an actual power electronics converter and Maximum Power Point Tracking (MPPT) controller.

Second, an efficient Adaptive Neuro-Fuzzy Inference System (ANFIS) based MPPT controller is proposed that extract maximum possible power from PV under all operating condition. The proposed ANFIS-based MPPT controller has the capacity to track the optimum point under rapidly changing irradiation conditions with less fluctuations in steady state as compared to the conventional MPPT methods. Nonlinear time domain simulations have been carried out to assess the effectiveness of the proposed controllers under different disturbances and compared with the performance of conventional Incremental Conductance (InCond) method. The obtained results demonstrate that the proposed ANFIS-based MPPT controller has better dynamic and steady state performance than the conventional method. Finally, its performance is investigated experimentally where Real Time Digital Simulator (RTDS) is utilized to simulate a PV system in real time and proposed ANFIS-based MPPT controller is developed in dSPACE DS1104. The experimental results are compared with those obtained from MATLAB simulation to assess the validity and accuracy of the proposed controller. Simulation and experimental results show that the proposed ANFIS-based MPPT has fast dynamic response and fewer fluctuations in the steady state as compare to conventional InCond method.

PV panels are usually used in three main fields: Satellite applications, where the solar arrays provide power to satellites, Off-grid applications, where solar arrays are used to power remote loads that are not connected to the electric grid, and On-grid or grid connected applications, in which solar arrays are used to supply energy to local loads as well as to the electric grid as described in Roger et., ("*Photovoltaic systems Engineering,* 2nd ed. 2003—incorporated herein by reference). In addition, PV panels can be used in battery chargers, solar hybrid vehicles and solar powered water pumping system. Grid-connected PV systems currently dominate the PV market and can be installed on the facades and rooftops of buildings, on the shades of parking lots or they can also be installed as power plants that inject all produced power into the grid.

Large penetration of PV power into the electricity grid would have adverse effects on the transmission\distribution network and also on the other connected generators due to the uncertainty of the irradiation. It may cause security and stability issues of power system especially in the case of disturbances. An accurate PV array model is required that can simulate its output characteristics with the change in atmosphere conditions, i.e irradiation and cell temperature, to study and analyze the impact of PV generation on the utility power grid.

The energy production of the PV generation system can be increased in two ways; one is to build a larger Photovoltaic (PV) array generation system and the other is to achieve higher efficiency in converting incident solar energy into electrical energy. Once the construction of the generation system has been completed, the only viable solution is to maximize the conversion efficiency. The output of PV array generation system depends upon factors such as sun light intensity (irradiation), ambient temperature and the configuration of PV array; each of these factors is either a fixed or natural condition and thus generally cannot be controlled. Therefore, extracting the largest amount of power under a certain given set of operating conditions becomes very important for the total economics of the PV generation system.

Figure 3:
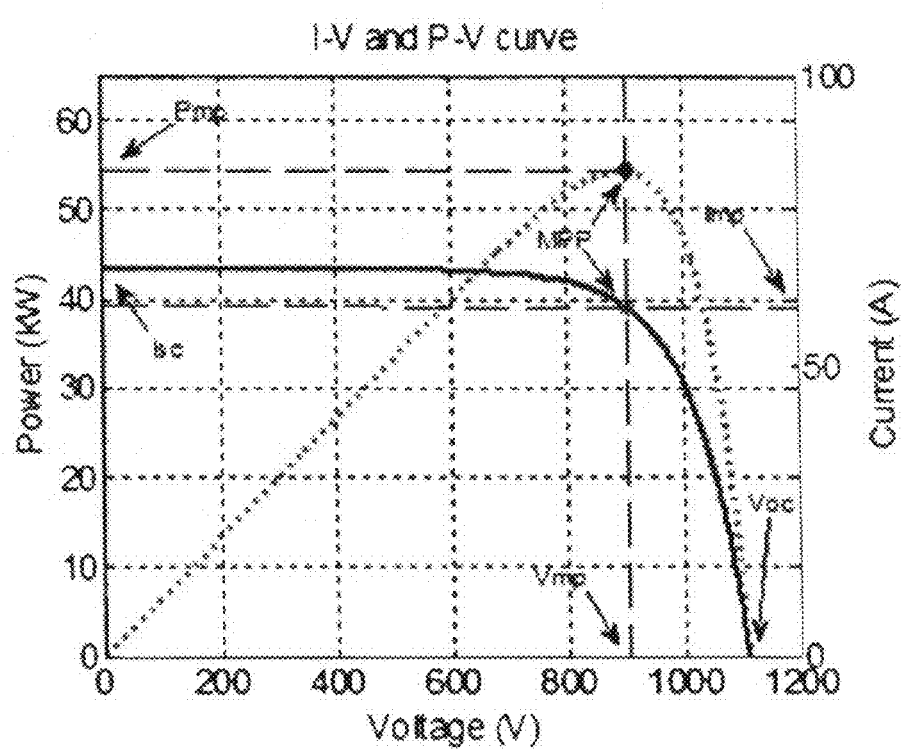
FIG. 3 is shows an I-V and a P-V curve of photovoltaic device showing key points.

The output characteristics of PV device are representing by I-V and P-V curves and shown in FIG. 3. For an arbitrary PV array configuration and set of operating conditions, it is possible to plot an I-V curve showing the array's output current as a function of its output voltage. The array's P-V curve shows the output power as a function of the output voltage. FIG. 3 shows two such curves for an arbitrary operating condition; the solid line shows the I-V curve of a PV array while the dotted line shows the power output of that same array. The small dot marked on the P-V curve is known as the Maximum Power Point (MPP) and it represents the maximum power that can be delivered by the PV array under a specific set of operating conditions. This is the point where the PV device is most efficient in converting the solar energy into electrical energy. The MPP is not a fixed point but actually varies throughout the day depending upon the environmental conditions, i.e solar radiation and cell temperature. These conditions are commonly known as operating conditions for PV device and are always changing with time which keeps varying the MPP. Therefore maximum power point tracking (MPPT) controller is of a great importance and an integral part of all kinds of PV systems that forces the PV system to operate at its maximum efficiency. Despite the increasing use of PV, this technology still faces a major obstacle due to its high capital cost and the low efficiency. Overall efficiency of the PV system depends upon the efficiencies of PV panels, power electronics converters and maximum power point algorithm. PV panels have efficiency around 8-20% only, converters have 95-98% and MPPT algorithm has more than 98%. The efficiencies of electronic converters and PV arrays depend on technology but MPPT efficiency can be increased by improving its tracking methods. These efficient and superior techniques can easily be installed in the previously existed PV systems by updating their software with less cost.

Photovoltaic (PV) system is one of the promising RES and can provide clean energy to the electricity grid and distant loads connected through the power electronic devices. For the simulation study of a power system, the system designers require an efficient and regimented PV array electrical model that is capable of generating electrical characteristics, i.e I-V and P-V relationship of PV panel under different radiation and cell temperature. The output characteristic of PV devices (panels or arrays) is extremely nonlinear and it is not suitable to represent them with constant or controlled voltage/current source. Several PV electrical models have been proposed and developed by the researchers Menicucci et al., ("User's Manual for PVFORM: A Photovoltaic system Shulation Program For Stand-Alone and Grid-interactive Applications," 1989— incorporated herein by reference), Hishikawa et al., ("Irradiance-dependence and translation of the I-V characteristics of crystalline silicon solar cells," in *Conference Record of the Twenty-Eighth IEEE Photovoltaic Specialists Conference*—2000 (Cat. No. 00CH37036), 2000, pp. 1464-1467— incorporated herein by reference), Marion et al. "Current-voltage curve translation by bilinear interpolation," *Progress in Photovoltaics: Research and Applications*, vol. 12, no. 8, pp. 593-607—incorporated herein by reference), King et al., ("*Photovoltaic array performance model.*" 2004—incorporated herein by reference), Sandia National Laboratories, ("Database of Photovoltaic Module Performance Parameters," 2002—incorporated herein by reference), Townsend, ("A method for estimating the long-term performance of directly-coupled photovoltaic systems," University of Wisconsin, Madison, 1989—incorporated herein by reference), Benavides et al., ("Modeling the Effect of Voltage Ripple on the Power Output of Photovoltaic Modules," *IEEE Transactions on Industrial Electronics*, vol. 55, no. 7, pp. 2638-2643, July 2008—incorporated herein by reference), Tan et al., ("A Model of PV Generation Suitable for Stability Analysis," *IEEE Transactions on Energy Conversion*, vol.

19, no. 4, pp. 748-755, December 2004—incorporated herein by reference), Glass, ("Improved solar array power point model with SPICE realization," in *IECEC 96 Proceedings of the 31st Intersociety Energy Conversion Engineering Conference*, 1996, vol. 1, pp. 286-291—incorporated herein by reference), Kuo et al., ("Novel maximum-power-point-tracking controller for photovoltaic energy conversion system," *IEEE Transactions on Industrial Electronics*, vol. 48, no. 3, pp. 594-601, June 2001—incorporated herein by reference), Dunford et al., ("A novel modeling method for photovoltaic cells," in 2004 *IEEE 35th Annual Power Electronics Specialists Conference (IEEE Cat. No. 04CH37551)*, 2004, pp. 1950-1956—incorporated herein by reference), Celik et al., ("Modelling and experimental verification of the operating current of mono-crystalline photovoltaic modules using four- and five-parameter models," *Applied Energy*, vol. 84, no. 1, pp. 1-15, January 2007—incorporated herein by reference), Gonzalez-Longatt, ("Model of photovoltaic module in matlab," in *II CIBELEC*, 2005, pp. 1-5—incorporated herein by reference), Chenni et al., *Energy*, vol. 32, no. 9, pp. 1724-1730, September 2007—incorporated herein by reference), Ishaque et al., ("Modeling and simulation of photovoltaic (PV) system during partial shading based on a two-diode model," *Simulation Modelling Practice and Theory*, vol. 19, no. 7, pp. 1613-1626, August 2011—incorporated herein by reference), De Soto et al., ("Improvement and validation of a model for photovoltaic array performance," *Solar Energy*, vol. 80, no. 1, pp. 78-88, January 2006—incorporated herein by reference), Carrero et al., ("A single procedure for helping PV designers to select silicon PV modules and evaluate the loss resistances," *Renewable Energy*, vol. 32, no. 15, pp. 2579-2589, December 2007—incorporated herein by reference), Dougal et al., ("Dynamic multiphysics model for solar array," *IEEE Transactions on Energy Conversion*, vol. 17, no. 2, pp. 285-294, June 2002—incorporated herein by reference), Villalva et al., ("Comprehensive Approach to Modeling and Simulation of Photovoltaic Arrays," *IEEE Transactions on Power Electronics*, vol. 24, no. 5, pp. 1198-1208, May 2009—incorporated herein by reference), Gow et al., ("Development of a photovoltaic array model for use in power-electronics simulation studies," *IEE Proceedings—Electric Power Applications*, vol. 146, no. 2, p. 193, 1999—incorporated herein by reference), Pongratananukul et al., ("Tool for automated simulation of solar arrays using general-purpose simulators," in *IEEE Workshop on Computers in Power Electronics, 2004 Proceedings.*, 2004, vol. 00, pp. 10-14—incorporated herein by reference),. Chowdhury et al., ("Modelling, simulation and performance analysis of a PV array in an embedded environment," in 2007 *42nd International Universities Power Engineering Conference*, 2007, no. 1, pp. 781-785—incorporated herein by reference), Herrmann et al., ("Hot spot investigations on PV modules-new concepts for a test standard and consequences for module design with respect to bypass diodes," in *Conference Record of the Twenty Sixth IEEE Photovoltaic Specialists Conference*—1997, 1997, pp. 1129-1132—incorporated herein by reference), Kawamura et al., ("Simulation of I-V characteristics of a PV module with shaded PV cells," *Solar Energy Materials and Solar Cells*, vol. 75, no. 3-4, pp. 613-621, Februry 2003—incorporated herein by reference), Patel et al., ("MATLAB-Based Modeling to Study the Effects of Partial Shading on PV Array Characteristics," *IEEE Transactions on Energy Conversion*, vol. 23, no. 1, pp. 302-310, March 2008—incorporated herein by reference), Patel et al., ("Maximum Power Point Tracking Scheme for PV Systems Operating Under Partially Shaded Conditions," *IEEE Transactions on Industrial Electronics*, vol. 55, no. 4, pp. 1689-1698, April 2008—incorporated herein by reference), Zagrouba et al., ("Identification of PV solar cells and modules parameters using the genetic algorithms: Application to maximum power extraction," *Solar Energy*, vol. 84, no. 5, pp. 860-866, May 2010—incorporated herein by reference), Charles et al. ("A practical method of analysis of the current-voltage characteristics of solar cells," *Solar Cells*, vol. 4, no. 2, pp. 169-178, September 1981—incorporated herein by reference), Ikegami et al., ("Estimation of equivalent circuit parameters of PV module and its application to optimal operation of PV system," *Solar Energy Materials and Solar Cells*, vol. 67, no. 1-4, pp. 389-395, March 2001—incorporated herein by reference), Jervase et al., ("Solar cell parameter extraction using genetic algorithms," *Measurement Science and Technology*, vol. 12, no. 11, pp. 1922-1925, November 2001—incorporated herein by reference), Kim et al., ("A novel parameter extraction method for the one-diode solar cell model," *Solar Energy*, vol. 84, no. 6, pp. 1008-1019, June 2010—incorporated herein by reference), Villalva et al., ("Modeling and circuit-based simulation of photovoltaic arrays," in 2009 *Brazilian Power Electronics Conference*, 2009, pp. 1244-1254—incorporated herein by reference), Walker et al., ("Evaluating MPPT converter topologies using a Matlab PV model," *Journal of Electrical & Electronics Engineering*, Australia, vol. 21, no. 1, pp. 49-55, 2001—incorporated herein by reference), Chatterjee et al., ("Identification of Photovoltaic Source Models," *IEEE Transactions on Energy Conversion*, vol. 26, no. 3, pp. 883-889, September 2011—incorporated herein by reference), Boyd et al., ("Evaluation and Validation of Equivalent Circuit Photovoltaic Solar Cell Performance Models," *Journal of Solar Energy Engineering*, vol. 133, no. 2, p. 021005, 2011—incorporated herein by reference), Ishaque et al., ("An improved modeling method to determine the model parameters of photovoltaic (PV) modules using differential evolution (DE)," *Solar Energy*, vol. 85, no. 9, pp. 2349-2359, September 2011—incorporated herein by reference), Carrero et al., ("Accurate and fast convergence method for parameter estimation of PV generators based on three main points of the I-V curve," *Renewable Energy*, vol. 36, no. 11, pp. 2972-2977, November 2011—incorporated herein by reference), Elhagry et al., ("Fuzzy modeling of photovoltaic panel equivalent circuit," in *Proceedings of 40th Midwest Symposium on Circuits and Systems. Dedicated to the Memory of Professor Mac Van Valkenburg*, 2000, vol. 1, pp. 60-63—incorporated herein by reference), Almonacid et al., ("Characterisation of Si-crystalline PV modules by artificial neural networks," *Renewable Energy*, vol. 34, no. 4, pp. 941-949, April 2009—incorporated herein by reference), Syafaruddin et al., ("Development of real-time simulation based on intelligent techniques for maximum power point controller of photovoltaic system," *International Journal of Innovative Computing, Information and Control*, vol. 6, no. 4, p. 4198, 2010—incorporated herein by reference), and Moldovan et al., ("Parameter Extraction of a Solar Cell Compact Model using Genetic Algorithms," in 2009 *Spanish Conference on Electron Devices*, 2009, pp. 379-382—incorporated herein by reference), including models that use experimental correlations, models that are based on analytical information of PV cell structure and models that merge both of the methods. Some of these models are described vaguely and some of them are too complex for simple power system studies.

The simplest model is temperature and radiation scaling of maximum power point as described in Menicucci et al., ("User's Manual for PVFORM: A Photovoltaic system Shulation Program For Stand-Alone and Grid-interactive Applications," 1989—incorporated herein by reference), it requires the temperature and irradiation coefficient of the maximum power point and predicts the performance of the PV device only at one point. In Hishikawa et al., ("Irradiance-dependence and translation of the I-V characteristics of crystalline silicon solar cells," in Conference Record of the Twenty-Eighth IEEE Photovoltaic Specialists Conference— 2000 (Cat. No. 00CH37036), 2000, pp. 1464-1467—incorporated herein by reference) and Marion et al. "Current-voltage curve translation by bilinear interpolation," Progress in Photovoltaics: Research and Applications, vol. 12, no. 8, pp. 593-607—incorporated herein by reference), a method of translation of I-V curve from one environmental condition to other is adopted. In Marion et al. ("Current-voltage curve translation by bilinear interpolation," Progress in Photovoltaics: Research and Applications, vol. 12, no. 8, pp. 593-607—incorporated herein by reference), bilinear interpolation method is presented that requires four practically determined I-V curves, two at different irradiations and two at different temperatures. Behavior of the PV panel at any ambient condition is determined by interpolating the four I-V curves with short circuit current and open circuit voltage to check for solar irradiance and temperature respectively. These model are quite complex and require a large amount of data that is not usually provided from the manufacturer. The most efficient and practical model for PV array simulation is developed in King et al., ("Photovoltaic array performance model.", 2004—incorporated herein by reference), Sandia Lab PV model. This model takes three inputs that is ambient temperature, solar radiation and wind speed and computes the voltage and current of PV array at five main points on the I-V. This model requires thirty practically determined constants to simulate the behavior of any PV panel. The values of these coefficients are available for a large number of commercial PV modules as described in Sandia National Laboratories, ("Database of Photovoltaic Module Performance Parameters," 2002—incorporated herein by reference). Due to the complexity of these models power system studies like load flow, maximum power point tracking, load frequency match become difficult and requires large computational time.

Electrical characteristics of the PV panel can be modeled by representing it with equivalent electrical circuit, as describe in Townsend, ("A method for estimating the long-term performance of directly-coupled photovoltaic systems," University of Wisconsin, Madison, 1989—incorporated herein by reference). This model has the advantage over the other models due to its electrical circuit nature and the behavior of the PV array can easily be understood in the circuit connected. This model is best suited for the dynamic and transient study of the power electronics converters.

Figure 4:
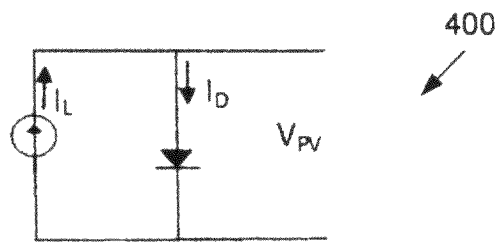
FIG. 4(a) shows a schematic diagram of an ideal photovoltaic device model.
FIG. 4(b) shows a schematic diagram of a four parameters photovoltaic device model ($R_S$ model).
FIG. 4(c) shows a schematic diagram of a five parameters photovoltaic device model ($R_{SH}$ model)
FIG. 4(d) shows a schematic diagram of a double diode photovoltaic device model (seven parameters model).
Figure 4:
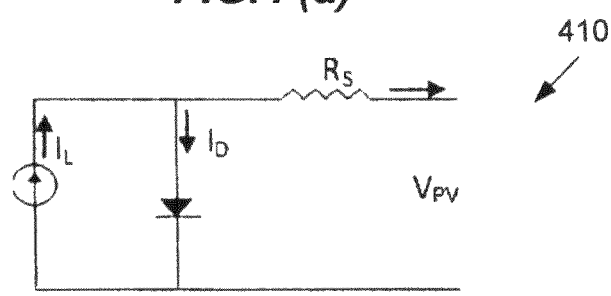
Figure 4:
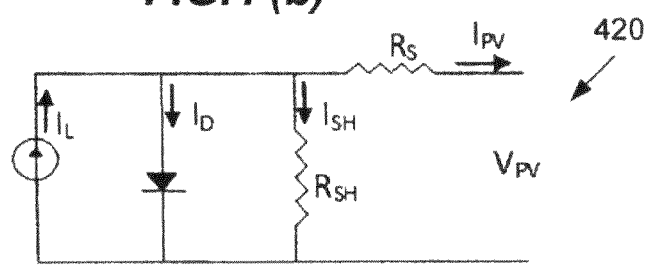
Figure 4:
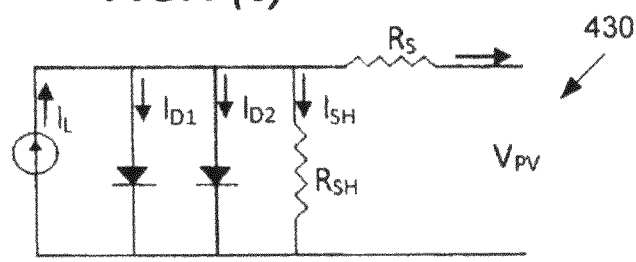

The electric circuit based model of the PV device shown in FIG. 4 is further classified as an ideal diode model (three parameters model) 400, four parameters model ($R_S$ model) 410, five parameters model ($R_{SH}$ model) 420 and double diode model (seven parameters model) 430.

The simplest among these models is the ideal diode model it consist of a single diode and irradiation dependent current source FIG. 4(a) as described in Benavides et al., ("Modeling the Effect of Voltage Ripple on the Power Output of Photovoltaic Modules," IEEE Transactions on Industrial Electronics, vol. 55, no. 7, pp. 2638-2643, July 2008—incorporated herein by reference), Tan et al., ("A Model of PV Generation Suitable for Stability Analysis," IEEE Transactions on Energy Conversion, vol. 19, no. 4, pp. 748-755, December 2004—incorporated herein by reference) and Glass, ("Improved solar array power point model with SPICE realization," in IECEC 96 Proceedings of the 31st Intersociety Energy Conversion Engineering Conference, 1996, vol. 1, pp. 286-291—incorporated herein by reference). This model needs three parameters, i.e $I_L$ light current, $I_O$ saturation current of diode and "a" ideality factor of diode to generate the complete output characteristics of a PV device. Performance of this ideal model is enhanced by adding a resistance in series and it is generally known as four parameter model (Rs-model), as shown in FIG. 4(b). This model requires one additional parameter ($R_S$ series resistance) to be known to characterize the I-V curve. In Chenni et al., Energy, vol. 32, no. 9, pp. 1724-1730, September 2007—incorporated herein by reference) model is implemented in MATLAB programming and examines the modeling process and illustrates the PV panel's output characteristics with the varying ambient conditions. This model is easy in implementation and provides acceptable results but its performance deteriorates at high temperatures and low irradiation and also for thin film technology based PV panels. Considering this issue an improved circuit based model is developed in De Soto et al., ("Improvement and validation of a model for photovoltaic array performance," Solar Energy, vol. 80, no. 1, pp. 78-88, January 2006— incorporated herein by reference), Carrero et al., ("A single procedure for helping PV designers to select silicon PV modules and evaluate the loss resistances," Renewable Energy, vol. 32, no. 15, pp. 2579-2589, December 2007— incorporated herein by reference), Dougal et al., ("Dynamic multiphysics model for solar array," IEEE Transactions on Energy Conversion, vol. 17, no. 2, pp. 285-294, June 2002— incorporated herein by reference), Villalva et al., ("Comprehensive Approach to Modeling and Simulation of Photovoltaic Arrays," IEEE Transactions on Power Electronics, vol. 24, no. 5, pp. 1198-1208, May 2009—incorporated herein by reference) widely known as five parameters model ($R_{SH}$ model) as shown in FIG. 4(c). An additional parameter, shunt resistance, is considered which was neglected in four parameter model. Comparison of four and five parameter model is done in Celik et al., ("Modelling and experimental verification of the operating current of mono-crystalline photovoltaic modules using four- and five-parameter models," Applied Energy, vol. 84, no. 1, pp. 1-15, January 2007—incorporated herein by reference) for the mono crystalline PV panel and showed that the five parameters model is more efficient in estimating the operating current and power at different atmospheric conditions. To further improve the efficiency of the circuit based model some authors used the two diode model (seven parameters model) Ishaque et al., ("Modeling and simulation of photovoltaic (PV) system during partial shading based on a two-diode model," Simulation Modelling Practice and Theory, vol. 19, no. 7, pp. 1613-1626, August 2011—incorporated herein by reference), Gow et al., ("Development of a photovoltaic array model for use in power-electronics simulation studies," IEE Proceedings—Electric Power Applications, vol. 146, no. 2, p. 193, 1999—incorporated herein by reference), Pongratananukul et al., ("Tool for automated simulation of solar arrays using general-purpose simulators," in IEEE Workshop on Computers in Power Electronics, 2004 Proceedings., 2004, vol. 00, pp. 10-14—incorporated herein by reference), and Chowdhury et al., ("Modelling, simulation and performance analysis of a PV array in an embedded environment," in 2007 42nd International Universities Power Engineering Conference, 2007, no. 1, pp. 781-785— incorporated herein by reference) as shown in FIG. 4(d) The number of parameters to be computed during simulation is increased by inclusion of an extra diode that will make the model computationally inefficient. The competency of the two diode model over Rs-model and $R_{SH}$-model is shown in Ishaque et al., ("An improved modeling method to determine the model parameters of photovoltaic (PV) modules using differential evolution (DE)," *Solar Energy*, vol. 85, no. 9, pp. 2349-2359, September 2011—incorporated herein by reference). To make the model computational efficient values of some parameters are assumed to be constant which deteriorates its performance under the partial shading condition. The authors in Carrero et al., ("Accurate and fast convergence method for parameter estimation of PV generators based on three main points of the I-V curve," *Renewable Energy*, vol. 36, no. 11, pp. 2972-2977, November 2011—incorporated herein by reference) suggested that the five parameters model is a good compromise between accuracy and simplicity and it is the most widely used model in the literature. Behavior of the PV device under the partial shaded condition has been studied by various researchers as Herrmann et al., ("Hot spot investigations on PV modules-new concepts for a test standard and consequences for module design with respect to bypass diodes," in *Conference Record of the Twenty Sixth IEEE Photovoltaic Specialists Conference*—1997, 1997, pp. 1129-1132—incorporated herein by reference), Kawamura et al., ("Simulation of I-V characteristics of a PV module with shaded PV cells," *Solar Energy Materials and Solar Cells*, vol. 75, no. 3-4, pp. 613-621, February 2003—incorporated herein by reference), Patel et al., ("MATLAB-Based Modeling to Study the Effects of Partial Shading on PV Array Characteristics," *IEEE Transactions on Energy Conversion*, vol. 23, no. 1, pp. 302-310, March 2008—incorporated herein by reference), and Patel et al., ("Maximum Power Point Tracking Scheme for PV Systems Operating Under Partially Shaded Conditions," *IEEE Transactions on Industrial Electronics*, vol. 55, no. 4, pp. 1689-1698, April 2008—incorporated herein by reference). This situation may happen due to passing clouds, dust or snow covering the PV panel, shadows of trees or birds litters. In partial shading state the un-shaded cells of the PV panel become more forward biased and the shaded cells become reverse bias. When the reverse voltage increases beyond the breakdown voltage of the cell the "hot-spot" phenomenon take place and causes irreparable damage to the cell. This problem is solved by using by-pass diodes as described in Herrmann et al., ("Hot spot investigations on PV modules-new concepts for a test standard and consequences for module design with respect to bypass diodes," in *Conference Record of the Twenty Sixth IEEE Photovoltaic Specialists Conference*—1997, 1997, pp. 1129-1132—incorporated herein by reference). Due to by-pass diodes, multiple peaks occur in the P-V characteristics, which add additional complexity in modeling the PV array. In Kawamura et al., ("Simulation of I-V characteristics of a PV module with shaded PV cells," *Solar Energy Materials and Solar Cells*, vol. 75, no. 3-4, pp. 613-621, February 2003—incorporated herein by reference) impact on the I-V curve and output of the PV panel due to the partial shading condition is studied. Experimental work on panel shading was performed in Patel et al., ("MATLAB-Based Modeling to Study the Effects of Partial Shading on PV Array Characteristics," *IEEE Transactions on Energy Conversion*, vol. 23, no. 1, pp. 302-310, March 2008—incorporated herein by reference). A comprehensive MATLAB based modeling of the shaded PV array is carried out in Patel et al., ("Maximum Power Point Tracking Scheme for PV Systems Operating Under Partially Shaded Conditions," *IEEE Transactions on Industrial Electronics*, vol. 55, no. 4, pp. 1689-1698, April 2008—incorporated herein by reference).

The most challenging part in the implementation of equivalent circuit based models is to identify the values of these parameters as their values are not provided in the solar panel catalogues. The performance and competence of these models are entirely dependent on these parameters and their values should be estimated using accurate and efficient algorithms. Two approaches are widely used for the estimation, one approach approximate the original I-V and P-V characteristics using the selected key points, i.e. the short circuit point, open circuit point and maximum power point Zagrouba et al. ("Identification of PV solar cells and modules parameters using the genetic algorithms: Application to maximum power extraction," *Solar Energy*, vol. 84, no. 5, pp. 860-866, May 2010—incorporated herein by reference) and Charles et al. ("A practical method of analysis of the current-voltage characteristics of solar cells," *Solar Cells*, vol. 4, no. 2, pp. 169-178, September 1981—incorporated herein by reference), while the other approach works on the curve fitting principle Ikegami et al., ("Estimation of equivalent circuit parameters of PV module and its application to optimal operation of PV system," *Solar Energy Materials and Solar Cells*, vol. 67, no. 1-4, pp. 389-395, March 2001—incorporated herein by reference), Jervase et al., ("Solar cell parameter extraction using genetic algorithms," *Measurement Science and Technology*, vol. 12, no. 11, pp. 1922-1925, November 2001—incorporated herein by reference), Kim et al., ("A novel parameter extraction method for the one-diode solar cell model," *Solar Energy*, vol. 84, no. 6, pp. 1008-1019, June 2010—incorporated herein by reference), Villalva et al., ("Modeling and circuit-based simulation of photovoltaic arrays," in 2009 *Brazilian Power Electronics Conference*, 2009, pp. 1244-1254—incorporated herein by reference). Both methods have their own pros and cons. The latter have the advantage that it considers all the experimental data. However, it has the difficulty of artificial solutions as described in Zagrouba et al., ("Identification of PV solar cells and modules parameters using the genetic algorithms: Application to maximum power extraction," *Solar Energy*, vol. 84, no. 5, pp. 860-866, May 2010—incorporated herein by reference) and requires large number of experimental data which is not usually provided by the manufacturer. The preceding method is simple and fast as compared to the curve fitting method and adopted in this study. However, it optimizes the values of parameters only at the selected key points as described in Jervase et al., ("Solar cell parameter extraction using genetic algorithms," *Measurement Science and Technology*, vol. 12, no. 11, pp. 1922-1925, November 2001—incorporated herein by reference).

Several algorithms have been utilized by the researchers for the identifications of these parameters. The simplest method is to assume the value of one parameter and calculate other parameters using analytical equations and iterative methods. In Villalva et al., ("Modeling and circuit-based simulation of photovoltaic arrays," in 2009 *Brazilian Power Electronics Conference*, 2009, pp. 1244-1254—incorporated herein by reference), authors suppose the value of "a" and find the values of $R_S$ and $R_{SH}$ concurrently by numerical technique and values of $I_0$ and $I_L$ analytically. An iterative technique is utilized in Kuo et al., ("Novel maximum-power-point-tracking controller for photovoltaic energy conversion system," *IEEE Transactions on Industrial Electronics*, vol. 48, no. 3, pp. 594-601, June 2001—incorporated herein by reference) and Chenni et al., *Energy*, vol. 32, no. 9, pp. 1724-1730, September 2007—incorporated herein by reference), to find the valued of $R_S$ and "a" by neglecting the effect of $R_{SH}$. In Walker et al., ("Evaluating MPPT converter topologies using a Matlab PV model," *Journal of Electrical & Electronics Engineering*, Australia, vol. 21, no. 1, pp. 49-55, 2001—incorporated herein by reference) $R_{SH}$ is ignored by considering it to be infinite and value of "a" is taken constant and compute other parameters by solving the analytical equations. In Chatterjee et al., ("Identification of Photovoltaic Source Models," *IEEE Transactions on Energy Conversion*, vol. 26, no. 3, pp. 883-889, September 2011—incorporated herein by reference, authors have solved the non-linear I-V characteristics equation of PV by simplifying the highly complex diode current equation. These assumptions degrade the efficiency of these methods and limit their scope as described in Chenni et al., *Energy*, vol. 32, no. 9, pp. 1724-1730, September 2007—incorporated herein by reference). In De Soto et al., ("Improvement and validation of a model for photovoltaic array performance," *Solar Energy*, vol. 80, no. 1, pp. 78-88, January 2006—incorporated herein by reference) and Boyd et al., ("Evaluation and Validation of Equivalent Circuit Photovoltaic Solar Cell Performance Models," *Journal of Solar Energy Engineering*, vol. 133, no. 2, p. 021005, 2011—incorporated herein by reference), authors used a nonlinear equation solver software for the solution of non-linear equations to find the model parameters. These software packages have limitation and cannot provide result for all the PV panels. To estimate the values of these parameters accurate and efficient algorithms should be used for the optimization process. In Ishaque et al., ("An improved modeling method to determine the model parameters of photovoltaic (PV) modules using differential evolution (DE)," *Solar Energy*, vol. 85, no. 9, pp. 2349-2359, September 2011—incorporated herein by reference), authors present a novel scheme for determination of the five parameters. Their method works on the principle of adjusting the I-V and P-V curve at three key point short circuit point, open circuit point and maximum power point and find out the best values of model parameters that result in the slightest error at these three key points. An iterative method is implemented in Carrero et al., ("Accurate and fast convergence method for parameter estimation of PV generators based on three main points of the I-V curve," *Renewable Energy*, vol. 36, no. 11, pp. 2972-2977, November 2011—incorporated herein by reference) for the estimation of parameters. This method uses simplified I-V equation and results in fast convergence.

In recent year some intelligent techniques like fuzzy Logic as described in Elhagry et al., ("Fuzzy modeling of photovoltaic panel equivalent circuit," in *Proceedings of 40th Midwest Symposium on Circuits and Systems. Dedicated to the Memory of Professor Mac Van Valkenburg*, 2000, vol. 1, pp. 60-63—incorporated herein by reference) and artificial neural network as described in Almonacid et al., ("Characterisation of Si-crystalline PV modules by artificial neural networks," *Renewable Energy*, vol. 34, no. 4, pp. 941-949, April 2009—incorporated herein by reference) and Syafaruddin et al., ("Development of real-time simulation based on intelligent techniques for maximum power point controller of photovoltaic system," *International Journal of Innovative Computing, Information and Control*, vol. 6, no. 4, p. 4198, 2010—incorporated herein by reference) have been employed to identify the values of these parameters. The results of these techniques are quite promising but they show problems when parameter identification method is integrated in PV simulator. As fuzzy logic controllers have fuzzification, rule base table and defuzzification which require large memory and neural network requires large amount of training data. Optimization technique can be used for the prediction of model parameters. Ikegami et al., ("Estimation of equivalent circuit parameters of PV module and its application to optimal operation of PV system," *Solar Energy Materials and Solar Cells*, vol. 67, no. 1-4, pp. 389-395, March 2001—incorporated herein by reference) minimized the error in the operating current using the empirically calculated current and voltage points by means of Levenberg-Marquardt optimization technique. Evolutionary Algorithm (EA) techniques are very effective stochastic optimization methods as they have the ability to deal with non-linear objective functions. Genetic algorithm (GA) as described in Moldovan et al., ("Parameter Extraction of a Solar Cell Compact Model using Genetic Algorithms," in *2009 Spanish Conference on Electron Devices*, 2009, pp. 379-382—incorporated herein by reference) and particle swam optimization (PSO) as described in Ye et al., ("Parameter extraction of solar cells using particle swarm optimization," *Journal of Applied Physics*, vol. 105, no. 9, p. 094502, 2009—incorporated herein by reference) are utilized to optimize the model parameters.

Maximum power point tracking (MPPT) controller is a crucial part of the PV system. It tracks and extracts the maximum possible power from the PV array under different operating conditions and improves the overall efficiency of a complete PV system. The idea of MPPT is not new, many MPPT methods have been proposed by researchers such as Moldovan et al., ("Parameter Extraction of a Solar Cell Compact Model using Genetic Algorithms," in 2009 *Spanish Conference on Electron Devices*, 2009, pp. 379-382—incorporated herein by reference), Ye et al., ("Parameter extraction of solar cells using particle swarm optimization," *Journal of Applied Physics*, vol. 105, no. 9, p. 094502, 2009—incorporated herein by reference), T. Esram et al., ("Comparison of Photovoltaic Array Maximum Power Point Tracking Techniques," *IEEE Transactions on Energy Conversion*, vol. 22, no. 2, pp. 439-449, June 2007—incorporated herein by reference), Ishaque et al., ("A review of maximum power point tracking techniques of PV system for uniform insolation and partial shading condition," *Renewable and Sustainable Energy Reviews*, vol. 19, pp. 475-488, March 2013—incorporated herein by reference), Reza Reisi et al., ("Classification and comparison of maximum power point tracking techniques for photovoltaic system: A review," *Renewable and Sustainable Energy Reviews*, vol. 19, pp. 433-443, March 2013—incorporated herein by reference), Subudhi et al., ("A Comparative Study on Maximum Power Point Tracking Techniques for Photovoltaic Power Systems," *IEEE Transactions on Sustainable Energy*, vol. 4, no. 1, pp. 89-98, January 2013—incorporated herein by reference), Hua et al., ("Fully digital control of distributed photovoltaic power systems," in *ISIE 2001—incorporated herein by reference*), 2001 IEEE International Symposium on Industrial Electronics Proceedings (Cat. No. 01TH8570), 2001, vol. 1, pp. 1-6—incorporated herein by reference), Kasa et al., ("Maximum power point tracking with capacitor identifier for photovoltaic power system," *IEE Proceedings—Electric Power Applications*, vol. 147, no. 6, p. 497, 2000—incorporated herein by reference), Koutroulis et al., ("Development of a microcontroller-based, photovoltaic maximum power point tracking control system," *IEEE Transactions on Power Electronics*, vol. 16, no. 1, pp. 46-54, 2001—incorporated herein by reference), Femia et al., ("Predictive & Adaptive MPPT Perturb and Observe Method," *IEEE Transactions on Aerospace and Electronic Systems*, vol. 43, no. 3, pp. 934-950, July 2007—incorporated herein by reference), Abdelsalam et al., ("High-Performance Adaptive Perturb and Observe MPPT Technique for Photovoltaic-Based Microgrids," *IEEE Transactions on Power Electronics*, vol. 26, no. 4, pp. 1010-1021, April 2011—incorporated herein by reference), Femia et al., ("Optimization of Perturb and Observe Maximum Power Point Tracking Method," *IEEE Transactions on Power Electronics*, vol. 20, no. 4, pp. 963-973, July 2005—incorporated herein by reference), Sera et al., ("Improved MPPT method for rapidly changing environmental conditions," in 2006 *IEEE International Symposium on Industrial Electronics*, 2006, pp. 1420-1425—incorporated herein by reference), Sera et al., ("Improved MPPT Algorithms for Rapidly Changing Environmental Conditions," in 2006 *12th International Power Electronics and Motion Control Conference*, 2006, pp. 1614-1619—incorporated herein by reference), Sera et al., ("Optimized Maximum Power Point Tracker for Fast-Changing Environmental Conditions," *IEEE Transactions on Industrial Electronics*, vol. 55, no. 7, pp. 2629-2637, July 2008—incorporated herein by reference), Ishaque et al., ("An Improved Particle Swarm Optimization (PSO)-Based MPPT for PV With Reduced Steady-State Oscillation," *IEEE Transactions on Power Electronics*, vol. 27, no. 8, pp. 3627-3638, August 2012—incorporated herein by reference), Peftitsis et al., ("A New MPPT Method for Photovoltaic Generation Systems Based on Hill Climbing Algorithm," in *International Conference on Electrical Machines Paper*, 2008, no. 3, pp. 1-5—incorporated herein by reference), Dunford et al., ("A modified adaptive hill climbing MPPT method for photovoltaic power systems," in 2004 *IEEE 35th Annual Power Electronics Specialists Conference (IEEE Cat. No. 04CH37551)*, 2004, pp. 1957-1963—incorporated herein by reference), Hussein et al., ("Maximum photovoltaic power tracking: an algorithm for rapidly changing atmospheric conditions," *IEE Proceedings—Generation, Transmission and Distribution*, vol. 142, no. 1, p. 59, 1995—incorporated herein by reference), Hohm et al., ("Comparative study of maximum power point tracking algorithms," *Progress in Photovoltaics: Research and Applications*, vol. 11, no. 1, pp. 47-62, January 2003—incorporated herein by reference), Qin et al., ("Comparative analysis of incremental conductance and perturb-and-observation methods to implement MPPT in photovoltaic system," in 2011 *International Conference on Electrical and Control Engineering*, 2011, pp. 5792-5795—incorporated herein by reference), Safari et al., ("Simulation and Hardware Implementation of Incremental Conductance MPPT With Direct Control Method Using Cuk Converter," *IEEE Transactions on Industrial Electronics*, vol. 58, no. 4, pp. 1154-1161, April 2011—incorporated herein by reference), Yang et al., ("Highly Efficient Analog Maximum Power Point Tracking (AMPPT) in a Photovoltaic system," *IEEE Transactions on Circuits and Systems I: Regular Papers*, vol. 59, no. 7, pp. 1546-1556, July 2012—incorporated herein by reference), Dondi et al., ("Modeling and Optimization of a Solar Energy Harvester System for Self-Powered Wireless Sensor Networks," *IEEE Transactions on Industrial Electronics*, vol. 55, no. 7, pp. 2759-2766, July 2008—incorporated herein by reference), Lopez-Lapena et al., ("A New MPPT Method for Low-Power Solar Energy Harvesting," *IEEE Transactions on Industrial Electronics*, vol. 57, no. 9, pp. 3129-3138, September 2010—incorporated herein by reference), Elgendy et al., ("Assessment of Perturb and Observe MPPT Algorithm Implementation Techniques for PV Pumping Applications," *IEEE Transactions on Sustainable Energy*, vol. 3, no. 1, pp. 21-33, January 2012—incorporated herein by reference), Masoum et al., ("Theoretical and experimental analyses of photovoltaic systems with voltage and current-based maximum power-point tracking," *IEEE Transactions on Energy Conversion*, vol. 17, no. 4, pp. 514-522, December 2002—incorporated herein by reference), Kobayashi et al., ("A novel optimum operating point tracker of the solar cell power supply system," in 2004 *IEEE 35th Annual Power Electronics Specialists Conference (IEEE Cat. No. 04CH37551)*, 2004, pp. 2147-2151—incorporated herein by reference), Bekker et al., ("Finding an optimal PV panel maximum power point tracking method," in 2004 *IEEE Africon. 7th Africon Conference in Africa (IEEE Cat. No. 04CH37590)*, 2004, vol. ol. 1, pp. 1125-1129—incorporated herein by reference), Yuvarajan et al., ("Photo-voltaic power converter with a simple maximum-power-point-tracker," in *Proceedings of the* 2003 *International Symposium on Circuits and Systems*, 2003, vol. 3, pp. III-399-III-402—incorporated herein by reference), Abido et al., ("Multi-Objective Optimal Power Flow Using Differential Evolution," *Arabian Journal for Science and Engineering*, vol. 37, no. 4, pp. 991-1005, April 2012—incorporated herein by reference), Mohamed et al., ("Hopfield Neural Network Optimized Fuzzy Logic Controller for Maximum Power Point Tracking in a Photovoltaic system," *International Journal of Photoenergy*, vol. 2012, pp. 1-13, 2012—incorporated herein by reference), Alajmi et al., ("Fuzzy-Logic-Control Approach of a Modified Hill-Climbing Method for Maximum Power Point in Microgrid Standalone Photovoltaic system," *IEEE Transactions on Power Electronics*, vol. 26, no. 4, pp. 1022-1030, Apr. 2011—incorporated herein by reference), Zheng et al., ("A maximum power point tracking method based on tabu search for PV systems under partially shaded conditions," in *IET Conference on Renewable Power Generation (RPG 2011)*, 2011, pp. 52-52—incorporated herein by reference), Taheri et al., ("A novel Maximum Power Point tracking control of photovoltaic system under partial and rapidly fluctuating shadow conditions using Differential Evolution," in 2010 *IEEE Symposium on Industrial Electronics and Applications (ISIEA)*, 2010, no. Isiea, pp. 82-87—incorporated herein by reference), Kaliamoorthy et al., ("A novel MPPT scheme for solar powered boost inverter using evolutionary programming," in 2011 *International conference on recent advancement in electrical, electronics and control enginering.*, 2011, pp. 346-351—incorporated herein by reference), Ishaque et al., ("Maximum Power Point Tracking for PV system under partial shading condition via particle swarm optimization," in 2011 *IEEE Applied Power Electronics Colloquium (IAPEC)*, 2011, vol. 2, no. 2, pp. 5-9—incorporated herein by reference), Ramaprabha et al., ("Maximum power point tracking using GA-optimized artificial neural network for Solar PV system," in 2011 *1st International Conference on Electrical Energy Systems*, 2011, no. 1, pp. 264-268—incorporated herein by reference), Ngan et al., ("Multiple Peaks Tracking Algorithm using Particle Swarm Optimization Incorporated with Artificial Neural Network," in *World Academy of Science, Engineering and Technology*, 2011, pp. 379-385—incorporated herein by reference), Liu et al., ("A Variable Step Size INC MPPT Method for PV Systems," *IEEE Transactions on Industrial Electronics*, vol. 55, no. 7, pp. 2622-2628, July 2008—incorporated herein by reference), Premrudeepreechacharn et al., ("Solar-array modelling and maximum power point tracking using neural networks," in 2003 *IEEE Bologna Power Tech Conference Proceedings*, 2003, vol. 2, pp. 419-423—incorporated herein by reference), Chao et al., ("An extension neural network based incremental MPPT method for a PV system," in 2011 *International Conference on Machine Learning and Cybernetics*, 2011, pp. 654-660—incorporated herein by reference), Tsai et al., ("A novel MPPT control design for PV modules using neural network compensator," in 2012 *IEEE International Symposium on Industrial Electronics*, 2012, pp. 1742-1747—incorporated herein by reference), Younis et al., ("An Improved Maximum Power Point Tracking Controller for PV Systems Using Artificial Neural Network," in *Przeglad Elektrotechniczny (Electrical Review)*, 2012, no. 3, pp. 116-121—incorporated herein by reference), Won et al., ("A new maximum power point tracker of photovoltaic arrays using fuzzy controller," in *Proceedings of* 1994 *Power Electronics Specialist Conference—PESC'94*, 1994, pp. 396-403—incorporated herein by reference), El Khateb et al., ("Fuzzy logic controller based SEPIC converter of maximum power point tracking," in 2012 *IEEE Industry Applications Society Annual Meeting*, 2012, pp. 1-9—incorporated herein by reference), Moreno et al., ("A fuzzy logic controller for stand alone PV systems," in *Conference Record of the Twenty-Eighth IEEE Photovoltaic Specialists Conference—2000 (Cat. No. 00CH37036)*, 2000, pp. 1618-1621—incorporated herein by reference), Godoy Simões et al., ("Fuzzy optimisation-based control of a solar array system," *IEE Proceedings—Electric Power Applications*, vol. 146, no. 5, p. 552, 1999—incorporated herein by reference), Patcharaprakiti et al., ("Maximum power point tracking using adaptive fuzzy logic control for grid-connected photovoltaic system," in 2002 *IEEE Power Engineering Society Winter Meeting. Conference Proceedings (Cat. No. 02CH37309)*, 2002, vol. 1, pp. 372-377—incorporated herein by reference), Cheng et al., ("FPGA-based PV systems fuzzy MPPT control algorithm," in 2010 *Seventh International Conference on Fuzzy Systems and Knowledge Discovery*, 2010, no. Fskd, pp. 1244-1248—incorporated herein by reference), Alajmi et al., ("A Maximum Power Point Tracking Technique for Partially Shaded Photovoltaic systems in Microgrids," *IEEE Transactions on Industrial Electronics*, vol. 60, no. 4, pp. 1596-1606, April 2013—incorporated herein by reference), Kottas et al., ("New Maximum Power Point Tracker for PV Arrays Using Fuzzy Controller in Close Cooperation With Fuzzy Cognitive Networks," *IEEE Transactions on Energy Conversion*, vol. 21, no. 3, pp. 793-803, September 2006—incorporated herein by reference), Letting et al., ("Particle swarm optimized T-S fuzzy logic controller for maximum power point tracking in a photovoltaic system," in 2010 *Conference Proceedings IPEC*, 2010, pp. 89-94—incorporated herein by reference), Khaehintung et al., ("A novel fuzzy logic control technique tuned by particle swarm optimization for maximum power point tracking for a photovoltaic system using a current-mode boost converter with bifurcation control," *International Journal of Control, Automation and Systems*, vol. 8, no. 2, pp. 289-300, April 2010—incorporated herein by reference), Messai girou et al., ("Maximum power point tracking using a GA optimized fuzzy logic controller and its FPGA implementation," *Solar Energy*, vol. 85, no. 2, pp. 265-277, February 2011—incorporated herein by reference), Jang, ("ANFIS: adaptive-network-based fuzzy inference system," *IEEE Transactions on Systems, Man, and Cybernetics*, vol. 23, no. 3, pp. 665-685, 1993—incorporated herein by reference), Jang, ("Neuro-fuzzy modeling and control," *Proceedings of the IEEE*, vol. 83, no. 3, pp. 378-406, March 1995—incorporated herein by reference), Aldobhani et al., ("Maximum Power Point Tracking of PV System Using ANFIS Prediction and Fuzzy Logic Tracking," in *International MultiConference of Engineers and Computer Scientists (IMECS)*, 2008, vol. II, pp. 19-21—incorporated herein by reference), and Mayssa et al., ("Advanced ANFIS-MPPT control algorithm for sunshine photovoltaic pumping systems," in 2012 *First International Conference on Renewable Energies and Vehicular Technology*, 2012, pp. 167-172—incorporated herein by reference). These methods differ in cost, sensor required, complexity, reliability, convergence speed, efficiency and hardware implementation. A comprehensive analysis of nineteen MPPT techniques have been presented in Esram et al., ("Comparison of Photovoltaic Array Maximum Power Point Tracking Techniques," *IEEE Transactions on Energy Conversion*, vol. 22, no. 2, pp. 439-449, June 2007—incorporated herein by reference), Ishaque et al., ("A review of maximum power point tracking techniques of PV system for uniform insolation and partial shading condition," *Renewable and Sustainable Energy Reviews*, vol. 19, pp. 475-488, March 2013—incorporated herein by reference), Reza Reisi et al., ("Classification and comparison of maximum power point tracking techniques for photovoltaic system: A review," *Renewable and Sustainable Energy Reviews*, vol. 19, pp. 433-443, March 2013—incorporated herein by reference) and Subudhi et al., ("A Comparative Study on Maximum Power Point Tracking Techniques for Photovoltaic Power Systems," *IEEE Transactions on Sustainable Energy*, vol. 4, no. 1, pp. 89-98, January 2013—incorporated herein by reference). Among these techniques Perturb and Observe (P&O) method as described in Hua et al., ("Fully digital control of distributed photovoltaic power systems," in *ISIE* 2001—incorporated herein by reference), 2001 *IEEE International Symposium on Industrial Electronics Proceedings (Cat. No. 01TH8570)*, 2001, vol. 1, pp. 1-6—incorporated herein by reference) and Kasa et al., ("Maximum power point tracking with capacitor identifier for photovoltaic power system," *IEE Proceedings—Electric Power Applications*, vol. 147, no. 6, p. 497, 2000—incorporated herein by reference), and Hill Climbing (HC) method as described in Koutroulis et al., ("Development of a microcontroller-based, photovoltaic maximum power point tracking control system," *IEEE Transactions on Power Electronics*, vol. 16, no. 1, pp. 46-54, 2001—incorporated herein by reference) are most popular and practically available because of their simplicity and satisfactory results. Both methods work on the same principle of perturbing the PV system and observing its effect on the PV panel power output. Difference lies in the method of perturbation, in P&O panel output voltage/current is perturbed while in Hill climbing duty cycle of DC-DC—converter is perturbed. But these methods have drawbacks associated with them like large convergence time, fluctuations in the steady state and possible failure to track MPP in rapidly changing conditions as described in Esram et al., ("Comparison of Photovoltaic Array Maximum Power Point Tracking Techniques," *IEEE Transactions on Energy Conversion*, vol. 22, no. 2, pp. 439-449, June 2007—incorporated herein by reference) and Ishaque et al., ("A review of maximum power point tracking techniques of PV system for uniform insolation and partial shading condition," *Renewable and Sustainable Energy Reviews*, vol. 19, pp. 475-488, March 2013—incorporated herein by reference). To overcome these shortcoming and to improve the efficiency of these methods many modified P&O and HC methods have been proposed. Predictive and adaptive P&O method is proposed in Femia et al., ("Predictive & Adaptive MPPT Perturb and Observe Method," *IEEE Transactions on Aerospace and Electronic Systems*, vol. 43, no. 3, pp. 934-950, July 2007—incorporated herein by reference); prediction is undertaken by parabolic interpolation of last three operating points. Adaptive change in voltage is provided depending upon the measured power. Authors show that the proposed method has less convergence time than the simple P&O technique. A survey on P&O and modified P&O methods has been carried out in Abdelsalam et al., ("High-Performance Adaptive Perturb and Observe MPPT Technique for Photovoltaic-Based Microgrids," *IEEE Transactions on Power Electronics*, vol. 26, no. 4, pp. 1010-1021, April 2011—incorporated herein by reference) and a modified P&O method is proposed, named PI-P&O, based on the adaptive tracking and ensures no steady state fluctuations and do not require any preset system dependent constants. Comparison with already existed adaptive methods is presented and results showed the effectiveness of the proposed method. Femia et al., ("Optimization of Perturb and Observe Maximum Power Point Tracking Method," *IEEE Transactions on Power Electronics*, vol. 20, no. 4, pp. 963-973, July 2005—incorporated herein by reference), developed the optimized P&O method based on the dynamics of the particular converter used. In Sera et al., ("Improved MPPT method for rapidly changing environmental conditions," in 2006 *IEEE International Symposium on Industrial Electronics*, 2006, pp. 1420-1425—incorporated herein by reference), Sera et al., ("Improved MPPT Algorithms for Rapidly Changing Environmental Conditions," in 2006 *12th International Power Electronics and Motion Control Conference*, 2006, pp. 1614-1619—incorporated herein by reference) and Sera et al., ("Optimized Maximum Power Point Tracker for Fast-Changing Environmental Conditions," *IEEE Transactions on Industrial Electronics*, vol. 55, no. 7, pp. 2629-2637, July 2008—incorporated herein by reference) a superior P&O method has been proposed that can trail the MPP in the rapidly varying irradiation situation; known as dP-P&O. An extra measurement has to perform to calculate the PV power within the MPPT sampling time. dP-P&O method separates the effects of insolation and perturbation change and then optimizes the tracker according to the change in irradiation. To improve the speed and reduce the steady state oscillations, Ishaque et al., ("An Improved Particle Swarm Optimization (PSO)-Based MPPT for PV With Reduced Steady-State Oscillation," *IEEE Transactions on Power Electronics*, vol. 27, no. 8, pp. 3627-3638, August 2012—incorporated herein by reference), proposed an improved particle swarm optimization technique. In Peftitsis et al., ("A New MPPT Method for Photovoltaic Generation Systems Based on Hill Climbing Algorithm," in *International Conference on Electrical Machines Paper*, 2008, no. 3, pp. 1-5—incorporated herein by reference) and Dunford et al., ("A modified adaptive hill climbing MPPT method for photovoltaic power systems," in 2004 *IEEE 35th Annual Power Electronics Specialists Conference (IEEE Cat. No. 04CH37551)*, 2004, pp. 1957-1963—incorporated herein by reference), an adaptive hill climbing technique is presented in which control mode switching and automatic parameter tuning is implemented to improve the steady state and dynamic response of the PV system. Hussein et al., ("Maximum photovoltaic power tracking: an algorithm for rapidly changing atmospheric conditions," *IEE Proceedings—Generation, Transmission and Distribution*, vol. 142, no. 1, p. 59, 1995—incorporated herein by reference), presents the Incremental Conductance (InCond) method that considers the inability of P&O and Hill climbing methods to relate the change in PV power to the change in irradiation in the rapidly varying environment condition. This algorithm can be assumed as an improvement of the P&O method. As the name implies, the algorithm uses the incremental conductance as background of operation, which is the current divided by the voltage (inverted resistance). Comparative study of the MPPT techniques is carried out in Hohm et al., ("Comparative study of maximum power point tracking algorithms," *Progress in Photovoltaics: Research and Applications*, vol. 11, no. 1, pp. 47-62, January 2003—incorporated herein by reference) and Qin et al., ("Comparative analysis of incremental conductance and perturb-and-observation methods to implement MPPT in photovoltaic system," in 2011 *International Conference on Electrical and Control Engineering*, 2011, pp. 5792-5795—incorporated herein by reference) and it is demonstrated using MATLAB/Simulink based simulation that InCond can outperforms the P&O method in rapidly changing environmental condition. Hardware implementation of this method with direct control method is demonstrated in Safari et al., ("Simulation and Hardware Implementation of Incremental Conductance MPPT With Direct Control Method Using Cuk Converter," *IEEE Transactions on Industrial Electronics*, vol. 58, no. 4, pp. 1154-1161, April 2011—incorporated herein by reference). Analog maximum power point tracking technique (AMPPT) is proposed for fast tracking and high efficiency in Yang et al., ("Highly Efficient Analog Maximum Power Point Tracking (AMPPT) in a Photovoltaic system," *IEEE Transactions on Circuits and Systems I: Regular Papers*, vol. 59, no. 7, pp. 1546-1556, July 2012—incorporated herein by reference). Authors used a wide range current multiplier to find the PV panel power gradient situation and then track the MPP. Maximum power point controller for low power PV application is discussed in Dondi et al., ("Modeling and Optimization of a Solar Energy Harvester System for Self-Powered Wireless Sensor Networks," *IEEE Transactions on Industrial Electronics*, vol. 55, no. 7, pp. 2759-2766, July 2008—incorporated herein by reference) and Lopez-Lapena et al., ("A New MPPT Method for Low-Power Solar Energy Harvesting," *IEEE Transactions on Industrial Electronics*, vol. 57, no. 9, pp. 3129-3138, September 2010—incorporated herein by reference) and for the stand alone PV water pumping system in Elgendy et al., ("Assessment of Perturb and Observe MPPT Algorithm Implementation Techniques for PV Pumping Applications," *IEEE Transactions on Sustainable Energy*, vol. 3, no. 1, pp. 21-33, January 2012—incorporated herein by reference). The simplest MPPT methods are based on approximation and known as fractional open circuit voltage and fractional short circuit current. In Masoum et al., ("Theoretical and experimental analyses of photovoltaic systems with voltageand current-based maximum power-point tracking," *IEEE Transactions on Energy Conversion*, vol. 17, no. 4, pp. 514-522, December 2002—incorporated herein by reference) and Kobayashi et al., ("A novel optimum operating point tracker of the solar cell power supply system," in 2004 *IEEE 35th Annual Power Electronics Specialists Conference (IEEE Cat. No. 04CH37551)*, 2004, pp. 2147-2151—incorporated herein by reference) fractional open circuit voltage method is implemented based on the fact that the ratio of the maximum power voltage ($V_{mp}$) and the open circuit voltage ($V_{oc}$) are approximately linearly proportional under varying weather conditions. The yielded power from PV panel definitely is less than the real power at MPP because of the obvious reason that this method is based on approximation. Following the same pattern fractional short circuit current method is shown in Bekker et al., ("Finding an optimal PV panel maximum power point tracking method," in 2004 *IEEE Africon. 7th Africon Conference in Africa (IEEE Cat. No. 04CH37590)*, 2004, vol. ol. 1, pp. 1125-1129—incorporated herein by reference) and Yuvarajan et al., ("Photo-voltaic power converter with a simple maximum-power-point-tracker," in *Proceedings of the 2003 International Symposium on Circuits and Systems*, 2003, vol. 3, pp. III-399-III- 402—incorporated herein by reference), which uses the fact that the ratio of maximum power current ($I_{mp}$) and short circuit current ($I_{sc}$) are linearly proportional. This method has the same drawbacks and weakness as that of fractional open circuit voltage method.

In recent years some Evolutionary Algorithm (EA) as described in Abido et al., ("Multi-Objective Optimal Power Flow Using Differential Evolution," *Arabian Journal for Science and Engineering*, vol. 37, no. 4, pp. 991-1005, April 2012—incorporated herein by reference) and Artificial Intelligence Techniques (AIT) like Artificial Neural Network (ANN) as described in Mohamed et al., ("Hopfield Neural Network Optimized Fuzzy Logic Controller for Maximum Power Point Tracking in a Photovoltaic system," *International Journal of Photoenergy*, vol. 2012, pp. 1-13, 2012—incorporated herein by reference), and Fuzzy Logic as described in Alajmi et al., ("Fuzzy-Logic-Control Approach of a Modified Hill-Climbing Method for Maximum Power Point in Microgrid Standalone Photovoltaic system," *IEEE Transactions on Power Electronics*, vol. 26, no. 4, pp. 1022-1030, April 2011—incorporated herein by reference) have been implemented to prevail over these problems as they have the ability to deal with non-linear objective functions. The Evolutionary programming techniques like tabu search, differential evolution, evolutionary programming, particle swarm optimization and genetic algorithm have been implemented in Ishaque et al., ("Maximum Power Point Tracking for PV system under partial shading condition via particle swarm optimization," in 2011 *IEEE Applied Power Electronics Colloquium (IAPEC)*, 2011, vol. 2, no. 2, pp. 5-9—incorporated herein by reference), Zheng et al., ("A maximum power point tracking method based on tabu search for PV systems under partially shaded conditions," in *IET Conference on Renewable Power Generation (RPG 2011)*, 2011, pp. 52-52—incorporated herein by reference), Taheri et al., ("A novel Maximum Power Point tracking control of photovoltaic system under partial and rapidly fluctuating shadow conditions using Differential Evolution," in 2010 *IEEE Symposium on Industrial Electronics and Applications (ISIEA)*, 2010, no. Isiea, pp. 82-87—incorporated herein by reference), Kaliamoorthy et al., ("A novel MPPT scheme for solar powered boost inverter using evolutionary programming," in 2011 *International conference on recent advancement in electrical, electronics and control enginering.*, 2011, pp. 346-351—incorporated herein by reference), Ishaque et al., ("Maximum Power Point Tracking for PV system under partial shading condition via particle swarm optimization," in 2011 *IEEE Applied Power Electronics Colloquium (IAPEC)*, 2011, vol. 2, no. 2, pp. 5-9—incorporated herein by reference), Ramaprabha et al., ("Maximum power point tracking using GA-optimized artificial neural network for Solar PV system," in 2011 *1st International Conference on Electrical Energy Systems*, 2011, no. 1, pp. 264-268—incorporated herein by reference), Ngan et al., ("Multiple Peaks Tracking Algorithm using Particle Swarm Optimization Incorporated with Artificial Neural Network," in *World Academy of Science, Engineering and Technology*, 2011, pp. 379-385—incorporated herein by reference) and Liu et al., ("A Variable Step Size INC MPPT Method for PV Systems," *IEEE Transactions on Industrial Electronics*, vol. 55, no. 7, pp. 2622-2628, July 2008—incorporated herein by reference). Results show that the use of these techniques along with the conventional methods improves the dynamic and steady state response of the MPPT controllers. The use of artificial neural network (ANN) technique for the MPPT controller design is given in Ramaprabha et al., ("Maximum power point tracking using GA-optimized artificial neural network for Solar PV system," in 2011 *1st International Conference on Electrical Energy Systems*, 2011, no. 1, pp. 264-268—incorporated herein by reference) and, Premrudeepreechacharn et al., ("Solar-array modelling and maximum power point tracking using neural networks," in 2003 *IEEE Bologna Power Tech Conference Proceedings*, 2003, vol. 2, pp. 419-423—incorporated herein by reference), Chao et al., ("An extension neural network based incremental MPPT method for a PV system," in 2011 *International Conference on Machine Learning and Cybernetics*, 2011, pp. 654-660—incorporated herein by reference), and Tsai et al., ("A novel MPPT control design for PV modules using neural network compensator," in 2012 *IEEE International Symposium on Industrial Electronics*, 2012, pp. 1742-1747—incorporated herein by reference). Results and comparison demonstrated by the authors showed that ANN based MPPT controller has much better tracking than other MPPT algorithms as described in Reza Reisi et al., ("Classification and comparison of maximum power point tracking techniques for photovoltaic system: A review," *Renewable and Sustainable Energy Reviews*, vol. 19, pp. 433-443, March 2013—incorporated herein by reference). ANN can map the input output nonlinear functions but it does not have heuristic nature and work as a black box that restricts its use in MPPT design. The fuzzy-inference system (FIS) based MPPT has been proposed in Alajmi et al., ("Fuzzy-Logic-Control Approach of a Modified Hill-Climbing Method for Maximum Power Point in Microgrid Standalone Photovoltaic system," *IEEE Transactions on Power Electronics*, vol. 26, no. 4, pp. 1022-1030, April 2011—incorporated herein by reference), Won et al., ("A new maximum power point tracker of photovoltaic arrays using fuzzy controller," in *Proceedings of 1994 Power Electronics Specialist Conference—PESC'94*, 1994, pp. 396-403—incorporated herein by reference), El Khateb et al., ("Fuzzy logic controller based SEPIC converter of maximum power point tracking," in 2012 *IEEE Industry Applications Society Annual Meeting*, 2012, pp. 1-9—incorporated herein by reference), Moreno et al., ("A fuzzy logic controller for stand alone PV systems," in *Conference Record of the Twenty-Eighth IEEE Photovoltaic Specialists Conference—2000 (Cat. No. 00CH37036)*, 2000, pp. 1618-1621—incorporated herein by reference), Godoy Simões et al., ("Fuzzy optimisation-based control of a solar array system," *IEE Proceedings—Electric Power Applications*, vol. 146, no. 5, p. 552, 1999—incorporated herein by reference), Patcharaprakiti et al., ("Maximum power point tracking using adaptive fuzzy logic control for grid-connected photovoltaic system," in 2002 *IEEE Power Engineering Society Winter Meeting. Conference Proceedings (Cat. No. 02CH37309)*, 2002, vol. 1, pp. 372-377—incorporated herein by reference), Cheng et al., ("FPGA-based PV systems fuzzy MPPT control algorithm," in 2010 *Seventh International Conference on Fuzzy Systems and Knowledge Discovery*, 2010, no. Fskd, pp. 1244-1248—incorporated herein by reference), Alajmi et al., ("A Maximum Power Point Tracking Technique for Partially Shaded Photovoltaic systems in Microgrids," *IEEE Transactions on Industrial Electronics*, vol. 60, no. 4, pp. 1596-1606, April 2013—incorporated herein by reference) and Kottas et al., ("New Maximum Power Point Tracker for PV Arrays Using Fuzzy Controller in Close Cooperation With Fuzzy Cognitive Networks," *IEEE Transactions on Energy Conversion*, vol. 21, no. 3, pp. 793-803, September 2006—incorporated herein by reference). Almost all proposed FIS in the literature have the same output that is change in duty cycle (dD), but they differ in their input variables, linguistic rules and membership functions. Most of the FIS based MPP controllers have error and change in error as input variables. Basically this error and change in error represent the slope and change in slope of the P-V curve. The problem with such inputs is that, as the duty cycle is not considered as input, operating point moves away from the original MPP in the varying atmospheric condition as described in Won et al., ("A new maximum power point tracker of photovoltaic arrays using fuzzy controller," in *Proceedings of 1994 Power Electronics Specialist Conference—PESC'94*, 1994, pp. 396-403—incorporated herein by reference).

In Godoy Simões et al., ("Fuzzy optimisation-based control of a solar array system," *IEE Proceedings—Electric Power Applications*, vol. 146, no. 5, p. 552, 1999—incorporated herein by reference), a fuzzy controller is presented with the inputs of array power variation and duty cycle. The dynamic behavior is improved in changing ambient conditions but this method added the steady state oscillation in the PV output which causes the power loss. Fuzzy cognitive networks are used in Kottas et al., ("New Maximum Power Point Tracker for PV Arrays Using Fuzzy Controller in Close Cooperation With Fuzzy Cognitive Networks," *IEEE Transactions on Energy Conversion*, vol. 21, no. 3, pp. 793-803, September 2006—incorporated herein by reference) to improve the efficiency of the fuzzy-based MPP tracker but it added complexity in the hardware design. In Alajmi et al., ("Fuzzy-Logic-Control Approach of a Modified Hill-Climbing Method for Maximum Power Point in Microgrid Standalone Photovoltaic system," *IEEE Transactions on Power Electronics*, vol. 26, no. 4, pp. 1022-1030, April 2011—incorporated herein by reference) and Alajmi et al., ("A Maximum Power Point Tracking Technique for Partially Shaded Photovoltaic systems in Microgrids," *IEEE Transactions on Industrial Electronics*, vol. 60, no. 4, pp. 1596-1606, April 2013—incorporated herein by reference) drawbacks of Hill Climbing method have been discussed in detail and improvement in the conventional Hill climbing method is demonstrated by fuzzifying its rules. In Letting et al., ("Particle swarm optimized T-S fuzzy logic controller for maximum power point tracking in a photovoltaic system," in 2010 *Conference Proceedings IPEC*, 2010, pp. 89-94—incorporated herein by reference), Khaehintung et al., ("A novel fuzzy logic control technique tuned by particle swarm optimization for maximum power point tracking for a photovoltaic system using a current-mode boost converter with bifurcation control," *International Journal of Control, Automation and Systems*, vol. 8, no. 2, pp. 289-300, April 2010—incorporated herein by reference) and Messai girou et al., ("Maximum power point tracking using a GA optimized fuzzy logic controller and its FPGA implementation," *Solar Energy*, vol. 85, no. 2, pp. 265-277, February 2011—incorporated herein by reference), Fuzzy Logic based MPPT controller optimized by evolutionary programming techniques are proposed. These techniques are used to optimize the membership function values of FIS MPPT with the objective function to minimize the tracking speed and reduce steady state oscillations.

FIS has two major advantages one is that it allows setting the fuzzy rules that are quite close to the real world processes and the other is their interpretability, i.e it can explain the reason of particular output occurrence. On the other hand it has some inadequacies like it requires expert knowledge in defining the fuzzy rule base and requires lot of effort and time in tuning the membership function parameters. While in the case of ANN situation is completely converse, it can be trained but cannot give details about the performance of a system for an output and act as a black box. Combining FIS with ANN results in a powerful AI technique known as Adaptive Network-Based Fuzzy Inference System (ANFIS) in Jang, ("ANFIS: adaptive-network-based fuzzy inference system," *IEEE Transactions on Systems, Man, and Cybernetics*, vol. 23, no. 3, pp. 665-685, 1993—incorporated herein by reference) and Jang, ("Neuro-fuzzy modeling and control," *Proceedings of the IEEE*, vol. 83, no. 3, pp. 378-406, March 1995—incorporated herein by reference).

To build ANFIS-based MPPT controller major challenge lies in gathering a large amount of training data. In Aldobhani et al., ("Maximum Power Point Tracking of PV System Using ANFIS Prediction and Fuzzy Logic Tracking," in *International MultiConference of Engineers and Computer Scientists (IMECS)*, 2008, vol. II, pp. 19-21—incorporated herein by reference) authors have used the actual field data for training of ANFIS-based MPPT and show that it has better performance than the conventional methods. But several problems are associated with the practical data, i.e it does not cover a wide dynamic range, only appropriate for a particular geographical location and a time consuming task as large amount of data is required for better performance of ANFIS. In Ref. Aldobhani et al., ("Maximum Power Point Tracking of PV System Using ANFIS Prediction and Fuzzy Logic Tracking," in *International MultiConference of Engineers and Computer Scientists (IMECS)*, 2008, vol. II, pp. 19-21—incorporated herein by reference), ANFIS inputs are open circuit voltage ($V_{OC}$) and short circuit current ($I_{SC}$) of the PV at certain operating condition and these values are calculated depending upon environmental conditions while in the proposed MPPT controller irradiation and temperature are taken as inputs whose values can directly be taken from the sensors.

On the other hand, easy and better way of getting training data is by simulation of PV model and as utilized in Mayssa et al., ("Advanced ANFIS-MPPT control algorithm for sunshine photovoltaic pumping systems," in 2012 *First International Conference on Renewable Energies and Vehicular Technology*, 2012, pp. 167-172—incorporated herein by reference) and H. Abu-Rub, A. Iqbal, S. Moin Ahmed, F. Z. Peng, Y. Li, and G. Baoming et al., ("Quasi-Z-Source Inverter-Based Photovoltaic Generation System With Maximum Power Tracking Control Using ANFIS," *IEEE Transactions on Sustainable Energy*, vol. 4, no. 1, pp. 11-20, January 2013—incorporated herein by reference). In Mayssa et al., ("Advanced ANFIS-MPPT control algorithm for sunshine photovoltaic pumping systems," in 2012 *First International Conference on Renewable Energies and Vehicular Technology*, 2012, pp. 167-172—incorporated herein by reference) effectiveness of PV model used to generate training data is not discussed, hence raising a concern about the incompetency of training data and so the MPPT controller. In this study, an accurate input-output data set is used for the training of the ANFIS-based MPPT controller. An accurate training data is gathered from the simulation studies using the developed PV model. This results in an efficient, simple structure of MPPT controller. In H. Abu-Rub, A. Iqbal, S. Moin Ahmed, F. Z. Peng, Y. Li, and G. Baoming et al., ("Quasi-Z-Source Inverter-Based Photovoltaic Generation System With Maximum Power Tracking Control Using ANFIS," *IEEE Transactions on Sustainable Energy*, vol. 4, no. 1, pp. 11-20, January 2013—incorporated herein by reference), working of ANFIS-based MPPT is shown in single-stage topology of power converter (with the inverter only). Unlike in H. Abu-Rub, A. Iqbal, S. Moin Ahmed, F. Z. Peng, Y. Li, and G. Baoming et al., ("Quasi-Z-Source Inverter-Based Photovoltaic Generation System With Maximum Power Tracking Control Using ANFIS," *IEEE Transactions on Sustainable Energy*, vol. 4, no. 1, pp. 11-20, January 2013—incorporated herein by reference), two-stage topology is used that provide the flexibility in designing the control architecture since it has more control variables and multiple control objectives can be achieved like MPPT, VAR compensating, active filtering etc. Two-stage scheme also offer further advantage by providing the constant dc-link voltage to the inverter which will be beneficial especially in the case of temperature variations (as temperature change effects on the PV output voltage considerably). Additionally, a novel experimental verification of the proposed ANFIS-based MPPT controller is shown by interfacing the RTDS and dSPACE controller.

The main objective in modeling the Photovoltaic (PV) is that the model is able to regenerate the output characteristics of the PV panel at different ambient condition with high precision. Several PV electrical models have been proposed and developed by researchers including the models that are based on the simple idealized model and the models that replicate the actual physics of the PV cell as described in Duffie et al., ("*Solar Engineering of Thermal Processes*, 3rd ed. 2006—incorporated herein by reference). Some of these models are described vaguely and some of them are too complex for power system studies like load flow, maximum power point tracking, load frequency match etc. These models also have implementation issues on several software packages. Electrical characteristics of the PV panel can be modeled by representing it with equivalent electrical circuit. This model has the advantage over other models due to its electric circuit nature and behavior of the PV array can easily be understood in the circuit connected. Power electronics design engineers require an efficient PV panel model for the simulation study of the power electronics before any experimental verification. This model is best suited for the dynamic and transient study of the power electronics converters.

A generalized PV array model simulator is proposed and developed in the MATLAB/Simulink. The simulator is designed based on the five parameters equivalent electric circuit model. The major challenge in the implementation of this model lies in the estimation of the model parameters. The exact values of these parameters are required to regenerate the output characteristics of PV panel accurately. An efficient approach is introduced to identify the values of five electrical model parameters at Standard Test Condition (STC) by converting the estimation problem into optimization problem and using the Differential Evolution (DE) as an efficient optimizing technique. The proposed estimation approach does not require any experimental data as required by other methods Ikegami et al., ("Estimation of equivalent circuit parameters of PV module and its application to optimal operation of PV system," *Solar Energy Materials and Solar Cells*, vol. 67, no. 1-4, pp. 389-395, March 2001—incorporated herein by reference) and Kim et al., ("A novel parameter extraction method for the one-diode solar cell model," *Solar Energy*, vol. 84, no. 6, pp. 1008-1019, June 2010—incorporated herein by reference) and can work only with the data provided by the manufacturer. These estimated parameters are utilized to design an efficient PV array simulator. The simulator is designed as a masked block and allows the user to enter the desired number of PV panels connected in series and parallel to have prescribed power output. The effectiveness of the developed simulator is investigated under different operating conditions including harsh partial shaded condition. Results show that the proposed model can regenerate the I-V curves at STC as well as at other operating condition with acceptable errors. Furthermore, the robustness of the proposed simulator is analyzed in conjunction with the DC-DC converter and MPPT controller. It is envisaged that the developed PV array simulator can be very helpful for the power system design engineers in the simulation study of the power systems before any experimental verification.

Commercially available PV devices are in the form of PV panels consist of series connected PV cells. Maximum output power of a single PV panel is in the range of tens of watts to some hundreds of watts that would be acceptable for the small scale applications. But for large scale applications, such as PV power stations, series and parallel combinations of these panels are needed to enhance the required PV output power. Connecting the PV panels in series increases the current capability of PV source and parallel connection increases the voltage rating of PV source. This series/parallel combination of PV panels is commonly known as PV array. Considering the importance of PV panel as a basic unit of PV array the model of the PV panel is developed which is then modified to stand for a complete PV array.

The five parameters electric circuit model of PV device is used and shown FIG. 4(c) 420 as described in Duffie et al., ("*Solar Engineering of Thermal Processes*, 3rd ed. 2006—incorporated herein by reference) and Nelson, ("*The Physics of Solar Cells*. London: Imperial College Press, London, 2003—incorporated herein by reference). It consists of light dependent current source, a p-n junction diode and two resistances one in series and the other in parallel. The current source ($I_L$) represents charge carrier generation in the semiconductor caused by incident radiation. The shunt diode represents recombination of these charge carriers at a high forward-bias voltage (V+I*Rs). The shunt resistor ($R_{SH}$) signifies high-current paths through the semiconductor along mechanical defects and material dislocations as described in Stutenbaeumer et al., ("Equivalent model of monocrystalline, polycrystalline and amorphous silicon solar cells," *Renewable Energy*, vol. 18, no. 4, pp. 501-512, December 1999—incorporated herein by reference).

A complete I-V characteristics of a PV panel can be calculated by equation (1)-(5):

$$I = I_L - I_D - I_{SH} \tag{1}$$

$$I_D = I_0 \left\{ \exp\left[\frac{(V + IR_S)}{a}\right] - 1 \right\} \tag{2}$$

$$I_{SH} = \frac{V + IR_S}{R_{SH}} \tag{3}$$

$$a = \frac{N_s nkT}{q} \tag{4}$$

$$I = I_L - I_0 \left\{ \exp\left[\frac{(V + IR_S)}{a}\right] - 1 \right\} - \frac{V + IR_S}{R_{SH}} \tag{5}$$

Where I and V represent the current and voltage generated from the PV panel. $I_L$ is the light generated current, $I_D$ is the diode current and $I_{SH}$ depicts is the shunt branch current, respectively $I_0$ is the diode saturation current, $R_S$ and $R_{SH}$ are the series and parallel resistance, $N_S$ is the number of cells in the PV panel, n is the ideality factor (it has a value between 1 to 2 for real diode), k is the Boltzmann's constant, T is the cell temperature and q is the electronic charge respectively.

Equation (5) shows the I-V characteristics of a PV device and governed by five parameters (IL, I0, RS, RSH and "a"). Modeling of the PV device is quite complex because of the transcendental non-linear characteristics of equation 5. The unknown values of these parameters and their dependence on the operating condition (temperature and irradiation) add more complexity in the modeling. Data usually supplied by the manufacturer is the values of I-V pair at short-circuit condition (SC), open-circuit conditions (OC) and maximum power conditions (MP) at STC (1000 W/m2 and 250 C). I-V characteristic at these key points is given by following equations:

At short circuit condition, voltage becomes zero, V=0 and I=$I_{SC,ref}$ as described in equation (6):

$$I_{SC,ref} = I_{L,ref} - I_{0,ref}\left\{\exp\left[\frac{I_{SC,ref} \cdot R_{S,ref}}{a_{ref}}\right] - 1\right\} - \frac{I_{SC,ref} \cdot R_{S,ref}}{R_{SH,ref}} \quad (6)$$

At open circuit condition, current becomes zero, I=0 and V=$V_{OC,ref}$ as described in equation (7):

$$I_{L,ref} = I_{0,ref}\left\{\exp\left[\frac{V_{OC,ref}}{a_{ref}}\right] - 1\right\} + \frac{V_{OC,ref}}{R_{SH,ref}} \quad (7)$$

At maximum power condition, V=$V_{MP,ref}$ and I=$I_{MP,ref}$ as described in equation (8):

$$I_{MP,ref} = I_{L,ref} - I_{0,ref}\left\{\exp\left[\frac{V_{MP,ref} + I_{MP,ref} \cdot R_{S,ref}}{a_{ref}}\right] - 1\right\} - \frac{V_{MP,ref} + I_{MP,ref} \cdot R_{S,ref}}{R_{SH,ref}} \quad (8)$$

Having the five parameters ($I_L$, $I_0$, $R_S$, $R_{SH}$, "a") known, Equation 5 can be solved. With different atmospheric conditions, these parameters have different values that can be calculated at any ambient condition using equations (9)-(14) assuming their values at STC are known.

$$a = a_{ref}\left(\frac{T_c}{T_{c,ref}}\right) \quad (9)$$

$$I_L = \frac{S}{S_{ref}}[I_{L,ref} + \mu_{I,sc}(T_c - T_{c,ref})] \quad (10)$$

$$R_{SH} = R_{SH,ref}\frac{S_{ref}}{S} \quad (11)$$

$$R_S = R_{S,ref} \quad (12)$$

$$\frac{I_0}{I_{0,ref}} = \left(\frac{T_c}{T_{c,ref}}\right)^3 \exp\left(\left(\frac{N_s * T_{ref}}{a_{ref}}\right) * \left(\frac{E_{g,ref}}{T_{ref}} - \frac{E_g}{T}\right)\right) \quad (13)$$

$$\frac{E_g}{E_{g,ref}} = 1 - C(T - T_{ref}) \quad (14)$$

Where S and Tc represent the solar radiation and temperature of the PV panel, $\mu_{I,sc}$ and NS are the coefficient of short circuit current and number of cells in the panel, respectively (both of these quantities is provided by the manufacturer), Eg is the band-gap energy of the PV cell material and C=0.0003174 as described in Soto et al., "Improvement and validation of a model for photovoltaic array performance," *Solar Energy*, vol. 80, no. 1, pp. 78-88, January 2006— incorporated herein by reference). Quantities with the subscript "ref" represent their values at the STC.

As discussed earlier PV panels can be grouped in different modes to form PV arrays. Some topologies are series array (panels are connected in series), parallel array (panels are connected in parallel), series-parallel (SP) array (panels are connected in both series and parallel) and total cross tied (TCT) array. Among these topologies SP array is most commonly used because of its flexibility in maintaining the required output voltage and current and better performance in the partial shaded conditions as described in Ramaprabha et al., ("A Comprehensive Review and Analysis of Solar Photovoltaic Array Configurations under Partial Shaded Conditions," *International Journal of Photoenergy*, vol. 2012, pp. 1-16, 2012—incorporated herein by reference). Equation 5 can be modified to represent the I-V relationship of SP array as equation (15):

$$I = N_{pp} * I_L - N_{pp} * I_0\left\{\exp\left[\frac{(V + IR_S * \mathbb{N})}{N_{ss} * a}\right] - 1\right\} - \left(\frac{V + IR_S * \mathbb{N}}{R_{SH} * \mathbb{N}}\right) \quad (15)$$

$$\mathbb{N} = \frac{N_{ss}}{N_{pp}} \quad (16)$$

Figure 5:
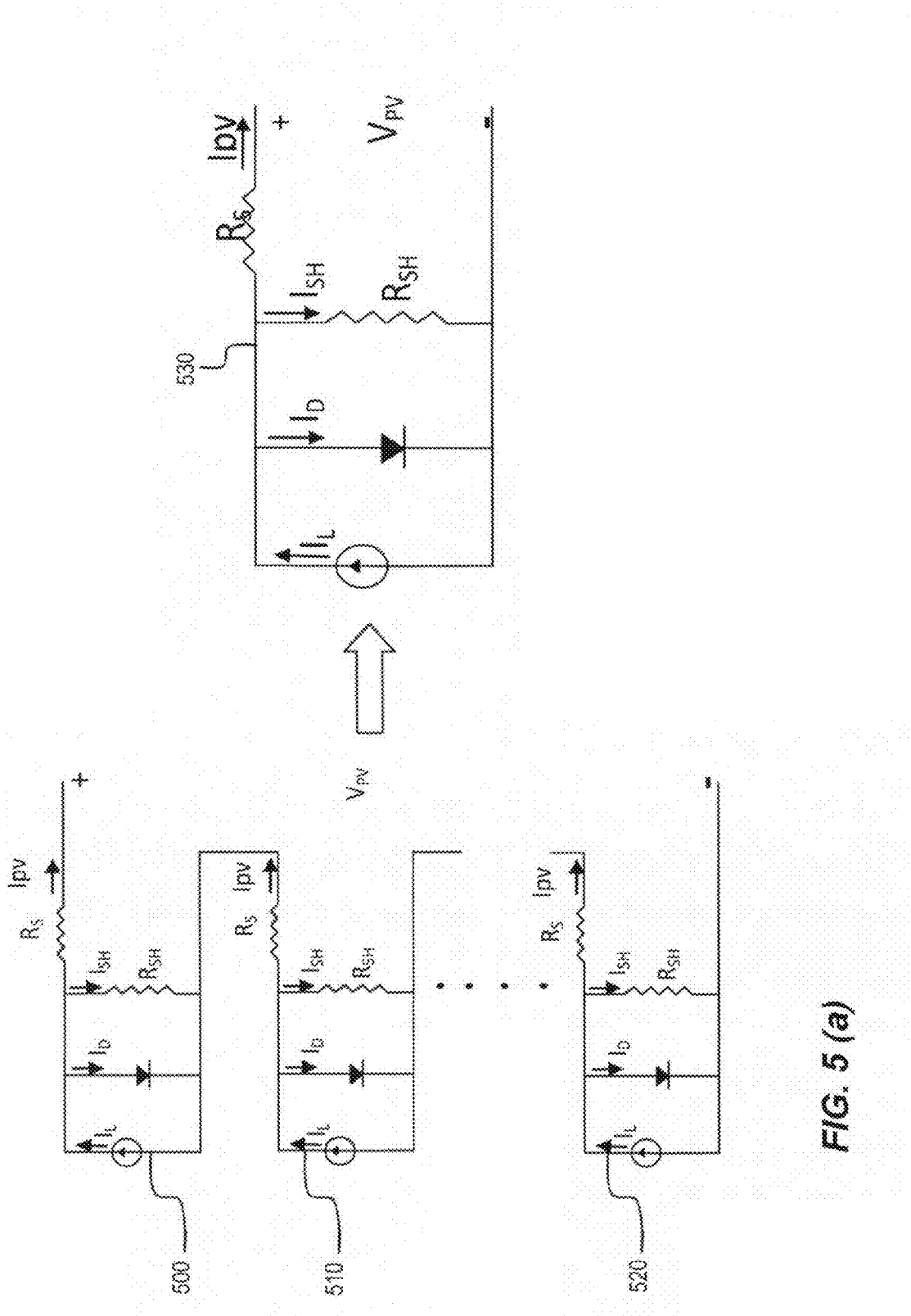
FIG. 5(a) shows a schematic diagram of a plurality of panels connected in series in an array.
FIG. 5(b) shows a schematic diagram of a plurality of panels connected in parallel in an array.
Figure 5:
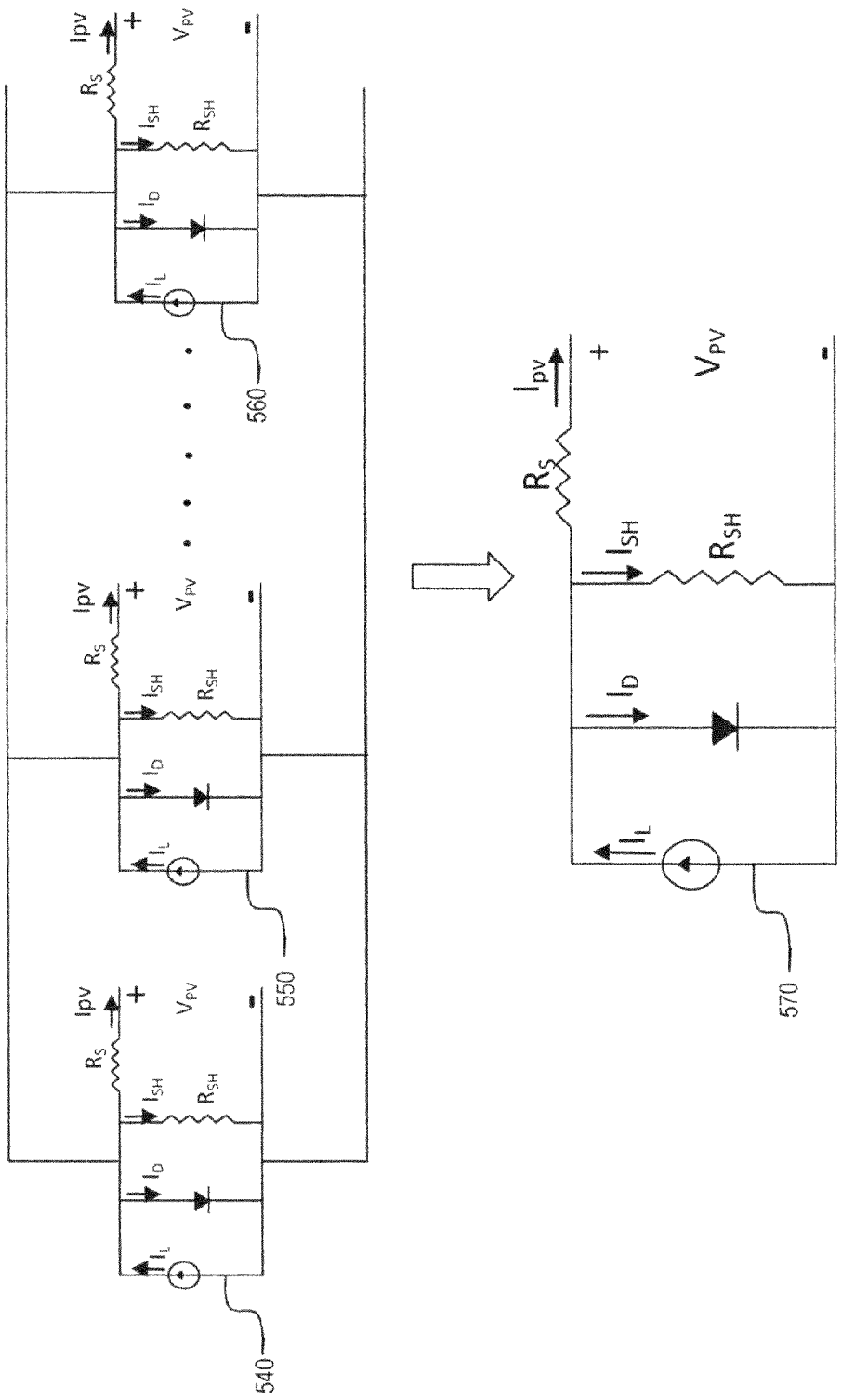

Where, $N_{SS}$ and $N_{PP}$ represent the number of panels connected in series and parallel, respectively. It can be noticed in equation (15) that $N_{PP}$ is multiplied with the current associated terms to enhance the current output of PV system and similarly $N_{SS}$ is multiplied with voltage related terms increase to voltage output of PV panel A theoretical illustration of a series connection and parallel connection of PV panels is shown in FIG. 5, respectively. These figures depicts that the circuit elements of combined panels can be merged together to form a single equivalent model that is similar to circuit of one PV panel as described in Chatterjee et al., ("Identification of Photovoltaic Source Models," *IEEE Transactions on Energy Conversion*, vol. 26, no. 3, pp. 883-889, September 2011— incorporated herein by reference). But the values of the parameters will transform depending upon the number of panels coupled in series and parallel. Expressions for the array parameters in relation with the panel parameters are shown in Table 1.

TABLE 1

| Panel parameter | Modified array parameters | PV Model parameter | Modified array parameters |
|---|---|---|---|
| $V_{OC}$ | $V_{OC} * N_{SS}$ | $I_L$ | $I_L * N_{PP}$ |
| $I_{SC}$ | $I_{SC} * N_{PP}$ | $I_0$ | $I_0 * N_{PP}$ |
| $V_{MP}$ | $V_{MP} * N_{SS}$ | $R_S$ | $R_S * (N_{SS}/N_{PP})$ |
| $I_{MP}$ | $I_{MP} * N_{PP}$ | $R_{SH}$ | $R_{SH} * (N_{SS}/N_{PP})$ |
| n | n * $N_{SS}$ | a | a * $N_{SS}$ |

FIG. 5(b) is a schematic of a plurality of panels connected in parallel in an array. In FIG. 5, single panel such as 540, 550 and 560 are linked in parallel and merged together as a single parallel mode 570 to increase current rating, the values of $I_{SH}$ (short circuit current), $I_{MP}$ (current at maximum power point), $I_L$ (light generated current) and $I_0$ (diode saturation current) are altered and multiplied with a number of parallel connected panels. The factor "a" (diode ideality factor), $V_{OC}$ (open circuit voltage), $V_{MP}$ (voltage at maximum power point) remains unchanged. While the $R_S$ (series resistance) and $R_{SH}$ (shunt resistance) are get divided by the number of panels connected in parallel.

FIG. 5(a) is a schematic of a plurality of panels connected in series in an array. In FIG. 4 single panel such as 500, 510 and 520 are linked in series and merged together as a single parallel mode 530 to enhance voltage rating, values of $V_{OC}$ (open circuit voltage), $V_{MP}$ (voltage at maximum power point) and factor "a" (diode ideality factor) are get multiplied with the number of series connected panels. Values of $I_{SH}$ (short circuit current), $I_{MP}$ (current at maximum power point), $I_L$ (light generated current) and $I_0$ (dark saturation current) remain unaltered and $R_S$ (series resistance) and $R_{SH}$ (shunt resistance) are get multiplied by the number of series connected panels.

The effect of each of the five parameters on the behavior of the I-V curve is shown in FIGS. 6(a), (b), (c), (d), (e) and (f). FIG. 6(a) shows a I-V curve 600 and a P-V curve of the five parameters PV device model. FIG. 6(b) shows I-V curves 610 of a parameter "a" effects in the five parameters PV device model. FIG. 6(c) shows I-V curves 620 of a parameter "$I_0$" effects in the five parameters PV device model. FIG. 6(d) shows I-V curves 630 of a parameter "$I_L$" effects in the five parameters PV device model. FIG. 6(e) shows I-V curves 640 of a parameter "$R_S$" effects in the five parameters PV device model. FIG. 6(f) shows I-V curves 650 of a parameter "$R_{SH}$" effects in the five parameters PV device model. The effect is shown for the Copper Indium Diselenide (CIS) solar panel as described in D. L. King et al., ("Photovoltaic module and array performance characterization methods for all system operating conditions," in *AIP Conference Proceedings,* 1997, vol. 394, pp. 347-368—incorporated herein by reference) around the STC condition, although the effect of each parameter on the I-V curve is similar for all panels and operating conditions. The bold I-V curve in each of the following plots is the result of using parameters calculated at STC data while the other two are the result of adjusting one specified parameter above and below the original value. The following figures show that both "a" and "$I_0$" adjust the predicted voltage at all points on the I-V curve and $I_L$ adjusts the predicted current. $R_S$ and $R_{SH}$ have a more localized influence around the maximum power point; $R_S$ adjusts the maximum power voltage and $R_{SH}$ adjusts the maximum power current.

Values of five parameters ($I_L$, $I_0$, $R_S$, $R_{SH}$, "a") are required for the solution of I-V characteristics of PV panel given in equation 5. These parameters have very significant effect on the I-V curve as described in FIG. 6(a), FIG. 6(b), FIG. 6(c), FIG. 6(d), FIG. 6(e) and FIG. 6(f). Mostly, value of one parameter is assumed to be constant and other parameters are calculated based on this assumption as described in Boyd et al., ("Evaluation and Validation of Equivalent Circuit Photovoltaic Solar Cell Performance Models," *Journal of Solar Energy Engineering,* vol. 133, no. 2, p. 021005, 2011—incorporated herein by reference). But for precise PV panel modeling it is imperative to calculate their values simultaneously. In this embodiment, DE is utilized as an efficient optimization technique to identify the values of these parameters. Unlike the reported methods that need the PV panel experimental data, the proposed scheme requires only the data supplied in the manufacturer provided catalogues. This data gives the values of I-V pair at short-circuit condition (SC), open-circuit conditions (OC) and maximum power conditions (MP) at STC (1000 W/m² and 25° C.). FIG. 6(a) shows these points on the typical I-V and P-V curve. The aim of the study is to use only the values of these points in estimating the parameters that can redraw the I-V and P-V curves of PV panels with high precision.

Similar to other optimizing techniques, DE optimization requires an objective function that needs to be minimized or maximized. An appropriate objective function is needed for this purpose that should be dependent on the optimizing parameters ($I_L$, $I_0$, $R_S$, $R_{SH}$, "a"). Objective function used in this work is based on the error calculation and given by the following equation $$J = Error_{MPP}^{V,I,P} + Error_{OC\,and\,SC}^{V,I} \qquad (17)$$

$$Error_X = \frac{X_{Meas} - X_{Exp}}{X_{Exp}} \qquad (18)$$

Where $V_{MP}$, $I_{MP}$ and $P_{MP}$ represent the voltage, current and power at maximum power point, respectively. $V_{OC}$ and $I_{SC}$ are voltage at open circuit point and current at short circuit point, respectively. Values of these points are given in the PV panel datasheet. $V_{SC}$ and $I_{OC}$ are the voltage at short circuit condition and current at open circuit condition, respectively, having values equal to zero. X represents any of the above mentioned point. $X_{meas}$ is calculated using equation (6)-(8) and $X_{exp}$ is taken from datasheet. Error represents the deviation of the measured value from the experimental value given in the data sheet.

Differential evolution (DE) is population based optimization technique and first introduced in R. Storn et al., ("Differential Evolution—A Simple and Efficient Heuristic for Global Optimization over Continuous Spaces," pp. 341-359, 1997—incorporated herein by reference). It is renowned for its robustness, simplicity, rapid convergence, less control variables and ability to search global optimum regardless of the initial values of parameters. DE is suitable for non-differentiable and nonlinear optimization. Like other evolutionary algorithm and search techniques DE needs to form a population ($G_i$) having a number (NP) of candidate solution, usually called individuals ($X_n^i$), and depending upon the dimension (D) of the problem each individual have control variables, called the optimizing parameters ($x_n$).

$$G^i = [X_1, X_2, X_3, \dots X_{NP}] \qquad (19)$$

$$X_n^i = [x_{n1}, x_{n2}, x_{n3}, \dots x_{nj}] \qquad (20)$$

Where i represents number of generation (iteration) and usually used in a stopping criterion, NP number of individuals or population size, n describes the dimension of the problem.

Figure 7:
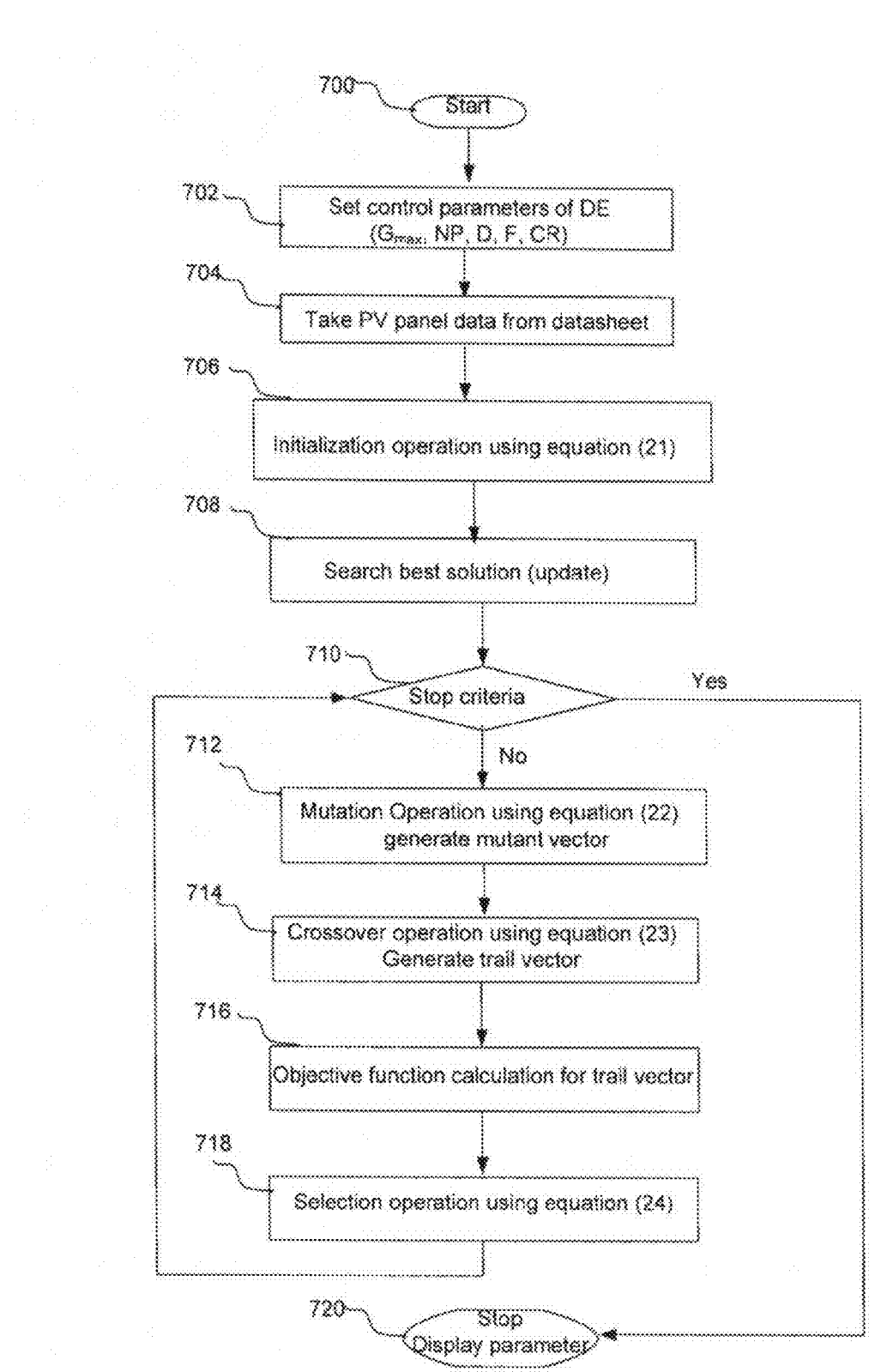
FIG. 7 shows a flow chart for parameter estimation using Differential evolution.

In all search algorithms the key step is to form the trail vector (variant vector) from the parent vector. The stratagem employed by DE to generate a trail vector is based on the difference between randomly chosen individuals. A trail (new) individual is generated for every parent (old) individual using the operation of mutation and crossover. The best individual is selected for the next generation (iteration) by comparing the objective function of old and new individual. DE optimization process has resemblance with the genetic algorithm (GA) with little difference; GA utilizes crossover operation as a search method while DE employs mutation operation as a search mechanism. DE includes following steps:

FIG. 7 is a flow chart for parameter estimation using Differential evolution. The initialization is described from step 700 to 706. At first, DE needs to initialize its following control parameters at step 702:

$G_{max}$, number of generation (iteration) usually used as a stopping criterion.

NP, population size (number of candidate solution)

D, problem dimension, number of control variables (optimizing parameters)

$x_{j,min}$ and $x_{j,max}$, lower and upper bound of control variable j.

F, mutation factor, range [0, 1]

CR, cross over rate, range [0, 1]

At step 704, it takes PV panel data from the datasheet. It starts the optimization process by generating initial population 706 containing the NP candidate solution, each having D number control variables. Values of these variables are selected randomly using their minimum ($x_{min}$) and maximum limits ($x_{max}$) by following equation:

$$x_{ij} = x_{j,min} + \text{rand}*(x_{j,max} - x_{j,min}) \quad (21)$$

Where i=1, 2 . . . , NP and j=1, 2 . . . D.

After initialization, the objective function value of all individuals is calculated and evaluated to get the best solution (individual) at step 708. This best solution is then updated by comparing their value with the next generation best solution to locate the global optima at step 710. If the estimation achieves the best solution, it will stop and display the parameter at step 720. If the estimation does not achieve the best solution, it will continue through steps 712 to 718.

Mutation means a perturbation with a random element. It is a first operation that is utilized to generate a trail (variant) vector and creates a "mutant vector" for all individuals in the current generation at step 712. For every individual of parent vector ($X_i^{(G)}$) in a current generation (G) two individuals ($X_{r1}^{(G)}$, $X_{r2}^{(G)}$) are randomly selected from the population (NP). A mutant vector $V_i^{(G)}$ is then generated by adding a weighted difference of a best vector ($X_{best}^{(G)}$) and a parent vector ($X_i^{(G)}$), and a weighted difference of two randomly selected vectors ($X_{r1}^{(G)}$, $X_{r2}^{(G)}$) with a base individual using the following equation.

$$V_i^{(G)} = X_i^{(G)} + F(X_{best}^{(G)} - X_i^{(G)}) + F(X_{r1}^{(G)} - X_{r2}^{(G)}) \quad (22)$$

Where; F represents the mutation factor having real value between [0, 1] and effect the speed of convergence.

To further improve the diversity and add more perturbation, crossover operation is applied at step 714. In this operation mutant vector ($V_i^{(G)}$) and its parent vector ($X_i^{(G)}$) are combined to form a trial solution ($U_i^{(G)}$). Control variables (optimizing parameters) of both the vectors are mixed in this step based on the crossover factor (CR) to form the trail solution. Crossover process can be specified by following equation (23):

$$U_{j,i}^{(G)} = \begin{cases} V_{j,i}^{(G)}, & \text{if } rand \leq CR \\ X_{j,i}^{(G)}, & \text{otherwise} \end{cases} \quad (23)$$

Where j=[1, 2, . . . D], D is the number of the control variables, CR is the crossover factor having value between [0, 1].

Selection operation is considered to be the last step in the formation of new population which is performed at step 718. In this stage objective function value of generated trail vector is reckoned and comparison is made with the corresponding value of the parent vector. If the individuals of the trail vector have better objective value than the corresponding individuals of parent vector they will replace them, otherwise parent vector will be retained. Selection operation for the minimizing problem can be given by:

$$X_i^{(G+1)} = \begin{cases} U_i^{(G)}, & \text{if } J(U_i^{(G)}) \leq J(X_i^{(G)}) \\ X_i^{(G)}, & \text{otherwise} \end{cases} \quad (24)$$

where, J is the objective function.

As DE is the iteration based technique it needs certain stopping criteria to end the iterative process. Usually a predefined value of maximum number of generation (iteration) or tolerance in the error is used for the purpose. It can be any user defined condition. In this study, stopping criteria is based on objective function value and stops the iteration process when its value remains same for the prescribed number of generations.

Goal of this optimization problem is to identify the optimum values of the five parameters ($I_L$, $I_O$, $R_S$, $R_{SH}$, "a") at STC by minimizing the objective function given in equation (17) which will basically reduce the error at the above mentioned key points. The parameters determined at STC can then be used to calculate the values at other operating conditions using the equations (9)-(14). Flowchart for the proposed parameter estimation method using DE is shown in FIG. 7.

Figure 8:
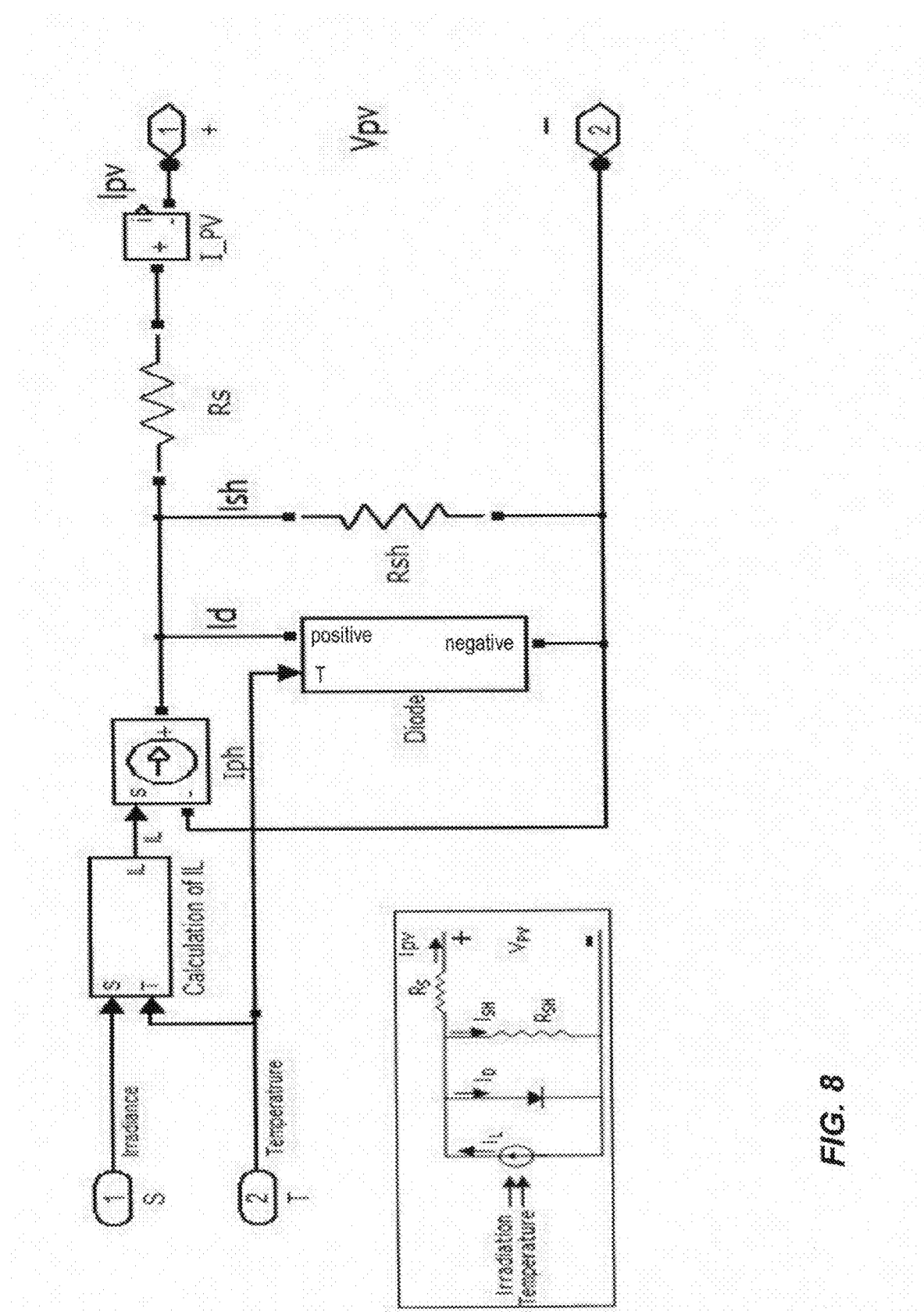
FIG. 8 shows a diagram for implementation of photovoltaic array simulator in Simulink.

A generalized PV array simulator model is implemented in MATLAB/Simulink using equation (1) to equation (14). The inputs to the simulator are irradiation and cell temperature and it is flexible enough to simulate any number of series ($N_{SS}$) and parallel ($N_{PP}$) connected PV panels using only the data provided by the manufacturer. FIG. 3.6 shows the last stage of the modeling and it depicts that the implemented circuit is quite similar to the equivalent circuit of PV array shown in FIG. 8.

Figure 9:
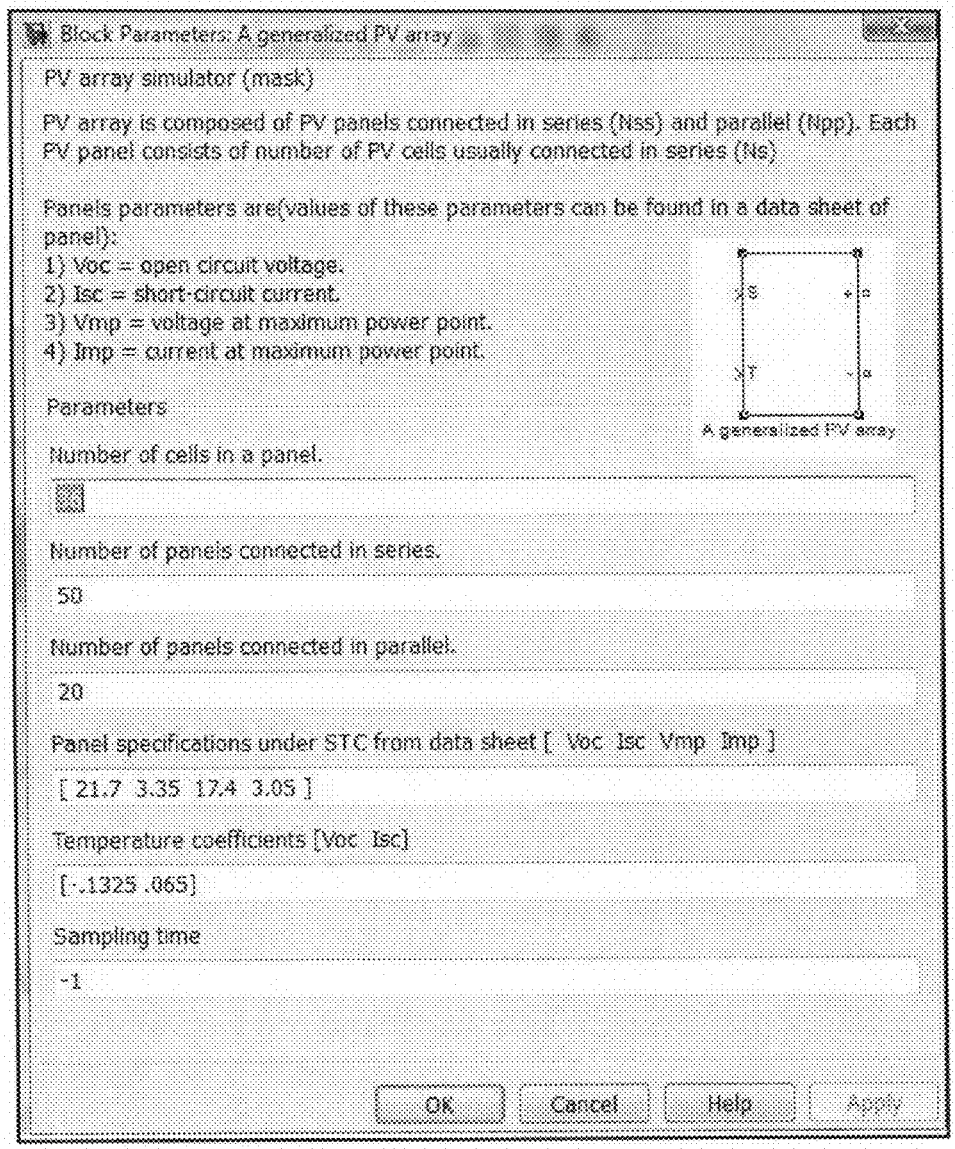
FIG. 9 shows a diagram of block parameters window of photovoltaic array simulator in Simulink.

It consists of light dependent current source, p-n junction diode, series and parallel resistance. This stage contains other sub systems that are connected together to execute I-V characteristics of PV array. These sub systems are not shown for brevity. The PV simulator is implemented as a mask block that prompts the user to enter the necessary parameters of the array to be executed. Parameters required are number of cell in the panel ($N_C$), open circuit voltage ($V_{OC}$), short circuit current ($I_{SH}$), voltage at maximum power point ($V_{MP}$), current at maximum power point ($I_{MP}$), temperature coefficients for voltage and current ($K_V$ and $K_I$), number of series ($N_{SS}$) and parallel ($N_{PP}$) connected panels in an array and the estimated values of the five parameters. A sample of parameter's block of generalized PV array simulator is shown in FIG. 9.

Figure 10:
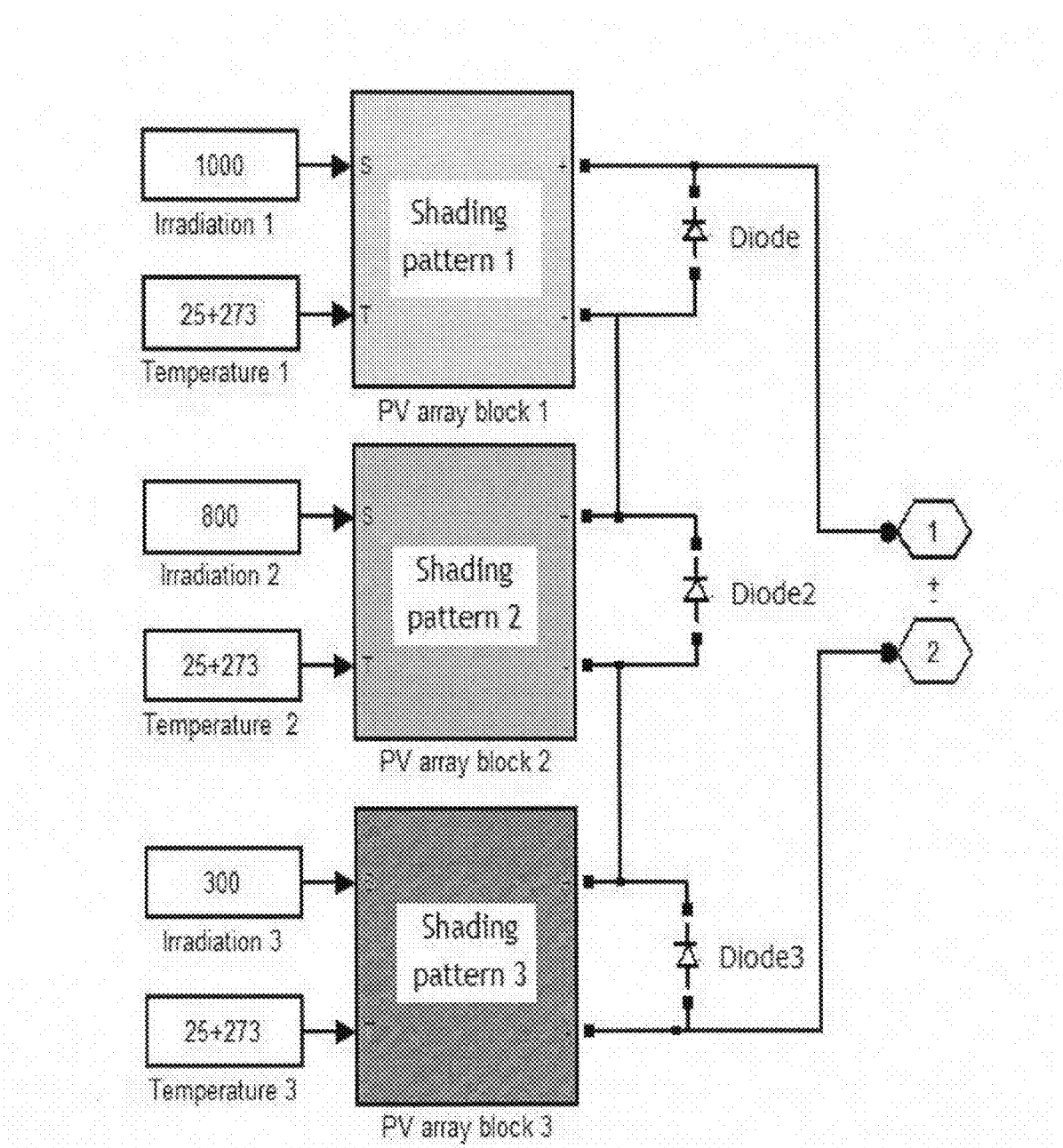
FIG. 10 shows a diagram of partial shaded implementation of photovoltaic array simulator in Simulink.
Figure 11:
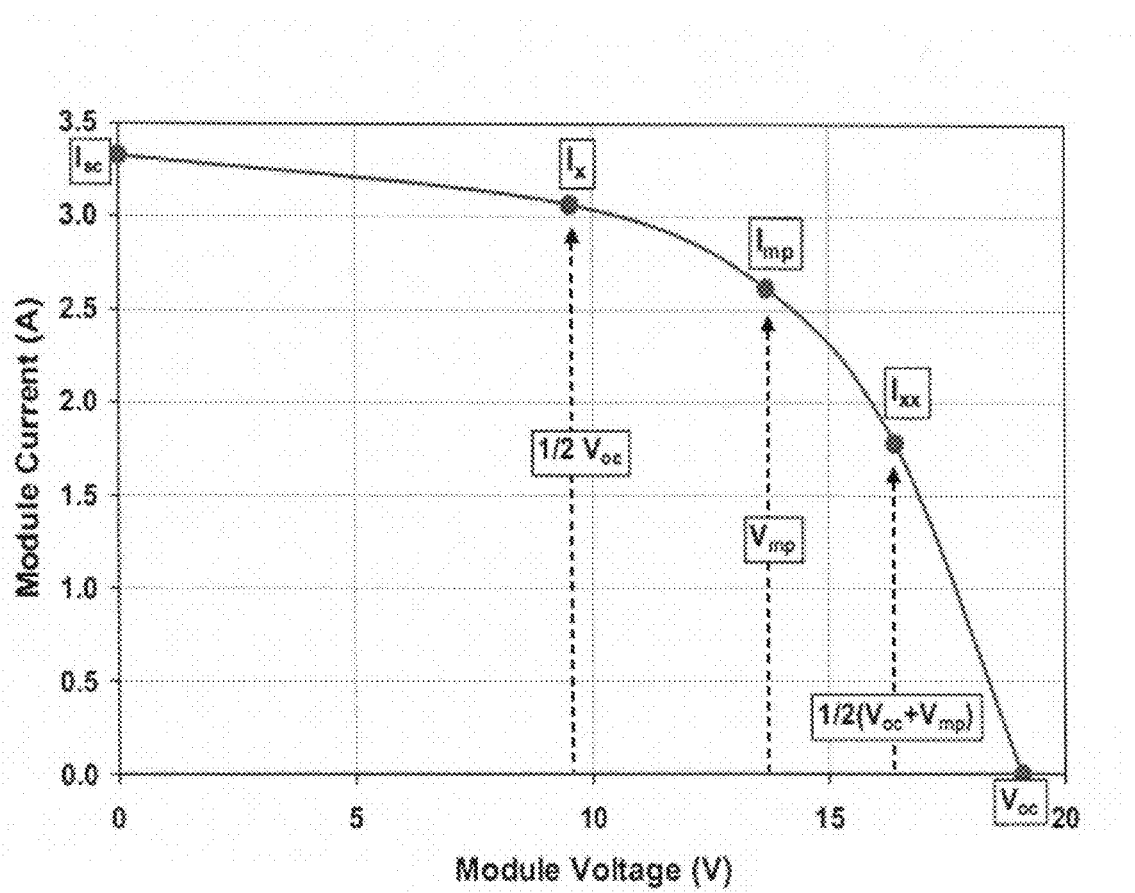
FIG. 11 shows an I-V curve with key points.

FIG. 10 is a diagram of partial shaded implementation of PV array simulator in simulink. The partial shaded condition of PV can be implemented by placing simulator block in series with each other and having an anti-parallel diode connected to each block as shown in FIG. 10. The number of series connected simulator blocks required depend on the number of shaded pattern needs to be executed. For instance FIG. 10 shows three PV array simulator blocks connected in series and can carry out the simulation of three different shading patterns. This generalizes the proposed simulator that can simulate a single PV panel, a group of PV panels connected in series and parallel (PV array) and partially shaded arrays with user defined shading patterns The developed PV simulator is verified through Test 1 to Test 4. Test 1 is to analyze of the proposed parameter estimation method In this test, analysis of the parameter estimation method proposed is carried out. For this purpose, six PV panels of three different technologies, two monocrystalline; two poly-crystalline and two thin-film technologies, are selected. To carry out this test, the I-V curves generated by estimated parameters are compared with the experimental curves given in the datasheet. The efficiency of the determined curves is investigated by measuring the errors between experimental and modeled values at five key points as described in D. L. King et al., ("Photovoltaic module and array performance characterization methods for all system operating conditions," in *AIP Conference Proceedings*, 1997, vol. 394, pp. 347-368—incorporated herein by reference) shown in FIG. 11. FIG. 11 is an I-V curve with key points.

These five key points on the I-V curve are short circuit (SC), open circuit (OC), maximum power point (MPP), point with voltage equal to half the voltage at maximum power point (X) and point with voltage equal to the average of maximum power point voltage and open circuit voltage (XX). Result and analysis show that the proposed method can simulate the output characteristics of all technologies efficiently.

The selected PV channels in this test are Sunpower 230W (mc-Si), Lorentz120W LC120-12P (pc-Si), BP Solar 3230N (pc-Si), Shell ST36 (CIS) and Kaneka U-EA110W (a-Si). Sunpower 230W (mc-Si) The solar panel datasheets Sunpower 230W (mc-Si). The manufacturer provided electrical data for the selected PV panels at STC are incorporated herein by reference.

Values of the five unknown parameters ($I_L$, $I_O$, $R_S$, $R_{SH}$ and "a") are identified using the proposed parameter estimation method for all the selected PV panels and are shown in Table 2. Table 2 is the estimated values of the five parameters at STC using proposed method.

Figure 12:
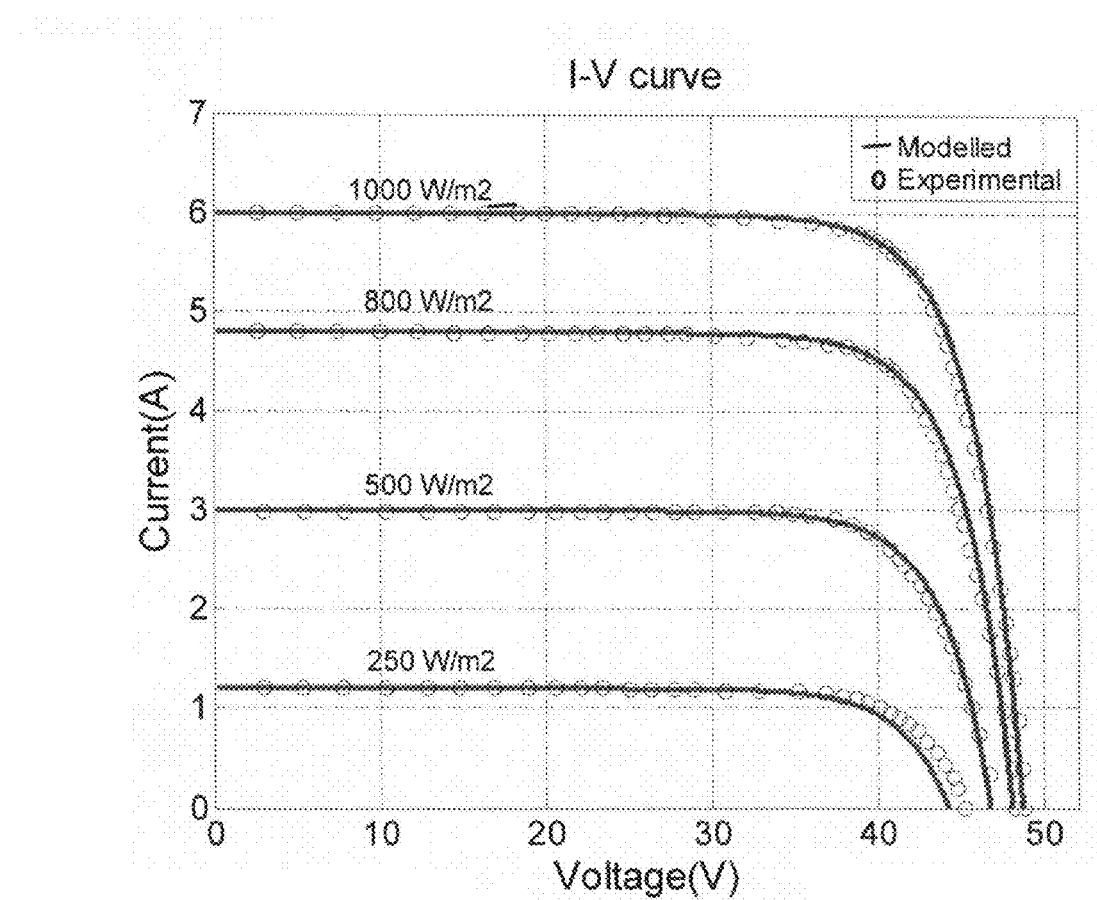
FIG. 12(a) shows I-V characteristics for a mono-crystalline technology (Sunpower 230W) at different irradiation level.
FIG. 12(b) shows I-V characteristics for the mono-crystalline technology (Sunpower 230W) at different temperature.
Figure 12:
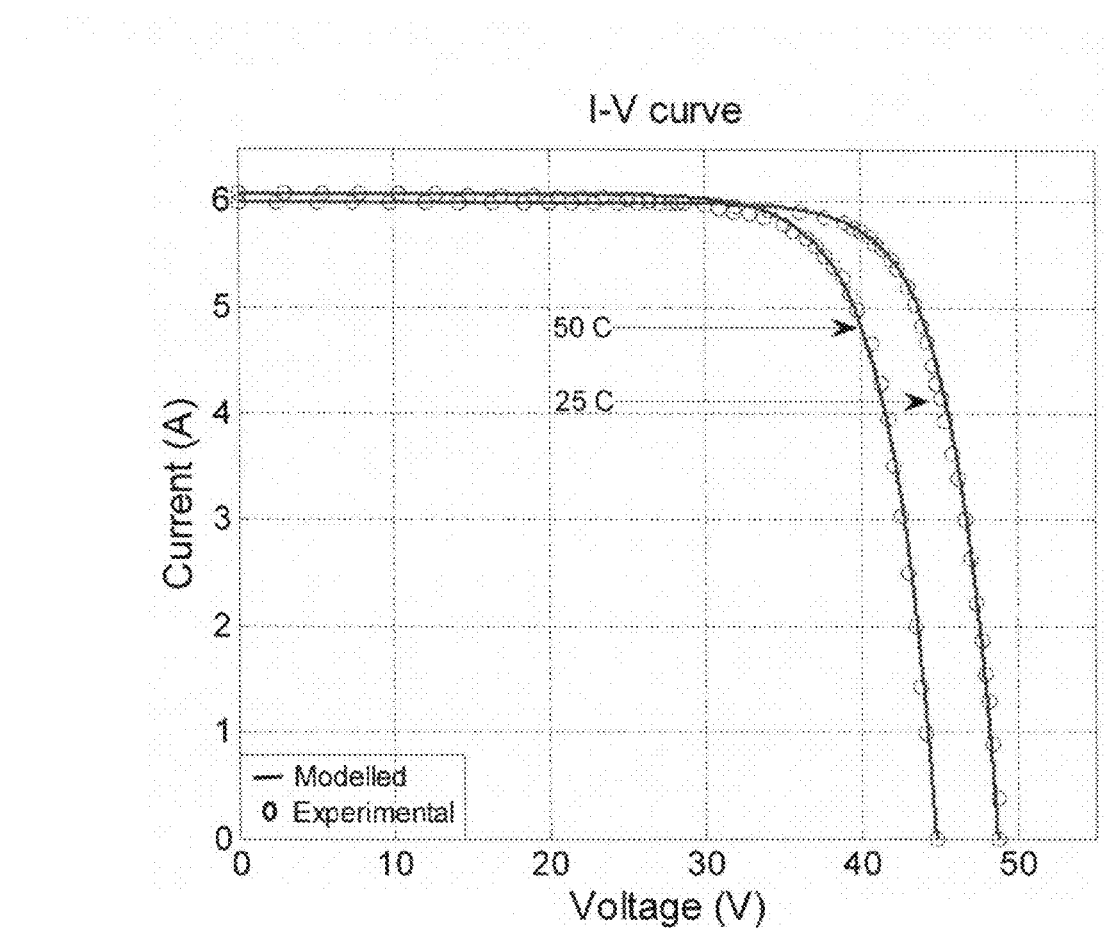
Figure 13:
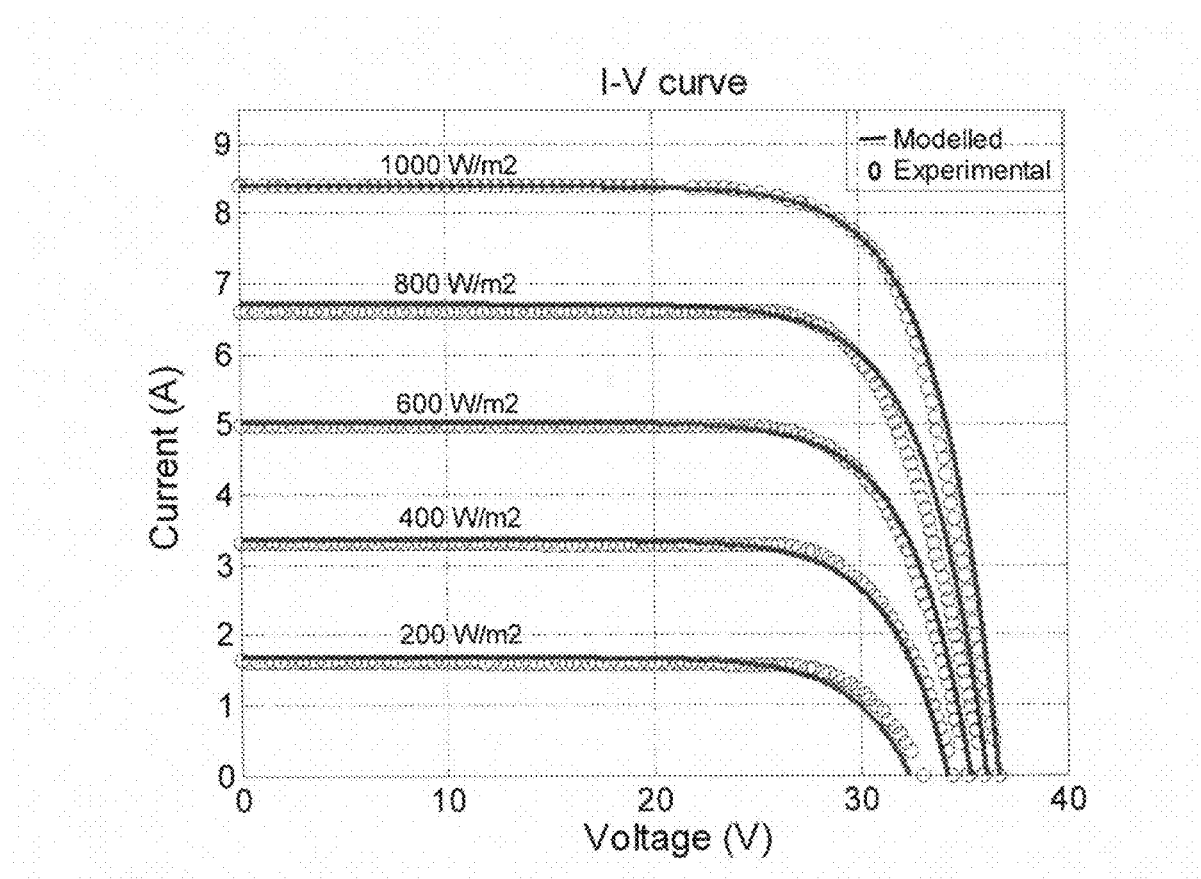
FIG. 13(a) shows I-V characteristics for a poly-crystalline technology (BP Solar 3230N) at different irradiation level.
FIG. 13(b) shows I-V characteristics for the poly-crystalline technology (BP Solar 3230N) at different temperature.
Figure 13:
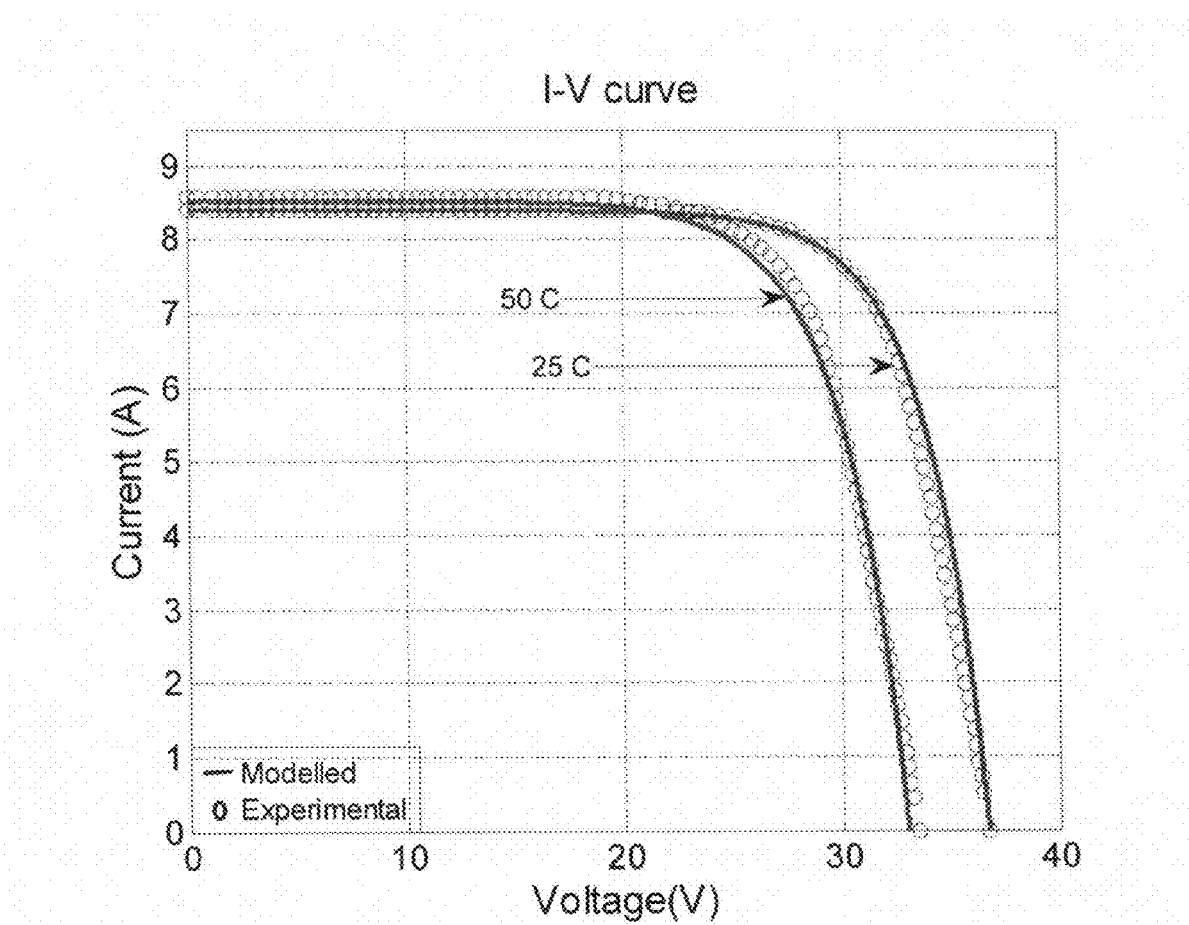
Figure 14:
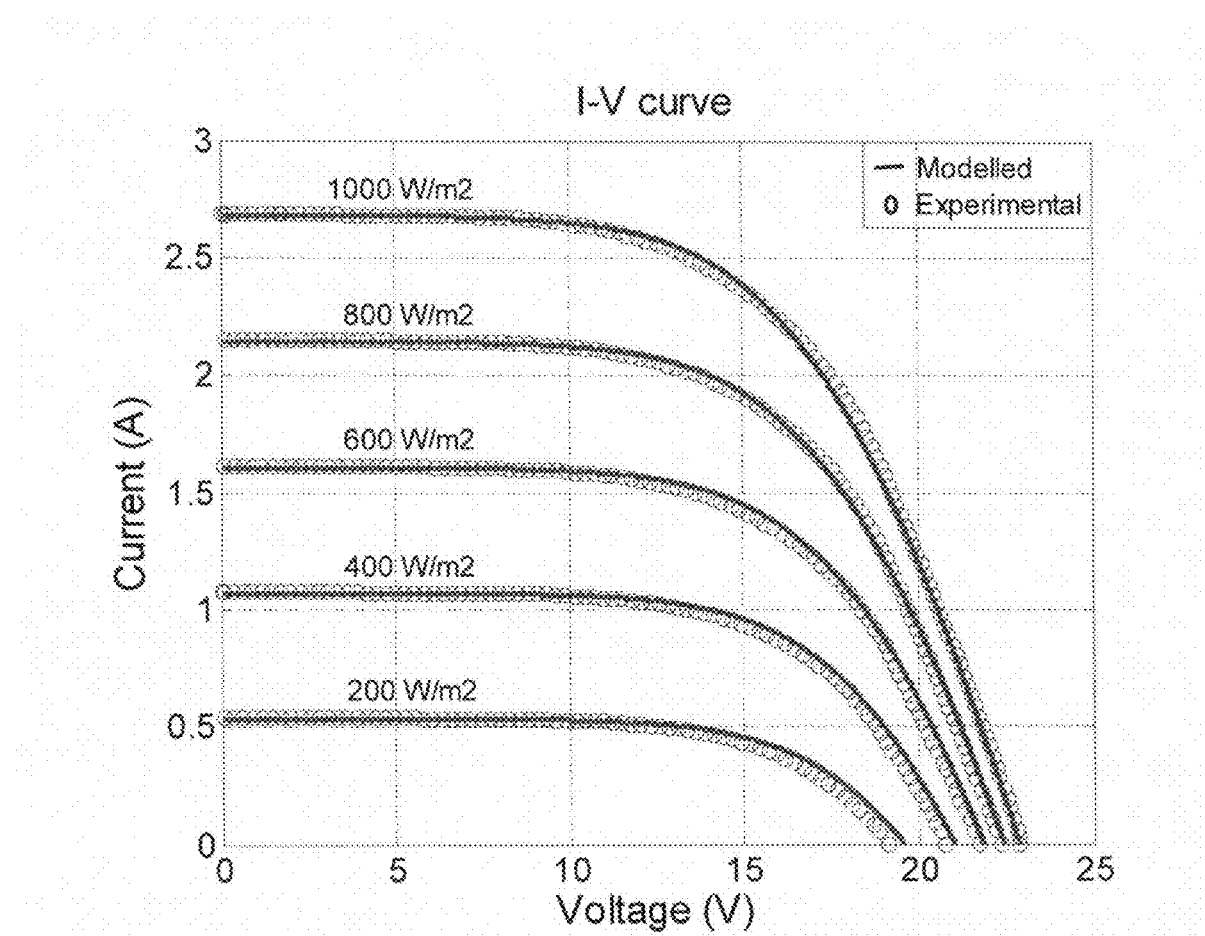
FIG. 14(a) shows I-V characteristics for a thin-film technology (Shell ST36) different irradiation level.
FIG. 14(b) shows I-V characteristics for the thin-film technology (Shell ST36) at different temperature.
Figure 14:
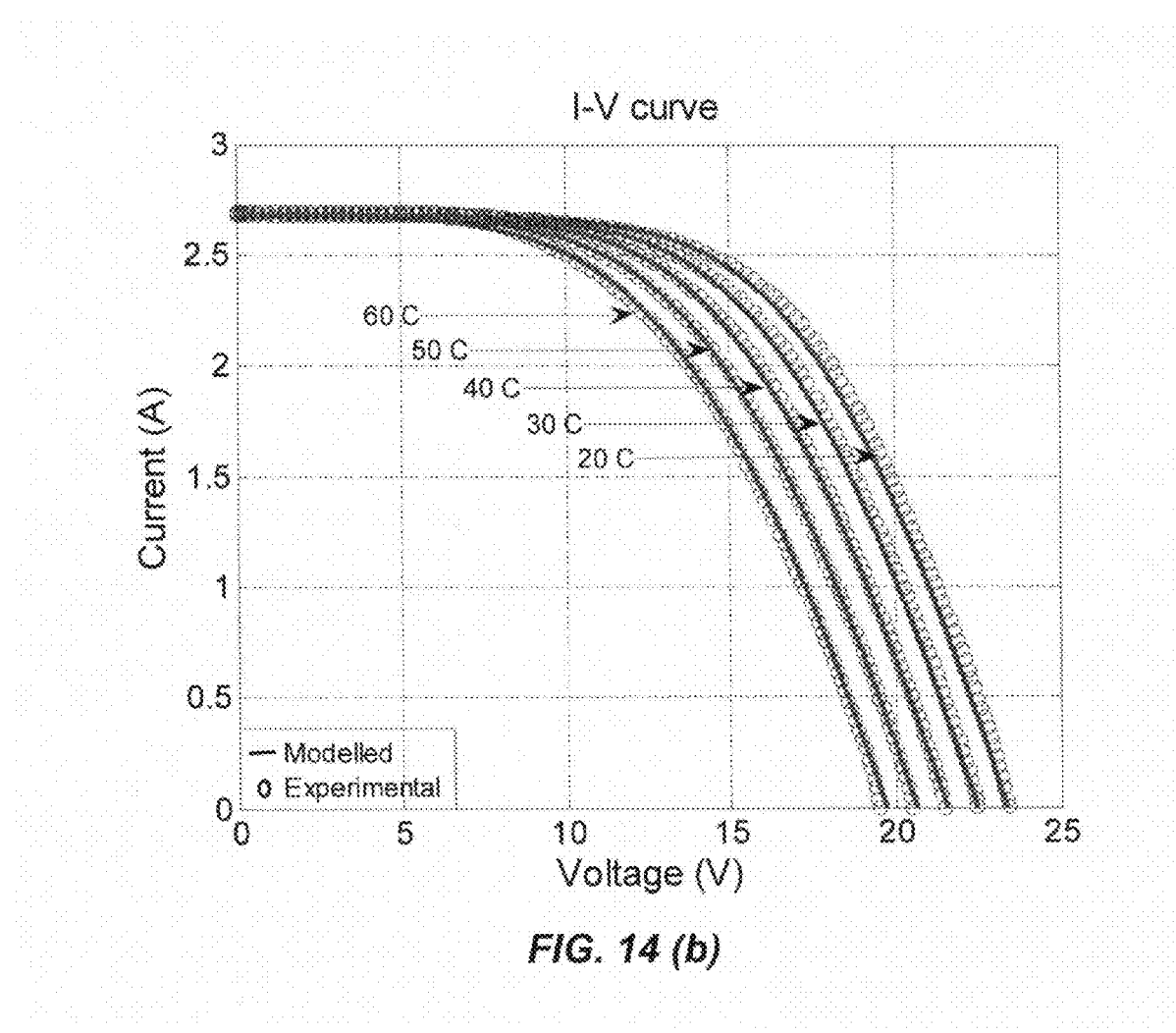

The electrical characteristics of the selected PV panels are simulated using the estimated parameters and the proposed approach is validated by comparing the determined curves (generated by estimated parameters) with the experimental curves. The experimental curves data is extracted from the PV panel datasheets using digitizer software. FIG. 12(*a*) shows the determined I-V curves (solid lines) along with the experimental curves (circles) for the mono-crystalline technology (Sunpower 230W) for different irradiation levels and constant temperature of 25° C. It illustrates that the I-V curves obtained from the proposed method are in great accordance with the experimental curves for all the irradiation levels, particularly for STC. The verification of the proposed method encountered with temperature change and constant irradiation level of 1000 W/m² is shown in FIG. 12(*b*). It can be seen that the curves generated from the proposed method matches with the experimental curves under all the temperature variations. Similarly, FIG. 13(*a*), FIG. 13(*b*), FIG. 14(*a*) and FIG. 14(*b*), show the comparison of modeled and experimental I-V curves for other polycrystalline and thin-film PV technologies, respectively. These figures show that the parameters estimated by the proposed approach can regenerate the I-V curves at different operating conditions accurately.

Three statistical errors are used for a comprehensive analysis of the proposed approach. These errors are the root mean square error (RMSE), the mean bias error (MBE) and the mean absolute error (MAE). They are given by the following equations;

TABLE 2

| | Mono crystalline (mc-Si) | | Poly crystalline (pc-Si) | | Thin film | |
| --- | --- | --- | --- | --- | --- | --- |
| | | | | | Kaneka U- | Shell |
| | Sunpower 230W | SunForte PM318B00 | Lorentz120 W | PB solar | EA110W (a-Si) | ST36 (CIS) |
| Light Current ($I_L$) | 5.99 | 6.2 | 7.7 | 8.4 | 2.519 | 2.6803 |
| Diode Saturation current ($I_O$) | 1.40E−07 | 7.76E−08 | 2.14E−05 | 8.20E−06 | 4.77E−06 | 4.12E−05 |
| Series Resistance ($R_S$) | 0.008686 | 0.01092 | 1.75E−04 | 0.0146 | 3.1375 | 1.3901 |
| Shunt Resistance ($R_{SH}$) | 95658.604 | 6.15E+04 | 75.7418 | 5.63E+04 | 4.09E+02 | 3.85E+04 |
| Modified Ideality factor (α) | 2.7715 | 3.5559 | 1.7091 | 2.651 | 5.4173 | 2.0662 |

Figure 6:
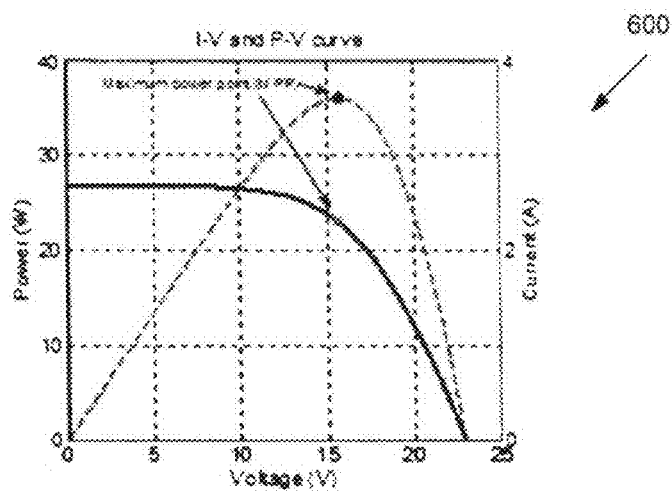
FIG. 6(a) shows an I-V curve and a P-V curve of the five parameters photovoltaic device model.
FIG. 6(b) shows I-V curves of a parameter "a" effects in the five parameters Photovoltaic device model.
FIG. 6(c) shows I-V curves of a parameter "$I_0$" effects in the five parameters Photovoltaic device model.
FIG. 6(d) shows I-V curves of a parameter "$I_L$" effects in the five parameters Photovoltaic device model.
FIG. 6(e) shows I-V curves of a parameter "$R_S$" effects in the five parameters Photovoltaic device model.
FIG. 6(f) shows I-V curves of a parameter "$R_{SH}$" effects in the five parameters Photovoltaic device model.
Figure 6:
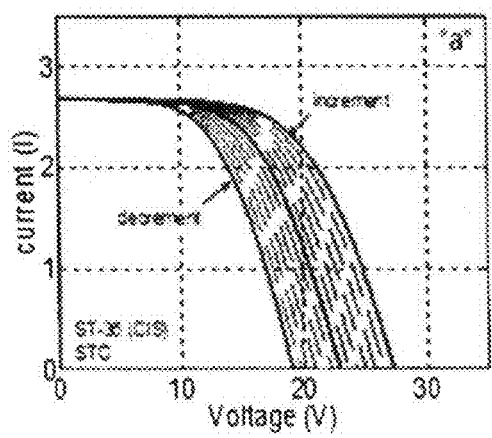
Figure 6:
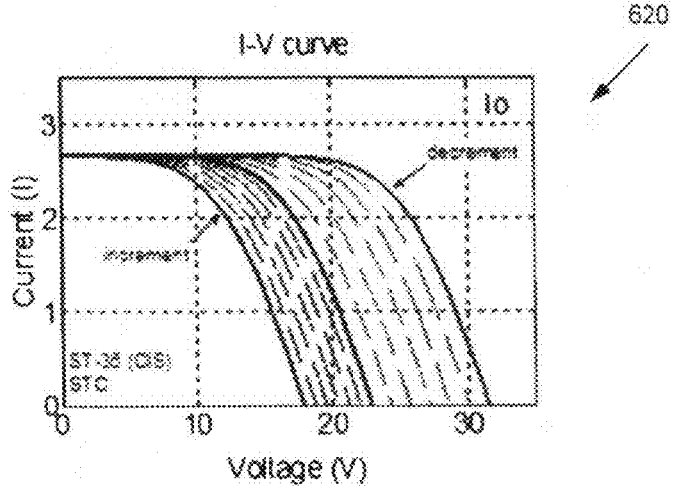
Figure 6:
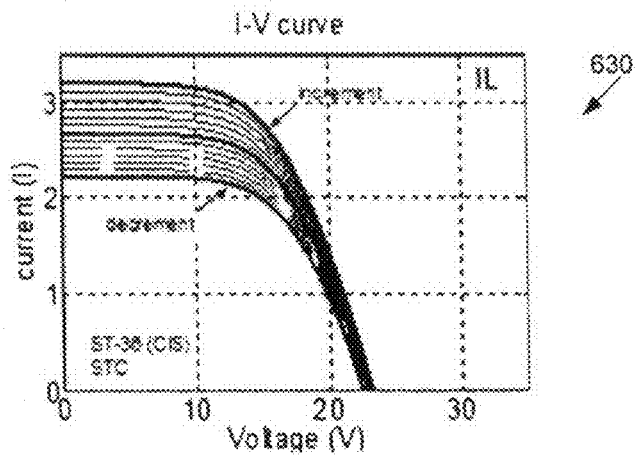
Figure 6:
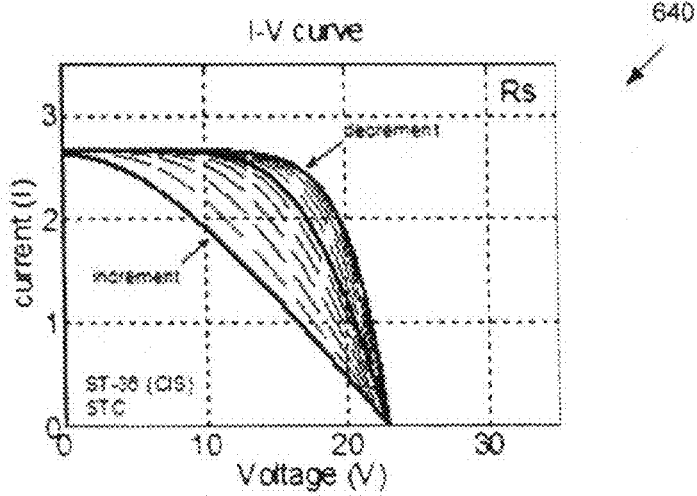
Figure 6:
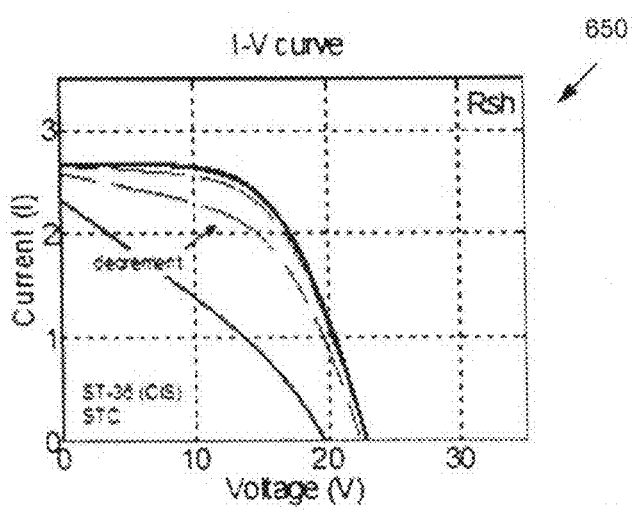

It can be noticed that the series resistance ($R_S$) of thin-film technology is quite higher than crystalline technology panels. Such behavior is expected and in accordance with Stutenbaeumer et al., ("Equivalent model of monocrystalline, polycrystalline and amorphous silicon solar cells," *Renewable Energy*, vol. 18, no. 4, pp. 501-512, December 1999—incorporated herein by reference), Ishaque et al., ("An improved modeling method to determine the model parameters of photovoltaic (PV) modules using differential evolution (DE)," *Solar Energy*, vol. 85, no. 9, pp. 2349-2359, September 2011—incorporated herein by reference). Series resistance has a central job in finding the curvature of the I-V curve as shown in FIG. 6 and its large value depicts a smoother curvature which is a usual behavior of I-V curves of thin film technologies as described in Guimard et al., ("Copper indium diselenide solar cells prepared by electrodeposition," in *Conference Record of the Twenty-Ninth IEEE Photovoltaic Specialists Conference*, 2002, pp. 692-695—incorporated herein by reference).

$$RMSE = \frac{\sqrt{\frac{1}{n}\sum_{i=1}^{n}(y_i - x_i)^2}}{\frac{1}{n}\sum_{i=1}^{n}x_i} \quad (25)$$

$$MBE = \frac{\frac{1}{n}\sum_{i=1}^{n}(y_i - x_i)}{\frac{1}{n}\sum_{i=1}^{n}x_i} \quad (26)$$

$$MAE = \frac{\frac{1}{n}\sum_{i=1}^{n}|y_i - x_i|}{\frac{1}{n}\sum_{i=1}^{n}x_i} \quad (27)$$

Where y and x represent the measured and experimental value, respectively and n is the number of data point taken (five in our case). The precision of the proposed method is analyzed by RMSE and MAE while MBE is used to show whether the approach is over-predicting or under-predicting the experimental value.

Figure 15:
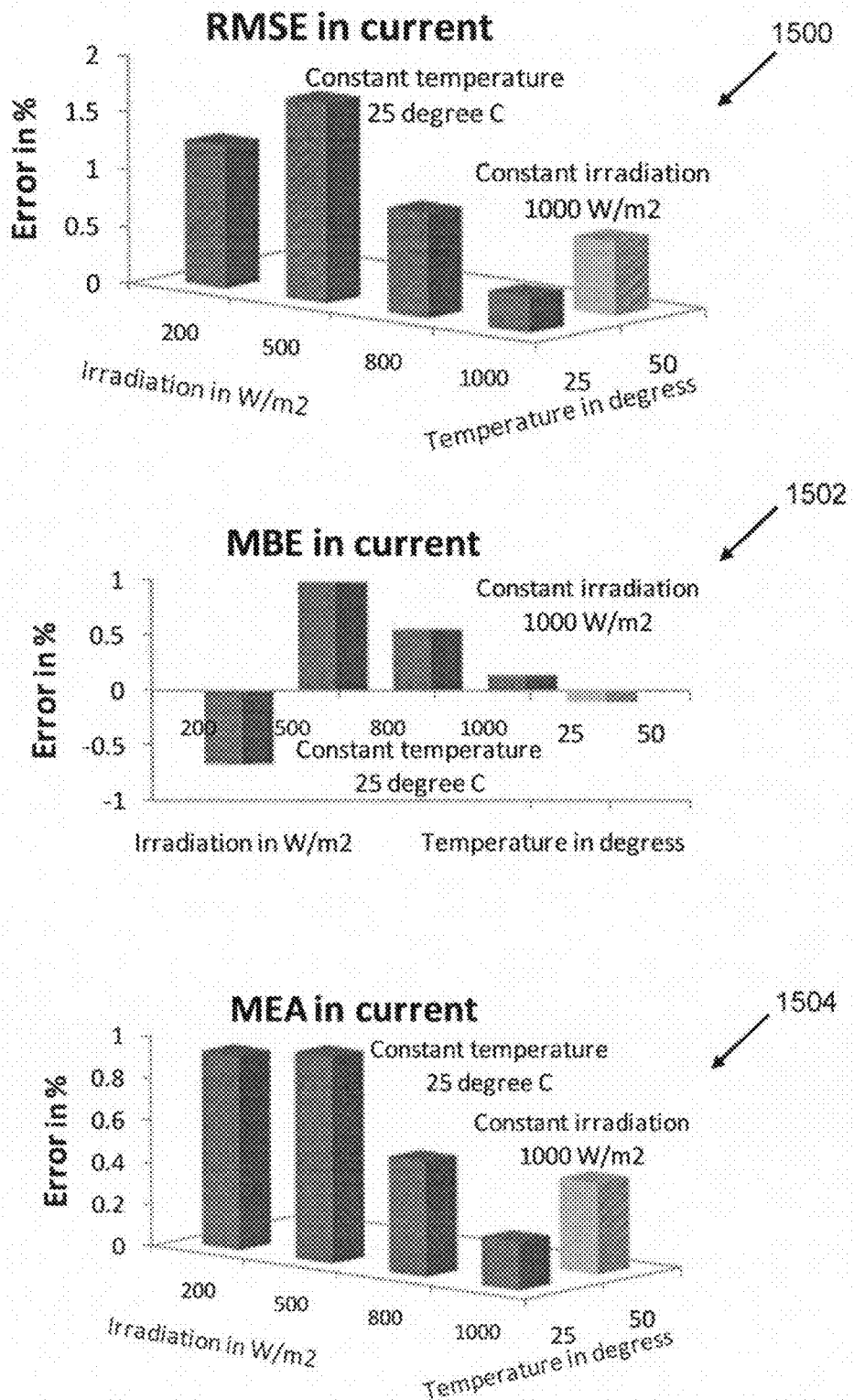
FIG. 15(a) shows a diagram of RMSE, MBE, MAE for different irradiation and temperature for mono-crystalline (m-Si).
FIG. 15(b) shows a diagram of RMSE, MBE, MAE for different irradiation and temperature for thin film (CIS).
Figure 15:
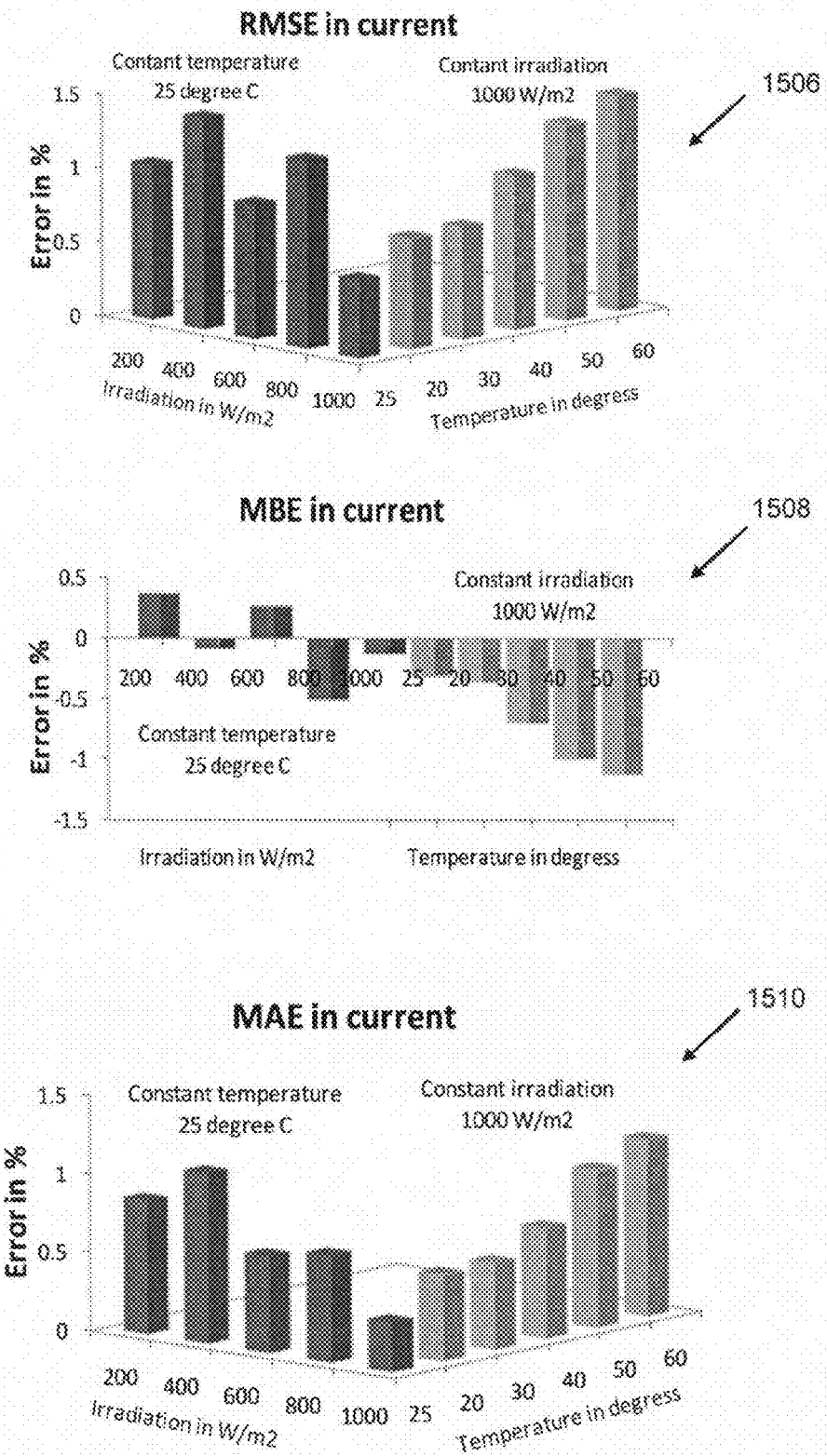

These errors are calculated for current and power at five key points for curves available in the datasheet. FIG. 15 illustrates the values of current errors for irradiation and temperature variation. FIG. 15(*a*) shows a diagram of RMSE 1500, MBE 1502, MAE 1504 for different irradiation and temperature for mono-crystalline (m-Si). FIG. 15(*b*) shows a diagram of RMSE 1506, MBE 1508, MAE 1510 for different irradiation and temperature for thin film (CIS). It can be observed that the error at STC is negligible and within the acceptable range for other conditions. Its value is increasing with the decrease in irradiation and increase in temperature and that is consistent with Hishikawa et al., ("Irradiance-dependence and translation of the I-V characteristics of crystalline silicon solar cells," in *Conference Record of the Twenty-Eighth IEEE Photovoltaic Specialists Conference*—2000 (*Cat. No. 00CH37036*), 2000, pp. 1464-1467—incorporated herein by reference) and Benavides et al., ("Modeling the Effect of Voltage Ripple on the Power Output of Photovoltaic Modules," *IEEE Transactions on Industrial Electronics*, vol. 55, no. 7, pp. 2638-2643, July 2008—incorporated herein by reference). This behavior of increase in error is expected because the five parameters are optimized at STC and their values at other operating conditions are measured using model translational equations (9)-(14). That explains why the error is increased in these conditions.

Figure 16:
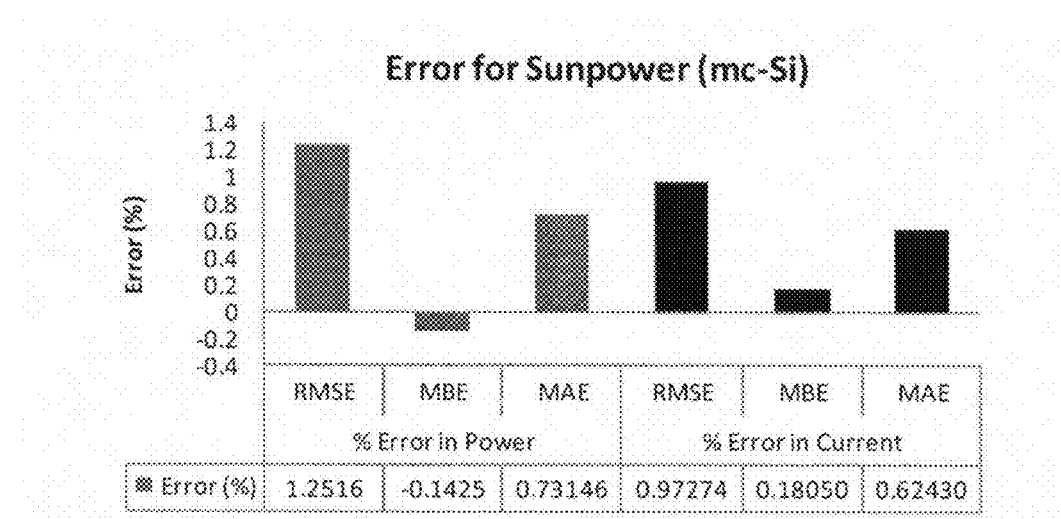
FIG. 16(a) shows a diagram of cumulative error for power and current of mono-crystalline silicon technology (Sunpower 230W).
FIG. 16(b) shows a diagram of cumulative error for power and current of mono-crystalline silicon technology (SunForte PM318B00).
Figure 16:
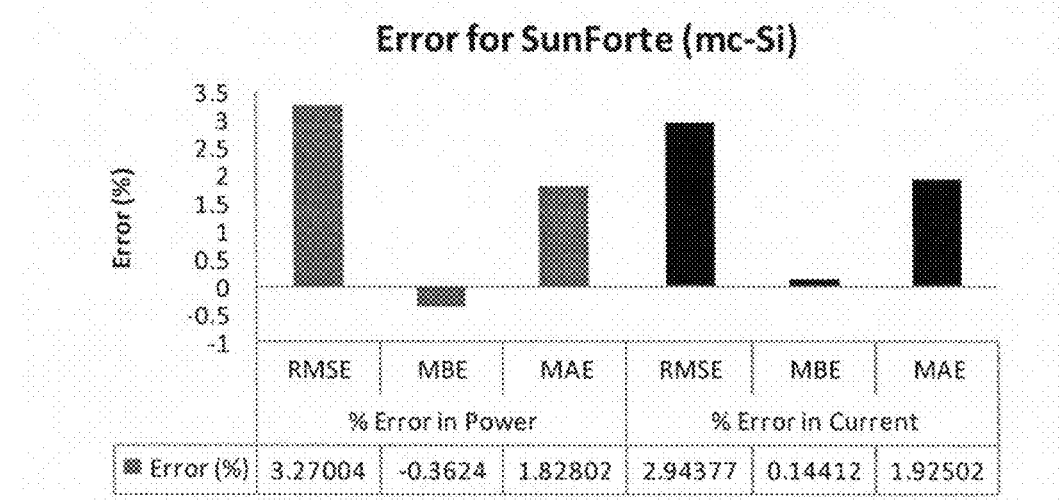
Figure 17:
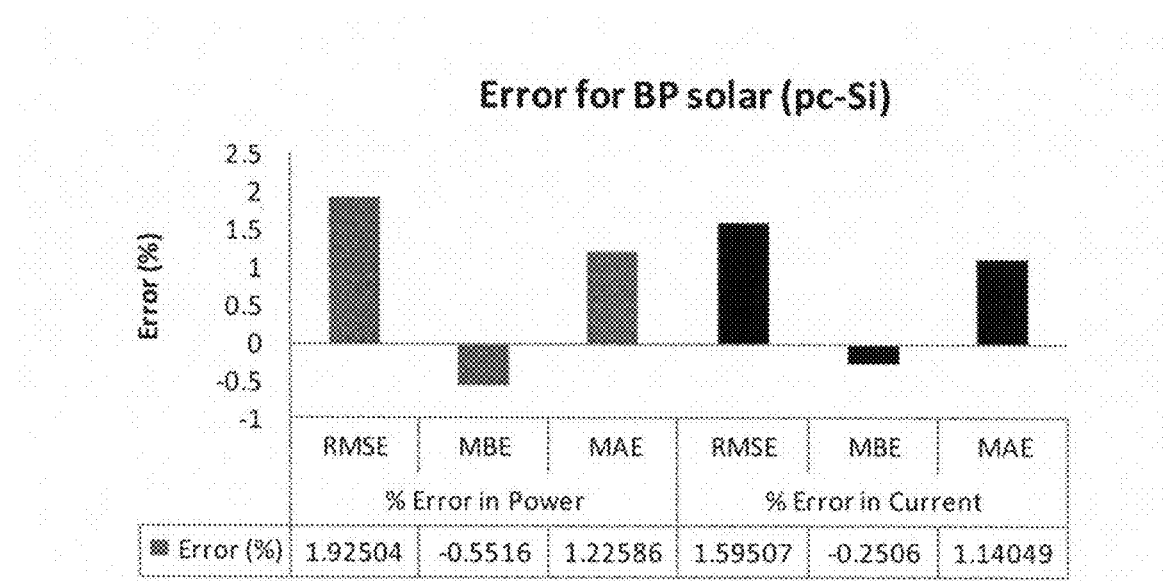
FIG. 17(a) shows a diagram of cumulative error for power and current of ploy-crystalline silicon technology (BP Solar 3230N).
FIG. 17(b) shows a diagram of cumulative error for power and current of ploy-crystalline silicon technology (Lorentz120W LC120-12P).
Figure 17:
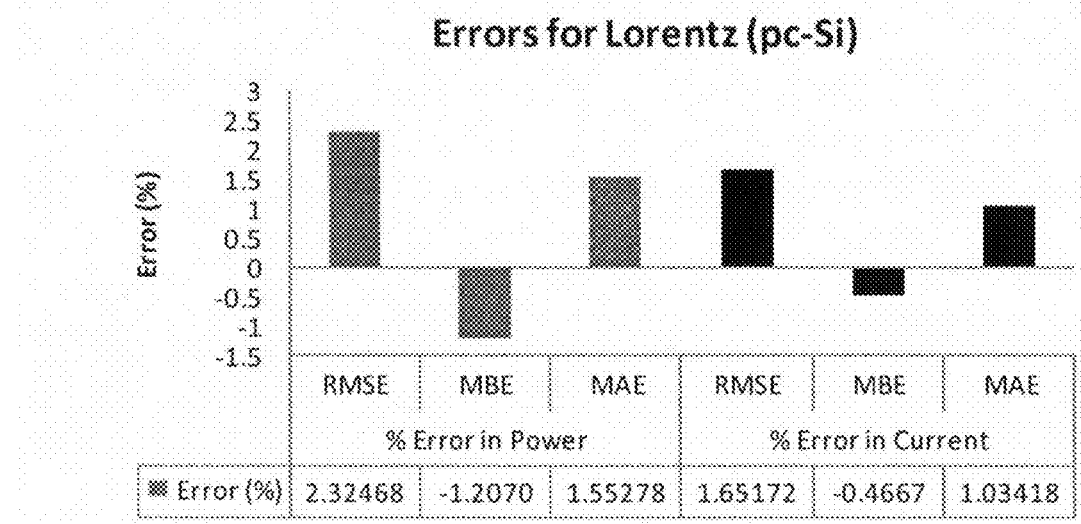
Figure 18:
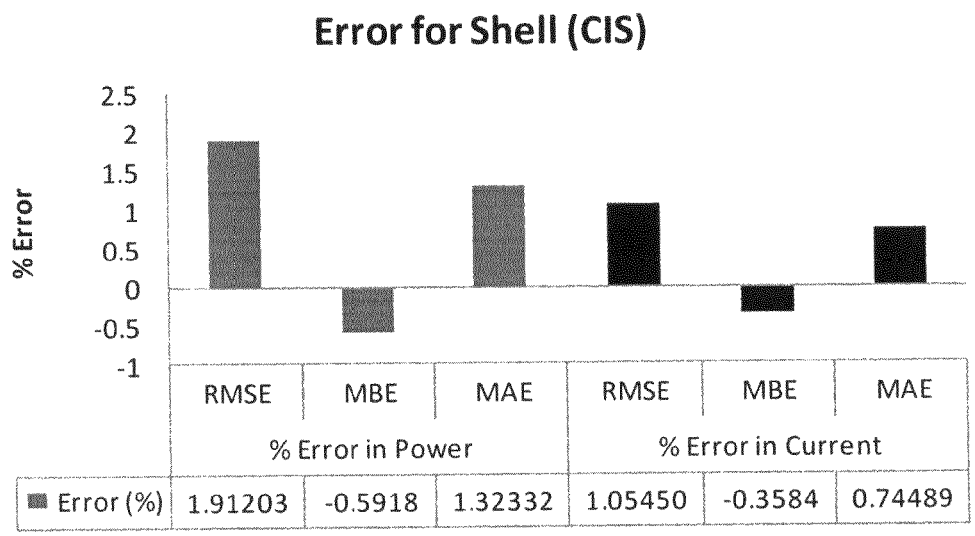
FIG. 18(a) shows a diagram of Cumulative error for power and current of thin-film technology (Shell ST36).
FIG. 18(b) shows a diagram of Cumulative error for power and current of thin-film technology (Kaneka U-EA110W).
Figure 18:
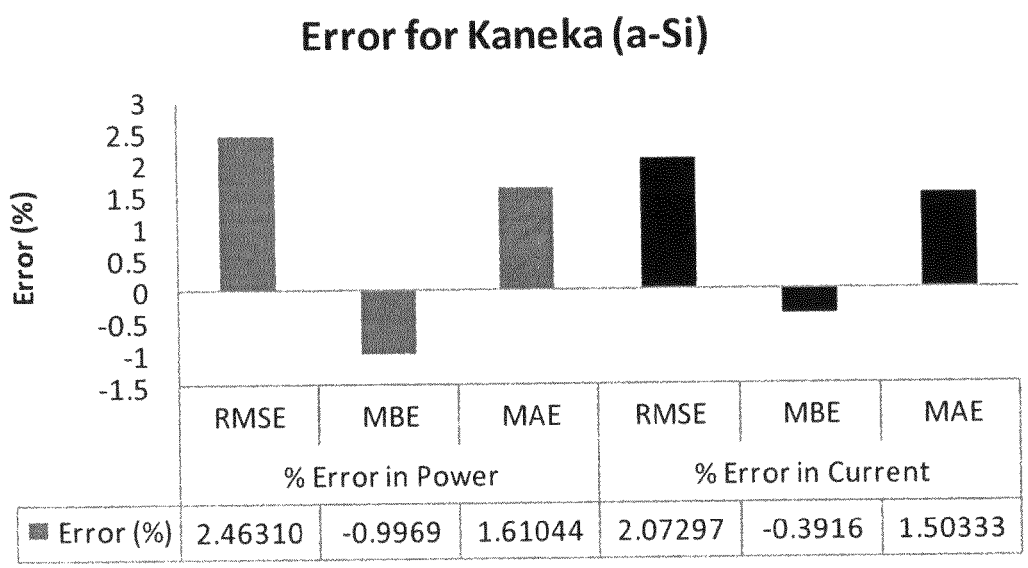

Results obtained are then used to measure the cumulative error at all the available operating conditions. FIGS. 16(*a*) and (*b*) show the cumulative error values of RMSE, MBE and MAE for the power and current of the mono-crystalline silicon technology PV panels (Sunpower and SunForte). It can be seen that the values are very small for all the three errors. Similarly, FIGS. 17(*a*) and (*b*), and FIGS. 18(*a*) and (*b*) show RMSE, MBE and MAE for poly-crystalline silicone and thin-film technologies. Small values of these errors validate the effectiveness of the proposed parameter estimation method.

In a Test 1 of PV simulator, the comprehensive analysis has been carried out to examine the effectiveness of the proposed parameter estimation method. Its efficiency has been tested for six PV panels of three different technologies by comparing the determined curves with the experimental curves. Three statistical errors have been used to measure its correctness at five key points. Cumulative error of each panel has been calculated. Results and analysis show that the estimated parameters can simulate the output characteristics of panels efficiently under all operating conditions.

Figure 19:
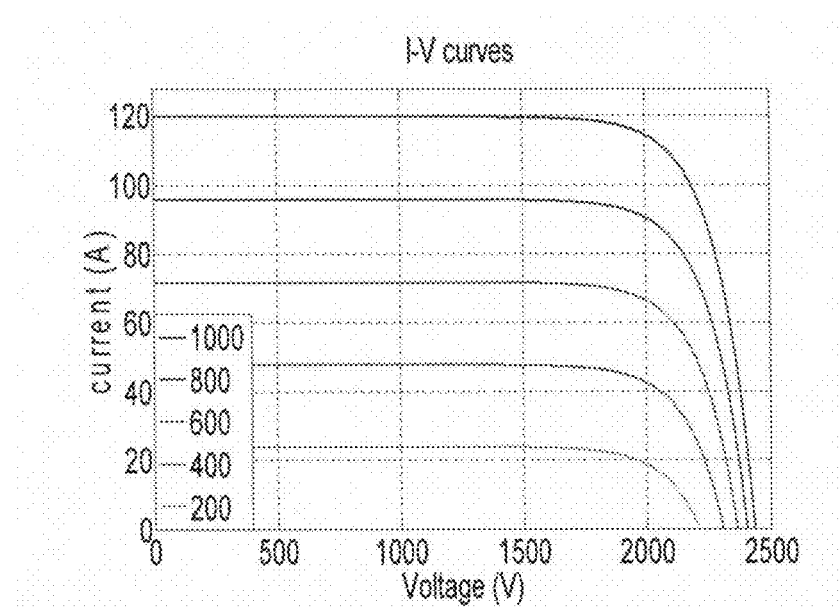
FIG. 19 shows I-V characteristics of photovoltaic array at different irradiation (W/m$^2$) and constant temperature of 25° C.

A Test 2 of PV simulator is to examine the performance of the proposed PV simulator as large PV array different operating conditions. PV array is composed of 50 series and 20 parallel connected panels of mono-crystalline (mc-Si) as described in ("Sun Power 230 Solar Panel," *Sunpower data sheet*—incorporated herein by reference) and electrical data of a PV panel is given in Table 2. FIG. 19 shows the I-V curves of the selected PV array at different irradiation levels with constant temperature of 25° C. PV array has 20 panels in parallel as a result its short circuit current ($I_{SC}$) at STC become 20*5.99=119.8 (20 is the short circuit of a PV panel) and it has 50 panels in series thus its open circuit voltage ($V_{OC}$) at STC become 48.7*50=2435 (48.7 is the open circuit voltage of a panel) and it is evident from FIG. 19. It is also obvious from the graphs that the value of short circuit current ($I_{SH}$) is highly decreased and a value of open circuit voltage ($V_{OC}$) is slightly reduced by decreasing the irradiation level.

Figure 20:
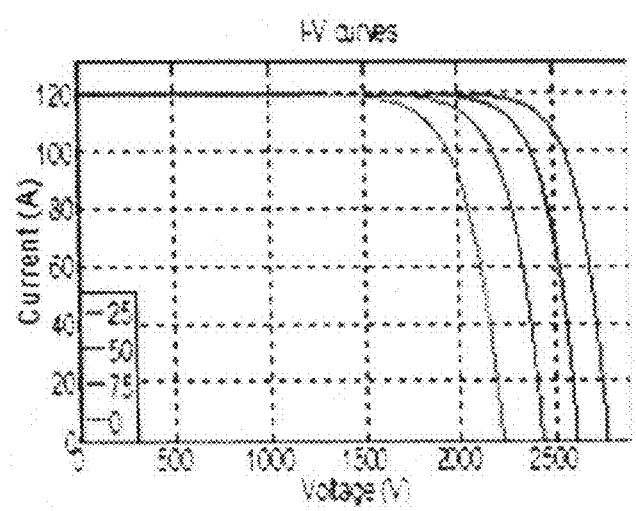
FIG. 20 shows I-V characteristics of photovoltaic array at different temperatures (° C.) and constant irradiation of 1000 W/m$^2$.

FIG. 20 shows the I-V curves of selected PV array at different temperatures and constant irradiation level of 1000 W/m². It is clear from the graphs that the I-V curve of the PV device are highly non-linear and short circuit current ($I_{SH}$) increased slightly and open circuit voltage ($V_{OC}$) decreased by increasing the cell temperature.

This test demonstrates that the proposed PV simulator can operate as a large PV array (PV power station) and can generate its I-V curves at different irradiation and temperatures. As these operating conditions cannot be constant and continuously varying with time, the proposed simulator can be a valuable tool to analyze the impacts of these changing condition on the overall power system performance and response.

Figure 21:
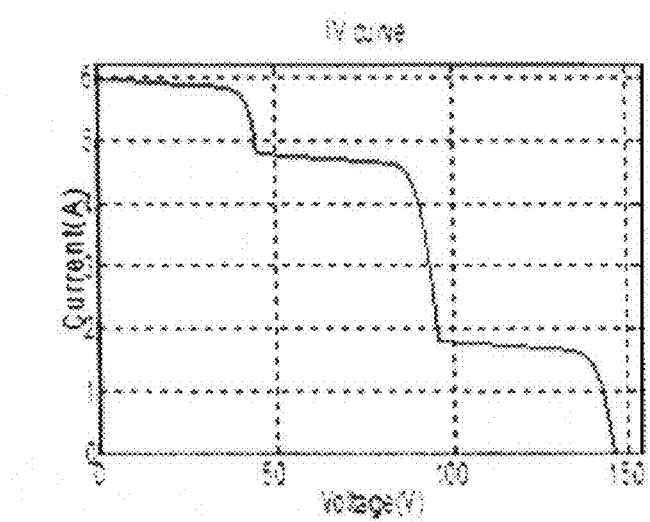
FIG. 21 shows an I-V curve for partial shaded photovoltaic array of FIG. 10.
Figure 22:
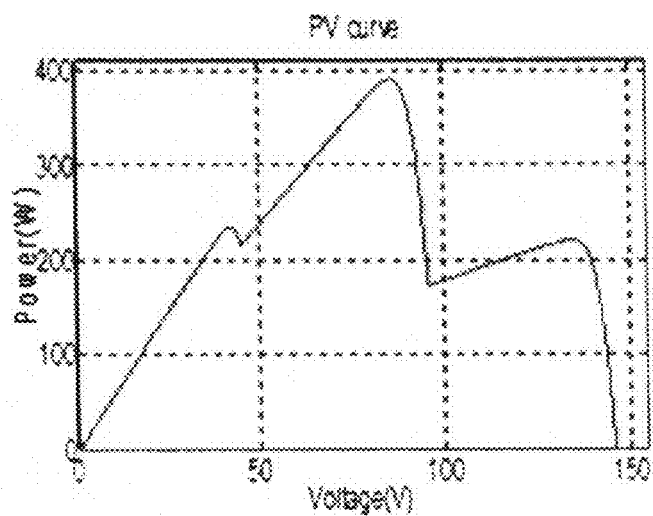
FIG. 22 shows a P-V curve for partial shaded photovoltaic array of FIG. 10.

A Test 3 of PV simulator is to test the designed simulator under partial shaded condition. In order to test the designed simulator under partial shaded condition, PV array configuration of FIG. 10 is adopted. It consists of three series connected PV panels and each panel has dissimilar shading pattern hence representing a partially shaded PV array. Panel 1 is operating at 1000 W/m² 25° C., panel 2 at 800 W/m² 25° C., and panel 3 at 300 W/m² 25° C. FIG. 21 and FIG. 22 show the I-V and P-V curve of array. I-V curve shows the multiple steps and P-V curve shows multiple peaks.

The number of these steps/peaks depends upon the number of shaded pattern used. At lower voltage level (from 0-49V) only panel 1 is functioning and other two panels are by passed through the bypass diodes and they do not take part in the overall output voltage as the irradiation level of panel 1 is higher than other two panels. In the intermediate voltage level (from 49V-98V) panel 1 and panel 2 are operating and panel 3 is bypassed. From FIG. 21 it can be noticed that when panel 2 start working PV array current trim down abruptly to reduced value of 4.8 A. The reason for this drastic change is that the panel 2 is illuminated with lesser irradiation and it cannot produce higher current than this value. Similarly, at high voltage level (greater than 98) all the three panels are functioning and current is limited by panel 3 because it has the lowest irradiation level. This test verifies the robustness of the designed simulator under the harsh condition of partial shading.

Figure 23:
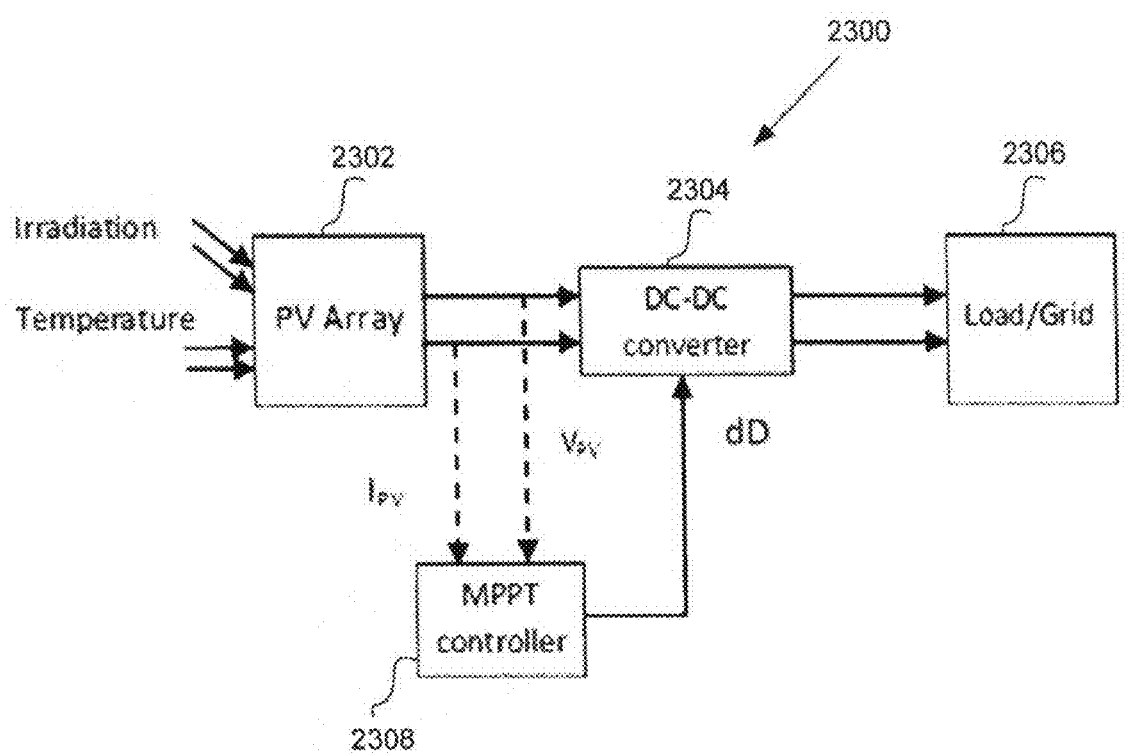
FIG. 23 shows a photovoltaic system used in a Test 4 of a photovoltaic simulator.

A Test 4 of PV simulator shows the capability of a designed simulator to interface with the power electronics devices and maximum power point tracking controller. FIG. 23 2300 shows a complete PV system consisting of PV array simulator 2302, DC-DC boost converter 2304, MPPT controller 2308 and load 2306. The PV simulator will generate the voltage and current depending upon the ambient conditions (irradiation and temperature). The current and voltage are varying due to changing atmospheric condition therefore DC-DC boost converter is used to maintain the output constant and available for the load where MPPT works as a controller for the DC-DC converter.

Figure 24:
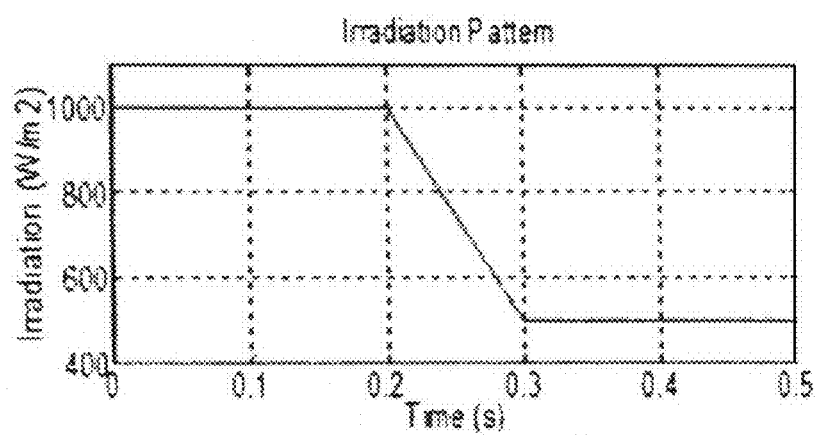
FIG. 24 shows an irradiation pattern used in the Test 4 of a photovoltaic simulator.

A single PV panel is used in this test and its electrical data is given in the Table 2. A non-linear time domain simulation is carried out and a change in solar radiation is applied to assess the robustness of the proposed simulator in conjunction with converter and MPPT controller. Irradiation pattern is shown in FIG. 24.

Figure 25:
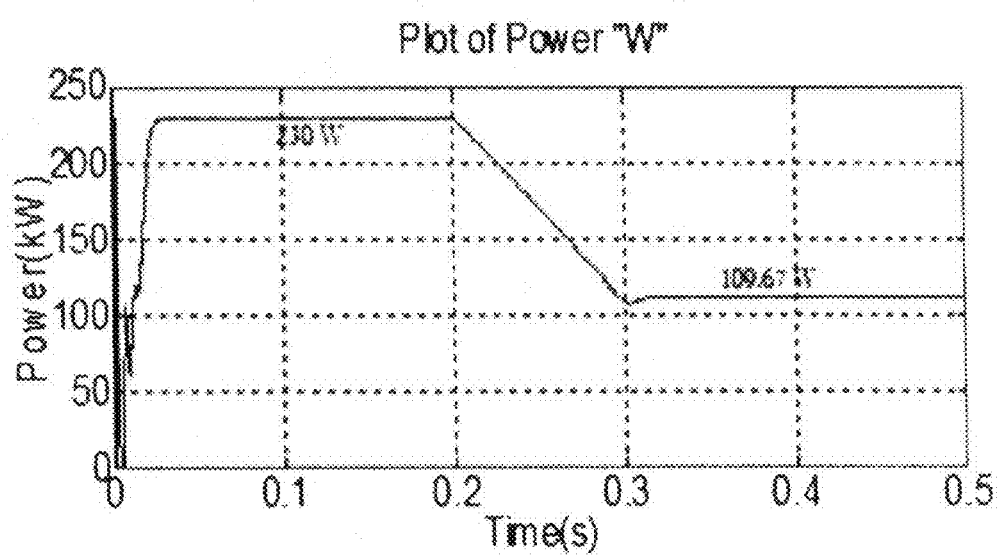
FIG. 25 shows a plot of panel power ($P_{PV}$) vs. time.
Figure 26:
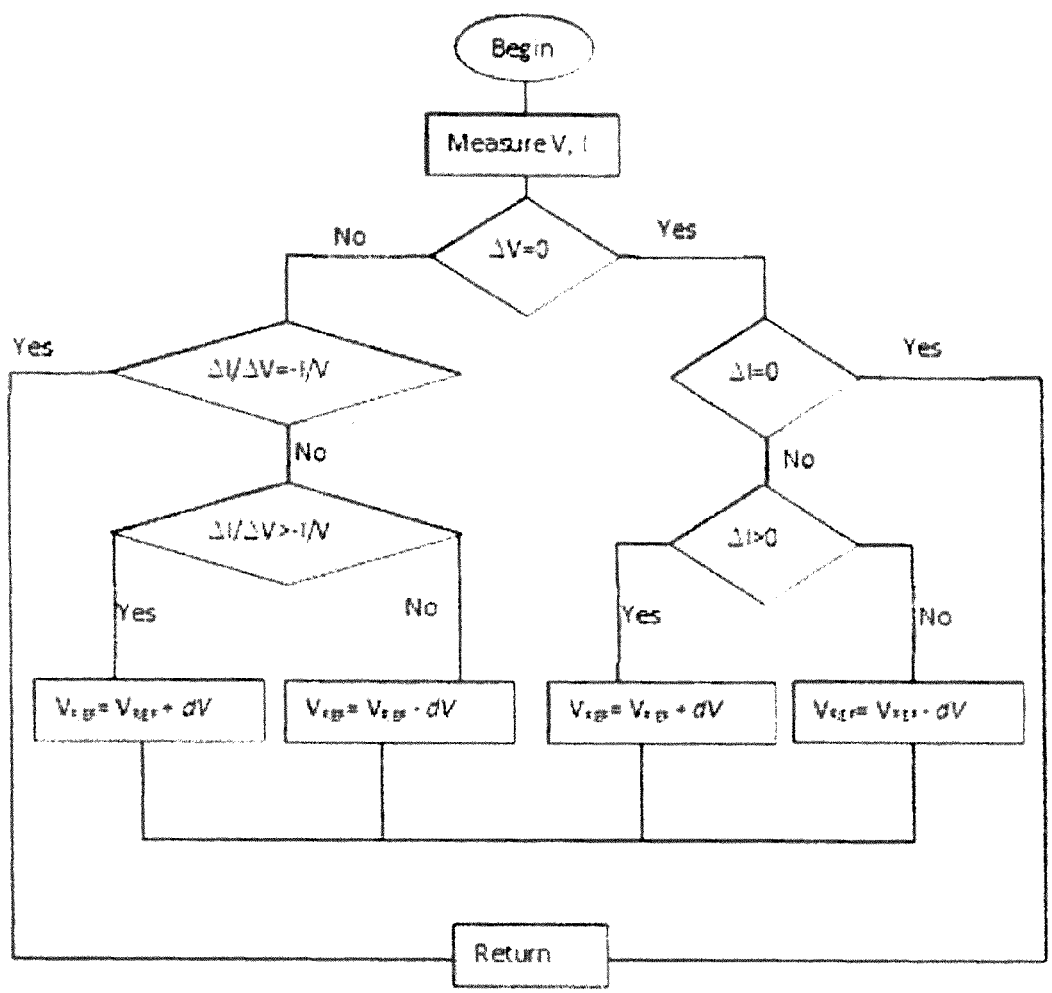
FIG. 26 shows a flowchart for incremental conductance method.

The solar radiation is decreased from 1000 (W/m²) to 500 (W/m²) from 0.2 sec to 0.3 sec. FIG. 25 is a plot of PV panel power ($P_{PV}$) vs time. FIG. 25 demonstrates that the MPPT controller is tracking the maximum power from the PV panel under both conditions. Result illustrates the dynamic performance of the overall system with the proposed simulator.

This test validates that the proposed PV simulator can function in conjunction with power electronics converters and their respective controllers. It allows the user to study the behavior of the whole system under different operating condition. Moreover, it can also be used to verify the effectiveness of MPPT controllers designed for normal and shaded conditions.

In current embodiment, a precise PV simulator has been developed based on the five parameters electric circuit model of PV device. Model parameters have been estimated by employing the efficient intelligent technique, Differential Evolution (DE), using only the data provided in the catalogue. PV simulator developed using these estimated parameters have been verified by comparing the curves of two different PV technologies at various operating conditions.

It has shown that the developed simulator can operate in harsh conditions of partial shading and rapidly changing irradiation condition. Further, the designed simulator can also be utilized in a complete PV system interfaced with different power electronic devices and MPPT controllers. Four different tests have been conducted and they verified the effectiveness of the proposed PV array simulator. It is envisaged that the developed PV array simulator can be very helpful for the power system design engineers in the simulation study of the power systems before any experimental verification.

PV devices have a non-linear I-V and P-V characteristics and have one optimum point called Maximum Power Point (MPP). This maximum power point is highly vulnerable to the ambient conditions, that are irradiation and cell temperature, and these conditions are always changing with time which keeps varying the MPP. Therefore the maximum power point tracking (MPPT) controller is of great importance and is coupled with the PV arrays to track the MPP and extract the maximum possible power from the array. Many MPPT 2308 methods have been proposed in Esram et al., ("Comparison of Photovoltaic Array Maximum Power Point Tracking Techniques," *IEEE Transactions on Energy Conversion*, vol. 22, no. 2, pp. 439-449, June 2007—incorporated herein by reference) and Ishaque et al., ("A review of maximum power point tracking techniques of PV system for uniform insolation and partial shading condition," *Renewable and Sustainable Energy Reviews*, vol. 19, pp. 475-488, March 2013—incorporated herein by reference) from simple linear approximation methods to complex intelligent techniques as described in Mellit et al., "Artificial intelligence techniques for photovoltaic applications: A review," *Progress in Energy and Combustion Science*, vol. 34, no. 5, pp. 574-632, October 2008—incorporated herein by reference). Maximum power point tracker works with the DC-DC converter 2304 which is operated as an interface between the PV panel/array and load/inverter. DC-DC converter 2304 performs two major tasks, one is to track the maximum power point and to regulate and step up or step down the output voltage. Stepping up and stepping down of the output voltage depends entirely on the system requirements and boost or buck converter is used accordingly. Voltage from the PV panel, which is varying depending on ambient conditions, is given as input to the DC-DC converter 2304 and its output is constant voltage across the capacitor where load/inverter 2306 can be connected. MPPT works as a controller for the DC-DC converter and controls the duty ratio of the switch such that it tracks the MPP under the changing ambient conditions. In short, maximum power point tracker (MPPT) is indispensable for all kinds of PV systems. Without MPPT controller 2308 PV array cannot be able to operate at full efficiency and will work at a point on I-V curve that equivalent with the I-V characteristics of the connected load. The new intelligent MPPT controller based on the Artificial Neuro-Fuzzy Inference System (ANFIS) is proposed and developed.

The Incremental Conductance (InCond) method is basically based upon the Hill Climbing (HC) Method also known as Perturbation & Observation (P&O). A slight modification in HC and P&O results in a InCond with more robust tracking. First we will discuss the P&O method then InCond for better understanding.

P&O technique is based on the principle of moving the operating point of the PV array in the direction of power increases. The algorithm constantly adjusts the electrical operating point by measuring the operating voltage and current of the PV panel to observe the change in power transfer. The perturbation is applied by slightly changing the voltage in a certain direction, and the power change is observed. If the change is positive, it is obvious that the MPPT has moved the operating point of the PV panel closer to the MPP. Thus the voltage is perturbed in the same direction. If the change on the other hand is negative, the operating point has become less optimal and the direction of perturbation must be changed. This algorithm can be described by the following statements:

If dP/dV>0: The PV panel has achieved an operating point closer to the MPP

If dP/dV<0: The PV panel has achieved an operation point further away from the MPP.

Algorithm of InCond is assumed as an improvement of the P&O method, as previously mentioned. As the name implies, the algorithm uses the incremental conductance as background of operation, which is the current divided by the voltage (inverted resistance). The MPPT finds the point where the gradient of the power over voltage equals zero and given by;

$$\frac{dP}{dV} = 0 \tag{28}$$

Using the product rule, the below relation can be found;

$$\frac{dP}{dV} = \frac{d(IV)}{dV} \tag{29}$$
$$= \frac{dI}{dV} + I\frac{dV}{dV}$$
$$= \frac{dI}{dV}V + I$$

$$\frac{dI}{dV} = -\frac{I}{V} \tag{30}$$

Drawbacks of the conventional MPPT techniques are thoroughly discussed in Alajmi et al., ("Fuzzy-Logic-Control Approach of a Modified Hill-Climbing Method for Maximum Power Point in Microgrid Standalone Photovoltaic system," *IEEE Transactions on Power Electronics*, vol. 26, no. 4, pp. 1022-1030, April 2011—incorporated herein by reference) and are given below; Slow converging to the optimum operating point; at steady-state condition, the amplitude of the PV power oscillates around the maximum point that causes system power losses and during cloudy days when the irradiance varies quickly the operating point moves away from the maximum optimum point.

Figure 27:
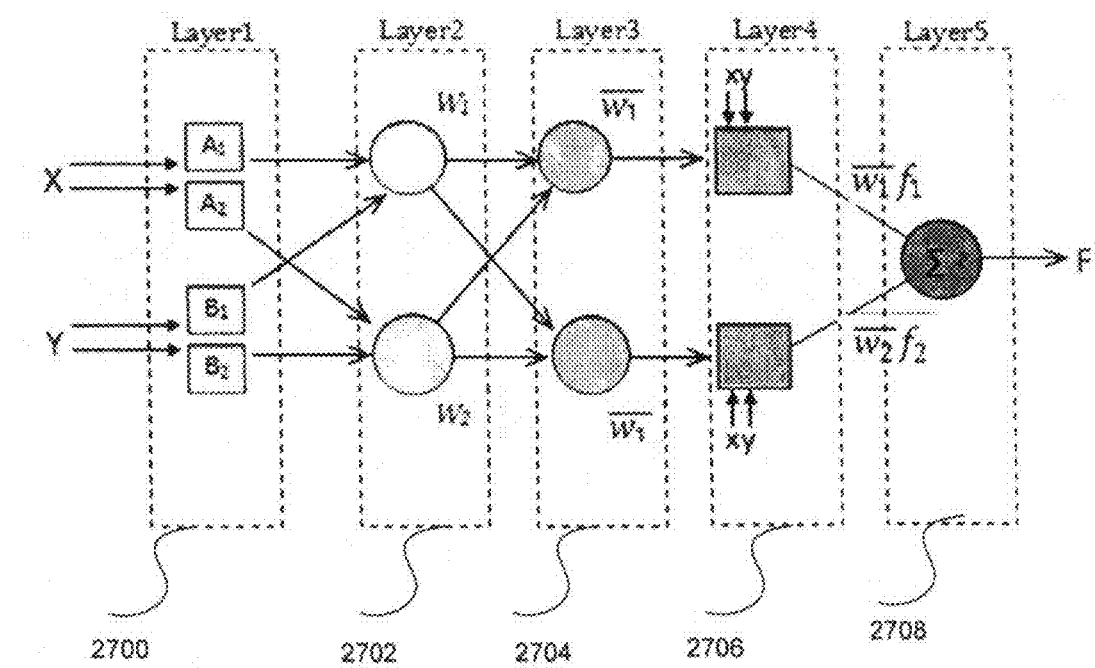
FIG. 27 shows a diagram of an Adaptive Network-Based fuzzy Inference System.

Like neural network ANFIS also has network type structure and maps the input-output data set using the parameters of fuzzy membership functions. FIG. 27 demonstrates a simple ANFIS architecture based on the two rule Sugeno system with two inputs (X and Y) and single output (F). Here A1, A2 and B1, B2 are fuzzy input memberships for input X and Y, respectively and are used to fuzzify the inputs as described in Jang, ("ANFIS: adaptive-network-based fuzzy inference system," *IEEE Transactions on Systems, Man, and Cybernetics*, vol. 23, no. 3, pp. 665-685, 1993— incorporated herein by reference).

A Two Rule Sugeno ANFIS has rules of the form:

If X is $A_1$ and y is $B_1$ THEN $f_1 = p_1 x + q_1 y + r^1$ (31)

If X is $A_2$ and y is $B_2$ THEN $f_2 = p_2 x + q_2 y + r_2$ (32)

Overall ANFIS architecture has 5 layers as shown in FIG. 27.

In layer 1 2700 every node is adaptive node and their number depends upon the number of input membership functions. Their output is given by:

$$O_{1,i} = \mu_{A_i}(x) \text{ for } i=1,2 \quad (33)$$

$$O_{1,i} = \mu_{B_{i-2}}(y) \text{ for } i=3,4 \quad (34)$$

Where, μ is the membership function and $O_{1,i}$ is the membership value for the crisp inputs X and Y. The subscripted 1 and i represent the layer number and node number, respectively.

Membership functions "μ" can be any shaped function like trapezoidal, triangle, Gaussian. The most commonly used membership function is generalized bell and is given by:

$$\mu_A(x) = \frac{1}{1 + \left|\frac{x - c_i}{a_i}\right|^{2b_i}} \quad (35)$$

Where; $a_i$, $b_i$, $c_i$ are parameters of the membership function (called premise parameter) and need to be optimize in the training process.

In layer 2 2702, every node in this layer is fixed node and accepts the output (membership values) from the layer 1 where t-norm is utilized to "AND" these values, given by:

$$O_{2,i} = w_i = \mu_{A_i}(x) \mu_B(y) \; i=1,2 \quad (36)$$

Output of each node corresponds to the firing strength of a rule.

In layer 3 2704, every node in this layer is fixed node and used to normalize the firing strength by dividing the rule's firing strength by the sum of all rules firing strengths, given by:

$$O_{3,i} = \overline{w}_i = \frac{w_i}{w_1 + w_2} \quad (37)$$

Output of each node represents the normalized firing strength of a rule.

In layer 4 2706, every node in this layer is adaptive node and given by the function:

$$O_{4,i} = \overline{w}_i f_i = \overline{w}_i (p_i x + q_i y + r_i) \quad (38)$$

Where, $p_i$, $q_i$, $r_i$ is the consequent parameters and need to optimize in the training process.

In layer 5 2708, it has only one fixed node and sum up all the input signals to get the final output and is given:

$$O_{5,i} = \sum_i \overline{w}_i f_i = \frac{\sum_i w_i f_i}{\sum_i w_i} \quad (39)$$

In the learning algorithm ANFIS optimize and adapt its parameters using the training data sets to predict the output data with high accuracy. The Sugeno-type model has two types of parameters as described in Jang, ("Neuro-fuzzy modeling and control," *Proceedings of the IEEE*, vol. 83, no. 3, pp. 378-406, March 1995—incorporated herein by reference). These two parameters are nonlinear parameters or membership functions parameters (premise parameters) and linear parameters or rules parameters (consequent parameters). In forward pass consequent (linear) parameters are calculated using a LSE algorithm while premise (nonlinear) parameters are unmodified. In backward pass premise (nonlinear) parameters are calculated using a back propagation algorithm while consequent (linear) parameters are unmodified.

LSE learning algorithm calculates the square error between training data output and predicted output that is obtained from the Sugeno-type model. This error is utilized to adapt the consequence parameters of the Sugeno parameters. The back propagation gradient descent method uses the error between output training data and predicted output in backward pass to calculate the error in different nodes.

As the output characteristics of PV system are highly nonlinear, AI techniques are widely used to improve the efficiency of the MPPT controller as described in Mellit et al., ("Artificial intelligence techniques for photovoltaic applications: A review," *Progress in Energy and Combustion Science*, vol. 34, no. 5, pp. 574-632, October 2008—incorporated herein by reference). Fuzzy logic can transform the linguistic and heuristic terms to numerical values and numerical values to linguistic terms using membership functions and fuzzy rules. Neural network can map the input output nonlinear functions but it does not have heuristic nature. Researchers combine the FIS with the ANN to build a hybrid system named as Adaptive Network-Based Fuzzy Inference System (ANFIS) to balance the shortcomings of one system with the advantages of another system as described in Jang, ("ANFIS: adaptive-network-based fuzzy inference system," *IEEE Transactions on Systems, Man, and Cybernetics*, vol. 23, no. 3, pp. 665-685, 1993—incorporated herein by reference).

To design a MPPT controller using ANFIS, first task is to gather the input-output data set for training purpose. This training data is generated using the developed PV model in chapter 3. A step by step process of data generation is illustrated in the flowchart shown in FIG. 28. As a first step, values of the five unknown parameters for a considered PV panel and PV array are estimated using an proposed efficient algorithm. The training parameters are: $N_{MAX}$: Number of training data points, $T_{MIN}$: Minimum temperature, $T_{MAX}$: Maximum, $S_{MIN}$: Minimum Irradiation $S_{MAX}$: Maximum Irradiation, and $T_{MIN}$, $T_{MAX}$ and $S_{MIN}$, $S_{MAX}$ represent the range of temperature and irradiation and can be specified depending upon the geographical location where PV array is installed.

Figure 28:
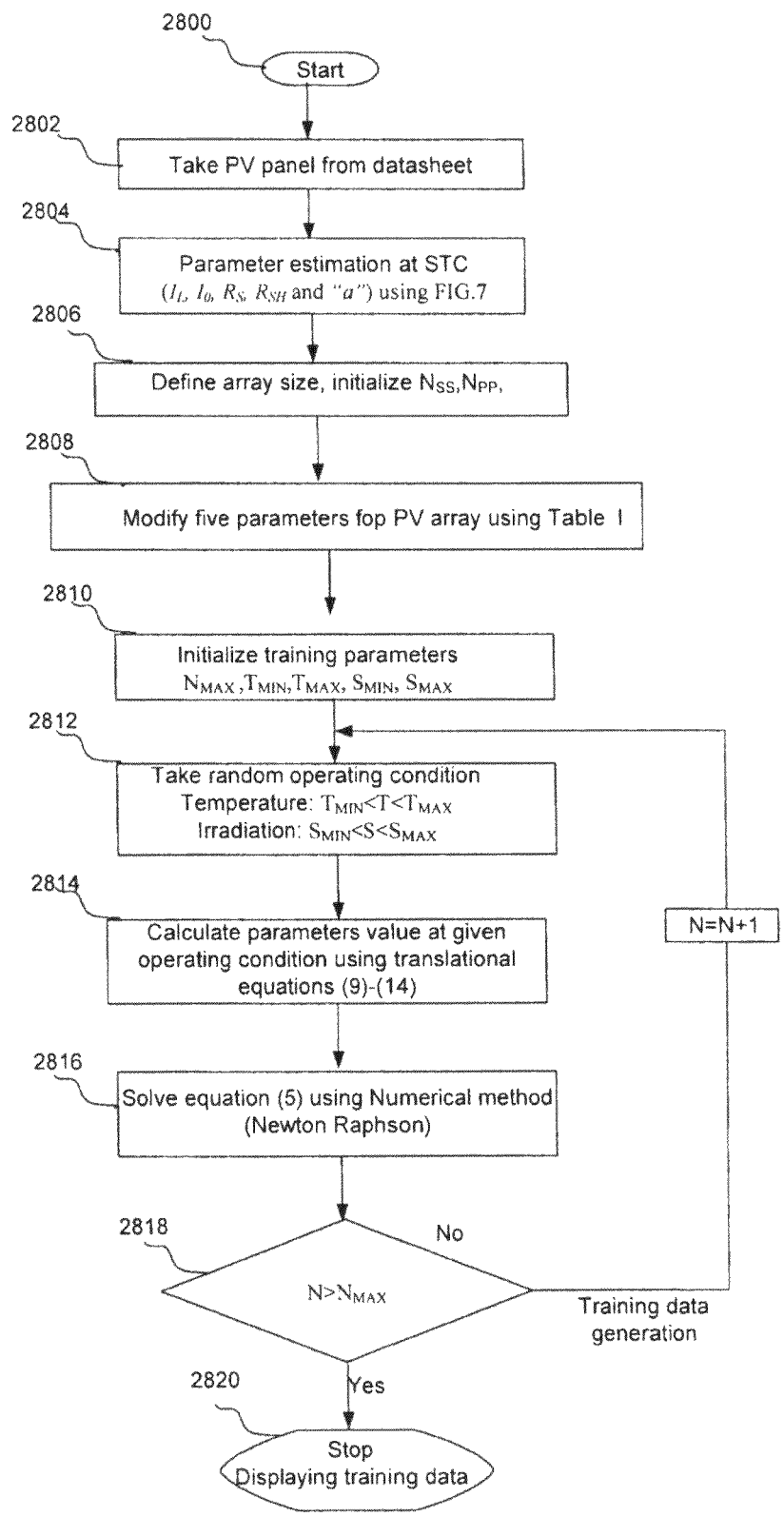
FIG. 28 shows a flow chart of a proposed method to generate input output data set for the Adaptive Network-Based fuzzy Inference System training.

As shown in FIG. 28, at step 2802, the processing circuitry takes photovoltaic panel data from the data sheet.

At step 2804, the processing circuitry use Differential evolution method shown in FIG. 7 to estimate the ($I_L$, $I_0$, $R_S$, $R_{SH}$ and "a") at Standard Test Condition (STC). At step 2806, the processing circuitry define the size of the photovoltaic and initialize $N_{SS}$ and $N_{PP}$, where the $N_{SS}$ and $N_{PP}$ represent the number of panels connected in series and parallel, respectively. At step 2808, the processing circuitry modifies the five parameters ($I_L$, $I_0$, $R_S$, $R_{SH}$ and "a") photovoltaic array using Table I. At step 2810, the processing circuitry initializes the training parameters $N_{MAX}$, $T_{MIN}$, $T_{MAX}$, $S_{MIN}$ and $S_{MAX}$.

From step 2812 to step 2814, the processing circuitry generates random operating condition within the specified range and modification of five parameters at this operating condition using equation (9)-(14). Advantage of using the random operating condition is that it includes the uncertainties of the weather conditions within the training process. At step 2816, the transcendental non-linear equation (5) is solved for current calculation using proficient numerical technique (Newton-Raphson in our case) and value of voltage corresponding to maximum power point is stored against the specified operating condition by the process circuitry. This process is executed for $N_{MAX}$ times to generate the training data set of length $N_{MAX}$ as show in step 2818. After getting the input-output data set, next step is to design the ANFIS-based MPPT by hybrid learning algorithm. In the learning algorithm parameters of the membership functions are adapted such that they track the input output data finely.

Figure 29:
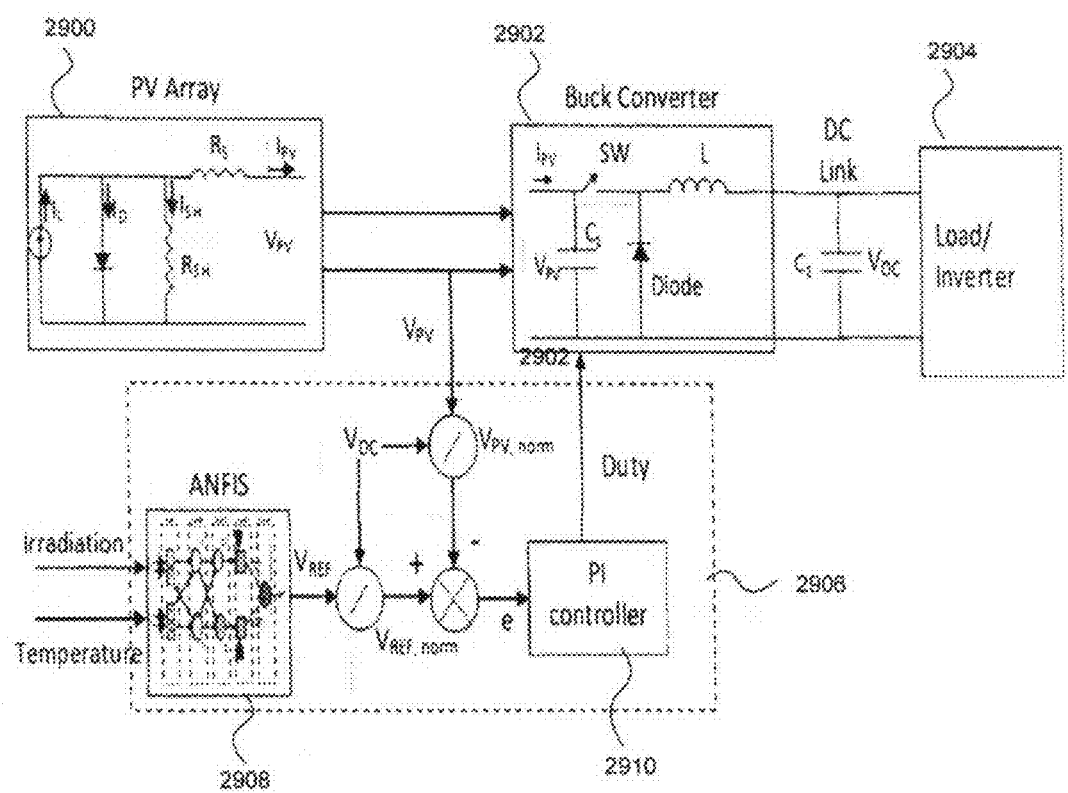
FIG. 29 shows a photovoltaic system.

The arrangement of the developed ANFIS-based MPPT controller is shown in FIG. 29. Input of the proposed ANFIS-based MPPT controller 2906 is the ambient conditions, i.e irradiation and temperature and its output is the reference voltage ($V_{REF}$) which is normalized using DC link voltage ($V_{DC}$). The normalized reference voltage ($V_{REF,norm}$) is feedback to the voltage control loop where proportional-integral (PI) controller 2910 is used to maintain the output voltage of photovoltaic array 2900 ($V_{PV}$) to the reference optimal voltage by adjusting the duty ratio of DC-DC converter 2902, which results in maximum power extraction.

A photovoltaic system used to verify the competence of the proposed ANFIS-based MPPT controller is shown in FIG. 29. It consists of photovoltaic array 2900, DC-DC buck converter 2902, MPPT controller 2906, DC link capacitor and inverter 2904. The photovoltaic (PV) array 2900 will generate a varying DC voltage ($V_{PV}$) and current ($I_{PV}$) depending upon the weather conditions. Buck converter 2902 and DC link capacitor are utilized to smooth these varying quantities and make accessible for the inverter. MPPT 2906 is employed as a controller for buck converter that adjusts the duty ratio of switch to extract maximum possible power from the PV array 2900 under all operating conditions.

Specifications of a photovoltaic panel used are shown in Table 3. An array of 50×20 panels is used to show the operation of the proposed ANFIS-based MPPT controller with a large PV power station.

TABLE 3

| Panel parameters from data sheet | Value | Estimated model parameters | Values |
|---|---|---|---|
| $V_{OC}$ | 21.7 | $I_L$ | 3.35 |
| $I_{SC}$ | 3.35 | $I_0$ | 1.7053e−05 |
| $V_{MP}$ | 17.4 | $R_S$ | 0.00477 |

TABLE 3-continued

| Panel parameters from data sheet | Value | Estimated model parameters | Values |
|---|---|---|---|
| $I_{MP}$ | 3.05 | $R_{SH}$ | 3.9601e+04 |
| $N_c$ | 36 | a | 1.78044 |

Buck converter 2902 is designed to work in a continuous conduction mode (CCM) and have the specifications of; $C_1$=100 µF, L=5 mH, switching frequency of 5 kHz and DC link capacitor $C_2$=500 µF. Training parameters used to generate the set of input-output data set are; $N_{MAX}$=1000, $T_{MAX}$=80° C., $T_{MIN}$=0° C., $S_{MAX}$=2000 W/m², $S_{MIN}$=0 W/m². These parameters show the wide and dynamic range for temperature and irradiation that allows the designed MPPT 2906 to work efficiently under uncertain operating conditions.

Figure 30:
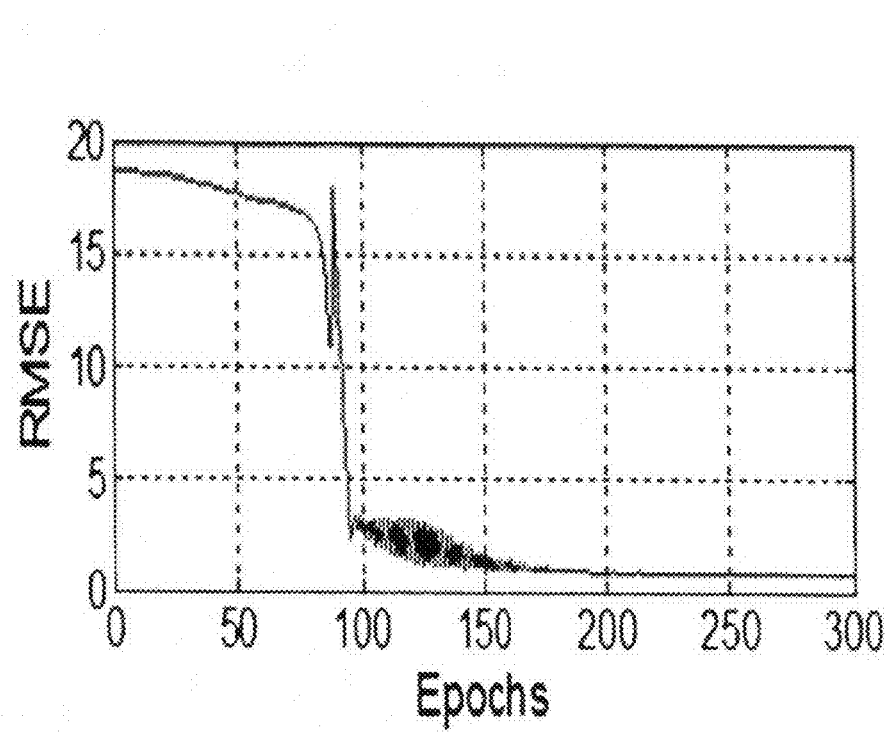
FIG. 30 shows a diagram of training error versus epochs for the Adaptive Network-Based fuzzy Inference System.

The ANFIS-based MPPT is developed in MATALB/Simulink using three generalized bell (g-bell) membership functions. Hybrid learning algorithm is utilized that use the LSE to adapt the consequent parameters and back propagation method to optimize the premise parameters of the membership functions. The epochs selected for training purpose is 300 that reduced the training root mean square error (RMSE) to the lower value of 0.8 as shown in FIG. 30.

To validate the effectiveness of the proposed ANFIS-based MPPT a comparison with conventional incremental conductance (InCond) method is carried out. Four different tests are conducted to verify the effectiveness of the proposed controller. These tests are step-up change in irradiation, step-down change in irradiation, step-up change in temperature and step-down change in temperature and are explained below.

Figure 31:
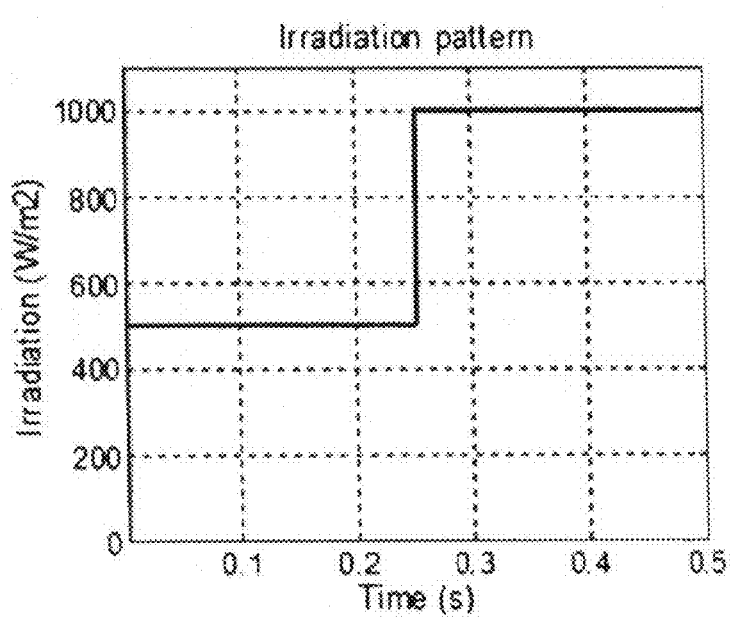
FIG. 31 shows a diagram of a setup-up irradiation pattern of a Test 1 for an adaptive network-based fuzzy inference based maximum power point tracking controller.
Figure 32:
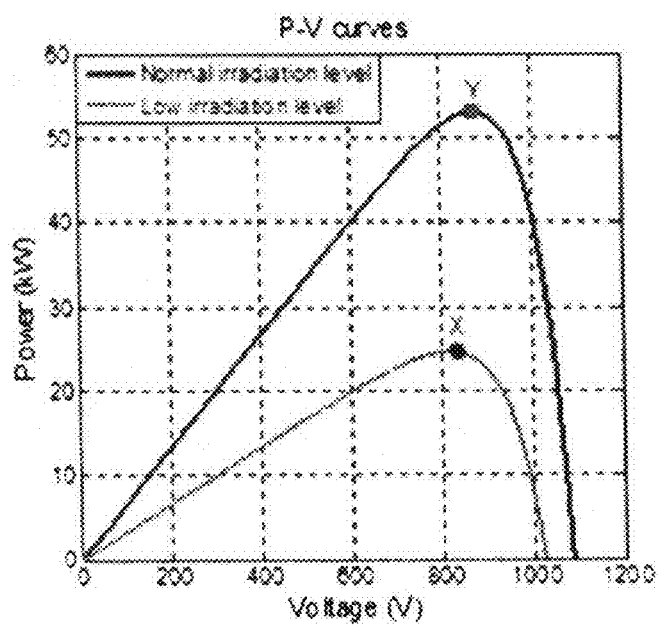
FIG. 32 shows a diagram of power vs. voltage curve under normal and low irradiation conditions of the Test 1 for the adaptive network-based fuzzy inference based maximum power point tracking controller.

A Test 1 for the adaptive network-based fuzzy inference based maximum power point tracking controller is conducted under the step-up change in irradiation level and its pattern is shown in the FIG. 31. It shows that the solar radiation is constant with a value of 500 W/m² up to 0.25 seconds and then increases drastically to 1000 W/m². The P-V curves for selected PV array under low (500 W/m² and 25° C.) and normal (1000 W/m² and 25° C.) irradiation level are shown in FIG. 32. It can be seen that the maximum power that can be generated by PV array at low irradiation level is 24.669 kW and labeled as point X on the graph. After a step-up change in irradiation, the operating point shifts to point Y having the maximum possible power of 53.07 kW ($V_{MP}*I_{MP}*N_{SS}*N_{PP}$=53.07 kW).

Figure 33:
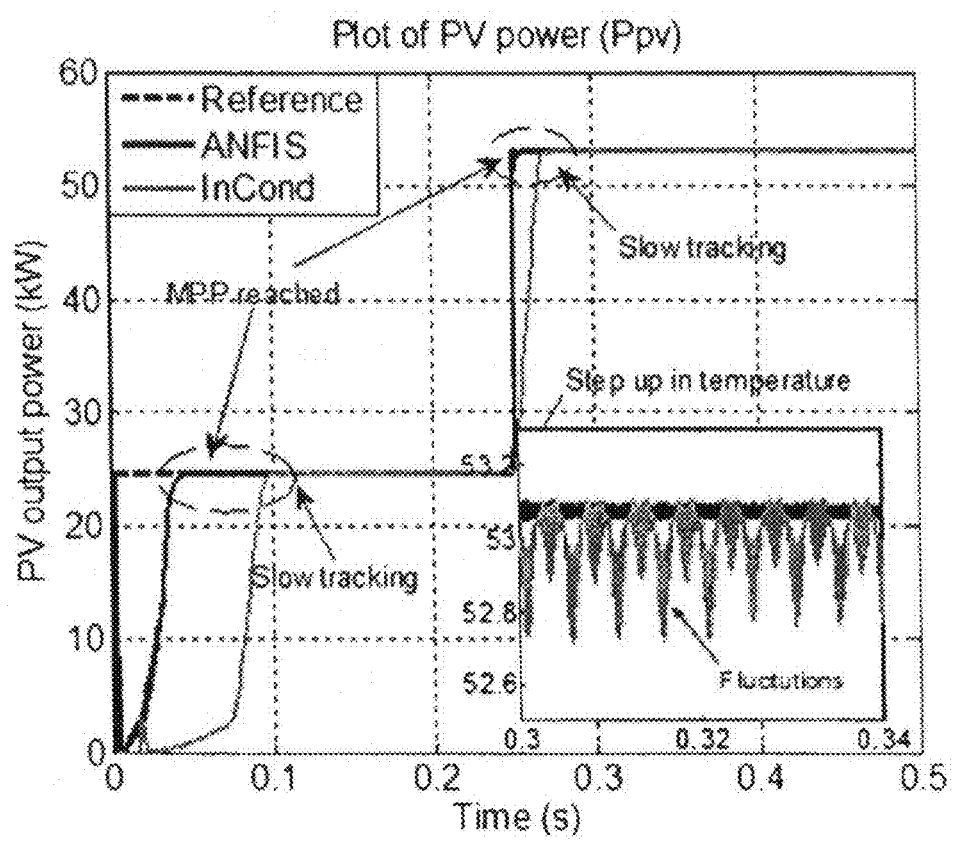
FIG. 33 shows a diagram of characteristics of Photovoltaic power output under step-up irradiation change of the Test 1 for the adaptive network-based fuzzy inference based maximum power point tracking controller.

A non-linear time domain simulation is carried out with the proposed ANFIS-based and InCond-based MPPT controllers. For InCond method fixed value of perturbation step size is chosen based on a tradeoff between fluctuations in the steady state and tracking speed. FIG. 33 shows a comparison of PV array power output ($P_{PV}$) for both the controllers. It can be seen from the graph that the MPP reached by the proposed ANFIS-based MPPT controller is much faster than the conventional InCond in both the tracking regions, i.e start of the algorithm and step-up change in irradiation. For example it can track the MPP in 0.04 sec while the InCond take 0.1 sec in the start of the algorithm. When a step-up change in irradiation occur, the MPPT controller shifts the operating point from point X to Y and it can be noticed from the plot that the response of InCond is much slower than the proposed ANFIS-based MPPT.

To demonstrate the efficiency of a proposed controller in the steady state region, portion of a graph from 0.3 sec to 0.34 sec is enlarged where irradiation level is maintained at 1000 W/m². It can be noticed from the enlarged graph that the proposed ANFIS-based MPPT has smoother response as compare to InCond which shows a considerable amount of fluctuation in the steady state and its power varies from 53.07 kW to 52.78 kW that shows oscillation of 294 W. Although, it is possible to diminish these fluctuations by reducing the perturbation step size but that results in even more slow tracking of MPP.

Figure 34:
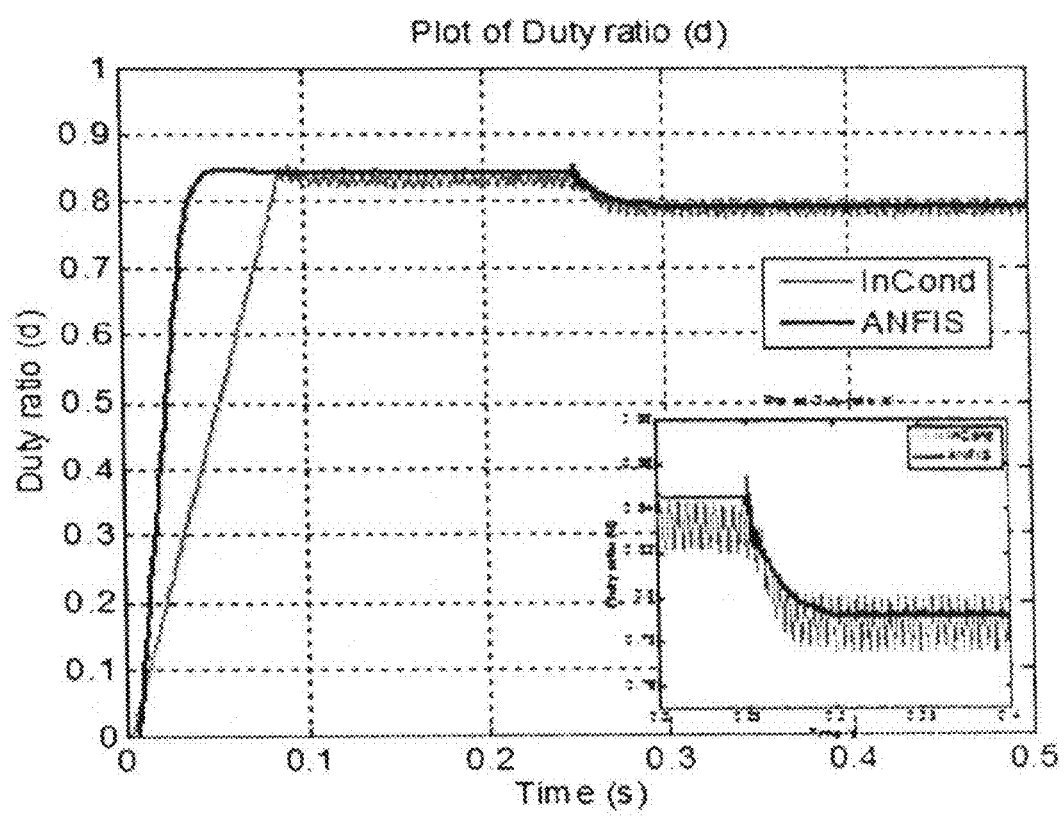
FIG. 34 shows a plot of duty ratio under step-up change in irradiation of the Test 1 for the adaptive network-based fuzzy inference based maximum power point tracking controller.
Figure 35:
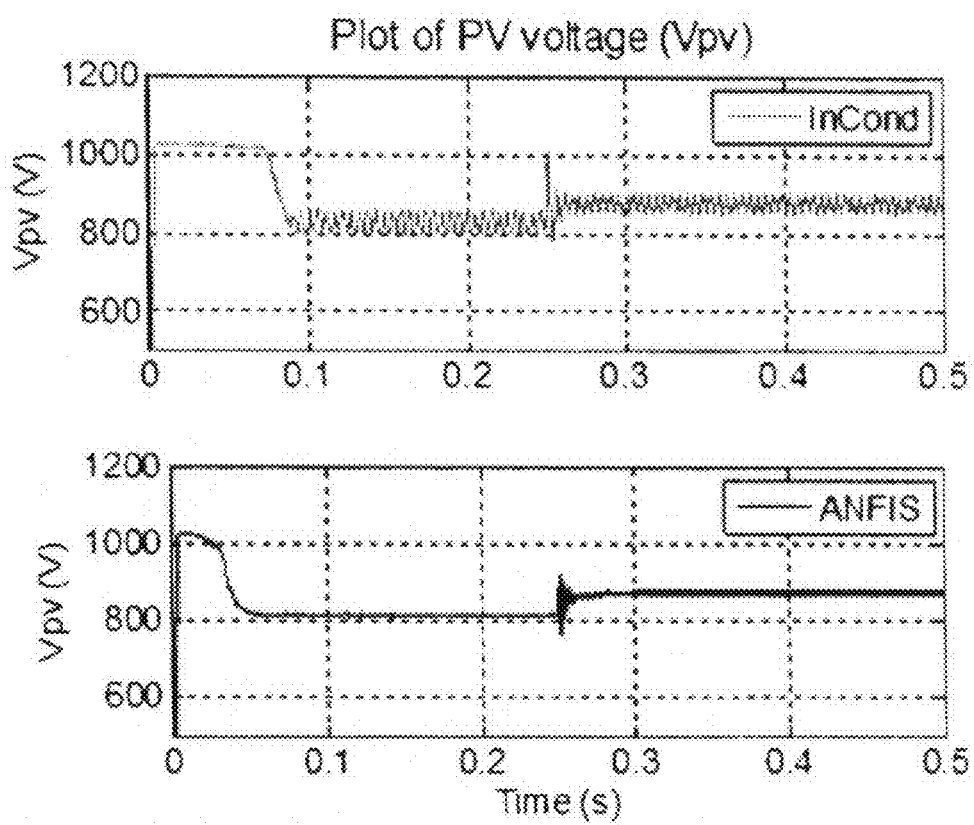
FIG. 35 shows a plot of characteristics of photovoltaic voltage under step-up irradiation change of the Test 1 for the adaptive network-based fuzzy inference based maximum power point tracking controller.
Figure 36:
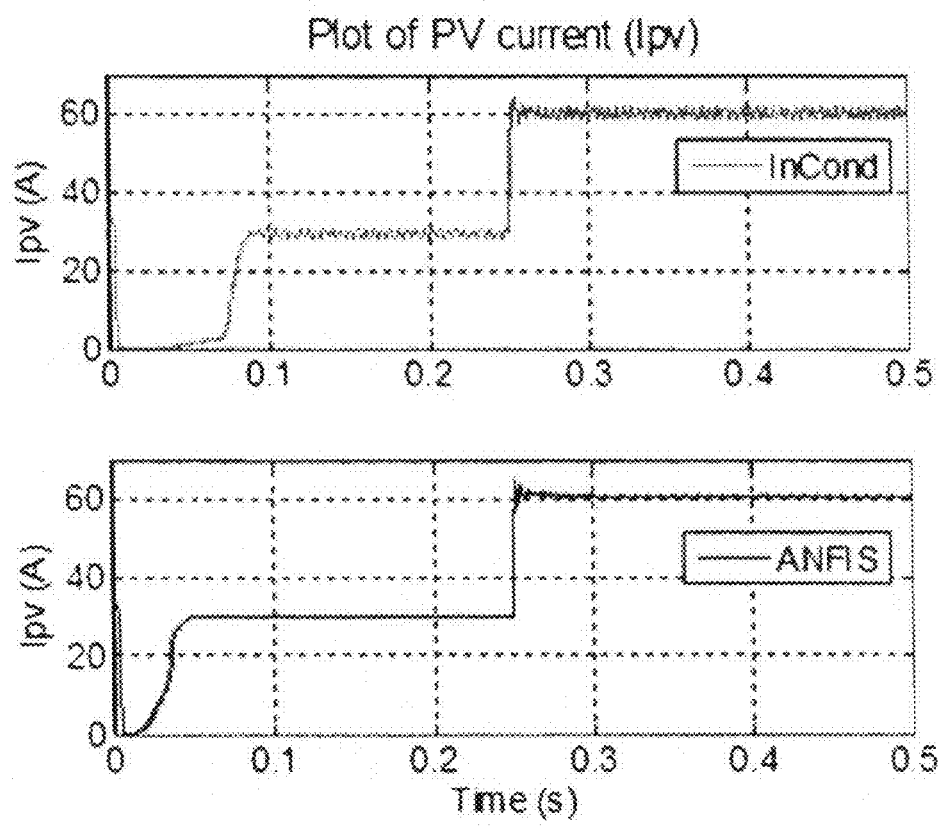
FIG. 36 shows a plot of characteristics of photovoltaic current under step-up irradiation change of the Test 1 for the adaptive network-based fuzzy inference based maximum power point tracking controller.

The simulation results for duty cycle, PV array voltage ($V_{PV}$) and current ($I_{PV}$) are shown in FIG. 34, FIG. 35 and FIG. 36, respectively, and verify the effectiveness of the proposed MPPT under the rapidly changing irradiation condition.

Figure 37:
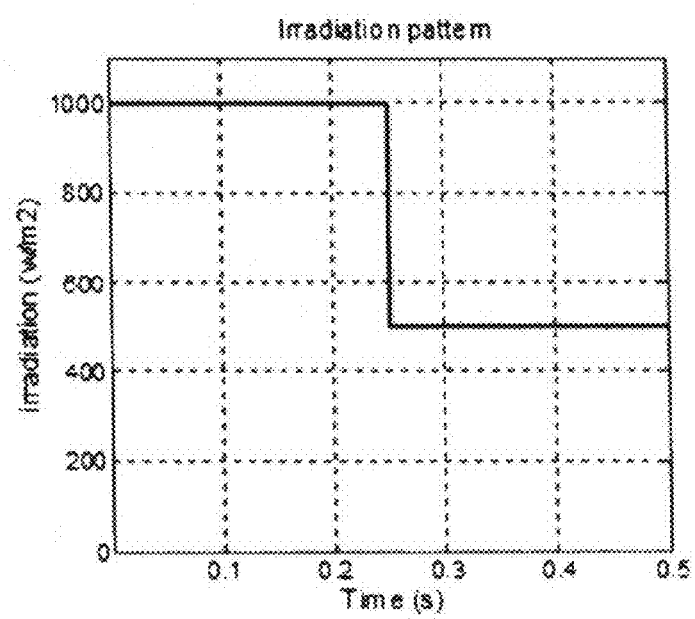
FIG. 37 shows a plot of a setup-down irradiation pattern of a Test 2 for the adaptive network-based fuzzy inference based maximum power point tracking controller.
Figure 38:
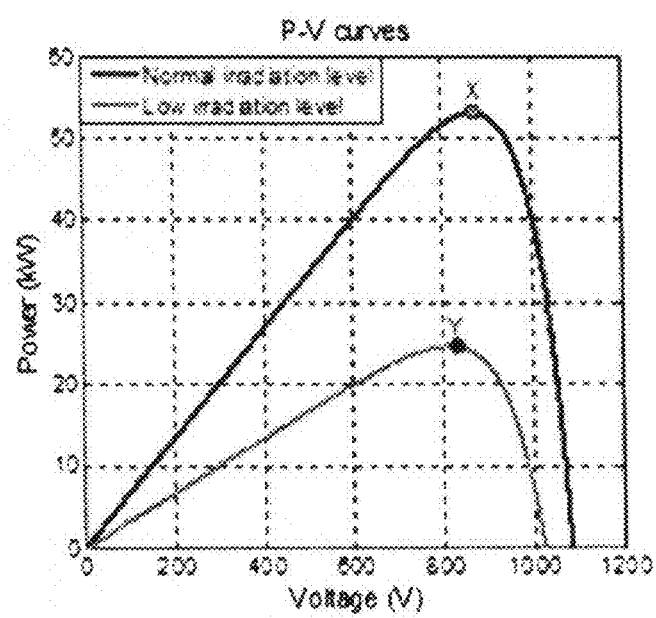
FIG. 38 shows a diagram of Power vs. voltage curve under normal and low irradiation conditions of the Test 2 for the adaptive network-based fuzzy inference based maximum power point tracking controller.

A test 2 for the adaptive network-based fuzzy inference based maximum power point tracking controller is conducted under the step-down change in irradiation level and its pattern is shown in the FIG. 37. It shows that the solar radiation is constant with a value of 1000 W/m² up to 0.25 seconds and then decrease drastically to 500 W/m². The P-V curves for selected PV array under normal (1000 W/m² and 25° C.) and low (500 W/m² and 25° C.) irradiation level are shown in Error! Reference source not found. It can be seen that the maximum power that can be generated by PV array at normal irradiation level is 53.07 kW ($V_{MP}*I_{MP}*N_{SS}*N_{PP}$=53.07 kW) and labeled as point X on the graph. After a step-down change in irradiation, the operating point shifts to point Y having the maximum possible power of 24.669 kW as shown in FIG. 38.

Figure 39:
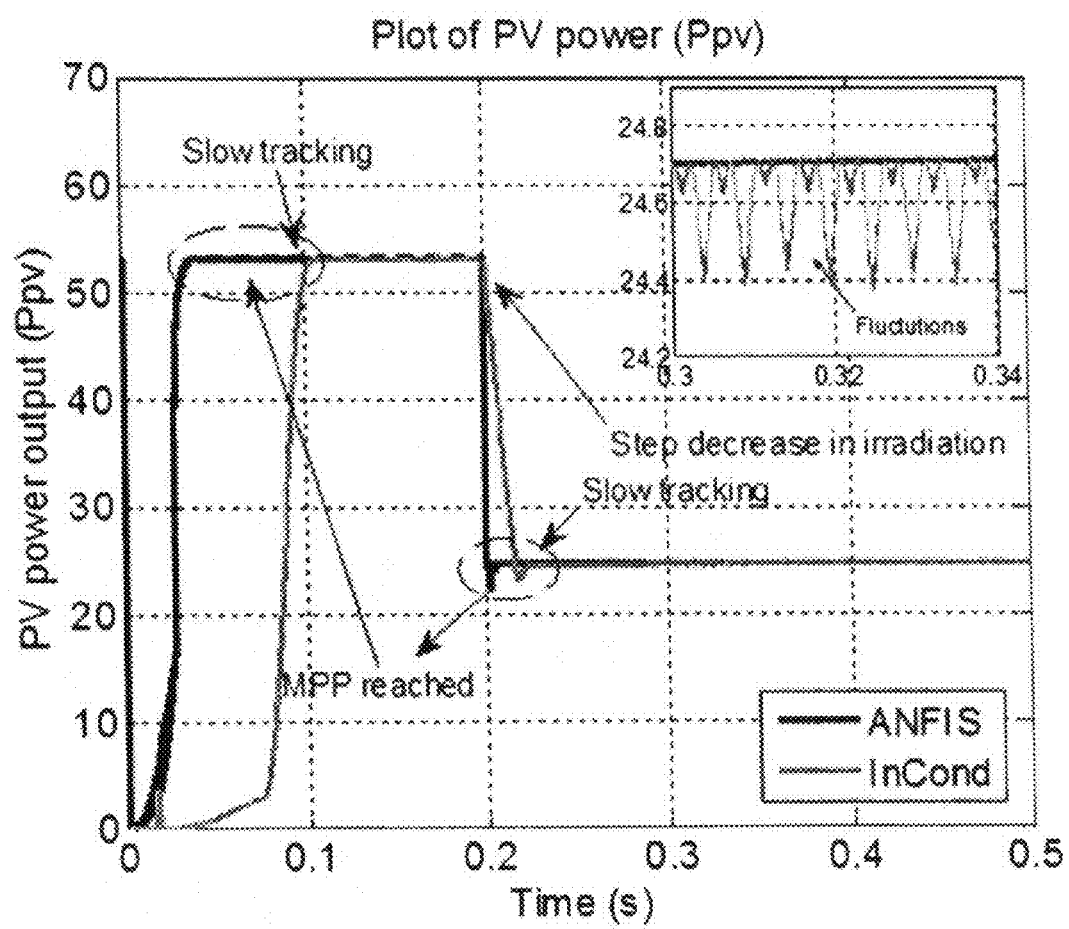
FIG. 39 shows a diagram of characteristics of photovoltaic power output under step-down irradiation change of the Test 2 for the adaptive network-based fuzzy inference based maximum power point tracking controller.

A non-linear time domain simulation is carried out with the proposed ANFIS-based and InCond MPPT controllers. For InCond method fixed value of perturbation step size is chosen based on a tradeoff between fluctuations in the steady state and tracking speed. FIG. 39 shows a comparison of PV array power output ($P_{PV}$) for both the controllers. It can be seen from the graph that the MPP reached by the proposed ANFIS-based controller is much faster than the conventional InCond in both the tracking regions, i.e start of the algorithm and step-up change in irradiation. For example it can track the MPP in 0.04 sec while the InCond take more than 0.1 sec in the start of the algorithm. When a step-down change in irradiation occur, the MPPT controller shifts the operating point from point X to Y and it can be noticed from the plot that the response of InCond is much slower than the proposed ANFIS-based MPPT.

To demonstrate the efficiency of a proposed controller in the steady state region, portion of a graph from 0.3 sec to 0.34 sec is enlarged where irradiation level is maintained at 500 W/m². It can be noticed from the enlarged graph that the proposed ANFIS-based MPPT has smoother response as compare to InCond which shows a considerable amount of fluctuation in the steady state and its power varies from 24.67 kW to 24.39 kW that shows oscillation of 280 W. Although, it is possible to diminish these fluctuations by reducing the perturbation step size but that results in even more slow tracking of MPP.

Figure 40:
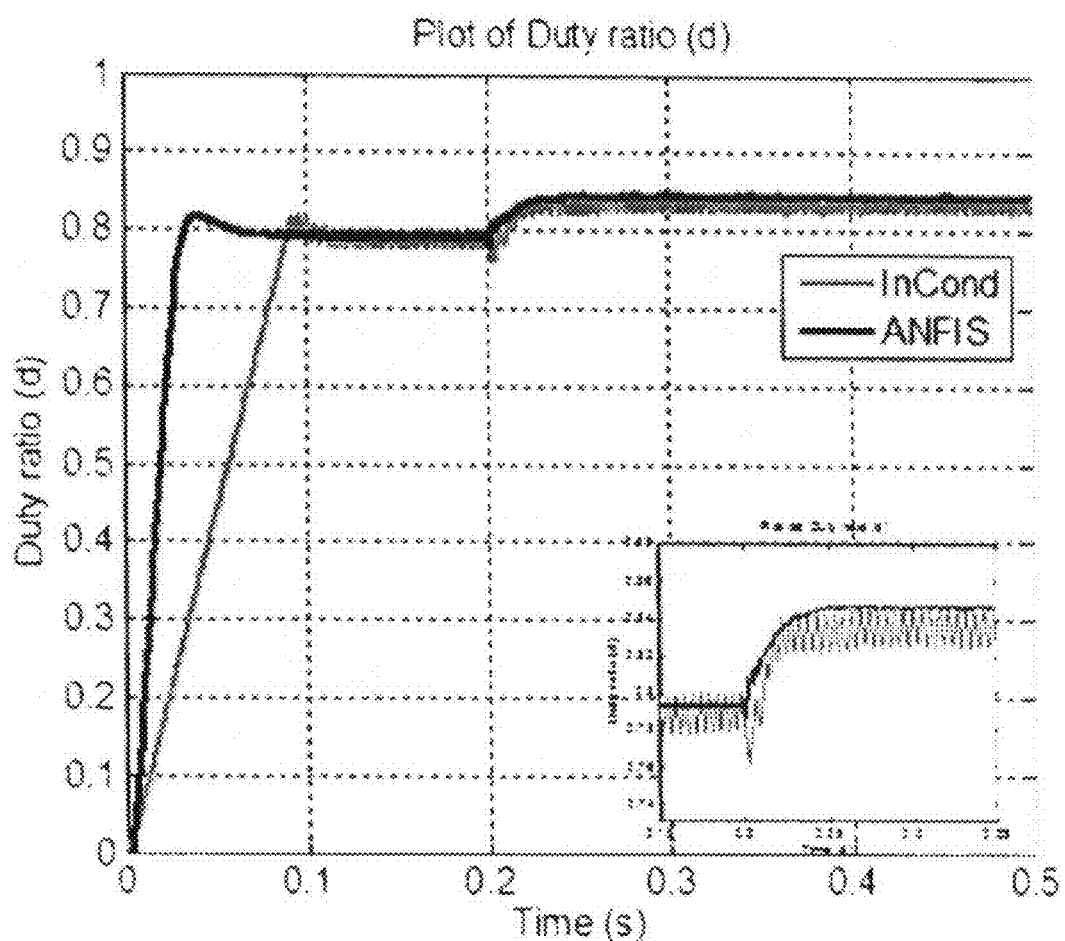
FIG. 40 shows a plot of duty ratio under step-down change in irradiation of the Test 2 for the adaptive network-based fuzzy inference based maximum power point tracking controller.
Figure 41:
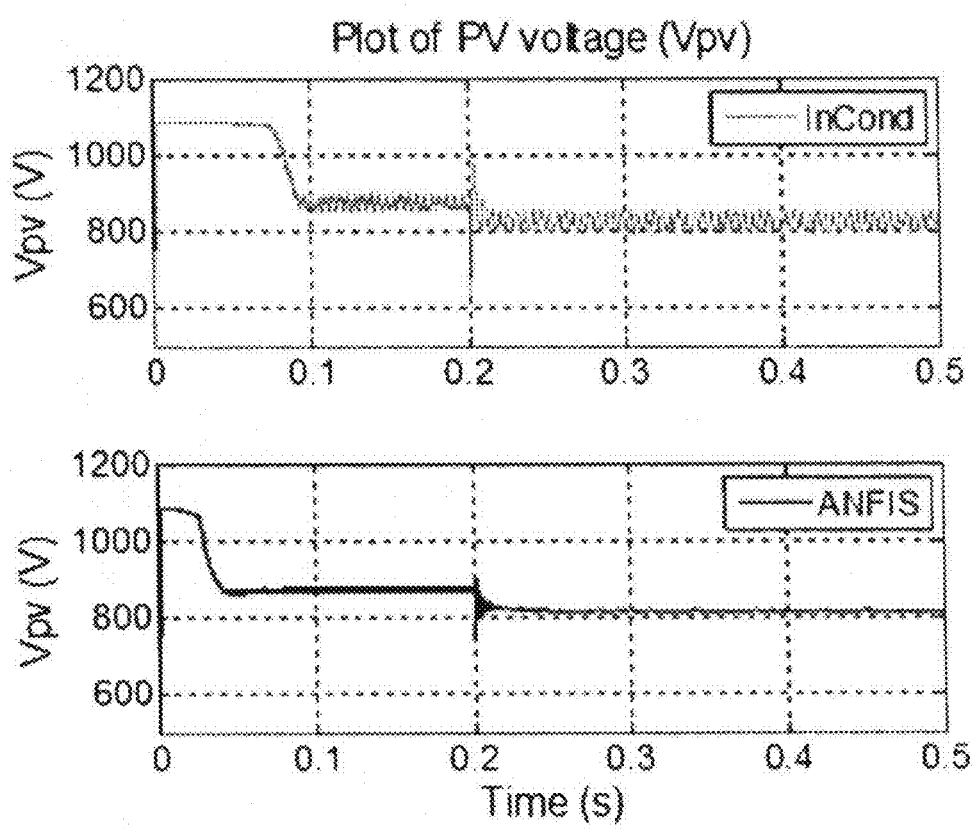
FIG. 41 shows a plot of characteristics of photovoltaic voltage under step-down irradiation change of the Test 2 for the adaptive network-based fuzzy inference based maximum power point tracking controller.
Figure 42:
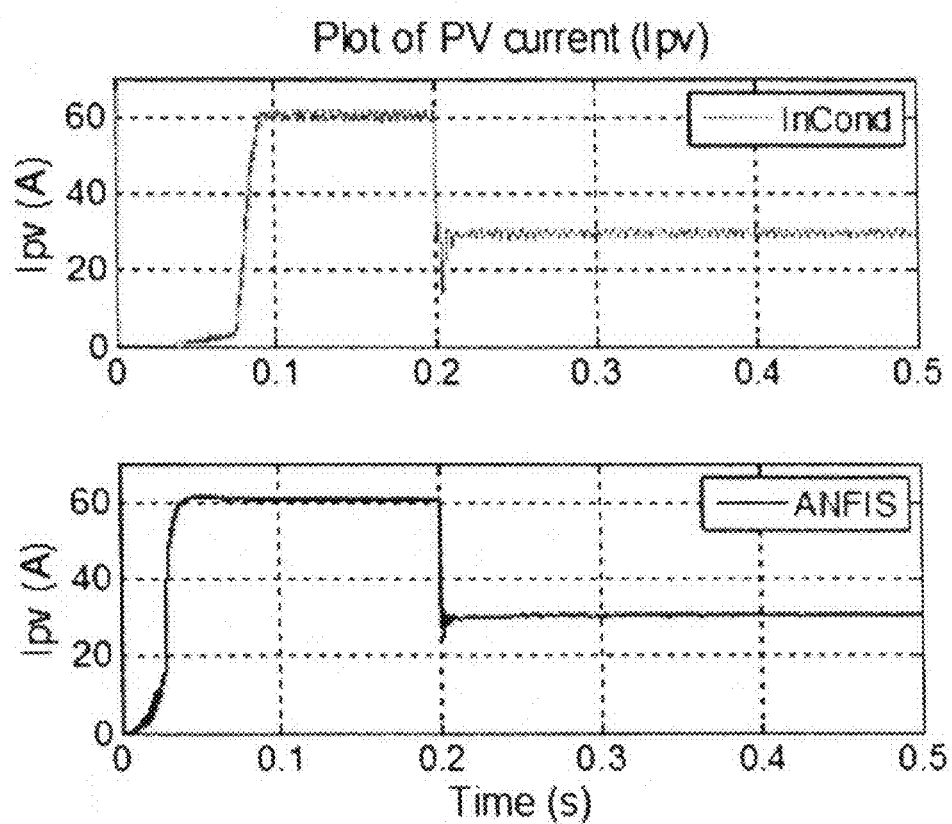
FIG. 42 shows a plot of characteristics of photovoltaic current under step-down irradiation change of the Test 2 for the adaptive network-based fuzzy inference based maximum power point tracking controller.

The simulation results for duty cycle, PV array voltage ($V_{PV}$) and current ($I_{PV}$) are shown in FIG. 40, FIG. 41 and FIG. 42, respectively, and verify the effectiveness of the proposed MPPT under the rapidly changing irradiation condition.

Figure 43:
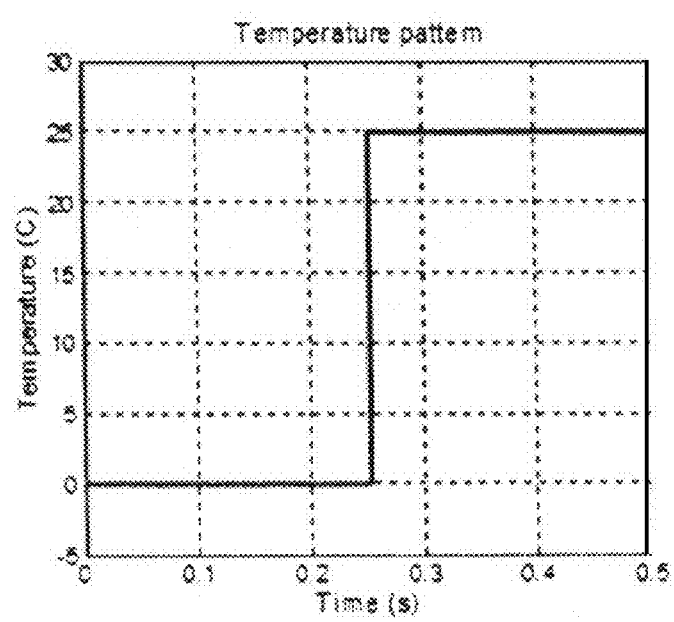
FIG. 43 shows a plot of a step-up temperature pattern of a Test 3 for the adaptive network-based fuzzy inference based maximum power point tracking controller.
Figure 44:
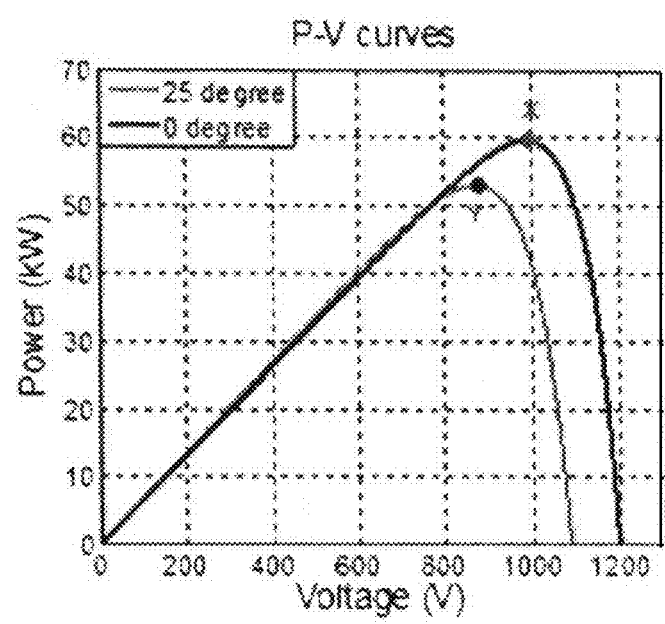
FIG. 44 shows a diagram of power vs. voltage curve under normal and low temperature conditions of the Test 3 for the adaptive network-based fuzzy inference based maximum power point tracking controller.

A test 3 for the adaptive network-based fuzzy inference based maximum power point tracking controller is conducted under the step-up change in temperature and its pattern is shown in the FIG. 43. It shows that the temperature is constant with a value of 0° C. up to 0.25 seconds and then increases drastically to 25° C. The P-V curves for selected PV array at low temperature (0° C. and 1000 W/m²) and normal (1000 W/m² and 25° C.) temperature are shown in FIG. 44. It can be seen that the maximum power that can be generated by PV array at low temperature is 59.53 kW and labeled as point X on the graph. After a step-up change in temperature, the operating point shifts down to point Y having the maximum possible power of 53.07 kW ($V_{MP}*I_{MP}*N_{SS}*N_{PP}$=53.07 kW) as shown in FIG. 44.

Figure 45:
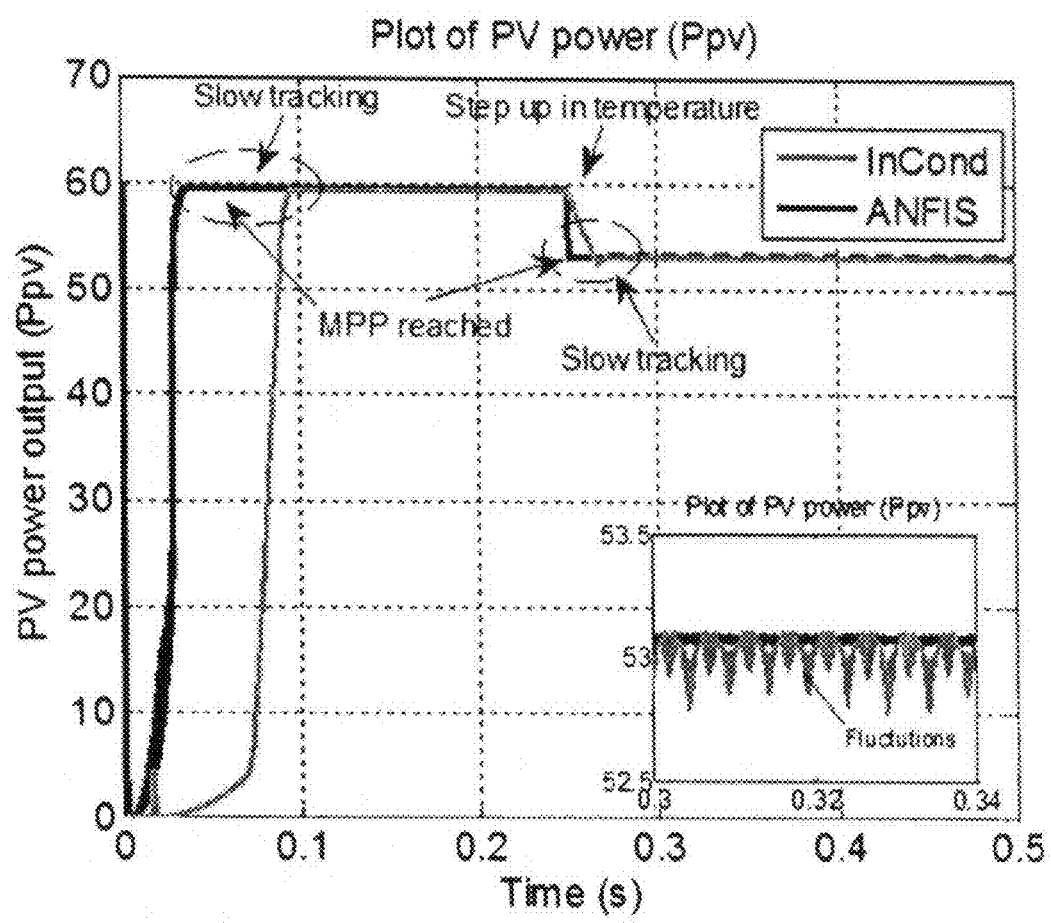
FIG. 45 shows a diagram of characteristics of Photovoltaic power output under step-up temperature change of the Test 3 for the adaptive network-based fuzzy inference based maximum power point tracking controller.

A non-linear time domain simulation is carried out with the proposed ANFIS-based and InCond MPPT controllers. For InCond method fixed value of perturbation step size is chosen based on a tradeoff between fluctuations in the steady state and tracking speed. FIG. 45 shows a comparison of PV array power output ($P_{PV}$) for both the controllers. It can be seen from the graph that the MPP reached by the proposed ANFIS-based controller is much faster than the conventional InCond in both the tracking regions, i.e start of the algorithm and step-up change in temperature. For example it can track the MPP in 0.04 sec while the InCond take more than 0.1 sec in the start of the algorithm. When a step-up change in temperature occur, the MPPT controller shifts the operating point from point X to Y and it can be noticed from the plot that the response of InCond is much slower than the proposed ANFIS-based MPPT.

Figure 46:
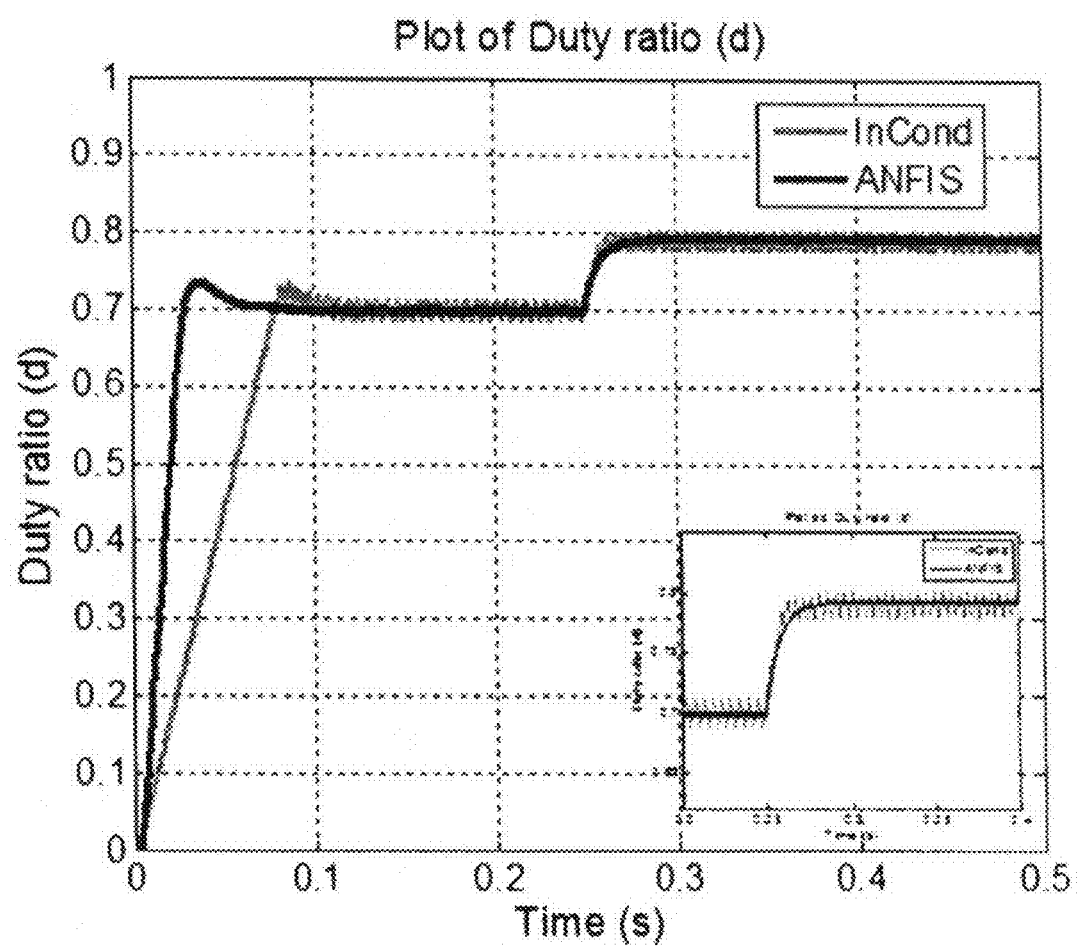
FIG. 46 shows a plot of duty ratio under step-up temperature change of the Test 3 for the adaptive network-based fuzzy inference based maximum power point tracking controller.
Figure 47:
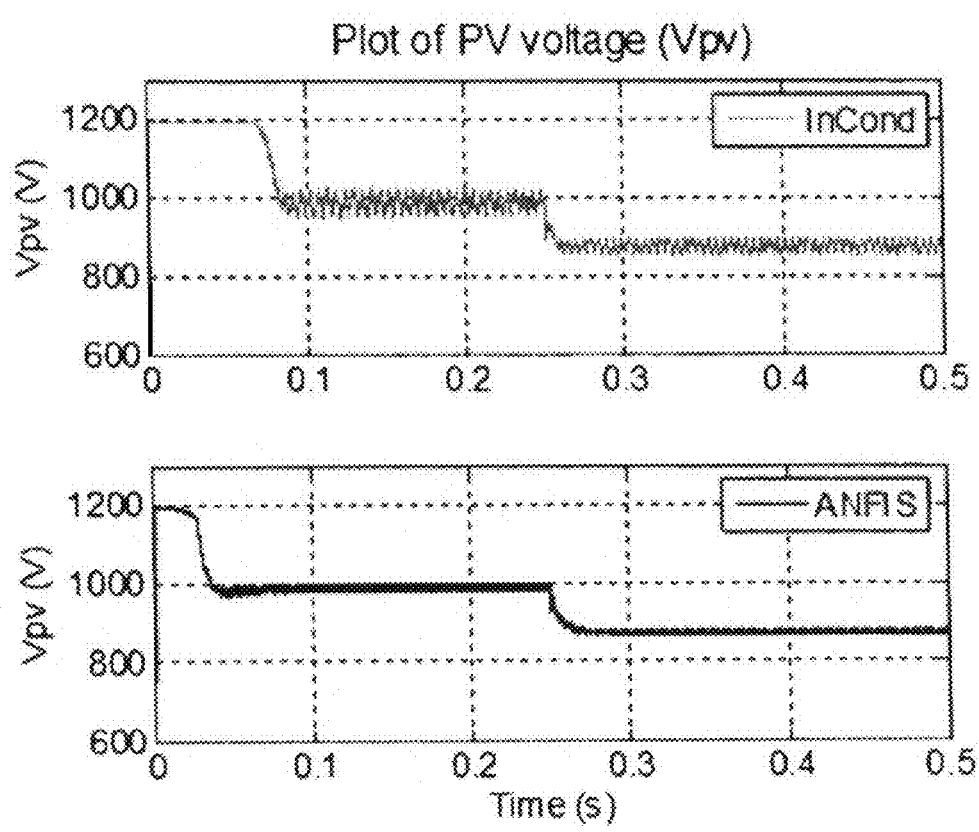
FIG. 47 shows a plot of characteristics of Photovoltaic voltage under step-up temperature change of the Test 3 for the adaptive network-based fuzzy inference based maximum power point tracking controller.
Figure 48:
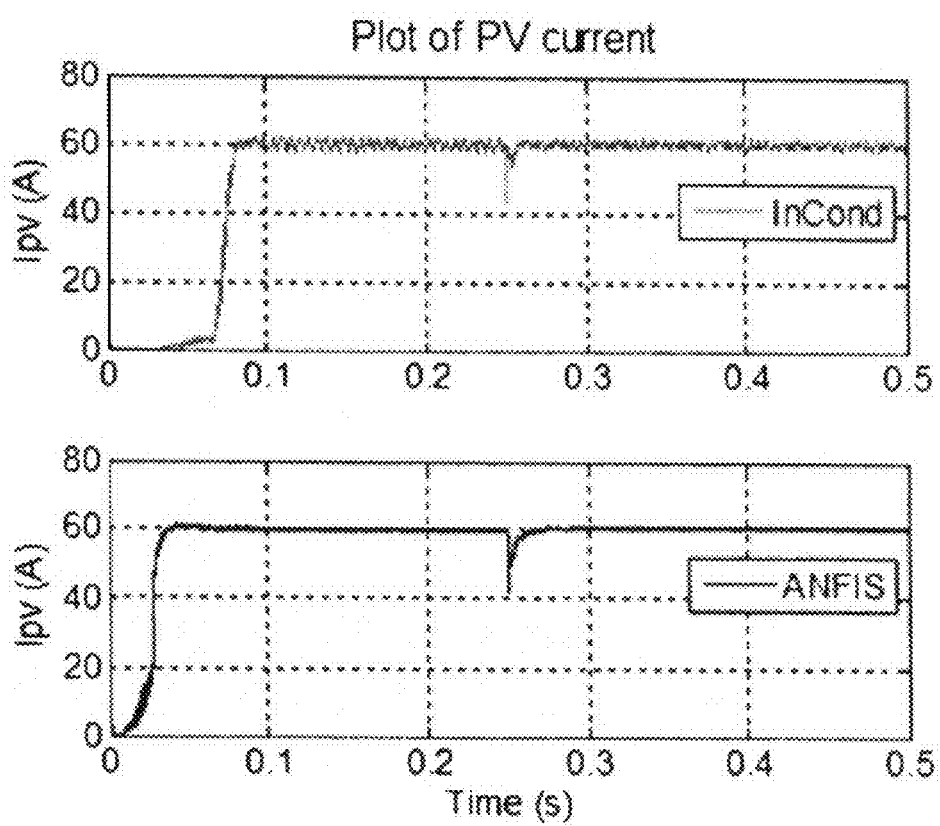
FIG. 48 shows a plot of characteristics of Photovoltaic current under step-up temperature change of the Test 3 for the adaptive network-based fuzzy inference based maximum power point tracking controller.

To demonstrate the efficiency of a proposed controller in the steady state region, portion of a graph from 0.3 sec to 0.34 sec is enlarged where temperature and irradiation level are maintained at 25° C. and 1000 W/m². It can be noticed from the enlarged graph that the proposed ANFIS-based MPPT has smoother response as compare to InCond which shows a considerable amount of fluctuation in the steady. Although, it is possible to diminish these fluctuations by reducing the perturbation step size but that results in even more slow tracking of MPP. The simulation results for duty cycle, PV array voltage ($V_{PV}$) and current ($I_{PV}$) are shown in FIG. 46, FIG. 47 and FIG. 48, respectively, and verify the effectiveness of the proposed MPPT under the rapidly changing temperature condition.

Figure 49:
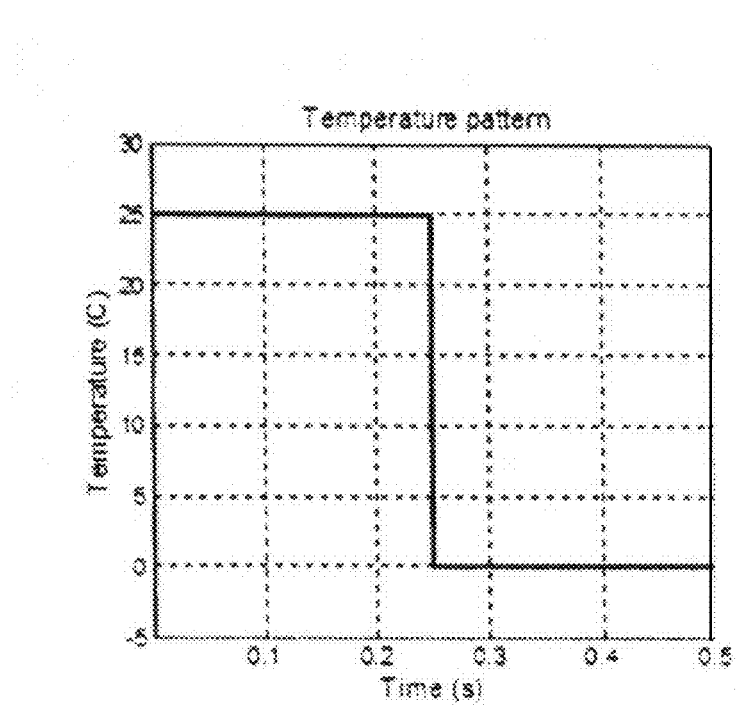
FIG. 49 shows a plot of a step-down temperature pattern of a Test 4 for the adaptive network-based fuzzy inference based maximum power point tracking controller.
Figure 50:
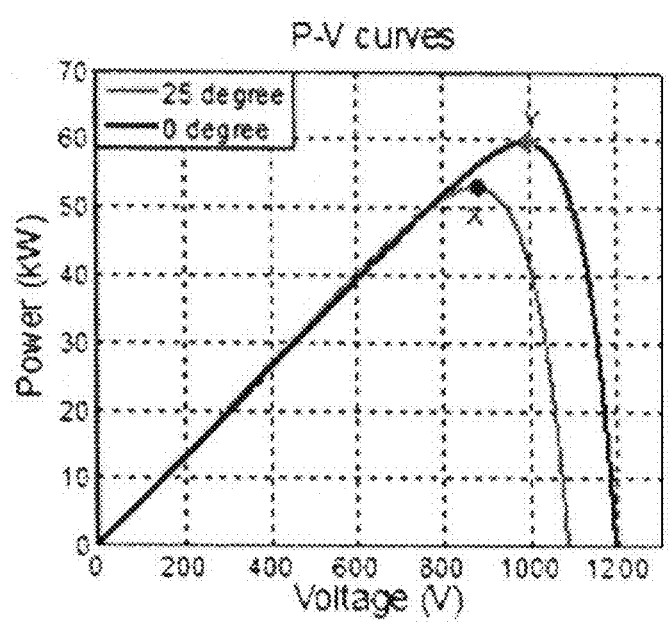
FIG. 50 shows a diagram of power vs. voltage curve under normal and low temperature conditions of the Test 4 for the adaptive network-based fuzzy inference based maximum power point tracking controller.

A test 4 for the adaptive network-based fuzzy inference based maximum power point tracking controller is conducted under the step-down change in temperature and its pattern is shown in the FIG. 49. It shows that the temperature is constant with a value of 25° C. up to 0.25 seconds and then decreases drastically to 0° C. The P-V curves for selected PV array under normal (25° C. and 1000 W/m²) and low temperature (0° C. and 1000 W/m²) irradiation level are shown in FIG. 50. It can be seen that the maximum power that can be generated by PV array at normal irradiation level is 53.07 kW ($V_{MP}*I_{MP}*N_{SS}*N_{PP}$=53.07 kW) and labeled as point X on the graph. After a step-down change in temperature, the operating point shifts up to point Y having the maximum possible power of 59.53 kW as shown in FIG. 50.

Figure 51:
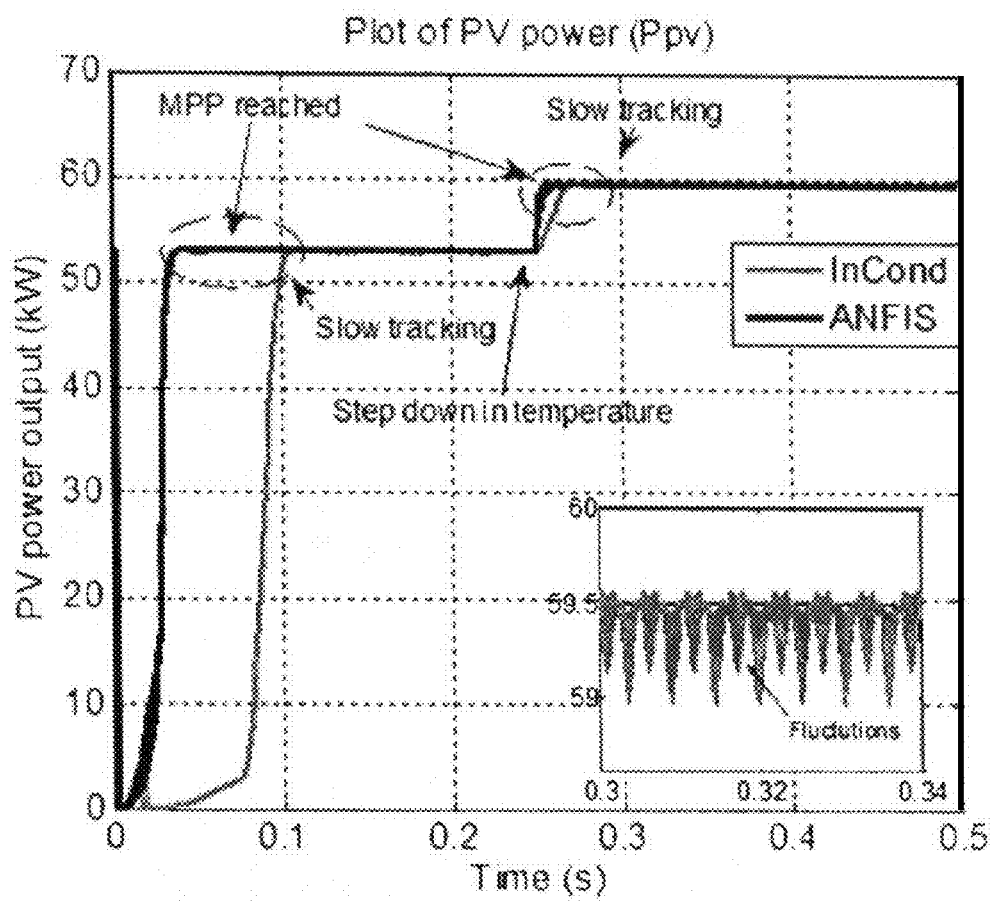
FIG. 51 shows a diagram of characteristics of photovoltaic power output under step-down temperature change of the Test 4 for the adaptive network-based fuzzy inference based maximum power point tracking controller.

A non-linear time domain simulation is carried out with the proposed ANFIS-based and InCond MPPT controllers. For InCond method fixed value of perturbation step size is chosen based on a tradeoff between fluctuations in the steady state and tracking speed. FIG. 51 shows a comparison of PV array power output ($P_{PV}$) for both the controllers. It can be seen from the graph that the MPP reached by the proposed ANFIS-based controller is much faster than the conventional InCond in both the tracking regions, i.e start of the algorithm and step-up change in irradiation. For example it can track the MPP in 0.04 sec while the InCond take more than 0.1 sec in the start of the algorithm. When a step-down change in temperature occur, the MPPT controller shifts the operating point from point X to Y and it can be noticed from the plot that the response of InCond is much slower than the proposed ANFIS-based MPPT.

To demonstrate the efficiency of a proposed controller in the steady state region, portion of a graph from 0.3 sec to 0.34 sec is enlarged where temperature and irradiation level is maintained at 0° C. and 1000 W/m². It can be noticed from the enlarged graph that the proposed ANFIS-based MPPT has smoother response as compare to InCond which shows a considerable amount of fluctuation in the steady state. Although, it is possible to diminish these fluctuations by reducing the perturbation step size but that results in even more slow tracking of MPP.

Figure 52:
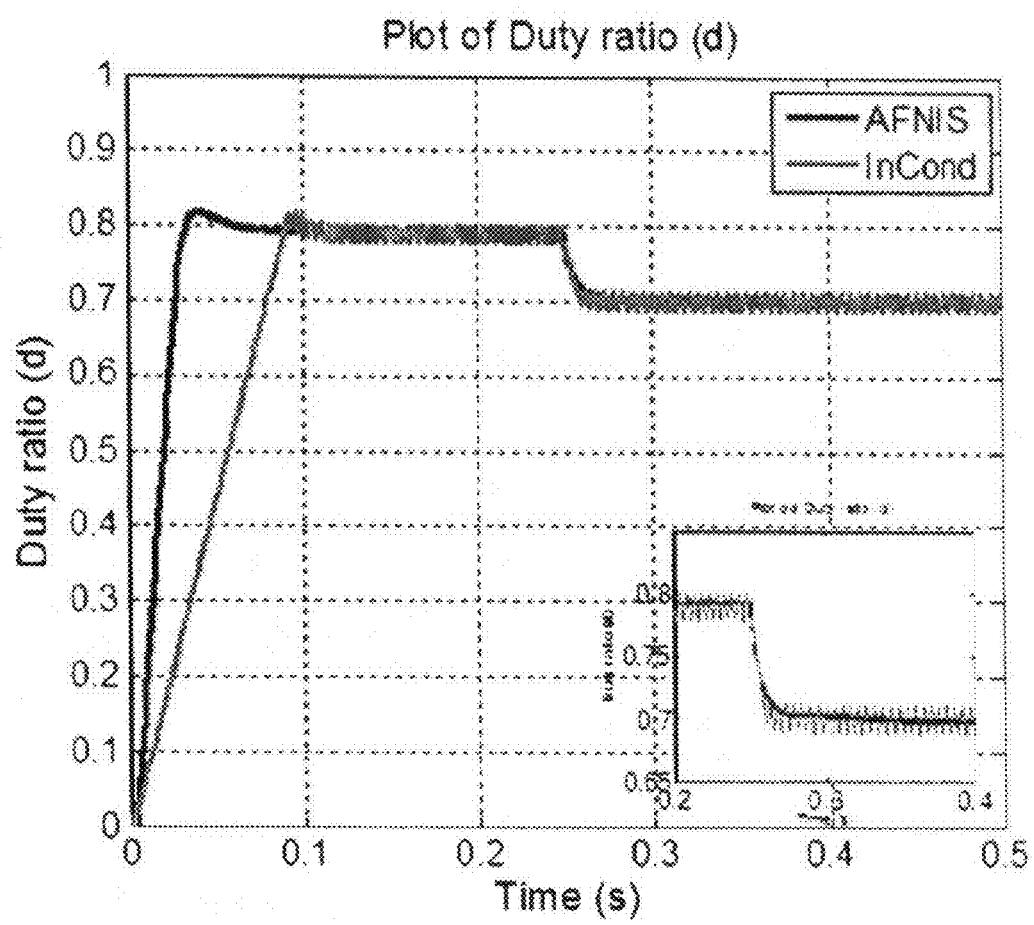
FIG. 52 shows a plot of duty ratio under step-down change in temperature of the Test 4 for the adaptive network-based fuzzy inference based maximum power point tracking controller.
Figure 53:
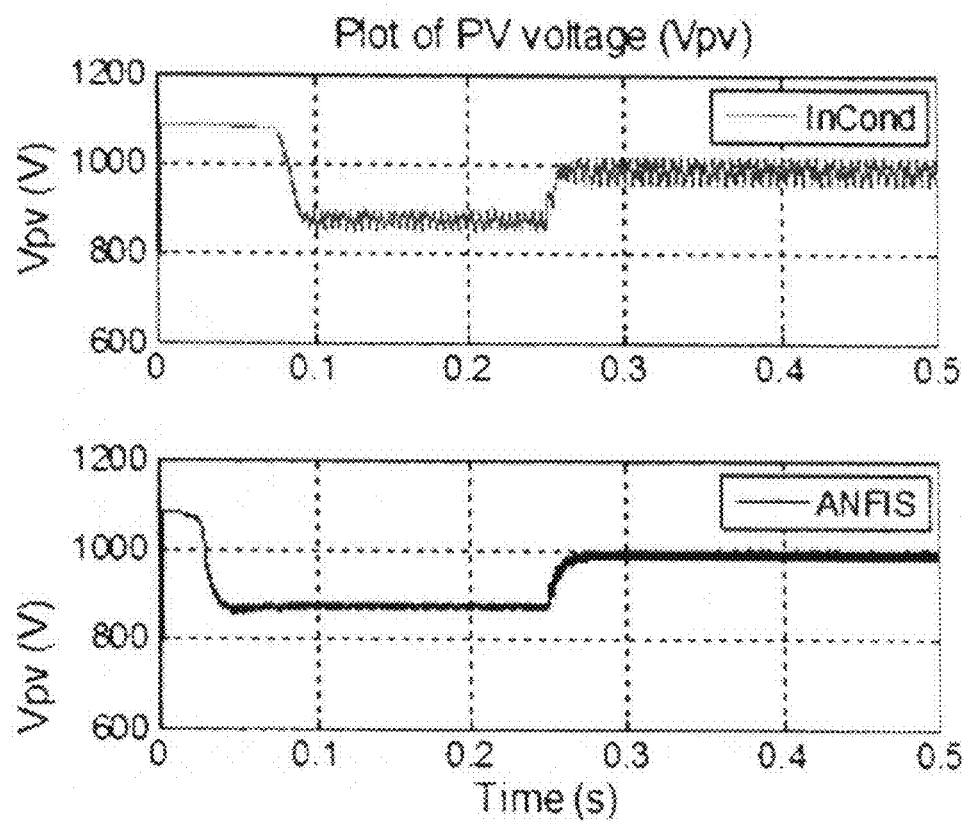
FIG. 53 shows a plot of characteristics of photovoltaic voltage under step-down temperature change of the Test 4 for the adaptive network-based fuzzy inference based maximum power point tracking controller.
Figure 54:
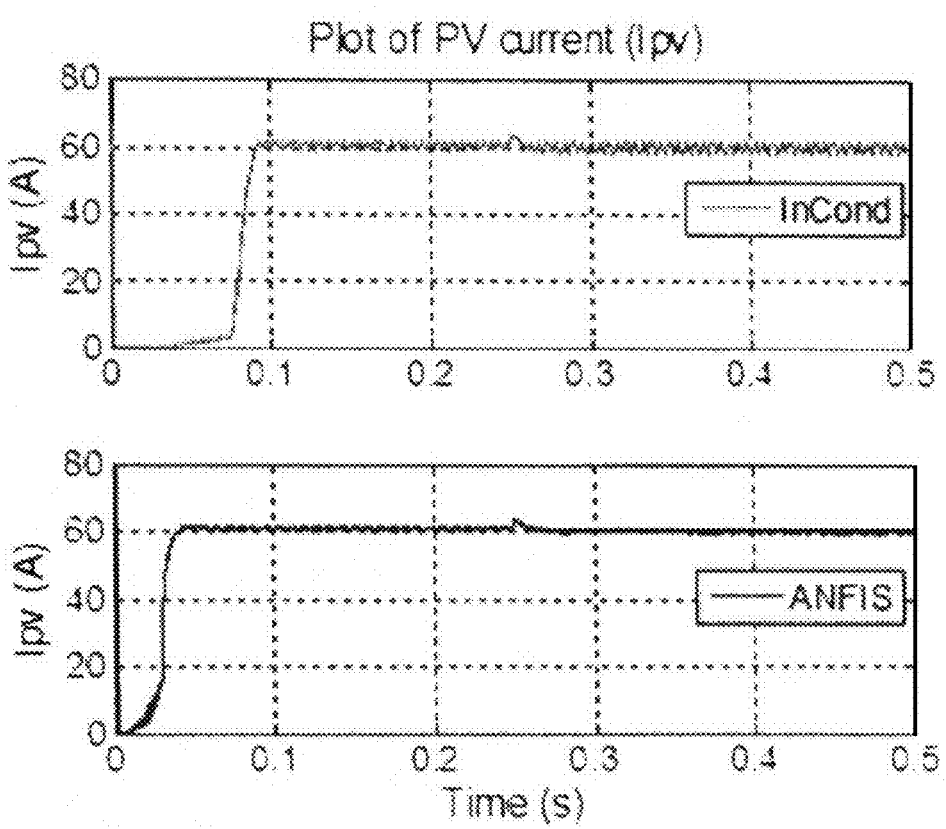
FIG. 54 shows a plot of characteristics of photovoltaic current under step-down temperature change of the Test 4 for the adaptive network-based fuzzy inference based maximum power point tracking controller.

The simulation results for duty cycle, PV array voltage ($V_{PV}$) and current ($I_{PV}$) are shown in FIG. 52, FIG. 53 and FIG. 54, respectively, and verify the effectiveness of the proposed MPPT under the rapidly changing irradiation condition.

A test 5 for the adaptive network-based fuzzy inference based maximum power point tracking controller is conducted under the linear change in irradiation level and its pattern is shown in the FIG. 55. It shows that the solar radiation is constant with a value of 500 W/m² up to 0.2 seconds and then increases linearly to 1000 W/m² at 0.4 seconds. The P-V curves for selected PV array under low (500 W/m² and 25° C.) and normal (1000 W/m² and 25° C.) irradiation level are shown in FIG. 56. It can be seen that the maximum power that can be generated by PV array at low irradiation level is 24.669 kW and labelled as point X on the graph. After a linear change in irradiation, the operating point shifts to point Y having the maximum possible power of 53.07 kW ($V_{MP}*I_{MP}*N_{SS}*N_{PP}$=53.07 kW).

A non-linear time domain simulation is carried out with the proposed ANFIS-based and InCond-based MPPT controllers. For InCond method fixed value of perturbation step size is chosen based on a trade-off between fluctuations in the steady state and tracking speed. FIG. 57 shows a comparison of PV array power output ($P_{PV}$) for both the controllers. It can be seen from the graph that the MPP reached by the proposed ANFIS-based MPPT controller is much faster than the conventional InCond. For example it can track the MPP in 0.04 sec while the InCond take 0.1 sec in the start of the algorithm. During changing irradiation, the MPPT controller tracks the MPP point and shift the operating point from point X to Y and it can be noticed from the plot that the response of InCond is much slower than the proposed ANFIS-based MPPT.

The simulation results for duty cycle, PV array voltage ($V_{PV}$) and current ($I_{PV}$) are shown in FIG. 58, FIG. 59 and FIG. 60, respectively, and verify the effectiveness of the proposed MPPT under the linear changing irradiation condition.

A test 6 for the adaptive network-based fuzzy inference based maximum power point tracking controller is a comparison is made between the proposed ANFIS-based and Fuzzy Logic based MPPT controller (FLC) under the step-down change in irradiation level and its pattern is shown in the FIG. 61. It shows that the solar radiation is constant with a value of 1000 W/m² up to 0.25 seconds and then decrease drastically to 500 W/m². The P-V curves for selected PV array under normal (1000 W/m² and 25° C.) and low (500 W/m² and 25° C.) irradiation level are shown in FIG. 62. It can be seen that the maximum power that can be generated by PV array at normal irradiation level is 53.07 kW ($V_{MP}*I_{MP}*N_{SS}*N_{PP}$=53.07 kW) and labeled as point X on the graph. After a step-down change in irradiation, the operating point shifts to point Y having the maximum possible power of 24.669 kW as shown in FIG. 62.

A non-linear time domain simulation is carried out with the proposed ANFIS-based and Fuzzy-based MPPT controllers. FLC MPPT developed in Sheraz et al., "An Efficient Fuzzy Logic Based Maximum Power point Tracking Controller for Photovoltaic systems", International Conference on Renewable Energies and Power Quality (ICREPQ'13), Bilbao Spain, 20-22 Mar. 2013—incorporated herein by reference) is used. FIG. 63 shows a comparison of PV array power output ($P_{PV}$) for both the controllers. It can be seen from the graph that the MPP reached by the proposed ANFIS-based controller is faster than the FLC MPPT in both the tracking regions, i.e start of the algorithm and step-up change in irradiation. When a step-down change in irradiation occur, the MPPT controller shifts the operating point from point X to Y and it can be noticed from the plot that the response of FLC MPPT is slower than the proposed ANFIS-based MPPT. The simulation results for duty cycle, PV array voltage ($V_{PV}$) and current ($I_{PV}$) are shown in FIG. 64, FIG. 65 and FIG. 66, respectively, and verify the effectiveness of the proposed ANFIS-based MPPT over the FLC MPPT controller.

The competence of proposed ANFIS-based MPPT at different operating condition is illustrated by comparing the maximum power extracted by ANFIS-based MPPT with the conventional InCond method. Percentage error is calculated using the reference power calculated from the efficiently developed PV model described in chapter 3 and is shown in FIG. 67 and FIG. 68.

FIG. 67 shows the percentage error at different irradiation levels with constant temperature of 25° C. It can be seen that the value of error is negligible for the ANFIS-based MPPT for a wide range of operating conditions. Lower value of error depicts that the proposed controller is able to extract maximum possible from the PV array at all weather condition. Its proficiency at varying temperature is shown FIG. 68. From the simulation results, it can be inferred that the proposed ANFIS-based controller is faster than InCond controller in transitional state, and has fewer oscillations in steady state. All these factors will cause less power loss and results in more power output from PV array.

Maximum Power Point Tracking (MPPT) controllers are used to extract maximum possible power from the PV system and all operation condition. The conventional MPPT controllers have some drawbacks associated with them that causes significant amount of power loss. In this chapter, a novel MPPT controller has been proposed and developed based on the ANFIS. The proposed controller hybridizes the principles of two efficient intelligent techniques; Fuzzy Inference systems (FIS) and Artificial Neural Network (ANN). A nonlinear time domain simulation has been carried out to assess the effectiveness of the proposed controllers under different disturbances. Results and comparison showed that the proposed ANFIS-based MPPT controller can fulfill the shortcomings of the conventional method and can track the MPP is shorter time with fewer fluctuations. The obtained results demonstrate that the proposed ANFIS-based controller has better dynamic and steady state performance than the conventional method.

The effectiveness of the proposed ANFIS-based MPPT controller is experimentally verified using the Real Time Digital Simulator (RTDS) and dSPACE controller. A complete PV system is developed in RTDS and the proposed ANFIS-based MPPT is designed in dSPCAE controller. The design and implementation of the PV system and proposed the ANFIS-based MPPT controller and integration of RTDS with dSPACE controller is presented.

Digital techniques are the most important techniques that simulate the modern power systems since later 1960s, especially for power system simulation. In the past, modern technology has gone through tremendous development in the area of power system and digital simulation. The microprocessor progresses, communication and transducer technologies have provided new means for the development in power system protection and relay testing.

In this embodiment, Real Time Digital Simulator (RTDS) is used to simulate a complete PV system. It is a fully digital electromagnetic transient power system simulator. It can be used to conduct close-loop testing of physical devices such as protection equipment and control equipment; to perform analytical system studies and to educate operators, engineers and students as described in Bo et al., ("A Real Time Digital Simulation System for Testing of Integrated Protection Schemes," in 2008 *Joint International Conference on Power System Technology and IEEE Power India Conference*, 2008, pp. 1-5—incorporated herein by reference). It is a cost-effective replacement for transient network analyzers and analogue/hybrid simulators. RTDS allows the user to investigate the effects of disturbances on power system equipment and networks to prevent outages or complete failure. Moreover, RTDS added the capability to improve the simulation accuracy and better capture the switching events as described in S. Foo, ("Real time simulation of power flow control strategies for fuel cell vehicle with energy storage by using Real Time Digital Simulator (RTDS)," in 2009 *IEEE 6th International Power Electronics and Motion Control Conference*, 2009, pp. 2323-2327—incorporated herein by reference).

RTDS is generally designed to simulate power systems in real time with time step-sizes on the order of 50 µs. The system uses a number of digital signal processors (DSPs) which operated in parallel. It provides a number of digital and analog I/O ports for interfacing hardware to the simulation. It features a more powerful processor combined with FPGAs which allow the simulation of a limited number of power electronics devices with time step as small as 1.4-2.5 µs embedded in the 50 µs time-step environment. Therefore, it allows the simulation of power electronics converter operating at higher switching frequency with sufficient accuracy. In addition, its real time capability allows the user to incorporate real devices into the simulation in a closed loop environment.

Its advantage is that it can solve the power system equations continuously and computes the outputs fast enough such that the simulation realistically represents the situation of the real systems. As it replicates the situation of real time systems it can be interfaced directly to the protective relays and power system control equipment to analyze their performance as described in Bo et al., ("A Real Time Digital Simulation System for Testing of Integrated Protection Schemes," in 2008 *Joint International Conference on Power System Technology and IEEE Power India Conference*, 2008, pp. 1-5—incorporated herein by reference).

RTDS is a combination of advanced computer hardware and comprehensive software called RSCAD. The custom parallel processing hardware architecture was assembled in modular units called racks. Each rack contains slot and rail-mounted cards. The specific composition of an RTDS depends on the processing and I/O requirements of the intended application. A common communications backplane links all rack mounted cards facilitating information exchange.

The RTDS™ employs an advanced and easy to use graphical user interface—the RSCAD Software Suite. All loading, running and controlling of the simulations are done entirely from the host workstation through the RSCAD/Runtime module. The Power and Control System Software is an integral part of RSCAD for RTDS™. The software is comprised of several modules designed to allow the user to perform the simulation and result analysis. Any power system network can be created on the computer screen of the RTDS. This can be done by selecting the components from a number of customized component model libraries then arranging them to build the network. Once the system has been drafted and with all parameter settings, the appropriate compiler automatically generates the low-level code necessary to perform the simulation using the RTDS Simulator. The Software is used to interface with the RTDS hardware. It is designed to allow the user to perform all the steps necessary to prepare and run the simulation then analyze its output. It has now become one of the most important product test and development tools throughout the world as described in McLaren et al., ("A real time digital simulator for testing relays," *IEEE Transactions on Power Delivery*, vol. 7, no. 1, pp. 207-213, 1992—incorporated herein by reference).

RTDS works in real-time to provide solutions to power system equations quickly enough to accurately represent conditions in the real world. RTDS offers superior accuracy over analogue systems. It allows for comprehensive product and/or configuration tests. RTDS provides a variety of transient study possibilities.

The dSPACE controller offers an inclusive solution for electronic control unit (ECU) software development. It is powerful development tools for dedicated services in the field of function prototyping, target implementation, and ECU testing. Real time control systems can be built using dSPACE and the control logic can be implemented as described in ("User's Manual, DSpace DS1104",—incorporated herein by reference).

In this embodiment dSPACE DS1104 R&D Controller Board is used. It is a standard board that can be plugged into a PCI (Peripheral Component Interconnect) slot of a PC. The DS1104 is specifically designed for the development of high-speed multivariable digital controllers and real-time simulations in various fields. It is a complete real-time control system based on a 603 PowerPC floating-point processor running at 250 MHz. For advanced I/O purposes, the board includes a slave-DSP subsystem based on the TMS320F240 DSP microcontroller.

Using an adapter cable one can link the external signals from the 100-pin I/O connector on the board to Sub-D (D-sub miniature) connectors. So, one can make a high-density connection between the board and the devices of your application through Sub-D connectors. Specific interface connector panels provide easy access to all the input and output signals of the DS1104 Controller Board. The Connector Panel (CP1104) provides easy-to-use connections between the DS1104 Controller Board and devices to be connected to it. Devices can be individually connected, disconnected or interchanged without soldering via BNC (Bayonet Neill-Concelman) connectors and Sub-D connectors. This simplifies system construction, testing and troubleshooting. In addition to the CP1104, the Connector/LED Combi Panel (CLP1104) provides an array of LEDs indicating the states of the digital signals as described in DSpace Foundation, ("DSpace 1.5.2 Manual,"—incorporated herein by reference).

For purposes of rapid control prototyping (RCP), specific interface connectors and connector panels, discussed above, provide easy access to all input and output signals of the board. Thus, the dSPACE DS1104 Controller Board is the ideal hardware for cost-sensitive RCP applications. The dSPACE works on Matlab/Simulink platform which is a common engineering software and easy to understand. Another feature of the dSPACE is the Control desk which allows the graphical user interface. Through the control desk the user can observe the response of the system also he can give command to the system through this interface. Real time interface is needed for the dSPACE to work. Real-time Interface (RTI) is the link between dSPACE's real-time systems and the MATLAB/Simulink. RTI is an easy graphical I/O configuration and automatic code generation system it executes the C code for Real Time Workshop so that the Simulink models can easily be implemented on dSPACE real-time hardware. Once the I/O has been configured and the controller has been programmed in a Simulink block diagram, model code can be generated using Real-Time Workshop. The real-time model is compiled and downloaded to the dSPACE hardware. The compilation of the .mdl file in Simulink using RTI also generates a file with extension .sdf. This file can be accessed in ControlDesk—software that helps in managing real-time and Simulink experiments. The dSPACE connecter panel (PCI) controller board includes 8 ADC inputs, 8 DAC outputs, digital I/O and connector/LED combination panel.

A complete PV system is developed on RSCAD software which is then compiled and sent for real-time simulations on RTDS. Real-time digital simulator (RTDS) is a combination of specialized computer hardware and software designed specifically for electromagnetic transient simulations in real-time. Its response is much nearer to the existing practical systems. RTDS is used for high speed simulations, closed-loop testing of protecting and control equipment and hardware in the loop (HIL) applications.

FIG. 69 shows the PV array model in RTDS. It has two power system nodes which allows it to be interfaced with the RTDS Network Solution; nodes P and N represent the positive and negative terminals respectively. The connections labeled "INSOLATION" and "TEMPERATURE" are the PV array input signals. Model can simulate PV panels with different specifications and able to work with any number of series and parallel connected PV panels depending upon the output power requirement.

In RTDS buck converter is designed with the help of IGBT switch, diode and inductor, available in the component library. Switching of the IGBT is controlled by PWM signal generated by comparing the duty cycle with the triangle wave. The value of the duty cycle is adjusted by the MPPT controller to track maximum power from PV array. FIG. 70 shows the designed buck converter.

The Gigabit Transceiver Analogue Output Card (GTAO) is used to convert the digital signals from RTDS to analogue signals and interface RTDS to external devices. The GTAO card includes twelve, 16 bit analogue output channels with an output range of +/−10 volts. The 16 bit DACs provide a wide dynamic range. It is mounted in the rear of the RTDS cubicle rack and connects to a GPC processor card via an optical cable. A single +24 volt power supply signal is required to power the card. Analogue output signals connect to terminal blocks available on the GTAO card.

To write the signals on the GTAO card a GTAO component is available in RSCAD/Draft named as "rtds_risc_ctl_GTAO OUT" and is located in the I/O Components hierarchy box under the Controls tab in the Master Library. The user is able to individually enable the channels and set scale factors for each enabled channel. The GTAO component with its twelve channels is shown in FIG. 71.

The Gigabit Transceiver Analogue Input Card (GTAI) is used to interface analogue signals from an external device to the RTDS. The GTAI card includes 12 analogue input channels with each channel configured as a differential input with an input range of +/−10 volts. Sixteen bit A/D converters are used on the GTAI card. The GTAI card is mounted on the rear of the RTDS cubicle and connects to a GPC processor card via an optical cable. A single +24 volt power supply signal is required to power the card. Analogue input signals connect to terminal blocks available on the GTAI card. The GTAI card uses two Analog Devices AD7656 ADCs. Each AD7656 chip includes six independent sixteen bit A/D converters.

To read the signals from the GTAI card a GTAI component is available in RSCAD/Draft named as "rtds_risc_ctl_GTAI" and is located in the I/O Components hierarchy box under the Controls tab in the Master Library. The user is able to individually enable the channels and set scale factors for each enabled channel.

The GTAI reads data from up to twelve analogue input channels and converts it to digital format for use by the RTDS. Each channel may be enabled or disabled using the toggle boxes provided in the 'ENABLE AND INPUT CHANNELS' menu. A separate scale value is specified for each input signal. Scale values represent the analogue signal peak voltage (in volts) which will result in a value of 1.0 to be present on the corresponding output signal wire. For example, a scale value of scl1=5.0 means that a voltage of 1 volt on the analogue input channel #1 will result in a value of ⅕ (0.2) on the output wire labeled '1'. The maximum input range of the GTAI is +/−10 volts peak. The GTAI component with its twelve channels is shown in FIG. 72.

A complete PV system in RSCAD is shown in FIG. 73. PV array takes irradiation and temperature as inputs and its outputs are DC voltage and DC current. It is then connected with Buck converter that is developed in bridge block (dotted border in FIG. 73) and shown in FIG. 74. It consists of the designed buck converter, triangular wave generator and comparator block. Switching of the buck converter is controlled by PWM signal generated by comparing the duty cycle with the triangle wave. The value of the duty cycle is adjusted by the MPPT controller to track maximum power from the PV array. Black box in FIG. 73 shows the measurement and control unit and its inner logic is shown in FIG. 75. It shows the control arrangement of the PV system. FIG. 76 shows the arrangement of the GTAO and GTAI components to interface the RTDS with the external MPPT controller. GTAO sends the irradiation and temperature signals to the external MPPT controller and GTAI receives the control signal ($V_{REF}$) from it. The reference voltage ($V_{REF}$) is then normalized using DC link voltage ($V_{DC}$) and fedback to the voltage control loop. In voltage control loop PI controller is used to maintain the output voltage of PV array ($V_{PV}$) to the reference optimal voltage by adjusting the duty cycle of buck converter which results in maximum power extraction.

The proposed ANFIS-based MPPT controller designed in chapter 4 is implemented in real domain using dSPACE DS1104 shown in FIG. 77. Inputs to the proposed controller are irradiation and temperature and these are represented by DS1104ADC_C5 and DS1104ADC_C6 blocks in real time simulink model, respectively. These blocks are obtained from a dSPACE library in SIMULINK and convert the analog signal to digital signal. Here ADC in the name of the blocks depicts the analog to digital conversion. Similarly the output of the proposed controller is $V_{REF}$ and represented by DA1104DAC_C1 and converts the digital signal to analog (DAC). Basically these blocks are used to integrate the dSPACE controller with external analog signals and devices. In our case these blocks are linked to GTAO and GTAI of the RTDS. DS1104ADC_C5 and DS1104ADC_C6 blocks are linked with the GTAO and accept the analog signals of temperature and irradiation as input. In the same way, DA1104DAC_C1 is linked with GTAI of RTDS and send the control signal back to RTDS. A detailed interfacing of RTDS and dSPACE will be discussed in the next section. The gain blocks in FIG. 77 are used to get the actual values of inputs.

After designing the controller in the Simulink next step is to set time-step of a model to 100 μsec to synchronous with the time-step of dSPACE. In every time-step, the designed MPPT controller (DS1104) monitors the input quantities (irradiation and temperature) and after making the decision, based on the designed algorithm, generates the controlled output signal ($V_{REF}$). Real time implementation of a controller should run continuously for infinite time therefore set the stop time to infinite. Then the designed controller is converted into real time code and becomes ready to work in a real time domain.

A complete PV system build in RTDS and proposed ANFIS-based MPPT controller is designed in dSPACE DS1104 as explained previously. The dSPACE controller is integrated with RTDS to analyze the effectiveness of the proposed ANFIS-based MPPT experimentally. Interfacing of the equipments is carried out via analog link and two sets of analog to digital and digital to analog converters are utilized to achieve this job. GTAO and GTAI are associated with RTDS and ADC and DAC are associated with dSPACE as shown in FIG. 78.

FIG. 78 shows complete closed loop control system. Outputs (irradiation and temperature) from the RTDS are converted to analog signal in the range of 0-10V and send to the dSPACE controller where ADC utilized to convert them back to digital signal and processed by the designed controller. After processing the inputs, control signal is given out from dSPACE controller which is then changed into analog signal within the same range of 0-10V and provided to the RTDS where GTAI accepts it and converts back to the digital domain and present it to the RTDS where PV system is developed. A complete experimental setup includes a host PC for RTDS and dSPACE, an interface of dSPACE and RTDS and RTDS PV system simulator.

Experiment setup is utilized to verify the effectiveness of the proposed controller experimentally. PV system is developed in real time digital simulator (RTDS) and the proposed ANFIS-based MPPT is designed in dSPACE DS1104. In this chapter, experimental superiority of the proposed controller over conventional Incremental Conductance (InCond) controller will be investigated. Additionally, experimental results have been compared with the MATLAB simulation results to validate the accuracy of the proposed controller.

Experimentally, a series of tests are conducted in the RTDS and dSPACE DS1104 environment to examine the effectiveness of the proposed controller for different step changes in irradiation and temperature.

In the first test to examine the effectiveness of the proposed controller, step-up change in irradiation level is applied which is same as that applied in simulation studies and its irradiation pattern shown FIG. 31. The system response and performance under such disturbance are shown in FIG. 79-FIG. 82 and depict the experimental comparison between the proposed and conventional controllers. The experimental comparison of PV power output ($P_{PV}$) is shown in FIG. 79 and demonstrates that the proposed controller can track the MPP much faster than conventional controller and without significant oscillations in steady state. The characteristic of the duty ratio for buck converter switch is shown in FIG. 80 and shows much better performance than the conventional InCond controller cannot follow the rapidly changing irradiation condition. The PV output voltage and current under the step-up change in irradiation are shown in FIG. 81 and FIG. 82, respectively and confirm the effectiveness of the proposed controller. This verifies the competence of the proposed ANFIS-based MPPT over conventional method for the worst case of step-up change in irradiation condition, experimentally.

In the second test to examine the effectiveness of the proposed controller, a step-down change in irradiation level is applied that has the similar pattern of the simulation studies and shown in FIG. 37. The system response and performance under such disturbance are shown in FIG. 83-FIG. 86 that depicts the experimental comparison between the proposed and conventional controllers. Experimental results for PV power ($P_{PV}$) is shown in FIG. 83 which confirms that the proposed controller has less fluctuations and can reach the steady state faster and then the conventional InCond method. The behavior of the duty ratio for the buck converter switch is shown in FIG. 84. The output characteristics of PV voltage ($V_{PV}$) and current ($I_{PV}$) are shown in FIG. 85 and FIG. 86 respectively and verify the effectiveness of the proposed controller. This verifies experimentally the competence of the proposed ANFIS-based MPPT over conventional method for the worst case of step-down change in irradiation condition.

In the third test to examine the effectiveness of the proposed controller, step-up change in temperature is applied which is the same as that applied in simulation studies and its temperature pattern shown in FIG. 43. The system's experimental response and performance under such disturbance are shown in FIG. 87-FIG. 90. Experimental result for PV power ($P_{PV}$) is shown in FIG. 87 and depicts that the proposed controller can track the MPP point in reasonable time and without significant fluctuations in the steady state. The behavior of the duty ratio for the buck converter switch is shown in FIG. 88. The output characteristics of PV voltage ($V_{PV}$) and current ($I_{PV}$) are shown in FIG. 89 and FIG. 90 respectively and verify the effectiveness of the proposed controller. This verifies experimentally the competence of the proposed ANFIS-based MPPT for the worst case of step-up change in temperature.

In the fourth test to examine the effectiveness of the proposed controller, step-down change in temperature is applied and have the same pattern is used in the simulation studies and shown in FIG. 49. The system's experimental response and performance under such disturbance are shown in FIG. 91-FIG. 94. Experimental result for PV power ($P_{PV}$) is shown in FIG. 91 and depicts that the proposed controller can track the MPP point in reasonable time and without significant fluctuations in the steady state. The behavior of the duty ratio for the buck converter switch is shown in FIG. 92. The output characteristics of PV voltage ($V_{PV}$) and current ($I_{PV}$) are shown in FIG. 93 and FIG. 94, respectively and verify the effectiveness of the proposed controller. This verifies experimentally the competence of the proposed ANFIS-based MPPT for the worst case of step-down change in temperature.

The results from the MATLAB/Simulink simulations, are compared with the experimental results to explore the validity of the proposed ANFIS-based MPPT controller. The results and comparison show that the proposed controller has noticeable improvement in tracking the MPP under varying environmental conditions. Experimental and MAT- LAB/Simulink simulations results have confirmed the effectiveness of the proposed ANFIS-based MPPT for all the tests considered.

A first comparison is made between the simulation and experimental results for the step-up change in irradiation level to verify the working of the proposed controller. A comparison of the system response and performance under this disturbance is shown in FIG. 95-FIG. 98. FIG. 95 depicts the PV power output ($P_{PV}$) and how the proposed controller track the MPP in MATLAB/Simulink and experimental simulations under the step-up change in irradiation level. Comparison of duty ratio is shown in FIG. 96 and PV output voltage ($V_{PV}$) and current ($I_{PV}$) are illustrated in FIG. 97 and FIG. 98, respectively. It can be seen that the experimental results are very much similar to the simulation results. A small difference can be noticed in the transient phase that is because RTDS has a detailed real time simulation and depicts in depth response. On the other hand, model developed for MATLAB simulations is simplified. Both the experimental and MATLAB/Simulink results validate the accuracy of the proposed controller model.

In the second comparison, simulation results are compared with the experimental results to verify the accuracy of the proposed controller under the step-down change in irradiation condition. A comparison of the system response and performance under this disturbance is shown in FIG. 99-FIG. 102. PV power output ($P_{PV}$) is shown in FIG. 99 that confirms the similarity between the experimental and simulation results and show how the proposed controller track the MPP under the step-up change in irradiation level. Behavior of duty ratio is compared FIG. 100 and comparison for PV output voltage ($V_{PV}$) and current ($I_{PV}$) are illustrated in FIG. 101 and FIG. 102 respectively. It can be noticed that the simulation results are very much similar to the experimental results. This verifies the working of the proposed controller experimentally under the step-down change in irradiation condition.

In the third comparison, comparison is made between the simulation and experimental results for the step-up change in temperature to verify the effectiveness of the proposed controller. A comparison of the system response and performance under this disturbance is shown in FIG. 103-FIG. 106. FIG. 103 depicts the PV power output ($P_{PV}$) and how the proposed controller track the MPP in MATLAB/Simulink and experimental simulations under the step-up change in temperature. Comparison of duty ratio is shown in FIG. 104 and PV output voltage ($V_{PV}$) and current ($I_{PV}$) are illustrated in FIG. 105 and FIG. 106 respectively. It can be seen from all the graphs that the experimental curves are very close to the simulation curves. Both the experimental and MATLAB/Simulink results validate the accuracy and the effectiveness of the proposed controller model.

In the fourth comparison, simulation results are compared with the experimental results to verify the accuracy of the proposed controller under the step-down change in temperature. A comparison of the system response and performance under this disturbance is shown in FIG. 107-FIG. 110. PV power output ($P_{PV}$) is shown in FIG. 107 which demonstrates the closeness between the practical and simulation results and show that the proposed controller tracks the MPP under the step-up change in temperature. Behavior of duty ratio is compared in FIG. 108 and comparison for PV output voltage ($V_{PV}$) and current ($I_{PV}$) are illustrated in FIG. 109 and FIG. 110 respectively. It can be noticed from all the graphs that the simulation results are in full agreement to the experimental results. This confirms the accuracy and potential of the proposed controller experimentally under the step-down change in irradiation condition Experimental validation of the proposed ANFIS-based MPPT controller has been demonstrated under different disturbances. The performance of the proposed controller is compared with the conventional InCond method. Results and comparisons show that the proposed controller can track the MPP faster with less fluctuation in the steady state as compared with the conventional controller. Similarity between the experimental curves and the MATLAB/Simulink simulations results have also been shown to validate the accuracy and performance of the proposed controller practically.

A generalized PV array model simulator has been proposed and developed in the MATLAB/Simulink. Simulator has been designed based on the five parameters equivalent electric circuit model. The major challenge in the implementation of this model lies in the estimation of the five unknown model parameters. An ANFIS-based MPPT controller has also been proposed and the developed PV model has been utilized to evaluate the performance of the proposed ANFIS-based MPPT controller under different atmospheric conditions. Conventional MPPT techniques have some drawbacks like oscillation in the steady state, slow convergence and failure to track MPP in the rapidly changing conditions. All these factors causes considerable amount of power losses. It has been shown that the proposed controller can overcome the shortcoming of the conventional controllers.

PV model parameters have been identified using the efficient stochastic optimization technique. Estimation problem is converted into optimization one where Differential Evolution (DE) as an efficient optimizing technique is employed to estimate the model parameters at standard test condition (STC) (1000 W/m² and 25° C.) using only the data provided by the manufacturer.

The effectiveness of the proposed method has been analyzed by estimating the parameters of six PV panels of three different technologies (mono-crystalline, poly-crystalline and thin film) and comparing the determined I-V curves with the experimental curves given in the datasheets. Results and analysis have shown that the proposed method can simulate the output characteristics of all the three technologies efficiently.

Precise PV simulator has been developed that is flexible enough to simulate any number of PV panels connected in series and parallel. The robustness of the proposed simulator is demonstrated under the partial shaded conditions. Additionally, the performance of the developed simulator is verified by interfacing it with the actual power electronics converter and maximum power point tracking (MPPT) controller.

The proposed work will facilitate the power system design engineers to assess the behavior of the newly developed controllers and performance of the overall power system prior to any practical implementation.

An ANFIS-based MPPT controller has been proposed. The proposed controller hybridizes the principles of two efficient intelligent techniques; Fuzzy Inference systems (FIS) and Artificial Neural Network (ANN).

A nonlinear time domain simulation has been carried out to assess the effectiveness of the proposed controllers under different disturbances. Results and comparison showed that the proposed ANFIS-based MPPT controller can fulfill the shortcomings of the conventional method and can track the MPP faster with less overshoots. The obtained results demonstrate that the proposed controller has better dynamic and steady state performance than the conventional method.

Experimental setup has been put together to verify the effectiveness of the proposed controller practically. The ANFIS-based MPPT controller is developed in dSPACE DS1104 and PV system is designed in Real Time digital Simulator (RTDS). Results and analysis showed that the proposed ANFIS-based MPPT has fast response in the transient condition and has fewer oscillations in the steady state.

Comparison of experimental and MATLAB simulation results has been carried out to verify the accuracy of the proposed controller.

Other embodiment can also be employed, such as the developed PV simulator can be modified by using two-diode PV model that will add two additional unknown parameters to optimize and comparison can be done between modified and proposed simulator to investigate their efficiencies. Different optimization techniques can be used instead of DE to estimate the model parameters of PV, to study which optimizing technique is better. Different objective function can be used to test the efficiency of the optimizing techniques. Partial shading condition is one of the major issues and causes multiple peaks in the PV curve and made it difficult to track the global MPP. The proposed ANFIS-based MPPT controller is designed for uniform irradiation condition and it can be improved to work in the partial shading conditions. In current embodiment, step changes in irradiation and temperature has been applied to test the effectiveness of the proposed ANFIS-based MPPT. Of course, actual real data of irradiation and temperature can be used to verify its performance for real environmental conditions. The developed PV system model and proposed MPPT controller can be interfaced with the power grid through inverter and effects of changing environmental conditions on power grid can be studied. Practical setup of actual PV array with all necessary sensors and controllers can be installed to test the performance of proposed ANFIS-based MPPT controller.

Next, a hardware description of the processing circuitry according to exemplary embodiments is described with reference to FIG. 111. In FIG. 111, the processing circuitry includes a CPU 11100 which performs the processes described above. The process data and instructions may be stored in memory 11102. These processes and instructions may also be stored on a storage medium disk 11104 such as a hard drive (HDD) or portable storage medium or may be stored remotely. Further, the claimed advancements are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the processing circuitry communicates, such as a server or computer.

Further, the claimed advancements may be provided as a utility application, background daemon, or component of an operating system, or combination thereof, executing in conjunction with CPU 11100 and an operating system such as Microsoft Windows 7, UNIX, Solaris, LINUX, Apple MAC-OS and other systems known to those skilled in the art.

CPU 11100 may be a Xenon or Core processor from Intel of America or an Opteron processor from AMD of America, or may be other processor types that would be recognized by one of ordinary skill in the art. Alternatively, the CPU 11100 may be implemented on an FPGA, ASIC, PLD or using discrete logic circuits, as one of ordinary skill in the art would recognize. Further, CPU 11100 may be implemented as multiple processors cooperatively working in parallel to perform the instructions of the inventive processes described above.

The processing circuitry in FIG. 111 also includes a network controller 11106, such as an Intel Ethernet PRO network interface card from Intel Corporation of America, for interfacing with network 111111. As can be appreciated, the network 111111 can be a public network, such as the Internet, or a private network such as an LAN or WAN network, or any combination thereof and can also include PSTN or ISDN sub-networks. The network 111111 can also be wired, such as an Ethernet network, or can be wireless such as a cellular network including EDGE, 3G and 4G wireless cellular systems. The wireless network can also be WiFi, Bluetooth, or any other wireless form of communication that is known.

The processing circuitry further includes a display controller 11108, such as a NVIDIA GeForce GTX or Quadro graphics adaptor from NVIDIA Corporation of America for interfacing with display 11110, such as a Hewlett Packard HPL2445w LCD monitor. A general purpose I/O interface 11112 interfaces with a keyboard and/or mouse 11114 as well as a touch screen panel 11116 on or separate from display 11110. General purpose I/O interface also connects to a variety of peripherals 11118 including printers and scanners, such as an OfficeJet or DeskJet from Hewlett Packard.

A sound controller 11120 is also provided in the processing circuitry, such as Sound Blaster X-Fi Titanium from Creative, to interface with speakers/microphone 11122 thereby providing sounds and/or music.

The general purpose storage controller 11124 connects the storage medium disk 11104 with communication bus 11126, which may be an ISA, EISA, VESA, PCI, or similar, for interconnecting all of the components of the processing circuitry. A description of the general features and functionality of the display 11110, keyboard and/or mouse 11114, as well as the display controller 11108, storage controller 11124, network controller 11106, sound controller 11120, and general purpose I/O interface 11112 is omitted herein for brevity as these features are known.

It is to be understood that the present invention is not limited to the embodiments described above, but encompasses any and all embodiments within the scope of the following claims.

The invention claimed is:

1. A photovoltaic system to track the maximum power point, comprising:
 a photovoltaic array that generates a varying DC output voltage and current depending on one or more weather conditions;
 a buck/boost converter to step down/step up of the output voltage from the photovoltaic array;
 a DC link capacitor to connect the buck/booster converter to a load/inverter, wherein the load/inverter provides a grid output of the photovoltaic system;
 an adaptive network-based fuzzy inference maximum power point tracking controller to generate a reference voltage;
 a voltage control loop to compare the output voltage of the photovoltaic array to the reference voltage, and
 a proportional integral controller to maintain the output voltage of the photovoltaic array to the reference voltage by adjusting the duty ratio of buck/boost converter.

2. The photovoltaic system of claim 1, wherein
the adaptive network-based fuzzy inference based maximum power point tracking controller generates the reference voltage based on irradiation and temperature,
the reference voltage is output to the voltage control loop, and
the adaptive network-based fuzzy inference based maximum power point tracking controller maps an input-output data set to a 5-layer architecture to generate the reference voltage.

* * * * *